US012464946B2

(12) United States Patent
Oh et al.

(10) Patent No.: US 12,464,946 B2
(45) Date of Patent: Nov. 4, 2025

(54) LIGHT EMITTING DEVICE

(71) Applicant: Samsung Display Co., Ltd., Yongin-si (KR)

(72) Inventors: Chanseok Oh, Seoul (KR); Taeil Kim, Hwaseong-si (KR); Sun Young Pak, Suwon-si (KR); Junha Park, Gwacheon-si (KR); Jang Yeol Baek, Yongin-si (KR); Kyoung Sunwoo, Hwaseong-si (KR); Mun-Ki Sim, Seoul (KR); Minjung Jung, Gangwon-do (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 669 days.

(21) Appl. No.: 17/725,850

(22) Filed: Apr. 21, 2022

(65) Prior Publication Data

US 2023/0104499 A1 Apr. 6, 2023

(30) Foreign Application Priority Data

Jul. 21, 2021 (KR) ........................ 10-2021-0096029

(51) Int. Cl.

*C07F 5/02* (2006.01)
*H10K 50/12* (2023.01)
*H10K 50/81* (2023.01)
*H10K 50/82* (2023.01)
*H10K 85/60* (2023.01)

(52) U.S. Cl.

CPC ........... *H10K 85/6572* (2023.02); *C07F 5/02* (2013.01); *H10K 50/12* (2023.02); *H10K 50/81* (2023.02); *H10K 50/82* (2023.02)

(58) Field of Classification Search

None

See application file for complete search history.

(56) References Cited

U.S. PATENT DOCUMENTS

| | | | | |
|---|---|---|---|---|
| 2020/0058885 | A1 | 2/2020 | Hong et al. | |
| 2021/0013423 | A1 | 1/2021 | Lee et al. | |
| 2023/0422617 | A1 * | 12/2023 | Li | C09K 11/02 |

FOREIGN PATENT DOCUMENTS

| | | | | |
|---|---|---|---|---|
| CN | 111647009 A | * | 9/2020 | C07F 5/027 |
| KR | 10-1886773 | | 8/2018 | |
| KR | 10-1955648 | | 3/2019 | |
| KR | 10-2053324 | | 12/2019 | |
| KR | 10-2021-0019987 | | 2/2021 | |

OTHER PUBLICATIONS

Zhang, Yuewei, et al. "Sterically wrapped multiple resonance fluorophors for suppression of concentration quenching and spectrum broadening." Angewandte Chemie International Edition 61.2 (2022): e202113206. (Year: 2022).*

Machine translation of CN-111647009-A, translation generated Dec. 2024, 27 pages. (Year: 2024).*

Supporting information for Zhang, Yuewei, et al. "Sterically wrapped multiple resonance fluorophors for suppression of concentration quenching and spectrum broadening." Angewandte Chemie International Edition 61.2 (2022), 45 pages. (Year: 2022).*

Anton Pershin et al., "Highly emissive excitons with reduced exchange energy in thermally activated delayed fluorescent molecules", Nature Communications, Feb. 5, 2019, pp. 1-5, vol. 10, No. 597.

* cited by examiner

*Primary Examiner* — Robert S Loewe

(74) *Attorney, Agent, or Firm* — KILE PARK REED & HOUTTEMAN PLLC

(57) ABSTRACT

A light emitting device includes a first electrode, a second electrode disposed on the first electrode, and a light emitting layer disposed between the first electrode and the second electrode. The light emitting layer includes a novel polycyclic compound and thus, the light emitting device may exhibit high light emission efficiency properties and improved lifespan properties.

22 Claims, 7 Drawing Sheets

LIGHT EMITTING DEVICE

CROSS-REFERENCE TO RELATED APPLICATION(S)

This application claims priority to and benefits of Korean Patent Application No. 10-2021-0096029 under 35 U.S.C. § 119, filed on Jul. 21, 2021 in the Korean Intellectual Property Office, the entire contents of which are incorporated herein by reference.

BACKGROUND

1. Technical Field

The disclosure relates to alight emitting device including a novel polycyclic compound in a light emitting layer.

2. Description of the Related Art

Active development continues for an organic electroluminescence display device and the like as an image display device. An organic electroluminescence display device is a display device including a so-called self-luminescence light emitting device in which holes and electrons respectively injected from a first electrode and a second electrode recombine in an emission layer so that a light emitting material of the light emitting layer emits light to achieve the display of images.

In applying a light emitting device to an image display, there is a demand for low driving voltage, high luminescence efficiency, and long life, and continuous development is required on a material for a light emitting device which is capable of stably achieving such characteristics.

Recently, in order to implement a high-efficiency light emitting device, techniques for phosphorescence light emission using triplet state energy or delayed fluorescence light emission using triplet-triplet annihilation (TTA) in which a singlet exciton is generated by the collision of a triplet exciton are being developed, and development for thermally activated delayed fluorescence (TADF) materials using delayed fluorescence light is underway.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a light emitting device exhibiting an excellent light emission efficiency.

An embodiment provides a light emitting device which may include a first electrode, a second electrode disposed on the first electrode, and a light emitting layer disposed between the first electrode and the second electrode. The light emitting layer may include a polycyclic compound, and the first electrode and the second electrode may each independently include at least one selected from Ag, Mg, Cu, Al, Pt, Pd, Au, Ni, Nd, Ir, Cr, Li, Ca, LiF, Mo, Ti, W, In, Sn, Zn, an oxide thereof, a compound thereof, and a mixture thereof. The polycyclic compound may include a phenyl group, a first substituent substituted at the phenyl group, and represented by Formula A-1, a second substituent substituted at the phenyl group at an ortho position with respect to the first substituent, and a third substituent substituted at the phenyl group at an ortho position with respect to the first substituent and at a meta position with respect to the second substituent. The second substituent and the third substituent may each independently be a group represented by Formula A-2.

[Formula A-1]

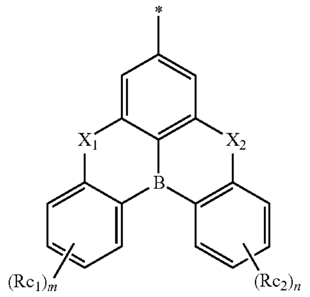

[Formula A-2]

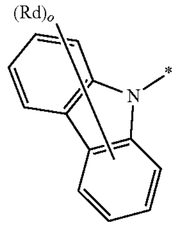

In Formula A-1, $X_1$ and $X_2$ may each independently be O, S, Se, or N(Ra), m and n may each independently be an integer from 0 to 4, and Ra, $Rc_1$, and $Rc_2$ may each independently be a hydrogen atom, a deuterium atom, a halogen atom, a cyano group, a substituted or unsubstituted amine group, a substituted or unsubstituted silyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In Formula A-2, o may be an integer from 0 to 8, and Rd may be a hydrogen atom, a deuterium atom, a halogen atom, a cyano group, a substituted or unsubstituted amine group, a substituted or unsubstituted silyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In an embodiment, the phenyl group and the first substituent may have a twisted molecular structure.

In an embodiment, the first substituent may be positioned on a first plane, and the phenyl group may be positioned on a second plane which is not parallel to the first plane.

In an embodiment, in Formula A-1, at least one of $X_1$ and $X_2$ may be N(Ra), and Ra may be a group represented by any one of Formulas $A_1$ to $A_6$.

$A_1$

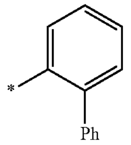

$A_2$

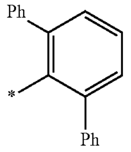

$A_3$

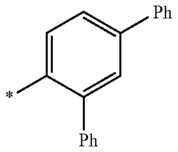

$A_4$

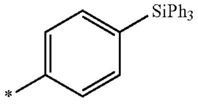

$A_5$

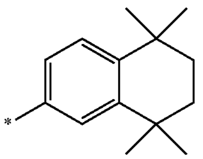

$A_6$

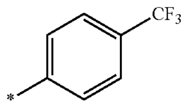

In Formulas $A_1$ to $A_6$, Ph may be an unsubstituted phenyl group.

In an embodiment, in Formula A-1, $Rc_1$ and $Rc_2$ may each independently be a substituted or unsubstituted carbazole group, or a substituted or unsubstituted diphenyl amine group.

In an embodiment, in Formula A-1, m and n may each be 1, and $Rc_1$ and $Rc_2$ may each be at a para position with respect to a boron atom.

In an embodiment, in Formula A-2, Rd may be a hydrogen atom, a deuterium atom, a fluorine atom, a cyano group, a substituted or unsubstituted phenyl group, a substituted or unsubstituted t-butyl group, a substituted or unsubstituted triphenylsilyl group, or a substituted or unsubstituted methyl group.

In an embodiment, the polycyclic compound may further include a fourth substituent substituted at the phenyl group at a para position with respect to the first substituent, and the fourth substituent may be a hydrogen atom, a substituted or unsubstituted carbazole group, or a substituted or unsubsti-tuted t-butyl group.

In an embodiment, the polycyclic compound may be any one selected from Compound Group 1, which is explained below.

In an embodiment, a light emitting device may include a first electrode, a second electrode disposed on the first electrode, and a light emitting layer disposed between the first electrode and the second electrode. The light emitting layer may include a polycyclic compound represented by Formula 1, and the maximum external quantum efficiency of the light emitting device may be equal to or greater than about 20%.

[Formula 1]

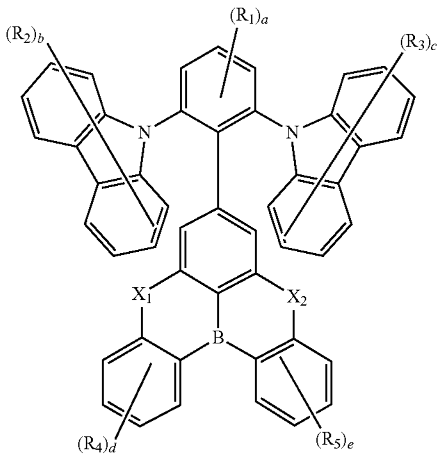

In Formula 1, $X_1$ and $X_2$ may each independently be O, S, Se, or N(Ra), a may be an integer from 0 to 3, b and c may each independently be an integer from 0 to 8, d and e may each independently be an integer from 0 to 4, and $R_1$ to $R_5$, and Ra may each independently be a hydrogen atom, a deuterium atom, a halogen atom, a cyano group, a substituted or unsubstituted amine group, a substituted or unsubstituted silyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In an embodiment, the polycyclic compound represented by Formula 1 may be represented by Formula 2.

[Formula 2]

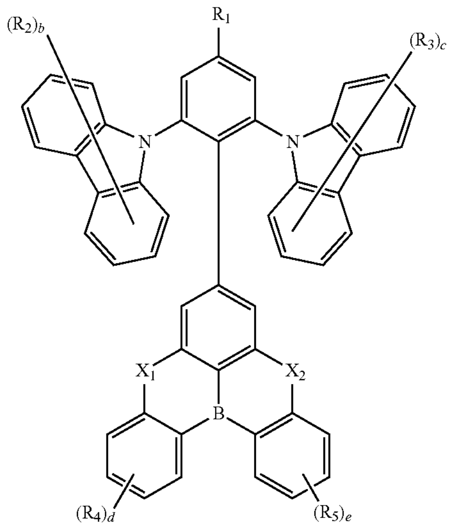

In Formula 2, $X_1$, $X_2$, b to e, and $R_1$ to $R_5$ may be the same as defined in Formula 1.

In an embodiment, in Formula 2, $R_1$ may be a hydrogen atom, a substituted or unsubstituted carbazole group, or a substituted or unsubstituted t-butyl group.

In an embodiment, in Formula 1, $R_2$ and $R_3$ may each independently be a hydrogen atom, a deuterium atom, a fluorine atom, a cyano group, a substituted or unsubstituted triphenylsilyl group, a substituted or unsubstituted phenyl group, a substituted or unsubstituted t-butyl group, or a substituted or unsubstituted methyl group.

In an embodiment, the polycyclic compound represented by Formula 1 may be represented by Formula 3-1 or Formula 3-2.

[Formula 3-1]

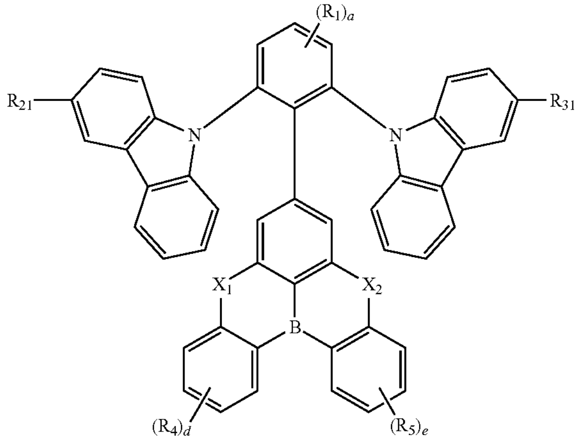

[Formula 3-2]

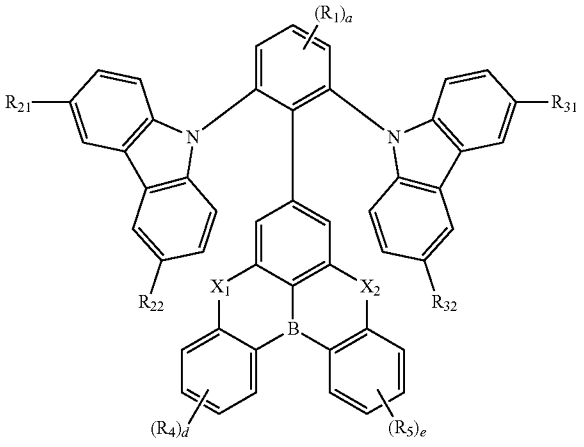

In Formula 3-1 and Formula 3-2, $R_{21}$, $R_{22}$, $R_{31}$, and $R_{32}$ may each independently be a hydrogen atom, a fluorine atom, a cyano group, a substituted or unsubstituted phenyl group, a substituted or unsubstituted t-butyl group, a substituted or unsubstituted triphenylsilyl group, or a substituted or unsubstituted methyl group, and $X_1$, $X_2$, a, d, e, $R_1$, $R_4$, and $R_5$ may be the same as defined in Formula 1.

In an embodiment, the polycyclic compound represented by Formula 1 may be represented by Formula 4.

[Formula 4]

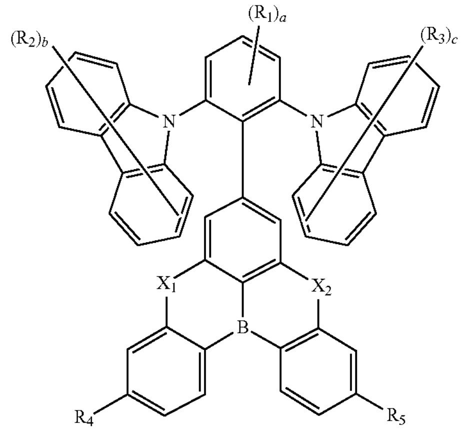

In Formula 4, $X_1$, $X_2$, a to c, and $R_1$ to $R_5$ may be the same as defined in Formula 1.

In an embodiment, in Formula 4, $R_4$ and $R_5$ may each independently be a substituted or unsubstituted carbazole group, or a substituted or unsubstituted diphenyl amine group.

In an embodiment, at least one of $X_1$ and $X_2$ may be N(Ra), and Ra may be a group represented by any one of Formulas $A_1$ to $A_6$.

$A_1$

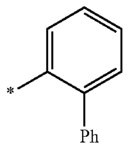

$A_2$

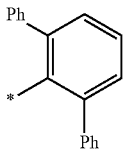

$A_3$

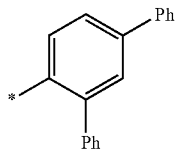

$A_4$

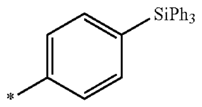

$A_5$

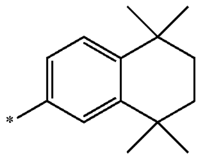

-continued

A6

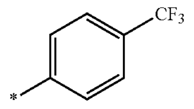

In Formulas $A_1$ to $A_6$, Ph may be an unsubstituted phenyl group.

In an embodiment, the polycyclic compound may include an enantiomer.

In an embodiment, the light emitting layer may be a delayed fluorescent light emitting layer including a host and a dopant, and the dopant may include the polycyclic compound.

In an embodiment, the light emitting layer may emit blue light having a center wavelength in a range of about 450 nm to about 470 nm.

BRIEF DESCRIPTION OF THE DRAWINGS

The accompanying drawings are included to provide a further understanding of the embodiments, and are incorporated in and constitute a part of this specification. The drawings illustrate embodiments of the disclosure and principles thereof. The above and other aspects and features of the disclosure will become more apparent by describing in detail embodiments thereof with reference to the attached drawings, in which.

DETAILED DESCRIPTION OF THE EMBODIMENTS

Figure 1:
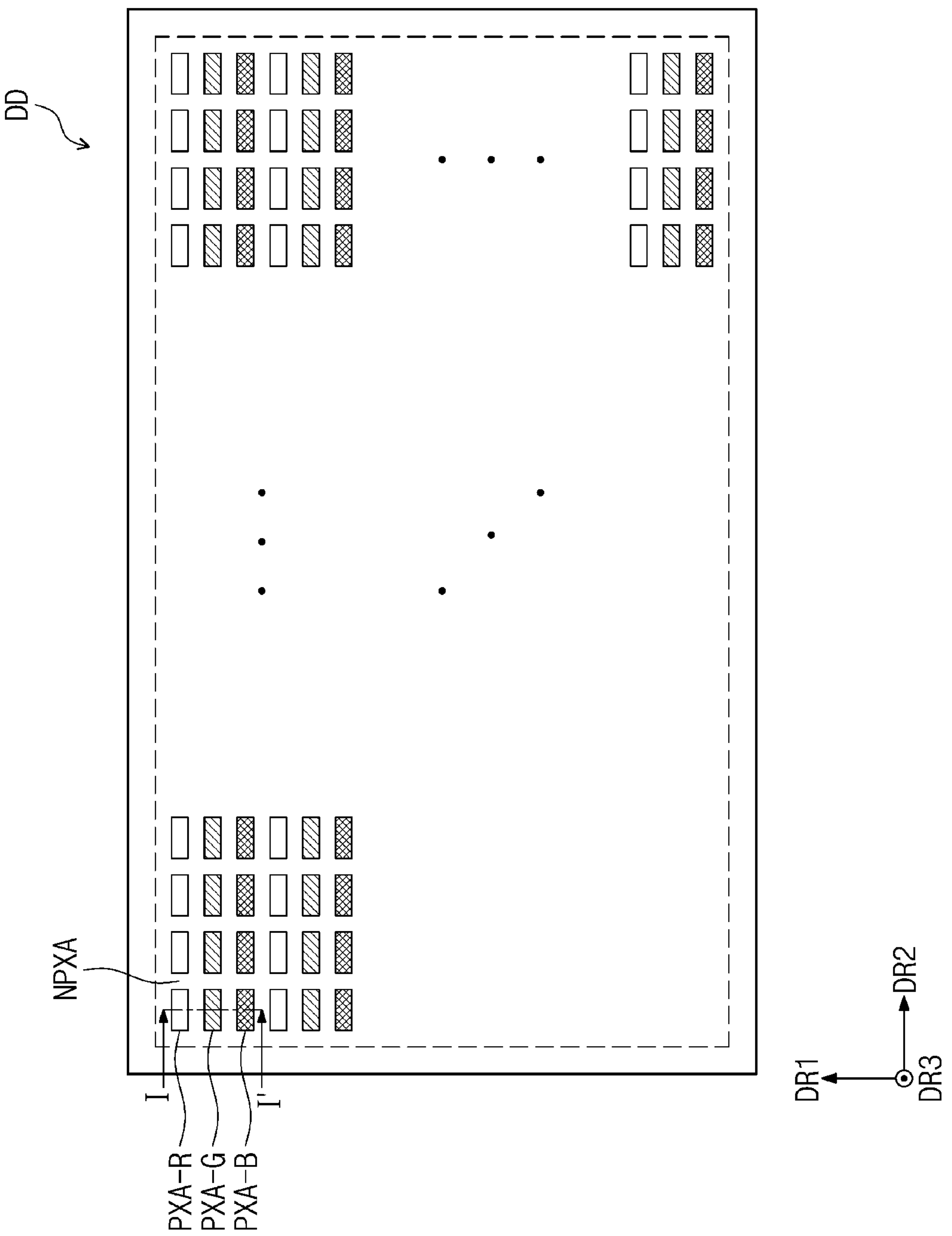
FIG. 1 is a plan view showing a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the specification, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the specification, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

In the specification, the term "substituted or unsubstituted" may mean a group that is substituted or unsubstituted with one or more substituents selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. Each of the substituents recited above may itself be substituted or unsubstituted. For example, a biphenyl group may be interpreted as an aryl group, or may be interpreted as a phenyl group substituted with a phenyl group.

In the specification, the term "bonded to an adjacent group to form a ring" may mean a group that is bonded to an adjacent group to form a substituted or unsubstituted hydrocarbon ring or a substituted or unsubstituted heterocycle. The hydrocarbon ring may be an aliphatic hydrocarbon ring or an aromatic hydrocarbon ring. The heterocycle may be an aliphatic heterocycle or an aromatic heterocycle. The hydrocarbon ring and the heterocycle may each independently be monocyclic or polycyclic. A ring that is formed by the combination of adjacent groups may itself be connected to another ring to form a spiro structure.

In the specification, the term "adjacent group" may mean a substituent which is substituted at an atom directly connected to an atom with which the substituent is substituted, another substituent substituted at an atom with which the substituent is substituted, or a substituent which is three-dimensional structurally most adjacent to the corresponding substituent. For example, in 1,2-dimethylbenzene, two methyl groups may be interpreted as being "an adjacent group" to each other, and in 1,1-diethylcyclopentane, two ethyl groups may be interpreted as being "an adjacent group" to each other. For example, in 4,5-dimethylphenanthrene, two methyl groups may be interpreted as being "an adjacent group" to each other.

In the specification, examples of the halogen atom may include a fluorine atom, a chlorine atom, a bromine atom, or an iodine atom.

In the specification, an alkyl group may be linear, branched, or cyclic. The number of carbon atoms in the alkyl group may be 1 to 30, 1 to 20, 1 to 10, or 1 to 6. Examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantly group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldodecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-heneicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, and an n-triacontyl group, and the like, but are not limited thereto.

In the specification, a cycloalkyl group may be a cyclic alkyl group. The number of carbon atoms in the cycloalkyl group may be 3 to 50, 3 to 30, 3 to 20, or 3 to 10. Examples of the cycloalkyl group may include a cyclopropyl group, a cyclobutyl group, a cyclopentyl group, a cyclohexyl group, a 4-methylcyclohexyl group, a 4-t-butylcyclohexyl group, a cycloheptyl group, a cyclooctyl group, a cyclononyl group, a cyclodecyl group, a norbornyl group, a 1-adamantyl group, a 2-adamantyl group, an isobornyl group, a bicycloheptyl group, and the like, but are not limited thereto.

In the specification, an alkenyl group may be a hydrocarbon group including one or more carbon-carbon double bonds in the middle or at a terminal of an alkyl group having 2 or more carbon atoms. The alkenyl group may be linear or branched. The number of carbon atoms in the alkenyl group is not particularly limited, but may be 2 to 30, 2 to 20, or 2 to 10. Examples of the alkenyl group may include a vinyl group, a 1-butenyl group, a 1-pentenyl group, a 1,3-butadienylaryl group, a styrenyl group, a styryl vinyl group, and the like, but are not limited thereto.

In the specification, an alkynyl group may be a hydrocarbon group including one or more carbon-carbon triple bonds in the middle or at a terminal of an alkyl group having 2 or more carbon atoms. The alkynyl group may be linear or branched. The number of carbon atoms in the alkynyl group is not particularly limited, but may be 2 to 30, 2 to 20, or 2 to 10. Examples of the alkynyl group may include an ethynyl group, a propynyl group, and the like, but are not limited thereto.

In the specification, a hydrocarbon ring group may be any functional group or substituent derived from an aliphatic hydrocarbon ring. The number of ring-forming carbon atoms in the hydrocarbon ring group may be 5 to 20.

In the specification, an aryl group may be any functional group or substituent derived from an aromatic hydrocarbon ring. The aryl group may be a monocyclic aryl group or a polycyclic aryl group. The number of ring-forming carbon atoms in the aryl group may be 6 to 60, 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a biphenylene group, a triphenylene group, a pyrenyl group, a benzofluoranthenyl group, a chrysenyl group, and the like, but are not limited thereto.

In the specification, a fluorenyl group may be substituted, and two substituents may be bonded to each other to form a spiro structure. Examples of substituted fluorenyl groups are as follows. However, embodiments are not limited thereto.

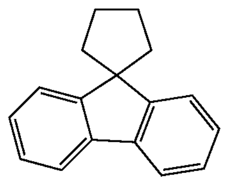
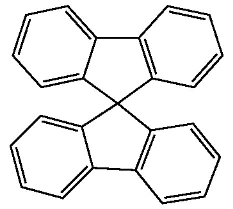
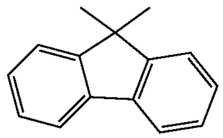
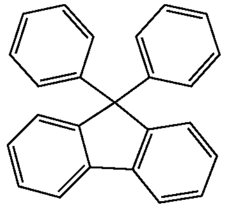

In the specification, a heterocyclic group may be any functional group or substituent derived from a ring including one or more of B, O, N, P, Si, or S as heteroatoms. The heterocyclic group may be an aliphatic heterocyclic group or an aromatic heterocyclic group. The aromatic heterocyclic group may be a heteroaryl group. The aliphatic heterocyclic group and the aromatic heterocyclic group may each independently be monocyclic or polycyclic.

In the specification, the heterocyclic group may include one or more of B, O, N, P, Si, or S as heteroatoms. When the heterocyclic group includes two or more heteroatoms, the two or more heteroatoms may be the same or different from each other. The heterocyclic group may be a monocyclic heterocyclic group or a polycyclic heterocyclic group, and the heterocyclic group may be a heteroaryl group. The number of ring-forming carbon atoms in the heterocyclic group may be 2 to 30, 2 to 30, 2 to 20, or 2 to 10.

In the specification, an aliphatic heterocyclic group may include one or more of B, O, N, P, Si, or S as heteroatoms. The number of ring-forming carbon atoms in the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, and the like, but are not limited thereto.

In the specification, a heteroaryl group may include one or more of B, O, N, P, Si, or S as heteroatoms. When the heteroaryl group includes two or more heteroatoms, the two or more heteroatoms may be the same or different from each other. The heteroaryl group may be a monocyclic heterocyclic group or a polycyclic heterocyclic group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a triazole group, a pyridine group, a bipyridine group, a pyrimidine group, a triazine group, a triazole group, an acridyl group, a pyridazinyl group, a pyrazinyl group, a quinoline group, a quinazoline group, a quinoxaline group, a phenothiazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzooxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, and the like, but are not limited thereto.

In the specification, the above description of an aryl group may be applied to an arylene group, except that the arylene group is a divalent group. The above description of a heteroaryl group may be applied to a heteroarylene group except that the heteroarylene group is a divalent group.

In the specification, a silyl group may be an alkylsilyl group or an arylsilyl group. Examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, and the like, but are not limited thereto.

In the specification, the number of carbon atoms in an amino group is not particularly limited, but may be 1 to 30. The amino group may be an alkylamino group, an arylamino group, or a heteroarylamino group. Examples of the amino group may include a methylamino group, a dimethylamino group, a phenylamino group, a diphenylamino group, a naphthylamino group, a 9-methyl-anthracenylamino group, a triphenylamino group, and the like, but are not limited thereto.

In the specification, the number of carbon atoms in a carbonyl group is not particularly limited, but may be 1 to 40, 1 to 30, or 1 to 20. For example, the carbonyl group may have one of the following structures, but is not limited thereto.

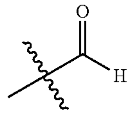
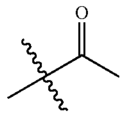
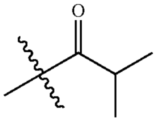
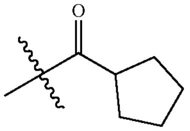
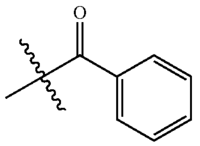

In the specification, the number of carbon atoms in a sulfinyl group or a sulfonyl group is not particularly limited, but may be 1 to 30. The sulfinyl group may be an alkyl sulfinyl group or an aryl sulfinyl group. The sulfonyl group may be an alkyl sulfonyl group or an aryl sulfonyl group.

In the specification, a thio group may be an alkyl thio group or an aryl thio group. The thio group may be a sulfur atom that is bonded to an alkyl group or to an aryl group as defined above. Examples of the thio group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, and the like, but are not limited thereto.

In the specification, an oxy group may be an oxygen atom that is bonded to an alkyl group or to an aryl group as defined above. The oxy group may be an alkoxy group or an aryl oxy group. The alkoxy group may be linear, branched, or cyclic. The number of carbon atoms in the alkoxy group is not particularly limited, but may be, for example, 1 to 20 or 1 to 10. Examples of the oxy group may include methoxy, ethoxy, n-propoxy, isopropoxy, butoxy, pentyloxy, hexyloxy, octyloxy, nonyloxy, decyloxy, benzyloxy, and the like, but are not limited thereto.

In the specification, a boron group may be a boron atom that is bonded to an alkyl group or to an aryl group as defined above. The boron group may be an alkyl boron group or an aryl boron group. Examples of the boron group may include a trimethylboron group, a triethylboron group, a t-butyldimethylboron group, a triphenylboron group, a diphenylboron group, a phenylboron group, and the like, but are not limited thereto.

In the specification, the alkenyl group may be linear or branched. The number of carbon atoms in the alkenyl group is not particularly limited, but may be 2 to 30, 2 to 20, or 2 to 10. Examples of the alkenyl group may include a vinyl group, a 1-butenyl group, a 1-pentenyl group, a 1,3-butadienylaryl group, a styrenyl group, a styryl vinyl group, and the like, but are not limited thereto.

In the specification, the number of carbon atoms in the amine group is not particularly limited, but may be 1 to 30. The amine group may be an alkylamine group or an arylamine group. Examples of the amine group may include a methylamine group, a dimethylamine group, a phenylamine group, a diphenylamine group, a naphthylamine group, a 9-methyl-anthracenylamine group, a triphenylamine group, and the like, but are not limited thereto.

In the specification, an alkyl group in an alkylthio group, an alkylsulfoxy group, an alkylaryl group, an alkylamino group, an alkyl boron group, an alkyl silyl group, or an alkyl amine group may be the same as the examples of the alkyl group described above.

In the specification, an aryl group in an aryloxy group, an arylthio group, an arylsulfoxy group, an arylamino group, an aryl boron group, an aryl silyl group, or an aryl amine group may be the same as the examples of the aryl group described above.

In the specification, a direct linkage may be a single bond.

In the specification,

and each indicates a binding site to a neighboring atom.

Hereinafter, embodiments will be described with reference to the accompanying drawings.

Figure 2:
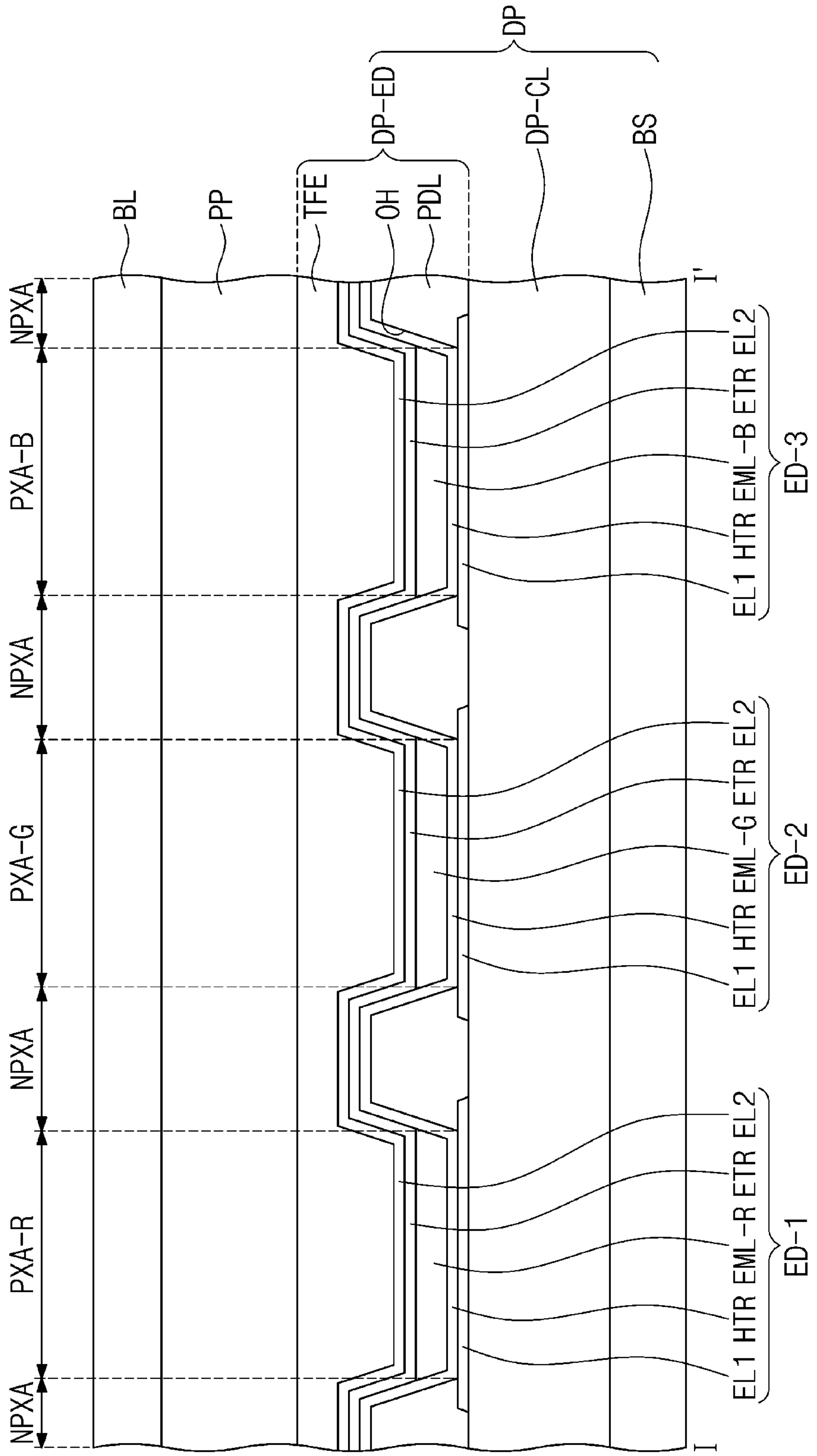
FIG. 2 is a schematic cross-sectional view of a display device according to an embodiment.

FIG. 1 is a plan view showing an embodiment of a display device DD. FIG. 2 is a schematic cross-sectional view of the display device DD of an embodiment. FIG. 2 is a schematic cross-sectional view showing a portion corresponding to line I-I' of FIG. 1.

The display device DD may include a display panel DP and an optical layer PP disposed on the display panel DP. The display panel DP includes light emitting devices ED-1, ED-2, and ED-3. The display device DD may include multiples of each of the light emitting devices ED-1, ED-2, and ED-3. The optical layer PP may be disposed on the display panel DP and may control light reflected at the display panel DP from an external light. The optical layer PP may include, for example, a polarizing layer or a color filter layer. Although not shown in the drawings, in an embodiment, the optical layer PP may be omitted from the display device DD.

A base substrate BL may be disposed on the optical layer PP. The base substrate BL may provide a base surface on which the optical layer PP is disposed. The base substrate BL may be a glass substrate, a metal substrate, a plastic substrate, and the like. However, embodiments are not limited thereto, and the base substrate BL may include an inorganic layer, an organic layer, or a composite material layer. Although not shown in the drawings, in an embodiment, the base substrate BL may be omitted.

The display device DD according to an embodiment may further include a filling layer (not shown). The filling layer (not shown) may be disposed between a display element layer DP-ED and the base substrate BL. The filling layer (not shown) may be an organic material layer. The filling layer (not shown) may include at least one of an acrylic resin, a silicone-based resin, or an epoxy resin.

The display panel DP may include a base layer BS, a circuit layer DP-CL provided on the base layer BS, and the display element layer DP-ED. The display element layer DP-ED may include a pixel definition layer PDL, the light emitting devices ED-1, ED-2, and ED-3 disposed between the pixel definition layer PDL patterns, and an encapsulation layer TFE disposed on the light emitting devices ED-1, ED-2, and ED-3.

The base layer BS may provide a base surface on which the display element layer DP-ED is disposed. The base layer BS may be a glass substrate, a metal substrate, a plastic substrate, or the like. However, embodiments are not limited thereto, and the base layer BS may include an inorganic layer, an organic layer, or a composite material layer.

In an embodiment, the circuit layer DP-CL is disposed on the base layer BS, and the circuit layer DP-CL may include transistors (not shown). Each of the transistors (not shown) may include a control electrode, an input electrode, and an output electrode. For example, the circuit layer DP-CL may include a switching transistor and a driving transistor for driving the light emitting devices ED-1, ED-2, and ED-3 of the display element layer DP-ED.

Each of the light emitting devices ED-1, ED-2, and ED-3 may have a structure of a light emitting device ED of an embodiment in accordance with FIG. 3 to FIG. 6, to be described later. Each of the light emitting devices ED-1, ED-2, and ED-3 may include a first electrode EL1, a hole transport region HTR, light emitting layers EML-R, EML-G, and EML-B, an electron transport region ETR, and a second electrode EL2.

FIG. 2 illustrates an embodiment in which the light emitting layers EML-R, EML-G, and EML-B of the light emitting devices ED-1, ED-2, and ED-3 are disposed in openings OH defined in the pixel definition layer PDL, and the hole transport region HTR, the electron transport region ETR, and the second electrode EL2 are each provided as a common layer throughout the light emitting devices ED-1, ED-2, and ED-3. However, embodiments are not limited thereto. Although not shown in FIG. 2, in an embodiment, the hole transport region HTR and the electron transport region ETR may each be patterned and provided inside the openings OH defined in the pixel definition layer PDL. For example, in an embodiment, the hole transport region HTR, the light emitting layers EML-R, EML-G, and EML-B, the electron transport region ETR, and the like of the light emitting devices ED-1, ED-2, and ED-3 may be patterned and provided by an ink-jet printing method.

The encapsulation layer TFE may cover the light emitting devices ED-1, ED-2, and ED-3. The encapsulation layer TFE may seal the display element layer DP-ED. The encapsulation layer TFE may be a thin film encapsulation layer. The encapsulation layer TFE may be a single layer or a lamination of multiple layers. The encapsulation layer TFE may include at least one insulation layer. The encapsulation layer TFE according to an embodiment may include at least one inorganic film (hereinafter, an encapsulation inorganic film). The encapsulation layer TFE according to an embodiment may include at least one organic film (hereinafter, an encapsulation organic film) and at least one encapsulation inorganic film.

The encapsulation inorganic film may protect the display element layer DP-ED from moisture and/or oxygen, and the encapsulation organic film may protect the display element layer DP-ED from foreign materials such as dust particles. The encapsulation inorganic film may include silicon nitride, silicon oxynitride, silicon oxide, titanium oxide, aluminum oxide, or the like, but is not particularly limited thereto. The encapsulation organic film may include an acrylic compound, an epoxy-based compound, and the like. The encapsulation organic film may include a photopolymerizable organic material, but is not particularly limited thereto.

The encapsulation layer TFE may be disposed on the second electrode EL2, and may be disposed to fill the openings OH.

Referring to FIG. 1 and FIG. 2, the display device DD may include non-light emitting regions NPXA and light emitting regions PXA-R, PXA-G, and PXA-B. Each of the light emitting regions PXA-R, PXA-G, and PXA-B may be a region in which light generated from each of the light emitting devices ED-1, ED-2, and ED-3 is emitted. The light emitting regions PXA-R, PXA-G, and PXA-B may be spaced apart from each other on a plane.

Each of the light emitting regions PXA-R, PXA-G, and PXA-B may be a region separated by the pixel definition layer PDL. The non-light emitting regions NPXA may be regions between the adjacent light emitting regions PXA-R, PXA-G, and PXA-B, and may correspond to the pixel definition layer PDL. For example, in an embodiment, each of the light emitting regions PXA-R, PXA-G, and PXA-B may correspond to a pixel. The pixel definition layer PDL may separate the light emitting devices ED-1, ED-2, and ED-3. The light emitting layers EML-R, EML-G, and EML-B of the light emitting devices ED-1, ED-2, and ED-3 may be disposed in the openings OH defined in the pixel definition layer PDL and separated from each other.

The light emitting regions PXA-R, PXA-G, and PXA-B may be separated into groups according to the color of light generated from each of the light emitting devices ED-1, ED-2, and ED-3. In the display device DD of an embodiment illustrated in FIG. 1 and FIG. 2, three light emitting regions PXA-R, PXA-G, and PXA-B which respectively emit red light, green light, and blue light are illustrated. For example, the display device DD of an embodiment may include a red light emitting region PXA-R, a green light emitting region PXA-G, and a blue light emitting region PXA-B, which are distinct from each other.

In the display device DD according to an embodiment, the light emitting devices ED-1, ED-2, and ED-3 may each emit light of different wavelength regions. For example, in an embodiment, the display device DD may include a first light emitting device ED-1 which emits red light, a second light emitting device ED-2 which emits green light, and a third light emitting device ED-3 which emits blue light. For example, the red light emitting region PXA-R, the green light emitting region PXA-G, and the blue light emitting region PXA-B of the display device DD may respectively correspond to the first light emitting device ED-1, the second light emitting device ED-2, and the third light emitting device ED-3.

However, embodiments are not limited thereto. The first to third light emitting devices ED-1, ED-2, and ED-3 may emit light in a same wavelength region, or at least one thereof may emit light of a different wavelength region. For example, the first to third light emitting devices ED-1, ED-2, and ED-3 may all emit blue light.

In the display device DD according to an embodiment, the light emitting regions PXA-R, PXA-G, and PXA-B may be arranged in a stripe configuration. Referring to FIG. 1, each of the red light emitting regions PXA-R, the green light emitting regions PXA-G, and the blue light emitting regions PXA-B may be arranged along a second direction axis DR2. In another embodiment, the red light emitting region PXA-R, the green light emitting region PXA-G, and the blue light emitting region PXA-B may be alternately arranged in the order of the red light emitting region PXA-R, the green light emitting region PXA-G, and the blue light emitting region PXA-B along a first direction axis DR1.

FIG. 1 and FIG. 2 illustrate that areas of the light emitting regions PXA-R, PXA-G, and PXA-B are all similar in size, but embodiments are not limited thereto. The areas of the light emitting regions PXA-R, PXA-G, and PXA-B may be different from each other according to a wavelength region of emitted light. The areas of the light emitting regions PXA-R, PXA-G, and PXA-B may be areas in a plan view that are defined by the first direction axis DR1 and the second direction axis DR2.

The arrangement type of the light emitting regions PXA-R, PXA-G, and PXA-B is not limited to what is illustrated in FIG. 1. The order in which the red light emitting region PXA-R, the green light emitting region PXA-G, and the blue light emitting region PXA-B are arranged may be provided in various combinations according to the display quality characteristics which are required for the display device DD. For example, the arrangement of the light emitting regions PXA-R, PXA-G, and PXA-B may be a PENTILE™ arrangement shape, or a diamond arrangement shape.

In an embodiment, the areas of the light emitting regions PXA-R, PXA-G, and PXA-B may be different in size from each other. For example, in an embodiment, an area of the green light emitting region PXA-G may be smaller than an area of the blue light emitting region PXA-B, but embodiments are not limited thereto.

Figure 5:
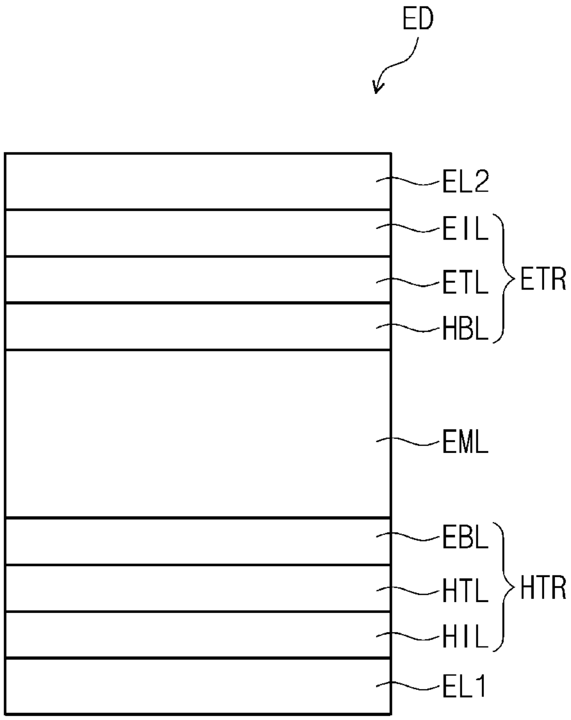
FIG. 5 is a schematic cross-sectional view showing a light emitting device according to an embodiment.
Figure 6:
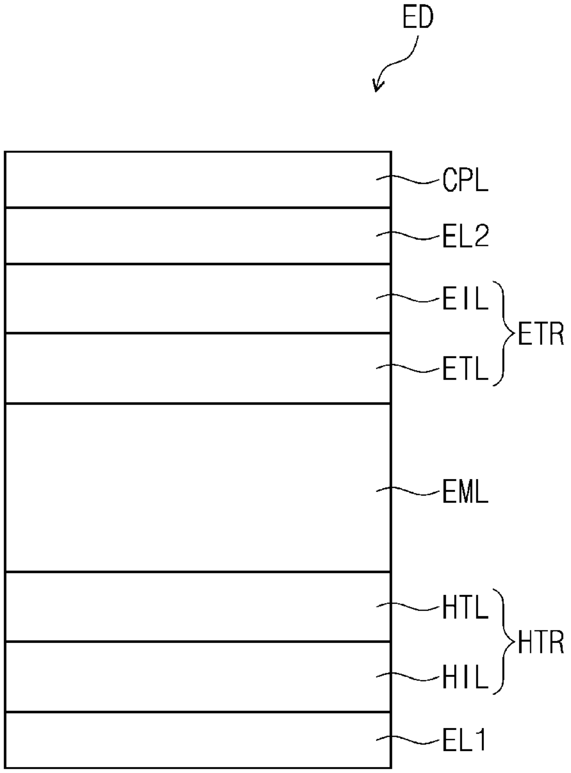
FIG. 6 is a schematic cross-sectional view showing a light emitting device according to an embodiment.
Figure 7:
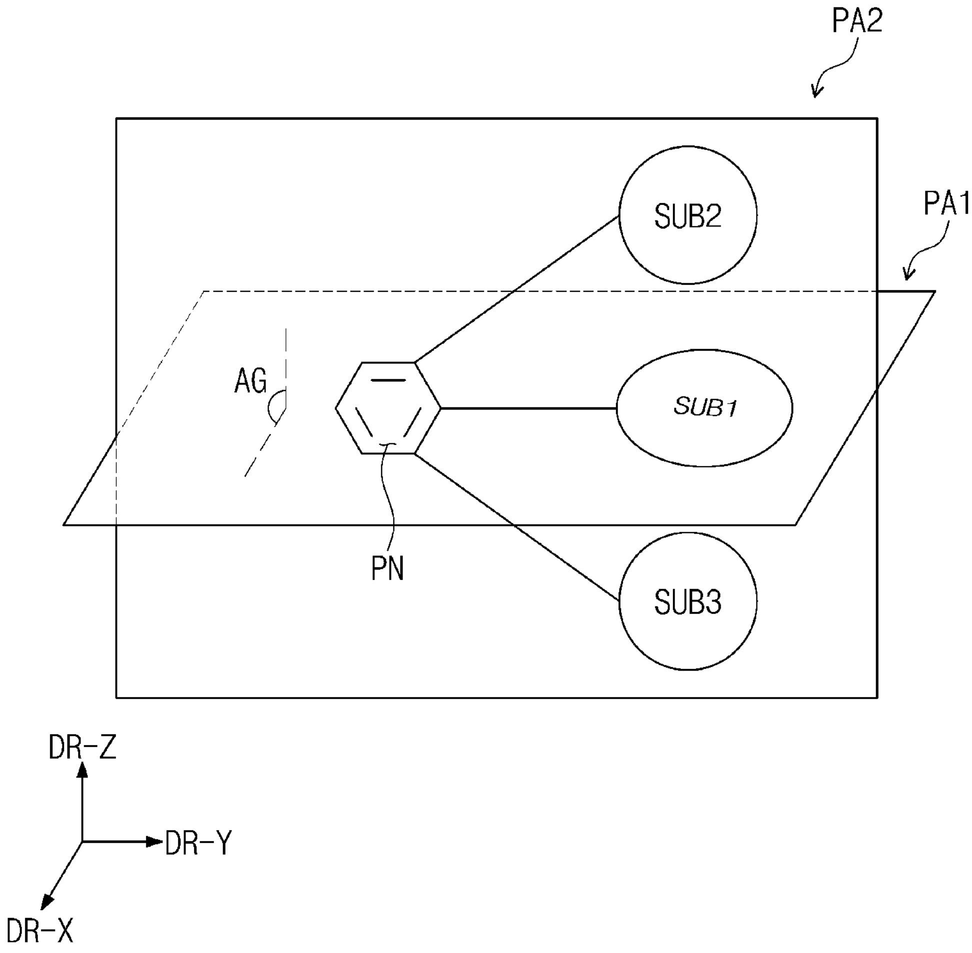
FIG. 7 is a schematic view showing the structure of a polycyclic compound according to an embodiment concept.

Hereinafter, FIG. 3 to FIG. 6 are each a schematic cross-sectional view showing a light emitting device according to an embodiment. FIG. 7 is a schematic view showing the structure of a polycyclic compound according to an embodiment.

The light emitting device ED according to an embodiment may include a first electrode EL1, a hole transport region HTR, a light emitting layer EML, an electron transport region ETR, and a second electrode EL2, which are sequentially stacked.

Figure 3:
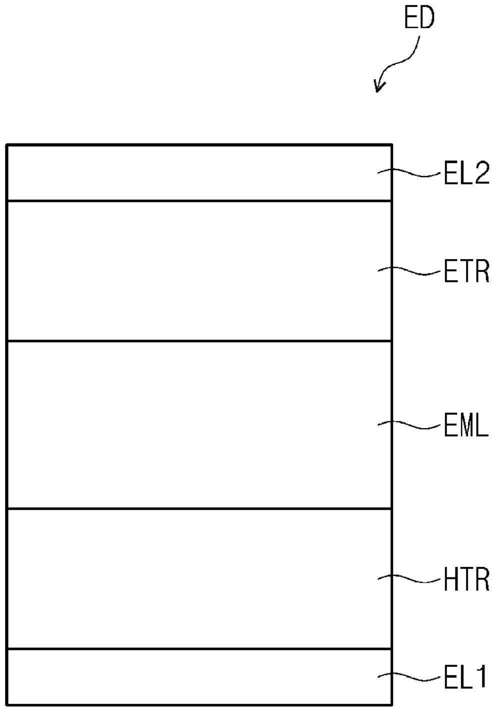
FIG. 3 is a schematic cross-sectional view showing a light emitting device according to an embodiment.
Figure 4:
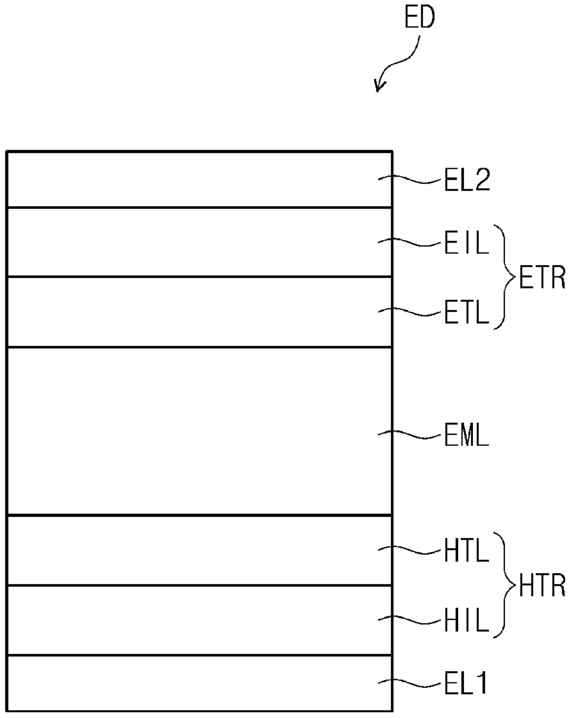
FIG. 4 is a schematic cross-sectional view showing a light emitting device according to an embodiment.

In comparison to FIG. 3, FIG. 4 shows a schematic cross-sectional view of the light emitting device ED of an embodiment in which the hole transport region HTR includes a hole injection layer HIL and a hole transport layer HTL, and the electron transport region ETR includes an electron injection layer EIL and an electron transport layer ETL. In comparison to FIG. 3, FIG. 5 shows a schematic cross-sectional view of the light emitting device ED of an embodiment in which the hole transport region HTR includes a hole injection layer HIL, a hole transport layer HTL, and an electron blocking layer EBL, and the electron transport region ETR includes an electron injection layer EIL, an electron transport layer ETL, and a hole blocking layer HBL. In comparison to FIG. 4, FIG. 6 shows a schematic cross-sectional view of the light emitting device ED of an embodiment that includes a capping layer CPL disposed on the second electrode EL2.

The first electrode EL1 has conductivity. The first electrode EL1 may be formed of a metal material, a metal alloy, or a conductive compound. The first electrode EL1 may be an anode or a cathode. However, embodiments are not limited thereto. For example, the first electrode EL1 may be an anode. The first electrode EL1 may be a transmissive electrode, a transflective electrode, or a reflective electrode. When the first electrode EL1 is a transmissive electrode, the first electrode EL1 may include a transparent metal oxide, for example, indium tin oxide (ITO), indium zinc oxide (IZO), zinc oxide (ZnO), indium tin zinc oxide (ITZO), or the like. When the first electrode EL1 is a transmissive electrode or a transflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, a compound thereof, or a mixture thereof (for example, a mixture of Ag and Mg). In another embodiment, the first electrode EL1 may have a multi-layered structure including a reflective film or a transflective film formed of the materials recited above, and a transparent conductive film formed of indium tin oxide (ITO), indium zinc oxide (IZO), zinc oxide (ZnO), indium tin zinc oxide (ITZO), or the like. For example, the first electrode EL1 may have a three-layered structure of ITO/Ag/ITO. However, embodiments are not limited thereto. The first electrode EL1 may include any one of the above-described metal materials, a combination of two or more metal materials selected from the above-described metal materials, an oxide of any one of the above-described metal materials, or the like. A thickness of the first electrode EL1 may be in a range of about 700 Å to about 10,000 Å. For example, the thickness of the first electrode EL1 may be in a range of about 1,000 Å to about 3,000 Å.

A hole transport region HTR is provided on the first electrode EL1. The hole transport region HTR may include at least one of a hole injection layer HIL, a hole transport layer HTL, a buffer layer (not shown), a light emitting auxiliary layer (not shown), or an electron blocking layer EBL. A thickness of the hole transport region HTR may be, for example, in a range of about 50 Å to about 15,000 Å.

The hole transport region HTR may be a layer formed of a single material, a layer formed of different materials, or a multi-layered structure having layers formed of different materials.

For example, the hole transport region HTR may have a single-layered structure having a single layer of the hole injection layer HIL or the hole transport layer HTL, or may have a single-layered structure having a single layer formed of a hole injection material and a hole transport material. For example, the hole transport region HTR may have a single-layered structure formed of different materials, or may have a structure in which a hole injection layer HIL/hole transport layer HTL, a hole injection layer HIL/hole transport layer HTL/buffer layer (not shown), a hole injection layer HIL/buffer layer (not shown), a hole transport layer HTL/buffer layer (not shown), or a hole injection layer HIL/hole transport layer HTL/electron blocking layer EBL, are stacked in its respective stated order from the first electrode EL1, but embodiments are not limited thereto.

The hole transport region HTR may be formed using various methods such as vacuum deposition, spin coating, casting, Langmuir-Blodgett (LB), inkjet printing, laser printing, and laser induced thermal imaging (LITI).

The transport region HTR may include a compound represented by Formula H-1.

[Formula H-1]

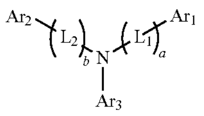

In Formula H-1, $L_1$ and $L_2$ may each independently be a direct linkage, a substituted or unsubstituted arylene group having 6 to 30 ring-forming carbon atoms, or a substituted or unsubstituted heteroarylene group having 2 to 30 ring-forming carbon atoms. In Formula H-1, a and b may each independently be an integer from 0 to 10. When a or b is 2 or greater, multiple $L_1$ groups and multiple $L_2$ groups may each independently be a substituted or unsubstituted arylene group having 6 to 30 ring-forming carbon atoms, or a substituted or unsubstituted heteroarylene group having 2 to 30 ring-forming carbon atoms.

In Formula H-1, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. In Formula H-1, $Ar_3$ may be a substituted or unsubstituted aryl group having 6 to 30 ring-forming carbon atoms.

In an embodiment, the compound represented by Formula H-1 may be a monoamine compound. In another embodiment, the compound represented by Formula H-1 may a diamine compound in which at least one of $Ar_1$ to $Ar_3$ includes an amine group as a substituent. In still another embodiment, the compound represented by Formula H-1 may be a carbazole-based compound containing a substituted or unsubstituted carbazole group in at least one of $Ar_1$ and $Ar_2$, or a fluorene-based compound containing a substituted or unsubstituted fluorene group in at least one of $Ar_1$ and $Ar_2$.

The compound represented by Formula H-1 may be any selected from Compound Group H. However, the compounds listed in Compound Group H are only examples. The compound represented by Formula H-1 is not limited to what is listed in Compound Group H.

[Compound Group H]
H-1-1
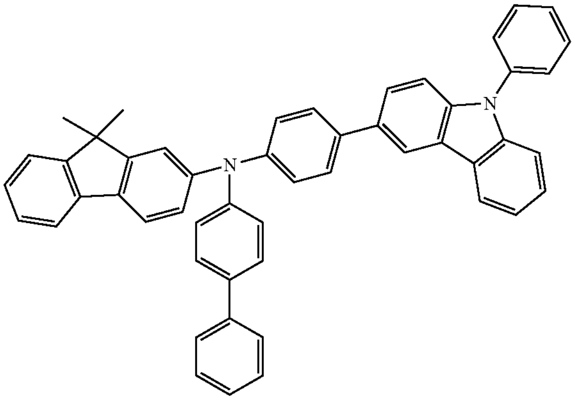
H-1-2
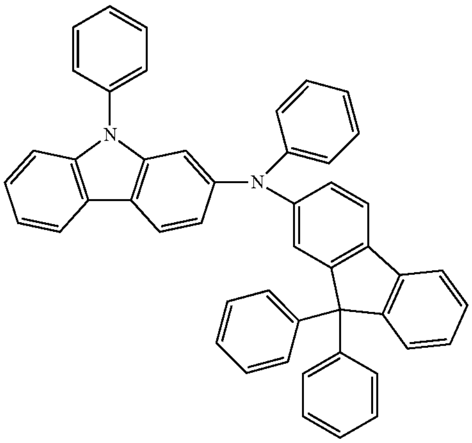
H-1-3
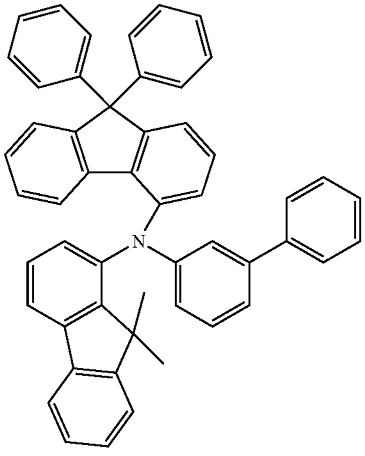
-continued
H-1-4
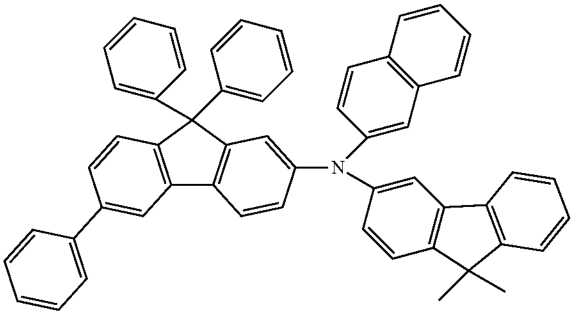
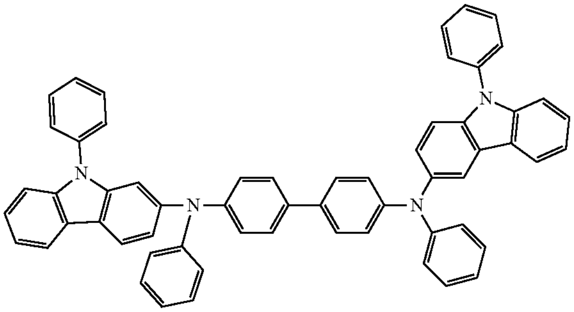
H-1-6
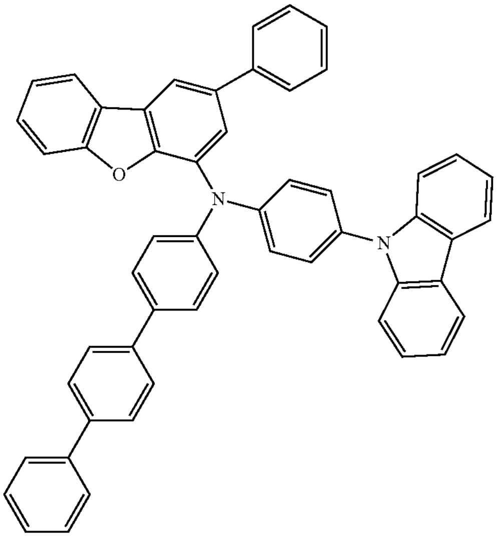

H-1-7
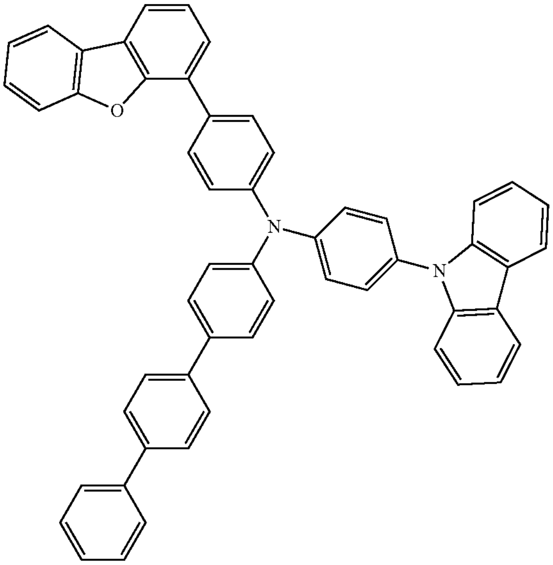
H-1-8
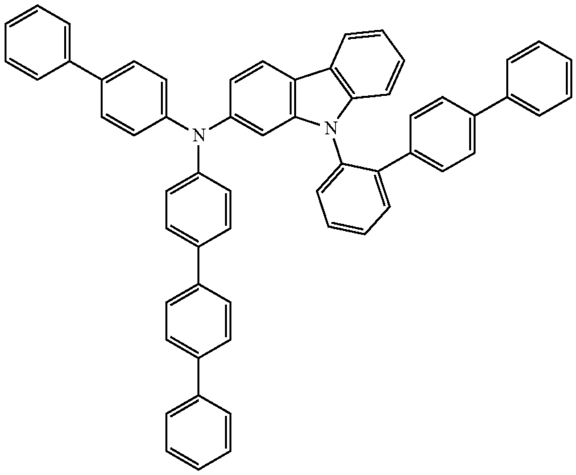
H-1-9
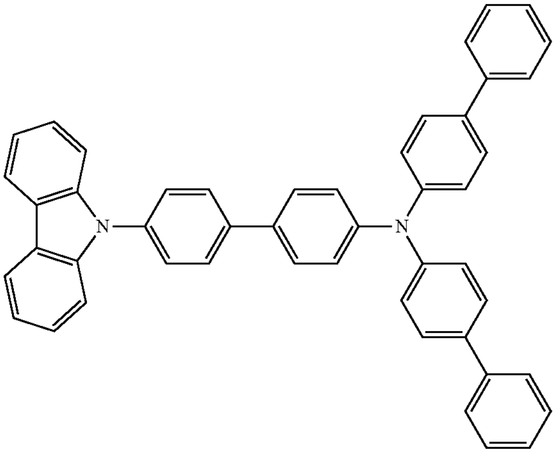
H-1-10
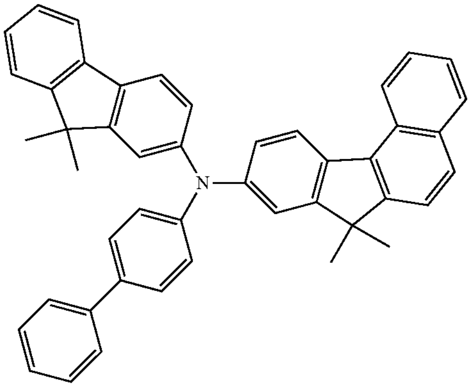
H-1-11
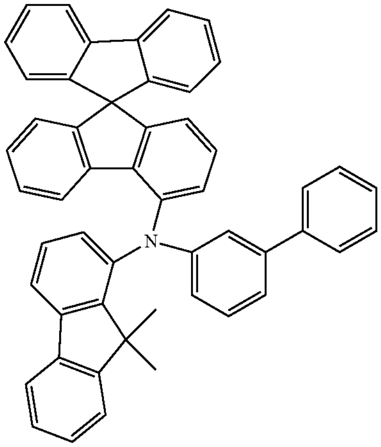
H-1-12
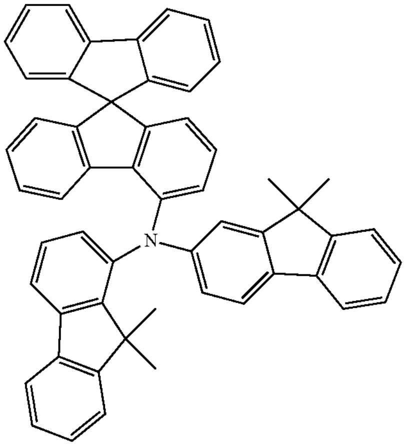
H-1-13
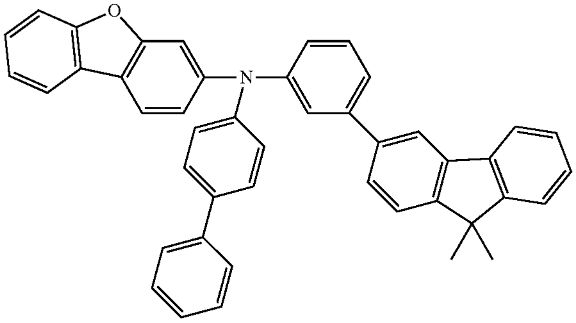

-continued

H-1-14

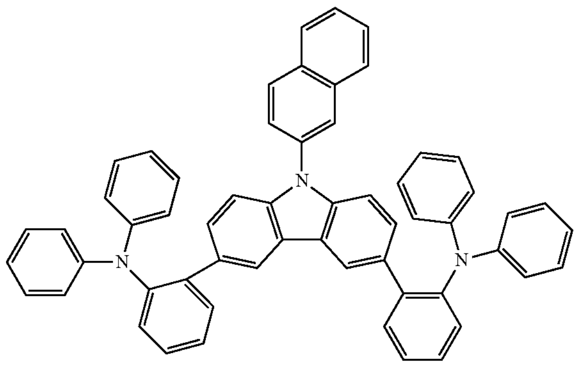

H-1-15

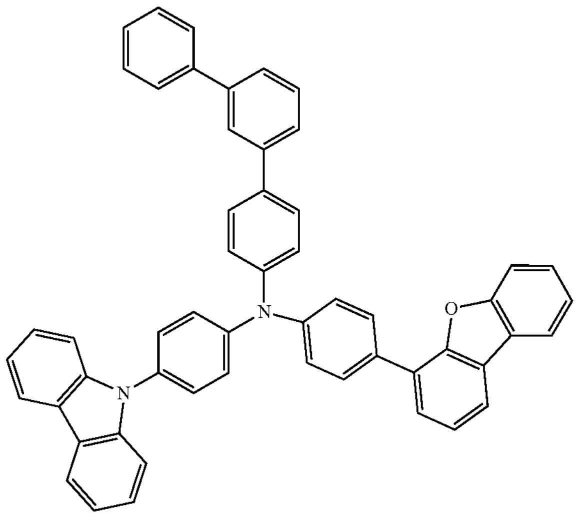

H-1-16

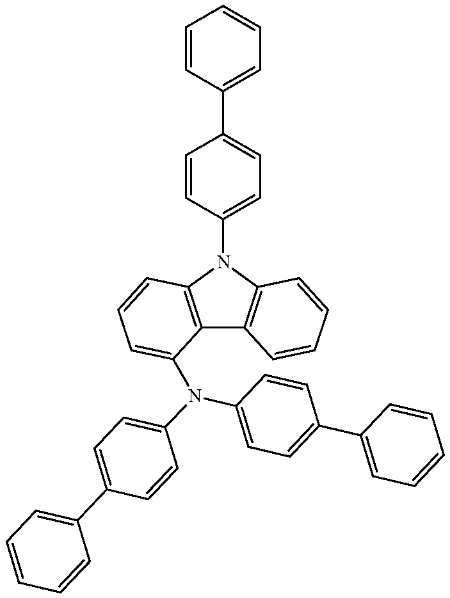

-continued

H-1-17

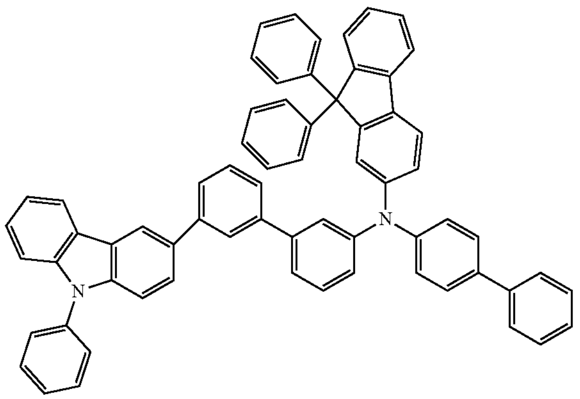

H-1-18

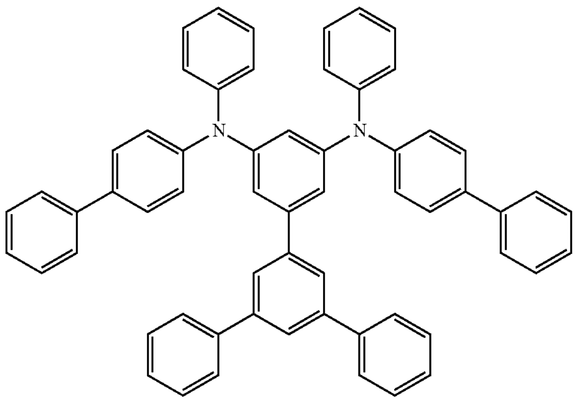

H-1-19

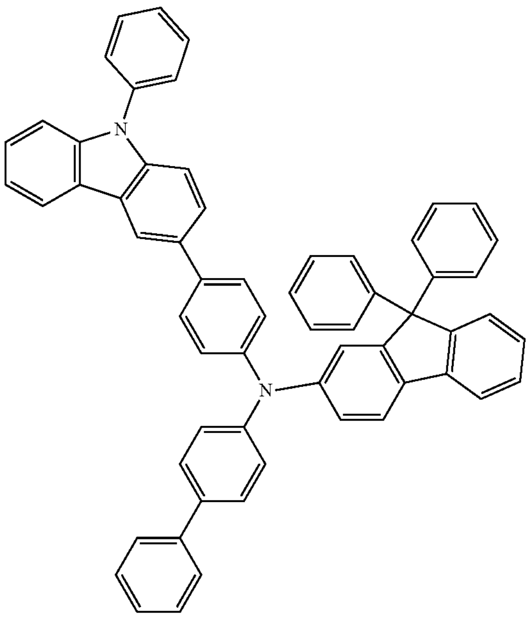

The hole transport region HTR may include a phthalocyanine compound such as copper phthalocyanine, $N^1,N^{1'}$-([1,1'-biphenyl]-4,4'-diyl)bis($N^1$-phenyl-$N^4,N^4$-di-m-tolylbenzene-1,4-diamine) (DNTPD), 4,4',4"-[tris(3-methylphenyl)phenylamino] triphenylamine (m-MTDATA), 4,4'4"-Tris(N,N-diphenylamino)triphenylamine (TDATA), 4,4',4"-tris[N(2-naphthyl)-N-phenylamino]-triphenylamine (2-TNATA), Poly(3,4-ethylenedioxythiophene)/Poly(4-styrenesulfonate) (PEDOT/PSS), Polyaniline/Dodecylbenzenesulfonic acid (PANI/DBSA), Polyaniline/Camphor sulfonic acid (PANI/CSA), Polyaniline/Poly(4-styrenesulfonate) (PANI/PSS), N,N'-di(naphthalene-1-yl)-N,N'-diphenyl-benzidine (NPB), triphenylamine-containing polyether ketone (TPAPEK), 4-Isopropyl-4'-methyldiphenyliodonium [Tetrakis(pentafluorophenyl)borate], dipyrazino[2,3-f: 2',3'-h] quinoxaline-2,3,6,7,10,11-hexacarbonitrile (HATCN), and the like.

The hole transport region HTR may include a carbazole-based derivative such as N-phenylcarbazole and polyvinylcarbazole, a fluorene-based derivative, a triphenylamine-based derivative such as N,N'-bis(3-methylphenyl)-N,N'-diphenyl-[1,1-biphenyl]-4,4'-diamine (TPD) and 4,4',4"-tris (N-carbazolyl)triphenylamine (TCTA), N,N'-di (naphthalene-1-yl)-N,N'-diplienyl-benzidine (NPB), 4,4'-Cyclohexylidene bis[N,N-bis(4-methylphenyl) benzenamine] (TAPC), 4,4'-Bis[N,N'-(3-tolyl)amino]-3,3'-dimethylbiphenyl (HMTPD), (1,3-Bis(N-carbazolyl) benzene (mCP), and the like.

The hole transport region HTR may include CzSi (9-(4-tert-Butylphenyl)-3,6-bis(triphenylsilyl)-9H-carbazole), CCP (9-phenyl-9H-3,9'-bicarbazole), mDCP (1,3-bis(1,8-dimethyl-9H-carbazol-9-yl)benzene), or the like.

The hole transport region HTR may include the above-described compounds of the hole transport region in at least one of the hole injection layer HIL, the hole transport layer HTL, or the electron blocking layer EBL.

A thickness of the hole transport region HTR may be in a range of about 100 Å to about 10,000 Å. For example, the thickness of the hole transport region HTR may be in a range of about 100 Å to about 5000 Å. When the hole transport region HTR includes a hole injection layer HIL, a thickness of the hole injection layer HIL may be, for example, in a range of about 30 Å to about 1,000 Å. When the hole transport region HTR includes a hole transport layer HTL, a thickness of the hole transport layer HTL may be in a range of about 30 Å to about 1,000 Å. When the hole transport region HTR includes an electron blocking layer EBL, a thickness of the electron blocking layer EBL may be in a range of about 10 Å to about 1,000 Å. When the thicknesses of the hole transport region HTR, the hole injection layer HIL, the hole transport layer HTL, and the electron blocking layer EBL satisfy the above-described ranges, satisfactory hole transport properties may be obtained without a substantial increase in driving voltage.

The hole transport region HTR may further include a charge generating material to improve conductivity, in addition to the above-mentioned materials. The charge generating material may be uniformly or non-uniformly dispersed in the hole transport region HTR. The charge generation material may be, for example, a p-dopant. The p-dopant may include at least one of a halogenated metal compound, a quinone derivative, a metal oxide, or a cyano group-containing compound, but embodiments are not limited thereto. For example, the p-dopant may include a halogenated metal compound such as CuI and RbI, a quinone derivative such as tetracyanoquinodimethane (TCNQ) and 2,3,5,6-tetrafluoro-7,7',8,8'-tetracyanoquinodimethane (F4-TCNQ), a metal oxide such as a tungsten oxide and a molybdenum oxide, a cyano group-containing compound such as dipyrazino[2,3-f: 2',3'-h] quinoxaline-2,3,6,7,10,11-hexacarbonitrile (HATCN) and 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP9), and the like, but embodiments are not limited thereto.

As described above, the hole transport region HTR may further include at least one of a buffer layer (not shown) or an electron blocking layer EBL in addition to the hole injection layer HIL and the hole transport layer HTL. The buffer layer (not shown) may increase light emission efficiency by compensating for a resonance distance according to a wavelength of light emitted from the light emitting layer EML. As for materials which may be included in the buffer layer, materials which may be included in the hole transport region HTR may be used. The electron blocking layer EBL may prevent electron injection from the electron transporting region ETR to the hole transporting region HTR.

The light emitting layer EML is provided on the hole transport region HTR. The light emitting layer EML may have a thickness in a range of about 100 Å to about 1,000 Å. For example, the light emitting layer EML may have a thickness in a range of about 100 Å to about 300 Å. The light emitting layer EML may be a layer formed of a single material, a layer formed of different materials, or a multi-layered structure having layers formed of different materials.

In the light emitting device ED of an embodiment, the light emitting layer EML may include a polycyclic compound of an embodiment. Referring to FIG. 7, the polycyclic compound of an embodiment may include a phenyl group PN, a first substituent SUB1 substituted in the phenyl group PN, a second substituent SUB2 substituted in the phenyl group PN at an ortho position with respect to the first substituent SUB1, and a third substituent SUB3 substituted in the phenyl group PN at an ortho position with respect to the first substituent SUB1 and at a meta position with respect to the second substituent SUB2.

The polycyclic compound of an embodiment may have a twisted molecular structure in which a phenyl group and the first substituent SUB1 are twisted. The first substituent SUB1 may be parallel to a first plane PA1 defined by an X-direction DR-X and a Y-direction DR-Y, and the phenyl group PN may be parallel to a second plane PA2 which is not parallel to the first plane PA1. An angle AG between the first plane PA1 and the second plane PA2 may be in a range of about 30 degrees to about 90 degrees. For example, the second plane PA2 may be perpendicular to the first plane PA1. The second plane PA2 may be a plane defined by the Y-direction DR-Y and a Z-direction DR-Z. The second substituent SUB2 and the third substituent SUB3 may be spaced apart from each other in the Z-direction DR-Z, with the first substituent SUB1 therebetween.

In the polycyclic compound of an embodiment, the second substituent SUB2 and the third substituent SUB3 may be the same as or different from each other. When the second substituent SUB2 and the third substituent SUB3 are different from each other, the polycyclic compound of an embodiment may include an enantiomer. When the second substituent SUB2 and the third substituent SUB3 are the same, the polycyclic compound of an embodiment may have a symmetric structure.

The first substituent SUB1 may be a group represented by Formula A-1.

[Formula A-1]

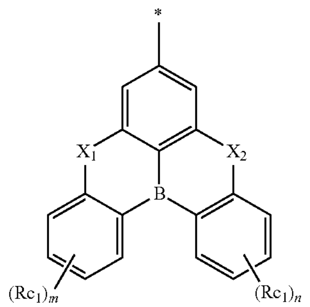

In Formula A-1, may indicate where the first substituent SUB1 is bonded to the phenyl group PN.

In Formula A-1, $X_1$ and $X_2$ may each independently be O, S, Se, or N(Ra). $X_1$ and $X_2$ may be the same as or different from each other. For example, in an embodiment, $X_1$ and $X_2$ may each be N(Ra), or one of $X_1$ and $X_2$ may be N(Ra), and the other of $X_1$ and $X_2$ may be O, S, or Se.

In Formula A-1, Ra, $Rc_1$, and $Rc_2$ may each independently be a hydrogen atom, a deuterium atom, a halogen atom, a cyano group, a substituted or unsubstituted amine group, a substituted or unsubstituted silyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In an embodiment, in Formula A-1, at least one of $X_1$ and $X_2$ may be N(Ra), and Ra may be a group represented by any one of Formulas $A_1$ to $A_6$.

$A_1$

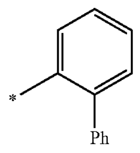

$A_2$

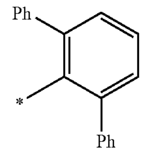

$A_3$

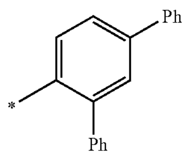

-continued $A_4$

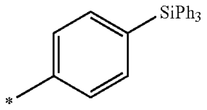

$A_5$

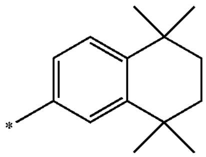

$A_6$

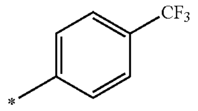

In Formulas $A_1$ to $A_6$, Ph is an unsubstituted phenyl group. In Formulas $A_1$ to $A_6$, may indicate, when at least one of $X_1$ and $X_2$ is N(Ra), a portion where Ra as represented by any one of Formulas $A_1$ to $A_6$ is bonded to a nitrogen atom of N(Ra).

In Formula A-1, m and n may each independently be an integer from 0 to 4. In Formula A-1, m and n may be the same as or different from each other. When m is 0, a benzene ring may be unsubstituted, and when m is 1, one $Rc_1$ group may be substituted at the benzene ring. When m is 2 or greater, multiple $Rc_1$ groups may be substituted at the benzene ring. When m is 1, $Rc_1$ may be substituted at the benzene ring at a para position with respect to a boron atom. When m is 2 or greater, multiple $Rc_1$ groups may all be the same, or at least one $Rc_1$ group may be different. When n is 1, $Rc_2$ may be substituted at the benzene ring at a para position with respect to the boron atom, and when n is 2 or greater, multiple $Rc_2$ groups may be all the same, or at least one $Rc_2$ group may be different.

In an embodiment, in Formula A-1, $Rc_1$ and $Rc_2$ may each independently be a substituted or unsubstituted carbazole group, or a substituted or unsubstituted diphenyl amine group. However, embodiments are not limited thereto.

The second substituent SUB2 and the third substituent SUB3 may each independently be a group represented by Formula A-2. For example, the second substituent SUB2 and the third substituent SUB3 may be the same as or different from each other.

[Formula A-2]

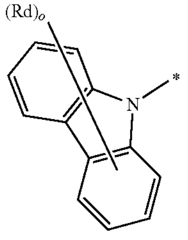

In Formula A-2, o may be an integer from 0 to 8. When o is 0, a benzene ring may be unsubstituted, and when o is 1, one Rd group may be substituted in the benzene ring. When o is 2 or greater, multiple Rd groups may be substituted at the benzene ring. When o is 1, Rd may be substituted at the benzene ring at a para position with respect to a nitrogen atom. When o is 2, two Rd groups may be substituted at a benzene ring and may each be at a para position with respect to a nitrogen atom. When o is 2 or greater, multiple Rd groups may all be the same, or at least one Rd group may be different.

In Formula A-2, Rd may be a hydrogen atom, a deuterium atom, a halogen atom, a cyano group, a substituted or unsubstituted amine group, a substituted or unsubstituted silyl group, a substituted or unsubstituted alkyl group having 1 to 10 carbons, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In an embodiment, in Formula A-2, Rd may be a hydrogen atom, a deuterium atom, a fluorine atom, a cyano group, a substituted or unsubstituted triphenylsilyl group, a substituted or unsubstituted phenyl group, a substituted or unsubstituted t-butyl group, or a substituted or unsubstituted methyl group. However, embodiments are not limited thereto.

In Formula A-2, when o is 1 or 2, except when Rd is a deuterium atom, Rd may be substituted at a para position with respect to a nitrogen atom of Formula A-2. For example, when o is 1, one Rd group may be substituted at a para position with respect to a nitrogen atom, and when o is 2, two Rd groups may be substituted and may each be at a para position with respect to a nitrogen atom.

The polycyclic compound of an embodiment has a twisted molecular structure in which the phenyl group PN and the first substituent SUB1 are twisted, so that the phenyl group PN and the first substituent SUB1 may not resonate. Since the phenyl group PN and the first substituent SUB1 do not resonate, electrons of the first substituent SUB1 may not be delocalized in the phenyl group PN. Since the electrons of the first substituent SUB1 are not delocalized in the phenyl group PN, the density of the electrons of the first substituent SUB1 may increase, and accordingly, the multi resonance effect of the first substituent SUB1 may increase.

In an embodiment, the bulky second substituent SUB2 and third substituent SUB3 may protect a vacant p-orbital of a boron atom of the first substituent SUB1 from a nucleophile. As a result, degradation due to the interaction between a boron atom of the polycyclic compound of an embodiment with the nucleophile may be reduced, and the structural stability of the polycyclic compound may increase. In the polycyclic compound of an embodiment, due to a steric hinderance effect of the bulky second substituent SUB2 and third substituent SUB3, the intermolecular distance with other polycyclic compounds may be large, so that there may be less intermolecular interaction. As a result, the structural stability of the polycyclic compound of an embodiment may increase.

Although not illustrated in the drawing, in an embodiment, the polycyclic compound may further include a fourth substituent substituted at a phenyl group PN1 at a para position with respect to the first substituent SUB1. In an embodiment, the fourth substituent may be a hydrogen atom, a substituted or unsubstituted carbazole group, or a substituted or unsubstituted t-butyl group.

In an embodiment, the polycyclic compound may be any one selected from Compound Group 1.

[Compound Group 1]

1

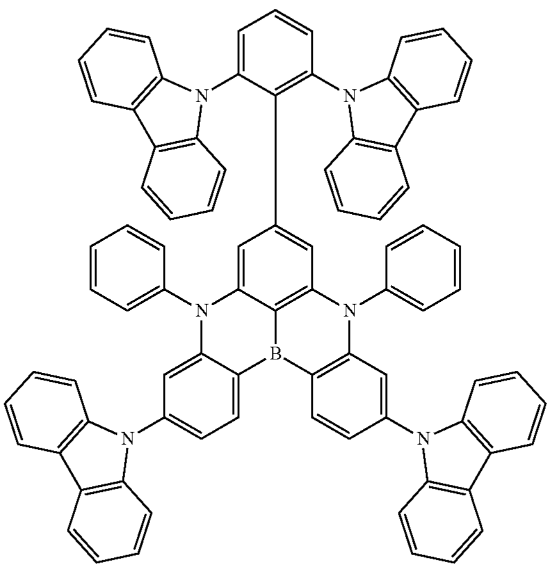

2

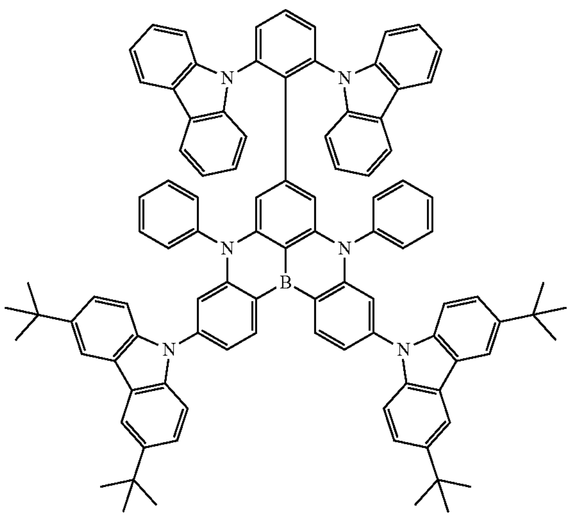

-continued
3
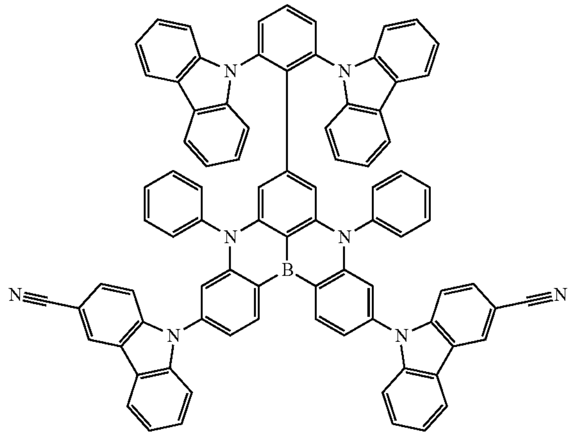
4
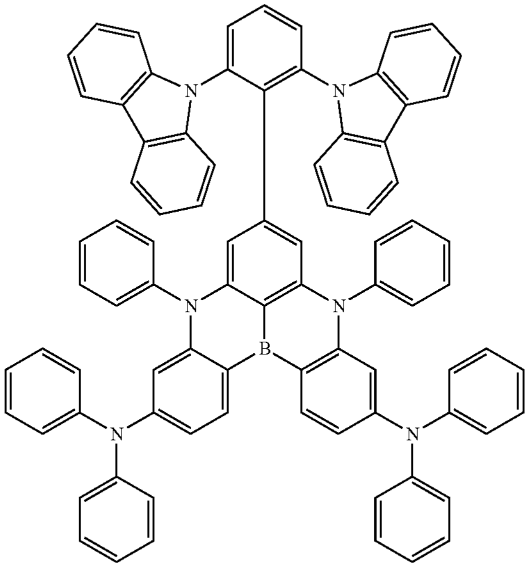
5
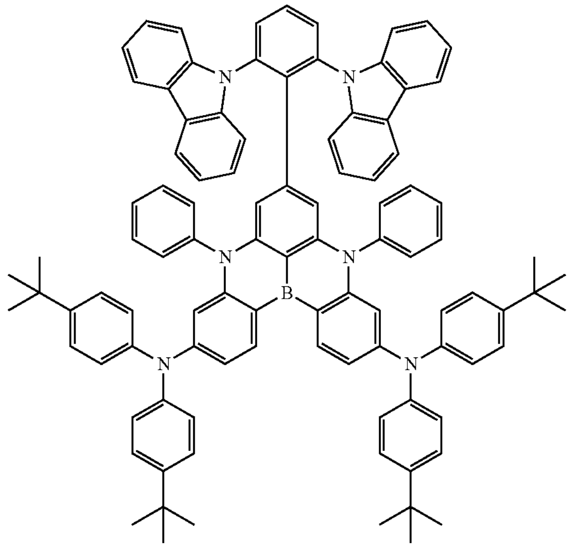
6
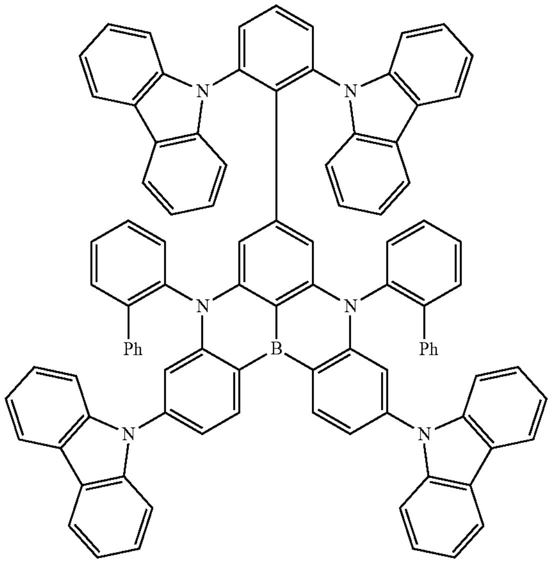

-continued
7
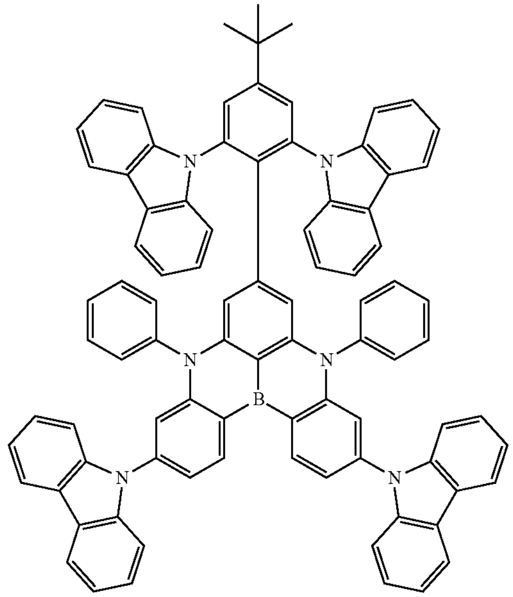
8
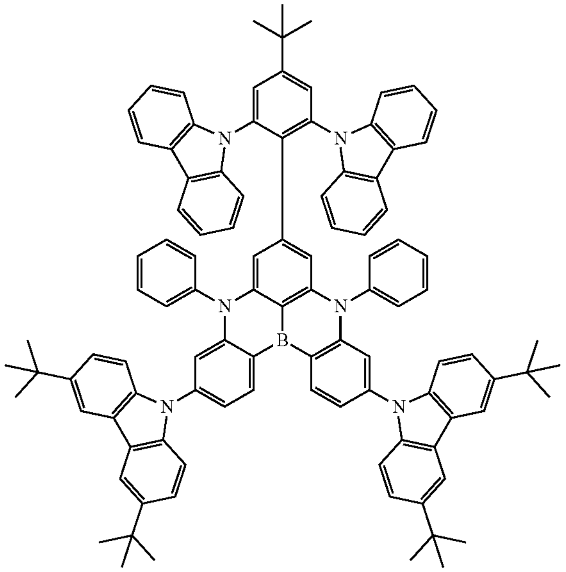
9
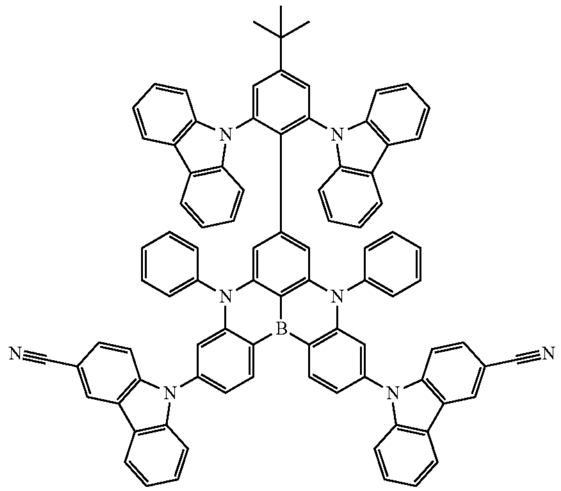
10
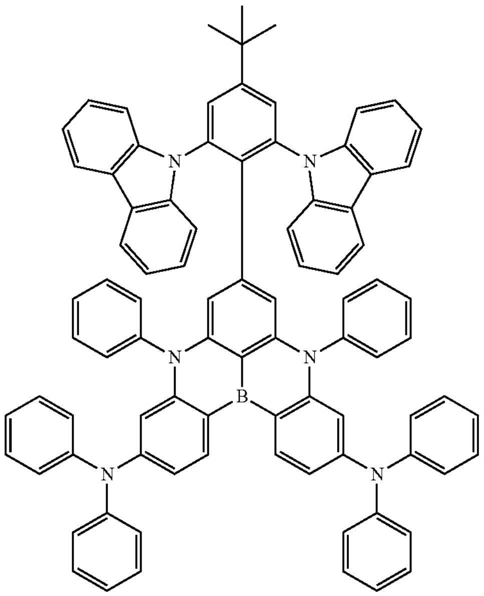

-continued
11
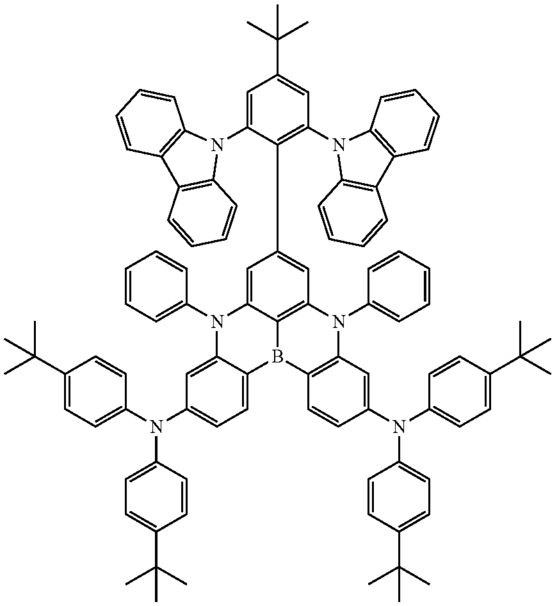
12
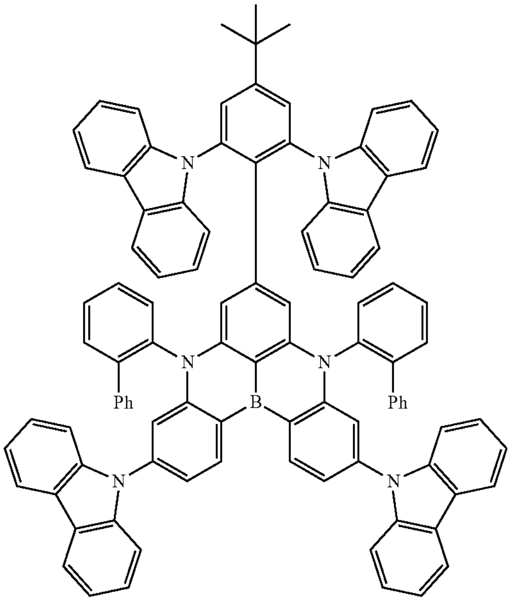
13
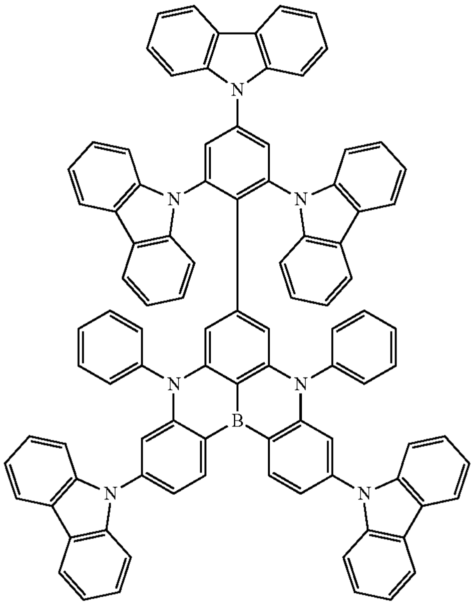
14
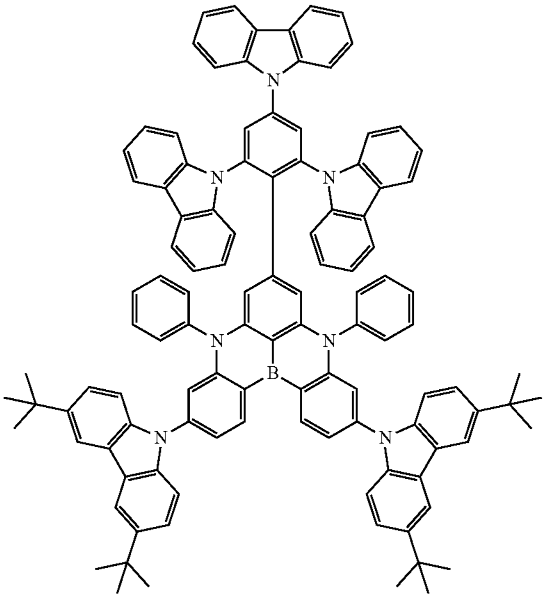

-continued
15
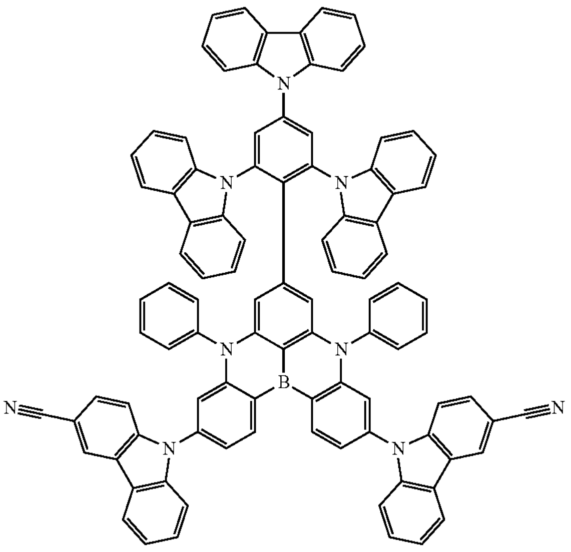
16
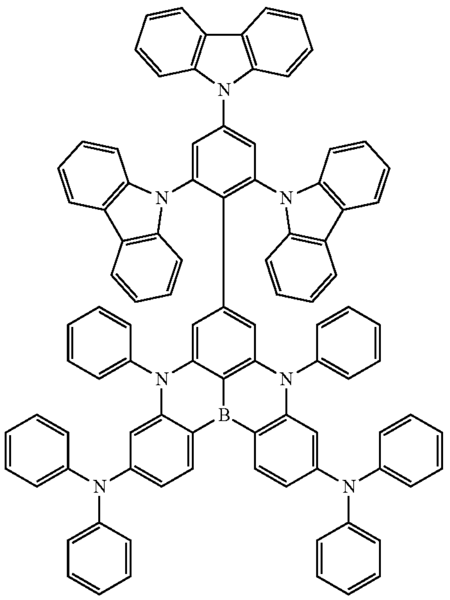
17
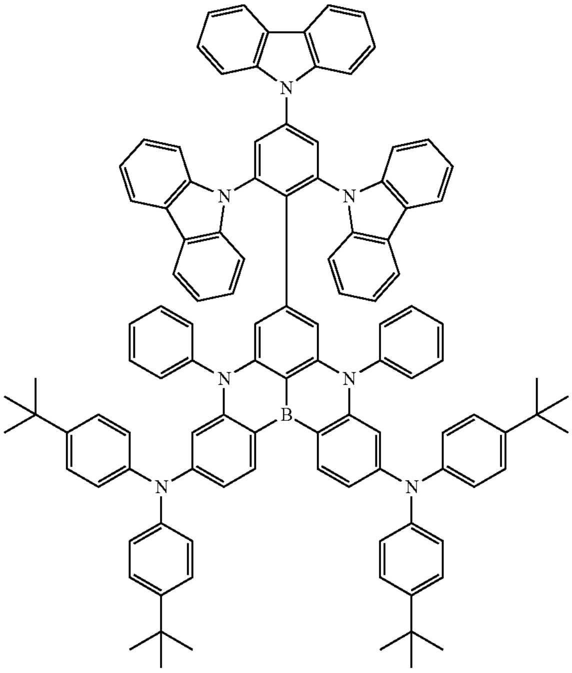
18
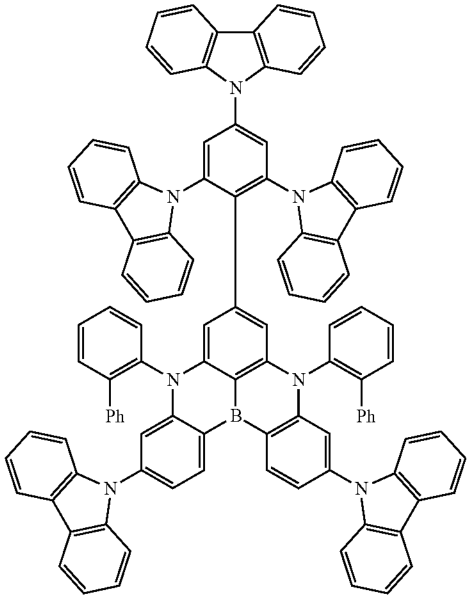

-continued
19
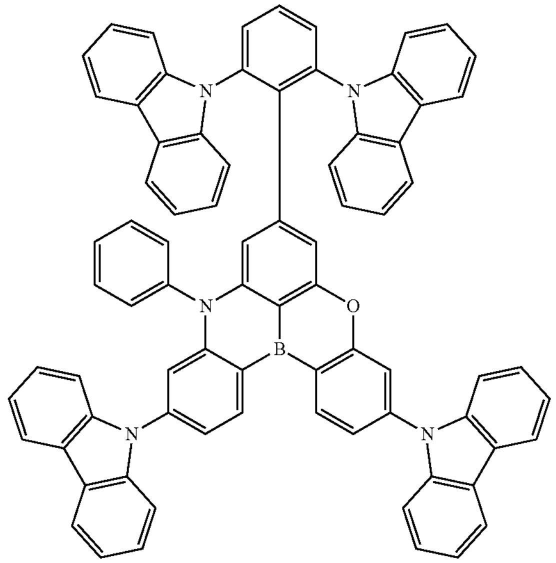
20
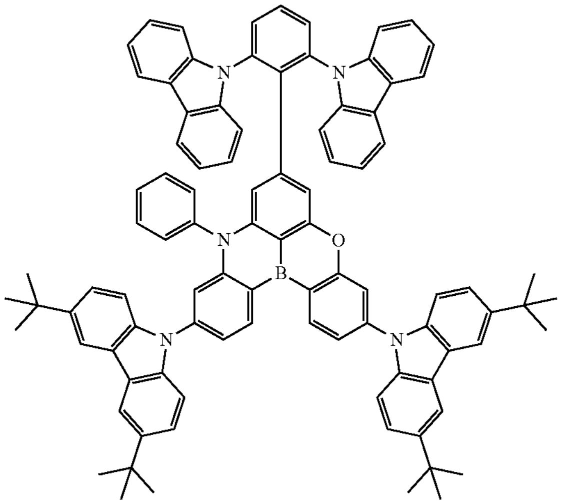
21
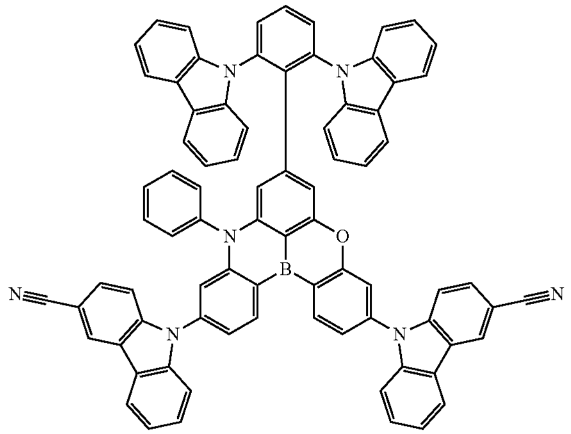
22
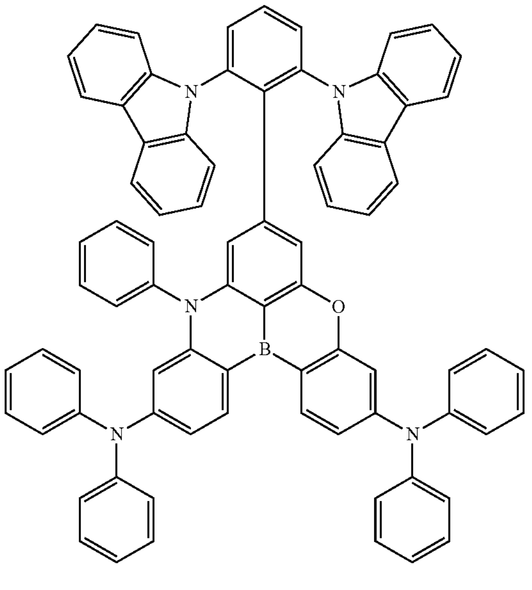

-continued
23
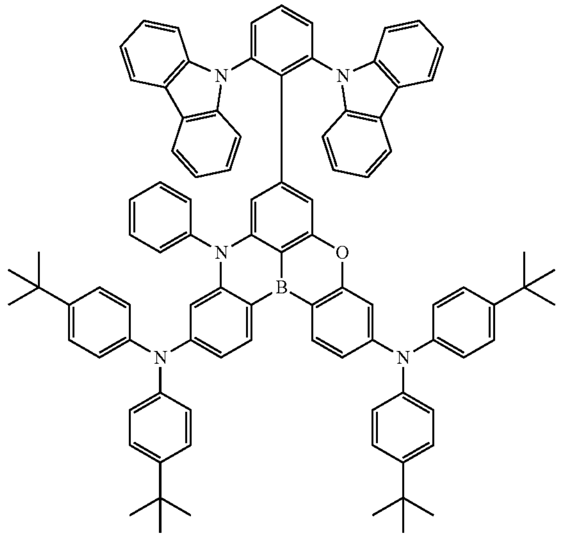
24
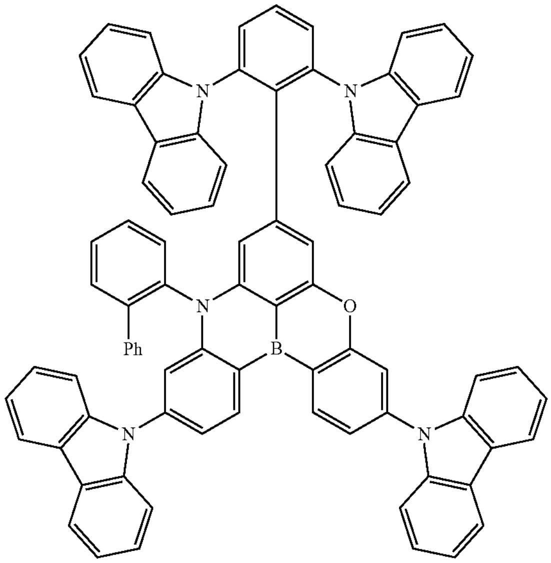
25
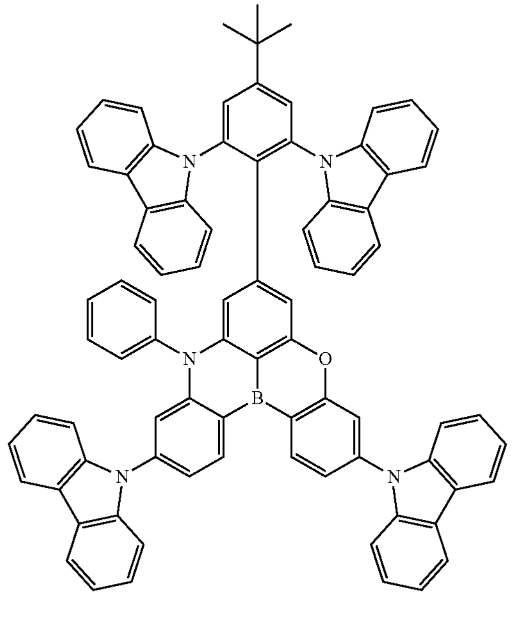
26
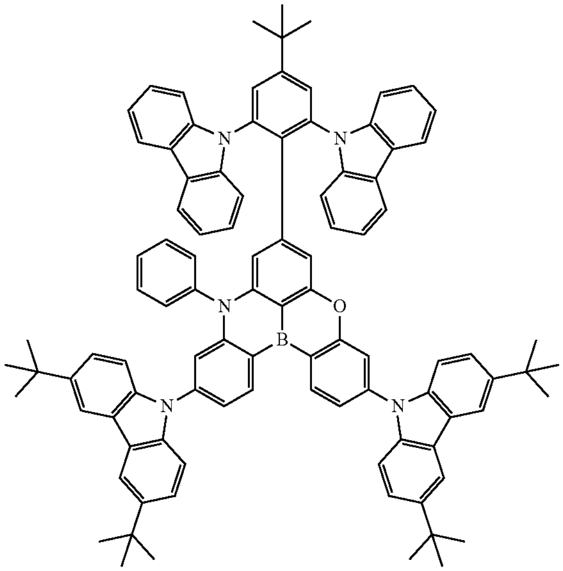

-continued
27
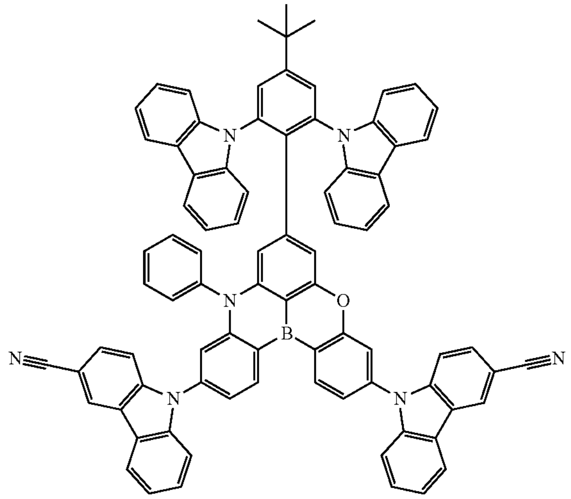
28
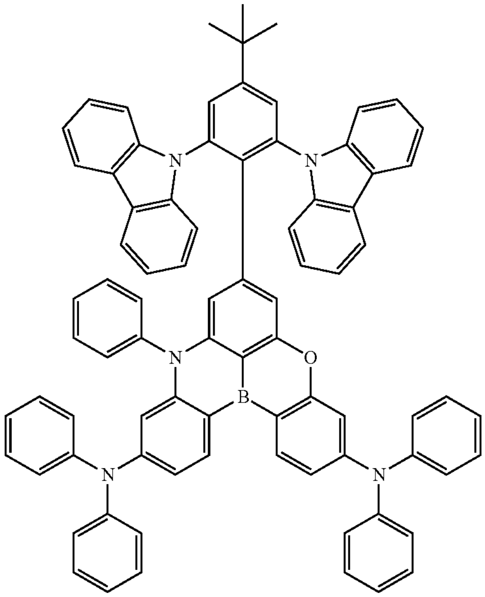
29
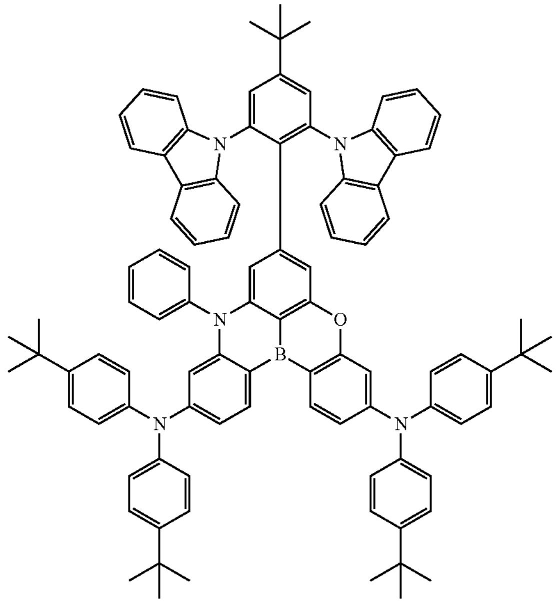
30
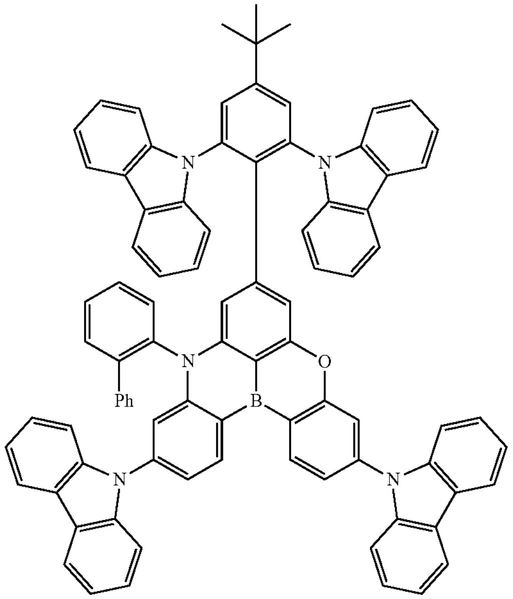

-continued
31
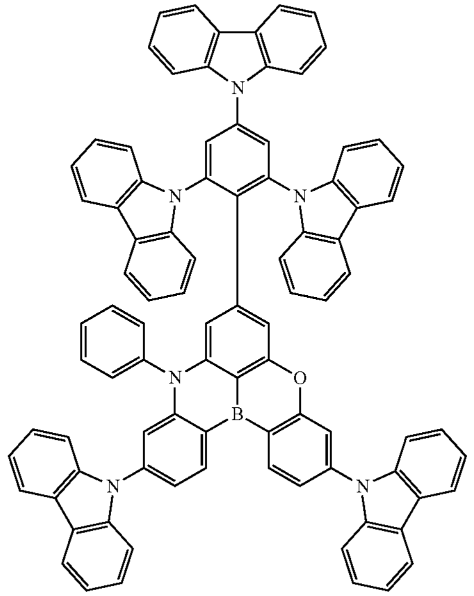
32
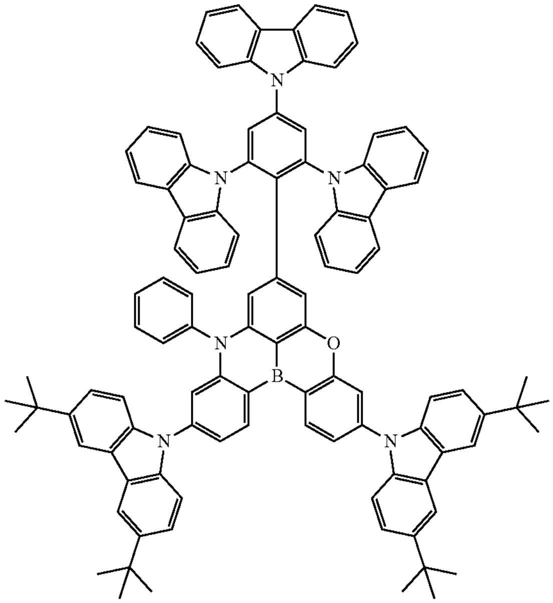
33
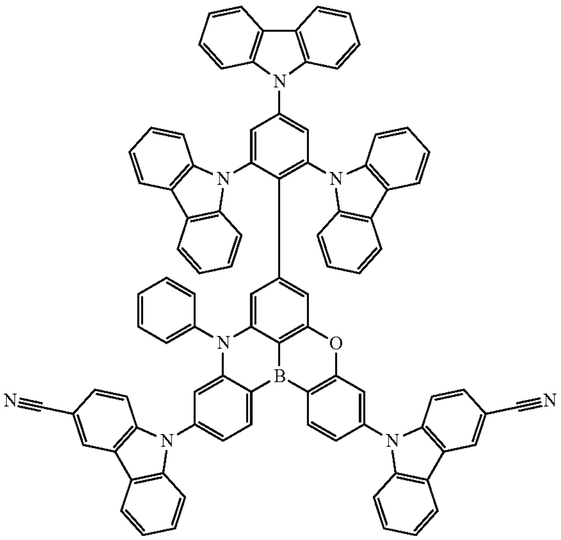
34
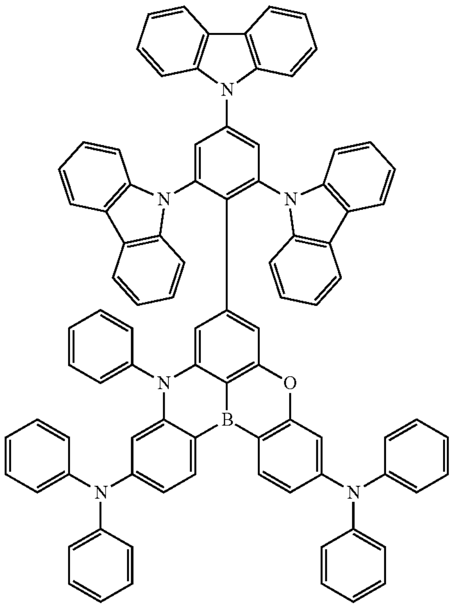

-continued
35
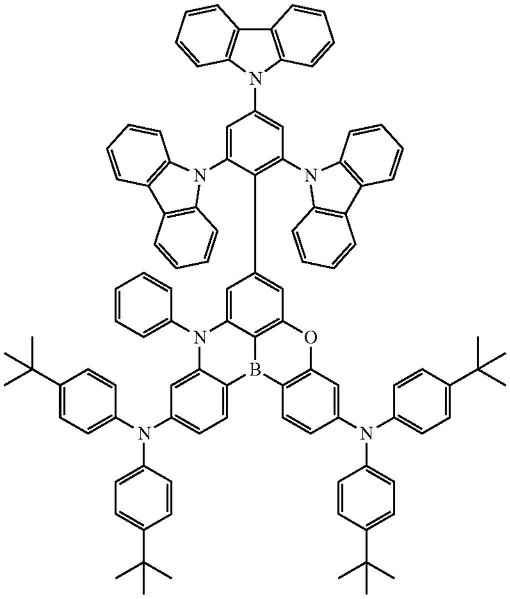
36
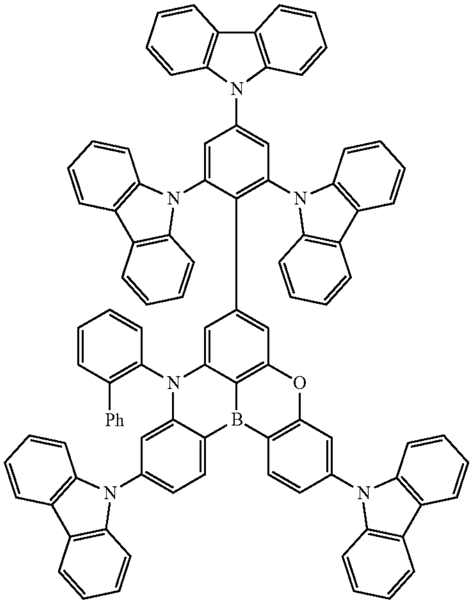
37
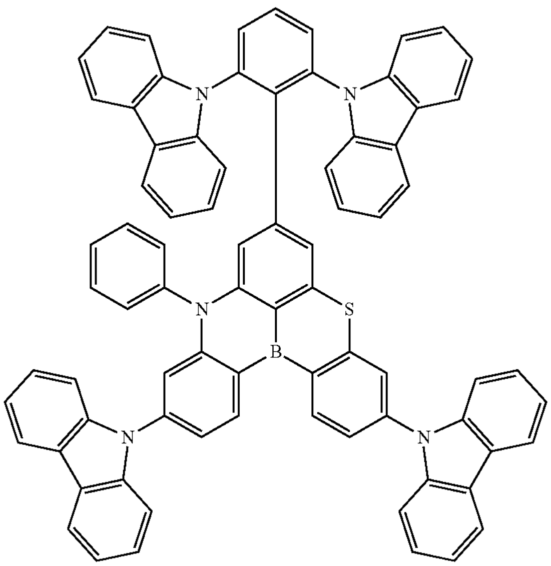
38
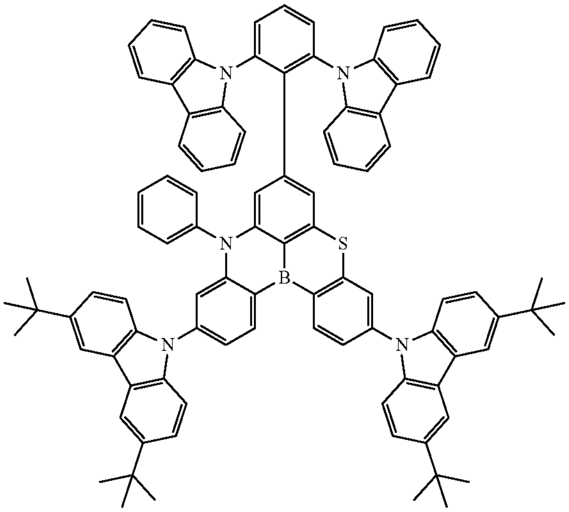

-continued
39
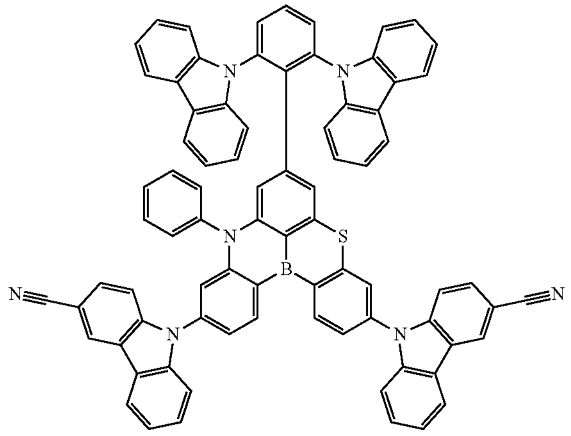
40
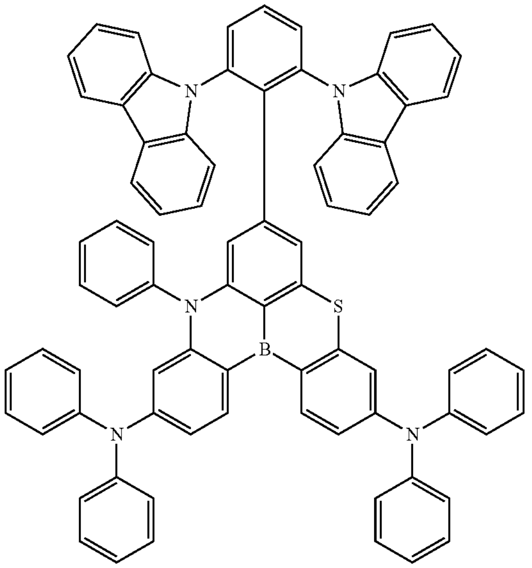
41
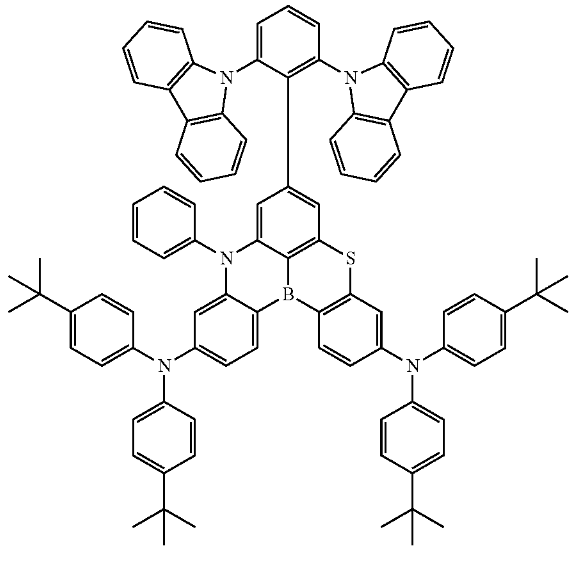
42
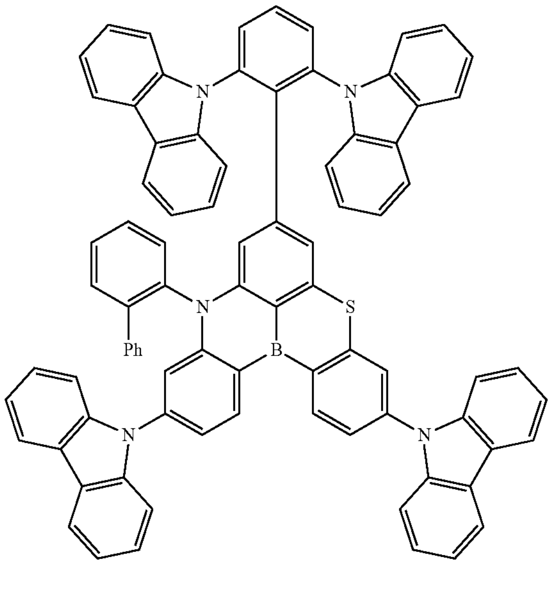

-continued
43
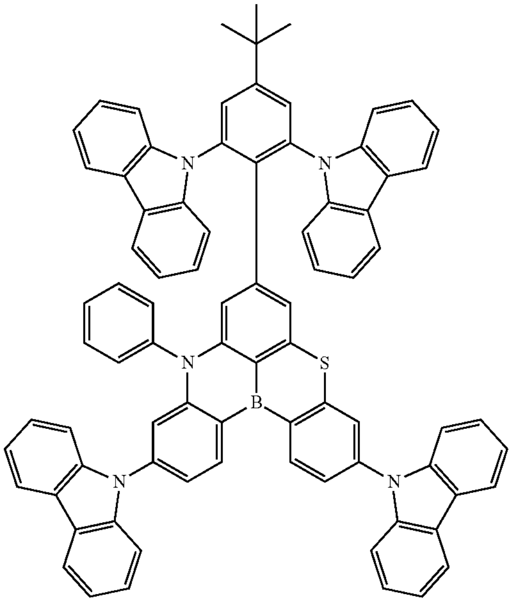
44
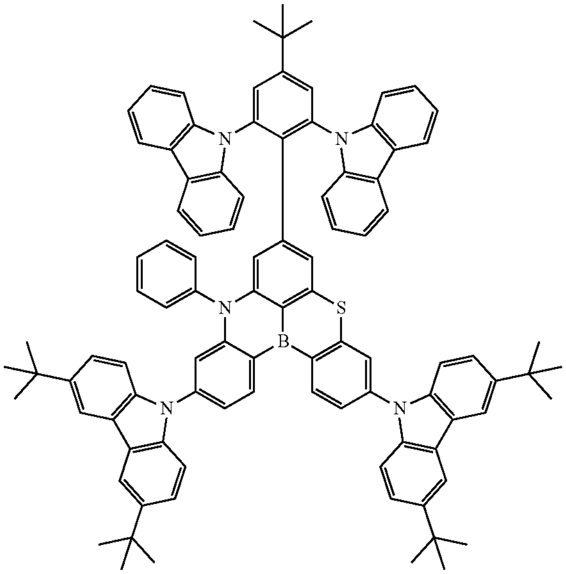
45
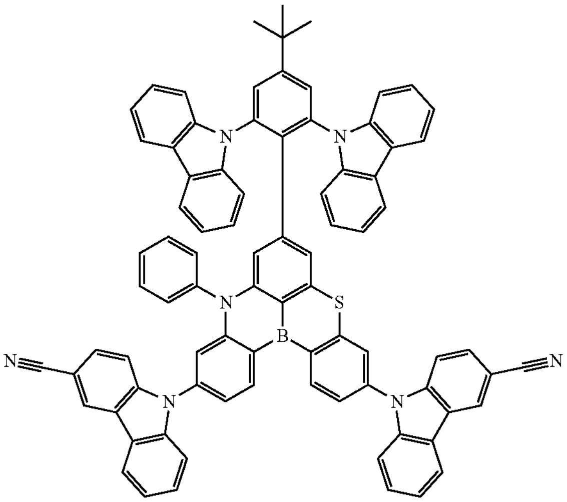
46
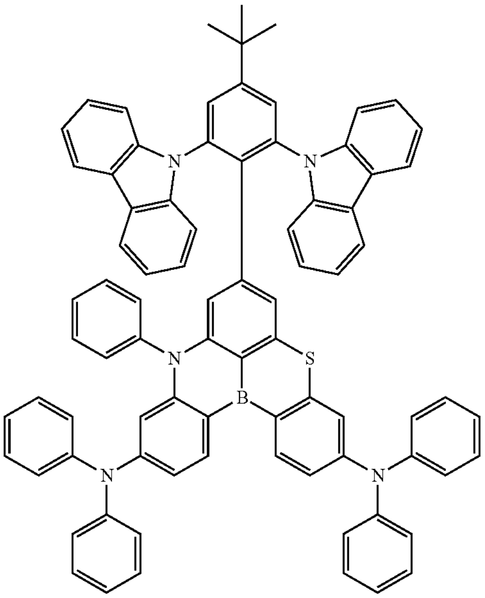

-continued
47
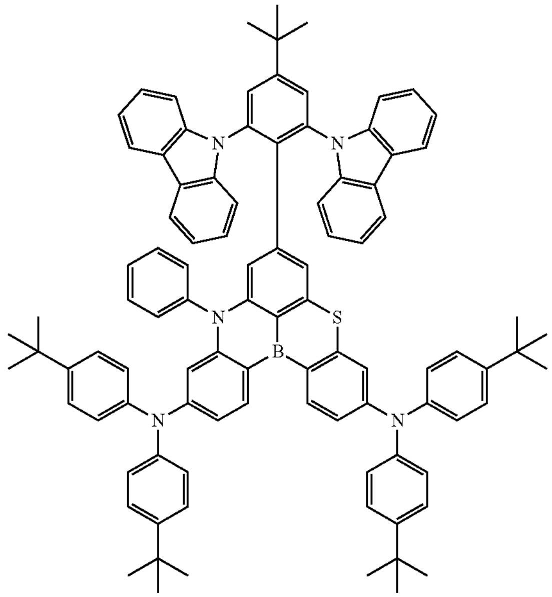
48
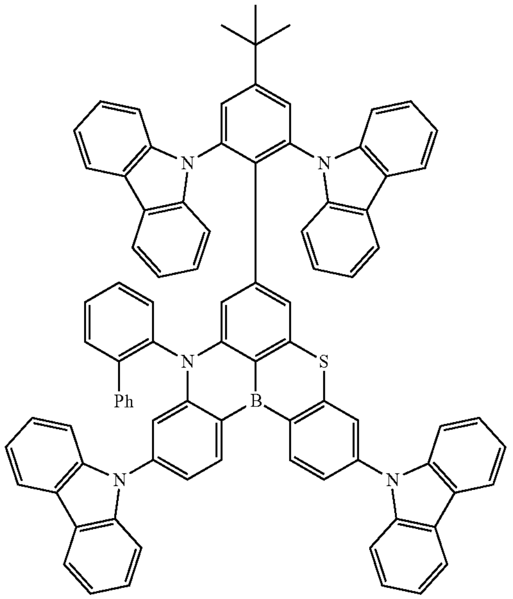
49
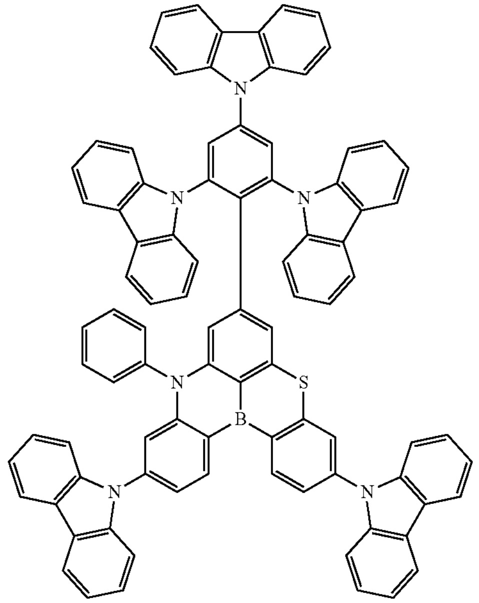
50
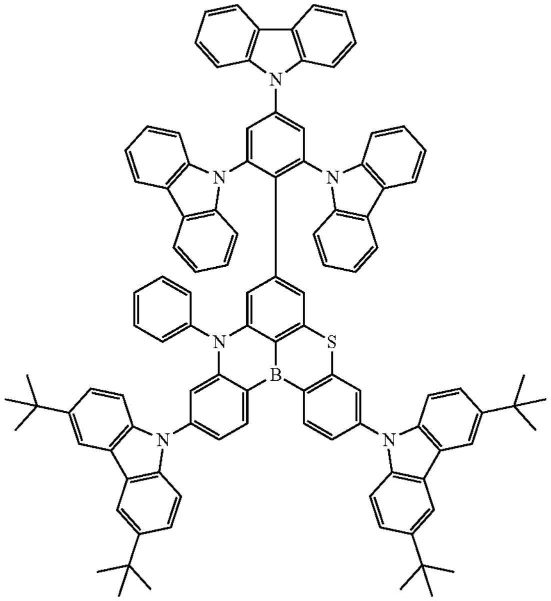

-continued
51
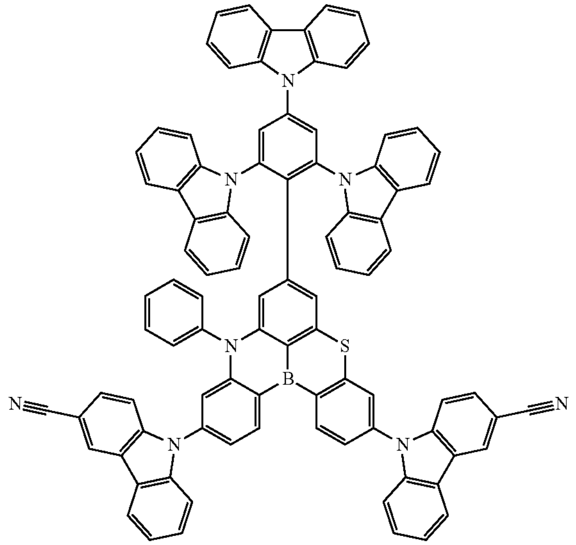
52
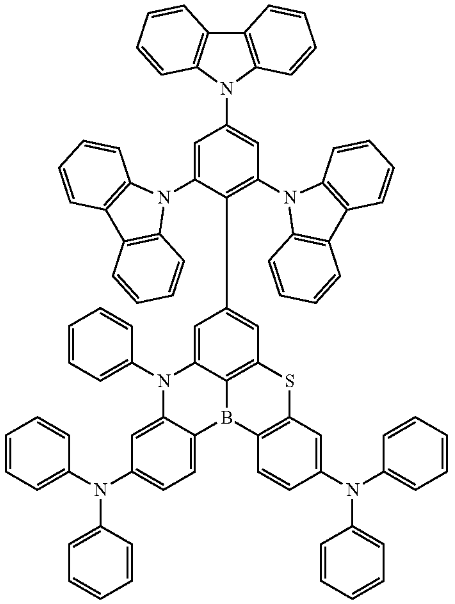
53
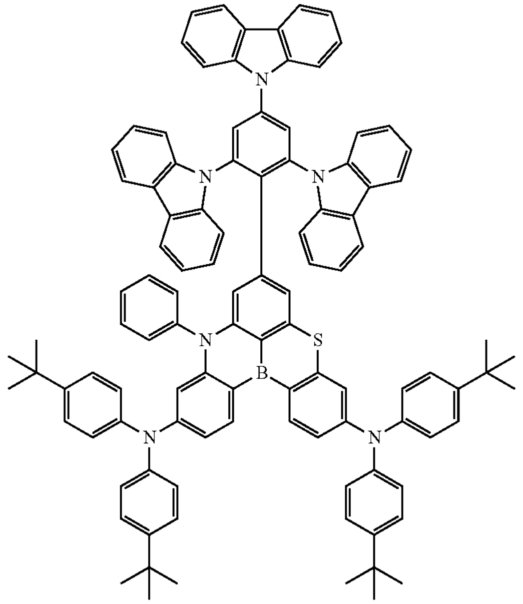
54
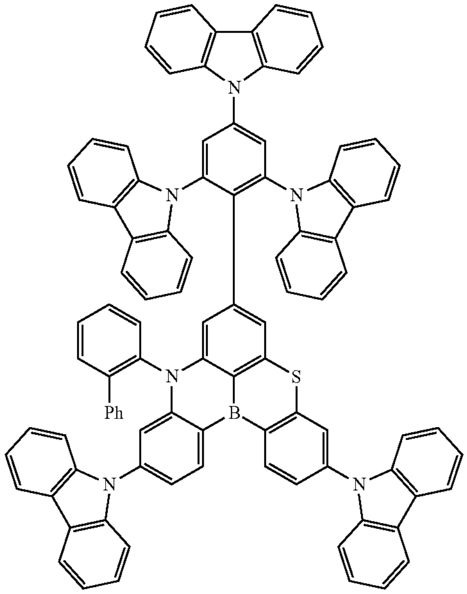

-continued
55
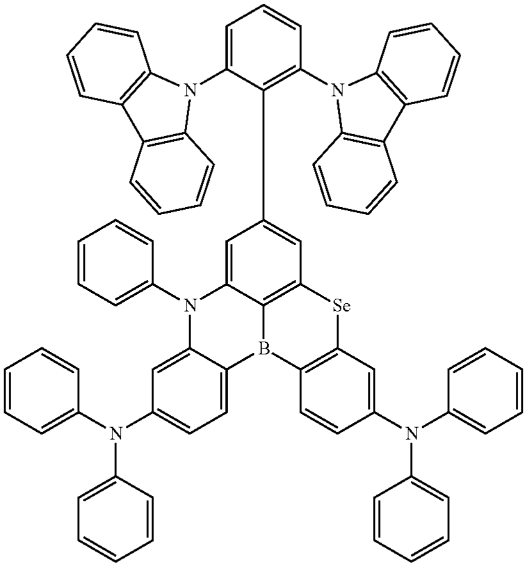
56
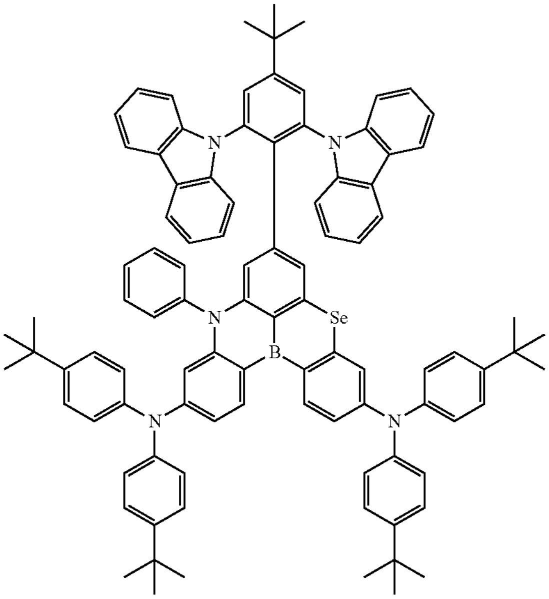
57
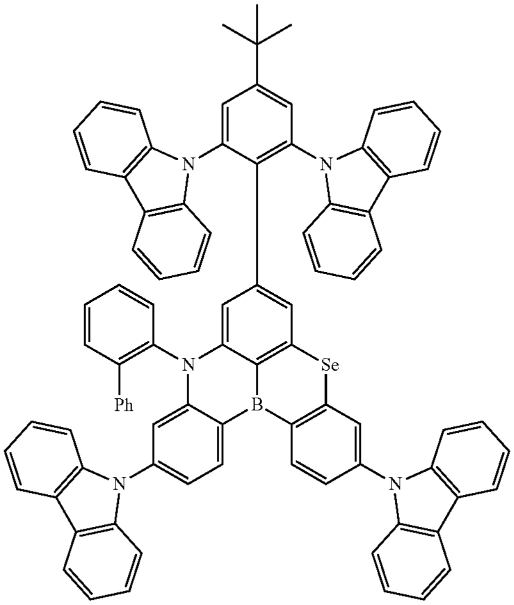
58
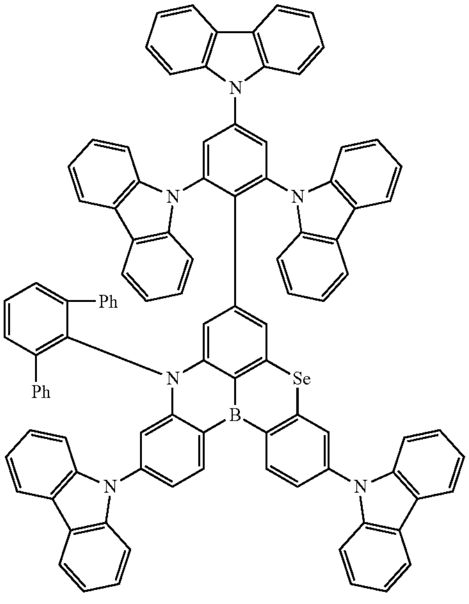

-continued
59
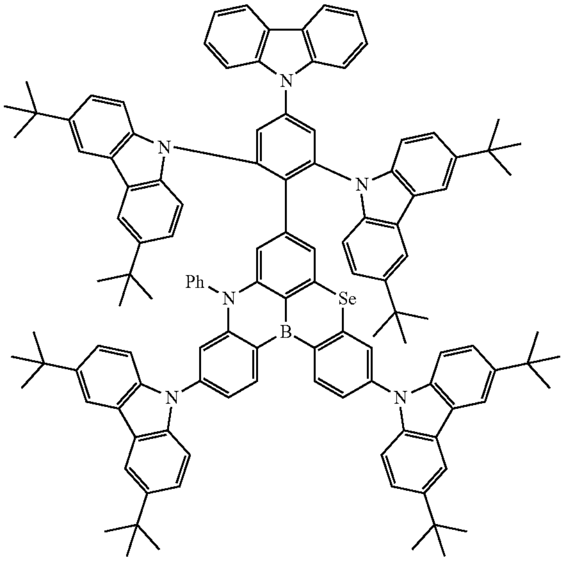
60
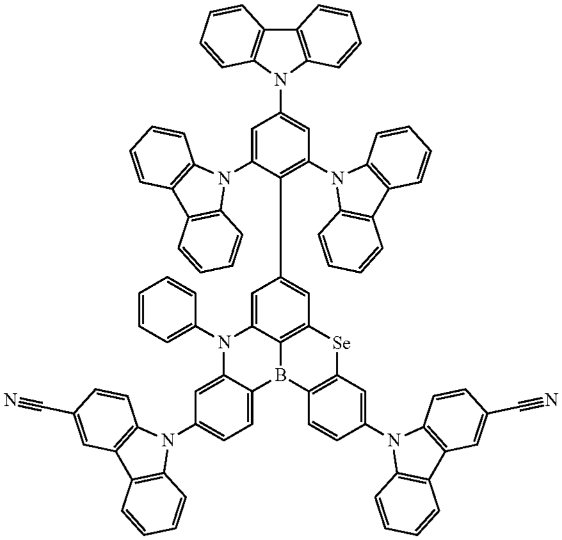
61
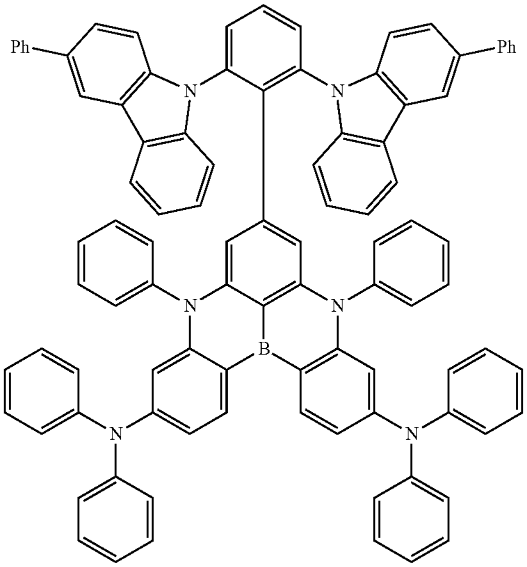
62
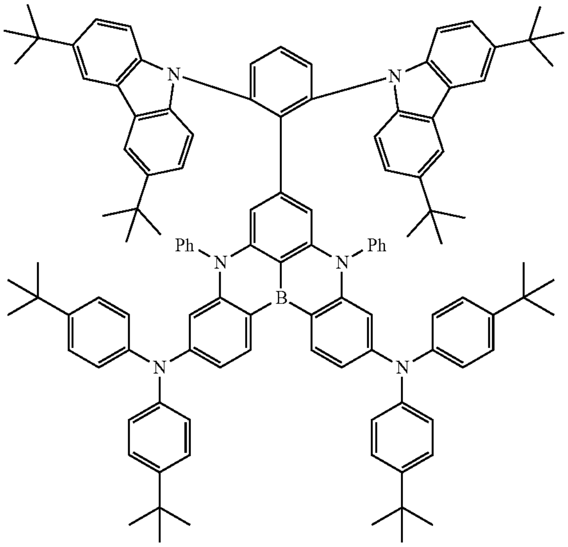

-continued
63
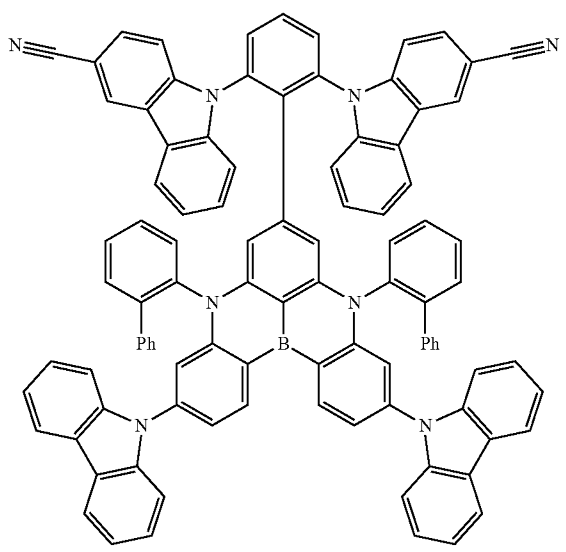
64
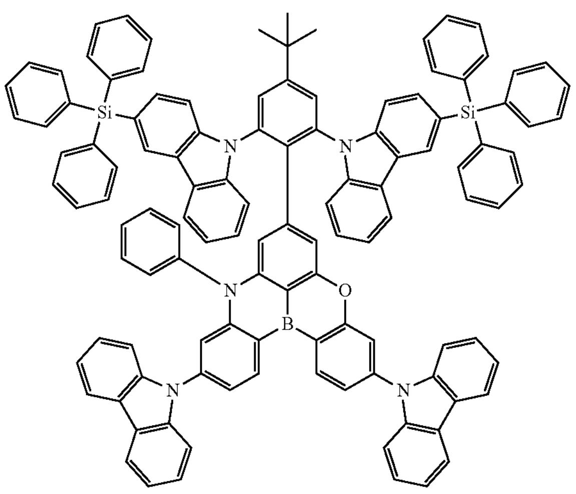
65
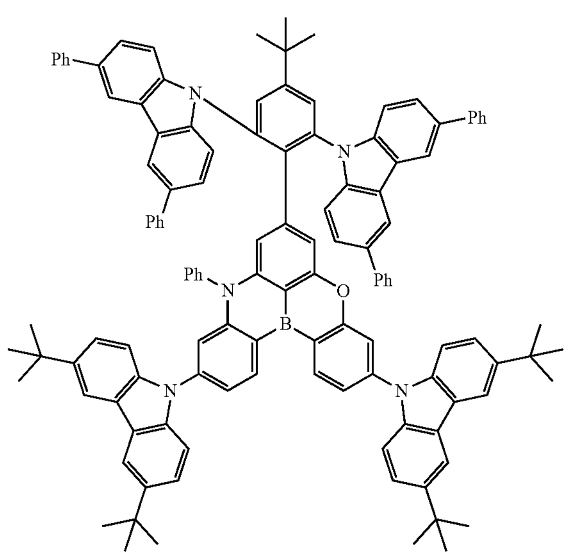
66
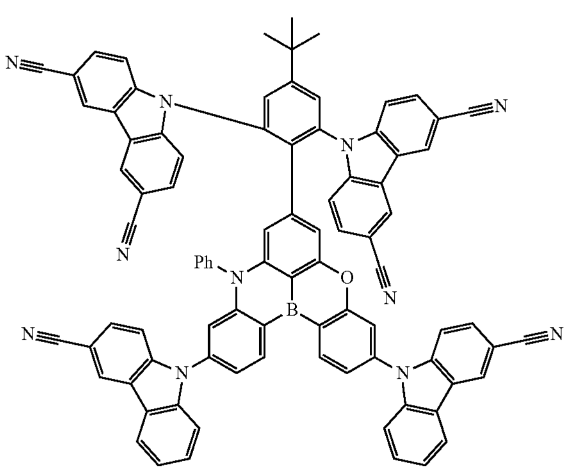

-continued
68
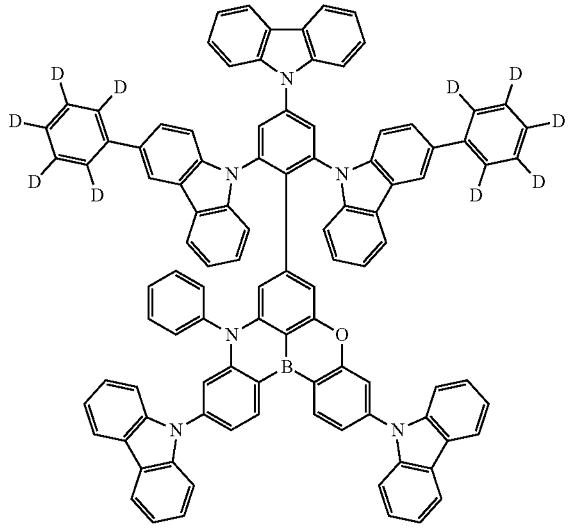
67
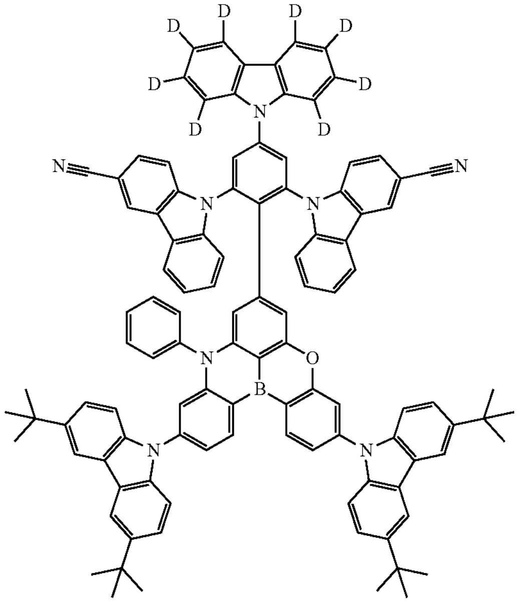
69
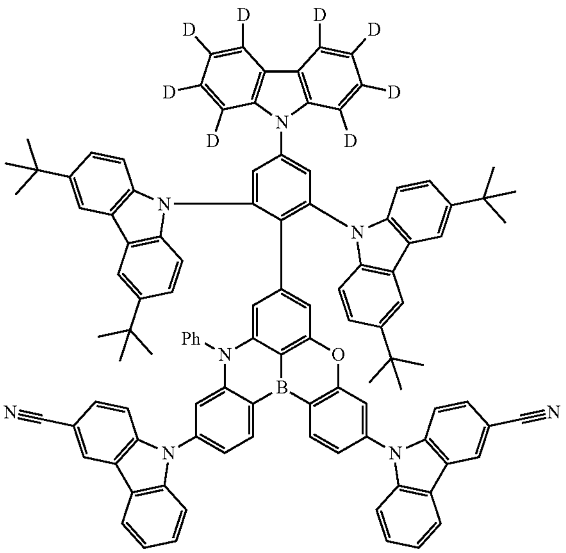
70
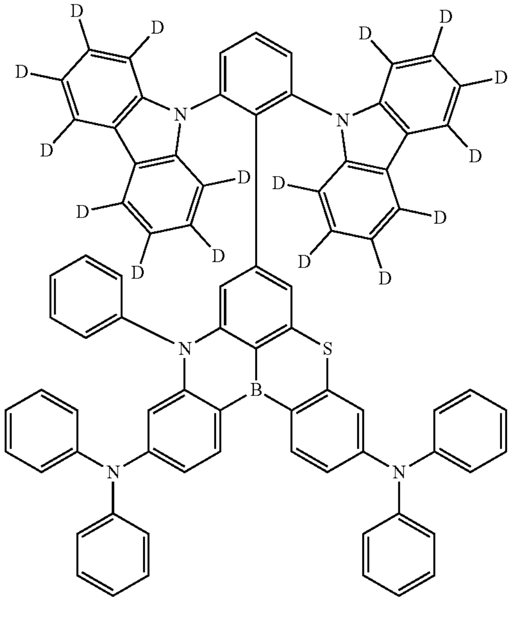

-continued
71
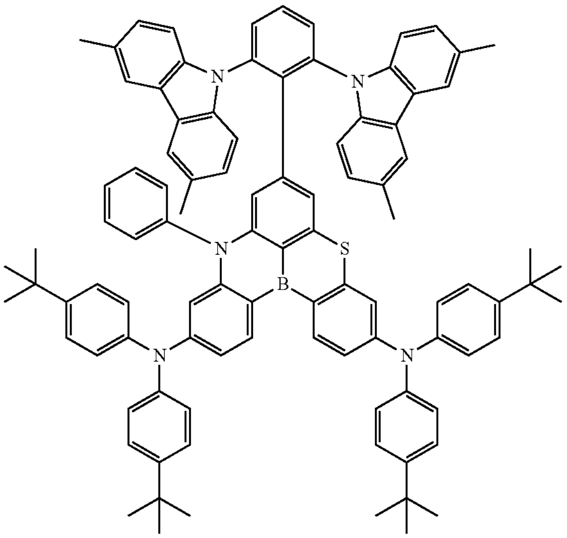
72
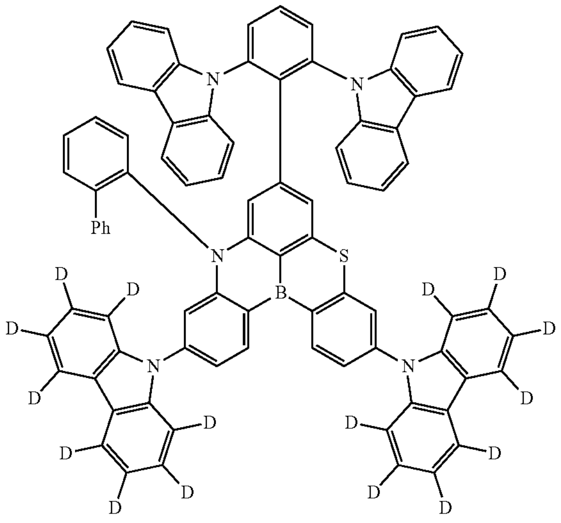
73
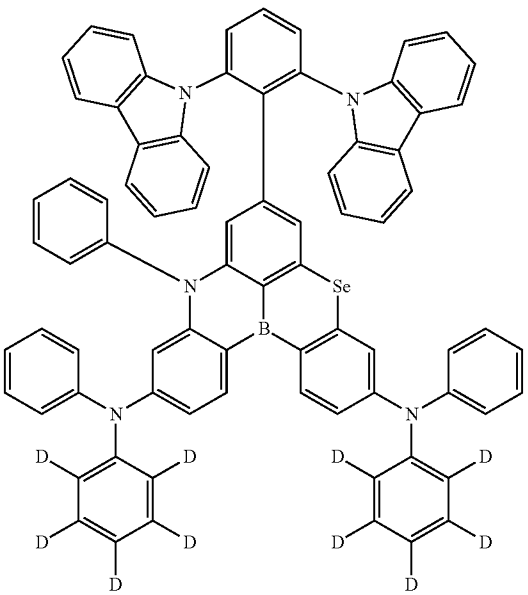
74
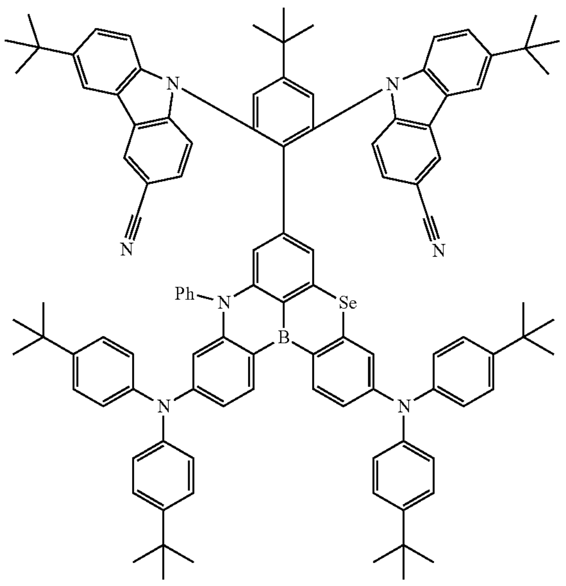

-continued
75
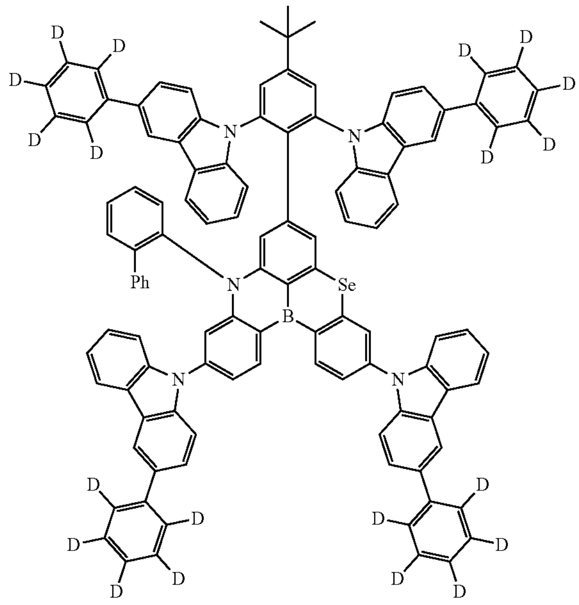
76
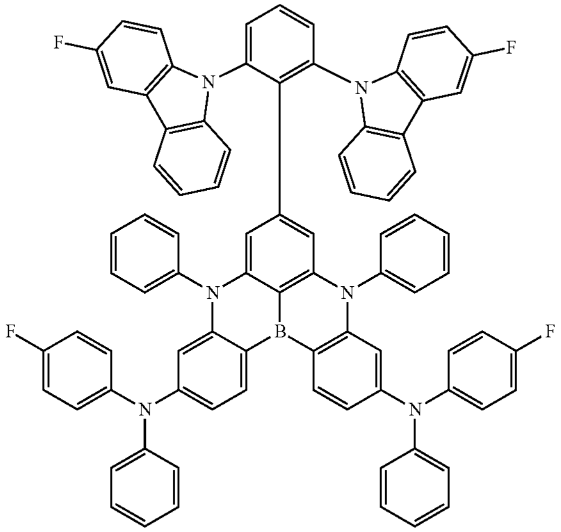
77
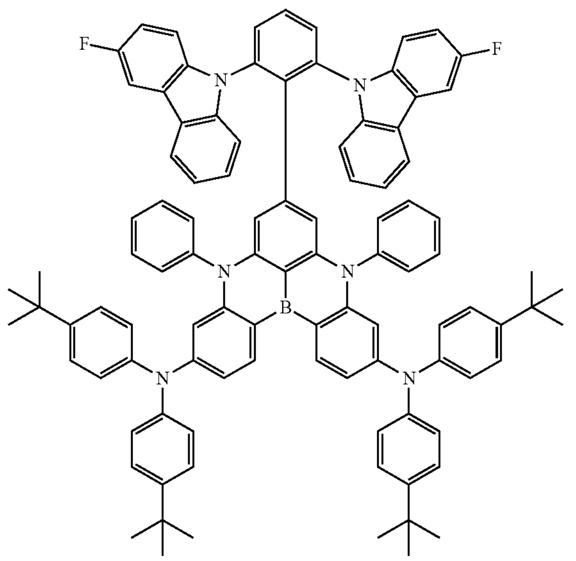
78
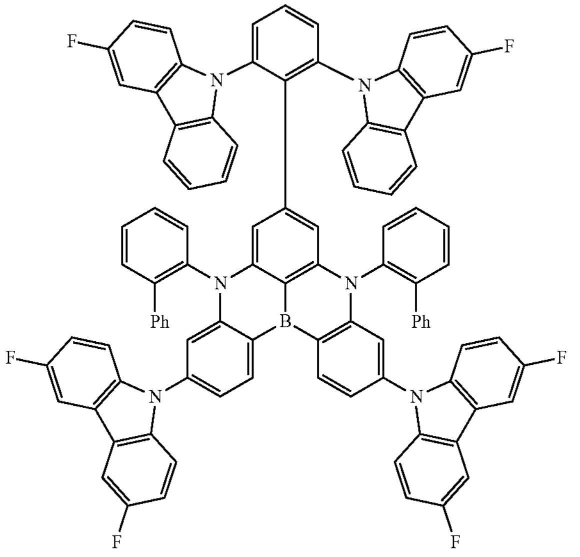

-continued
79
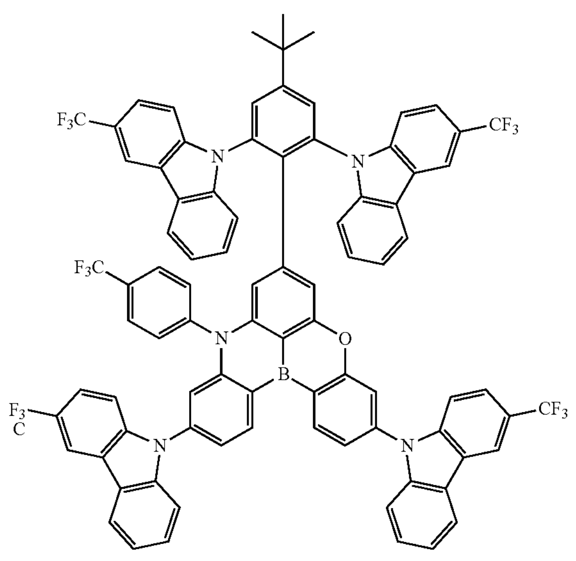
80
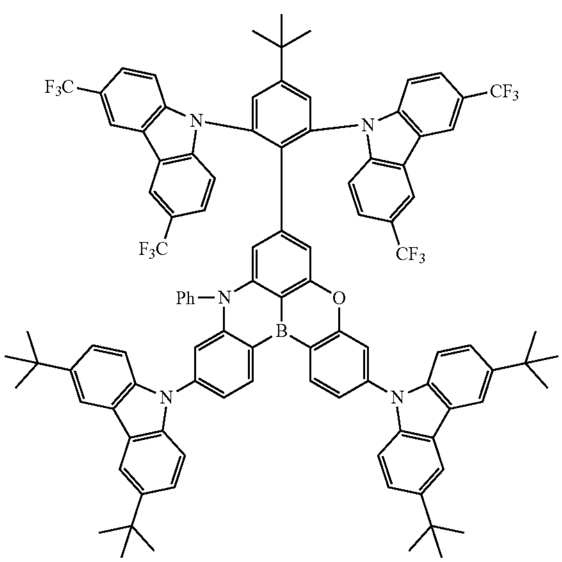
81
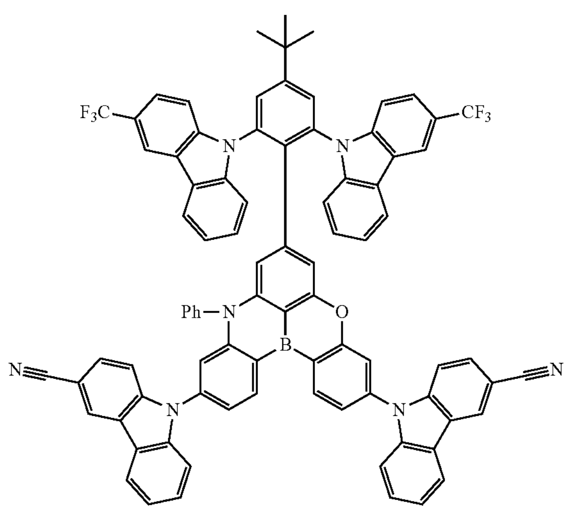
82
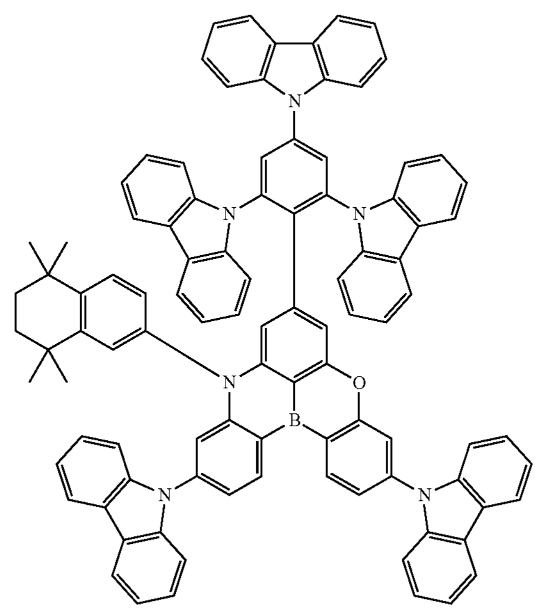

-continued
83
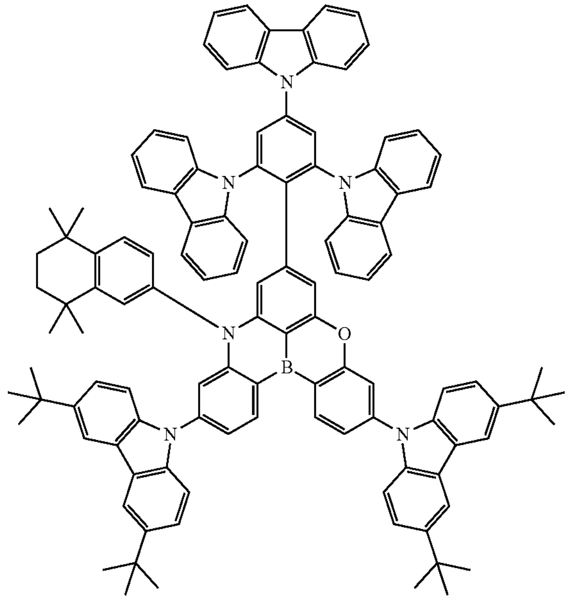
84
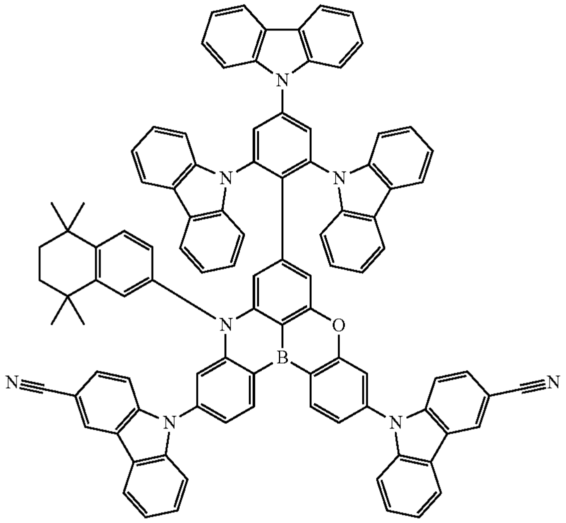
85
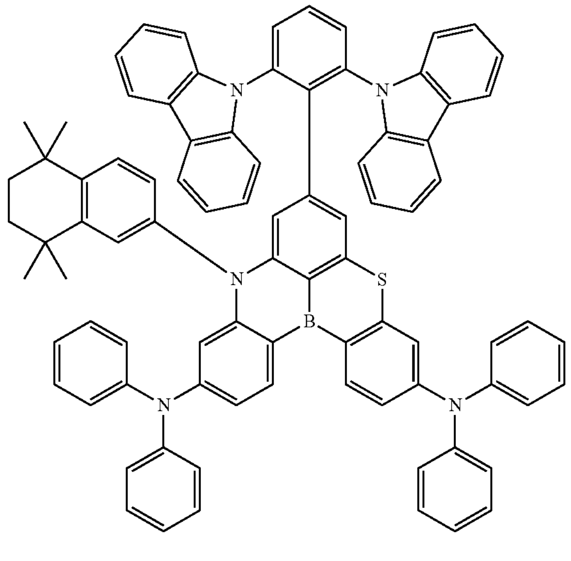
86
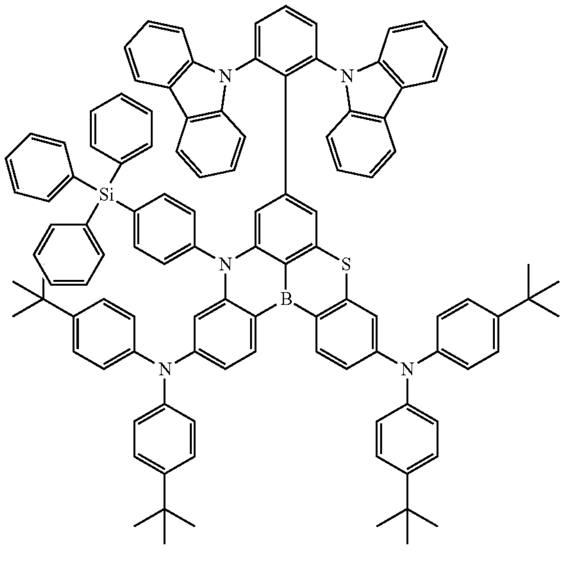

-continued
87
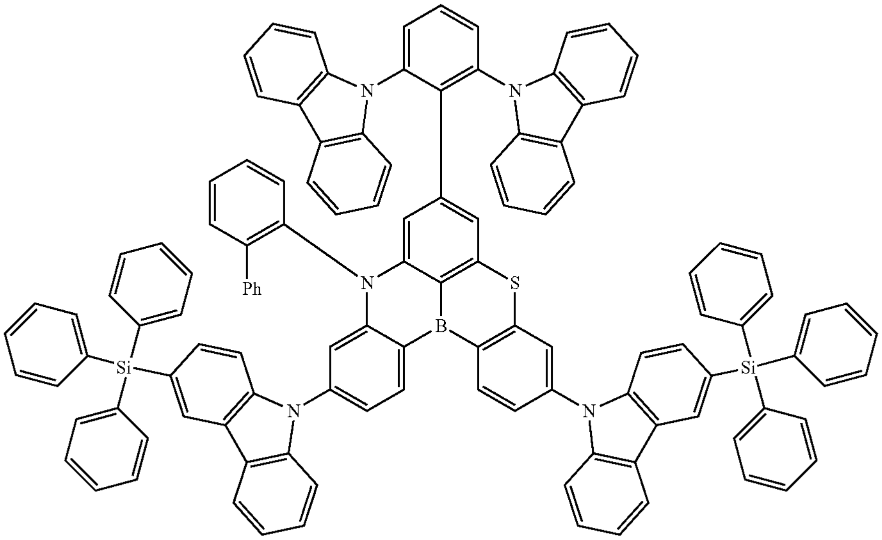
88
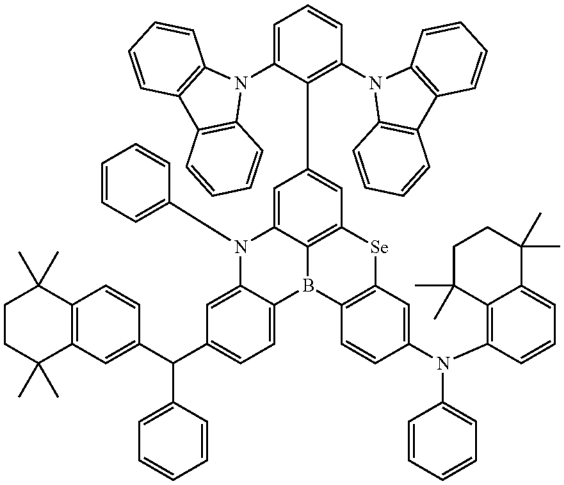
89
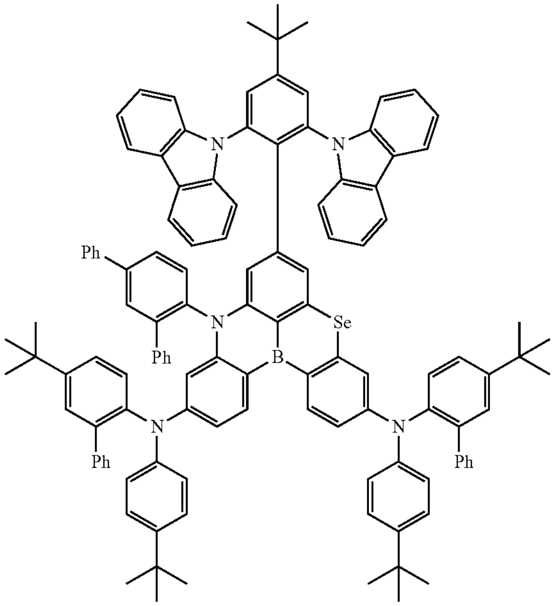

-continued

90

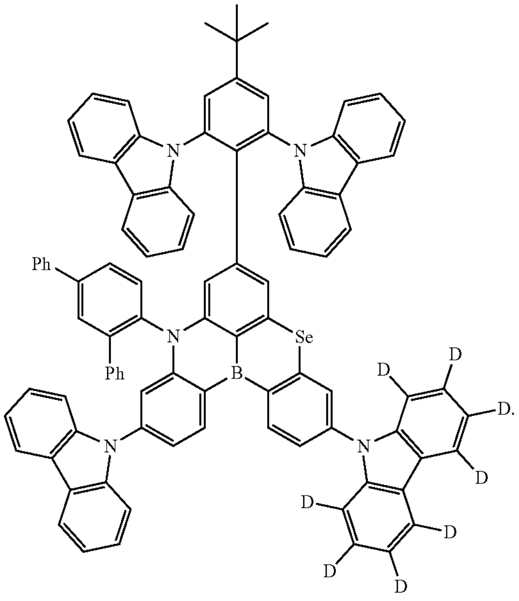

In Compound Group 1, Ph may be an unsubstituted phenyl group.

In an embodiment, the polycyclic compound may be represented by Formula 1.

[Formula 1]

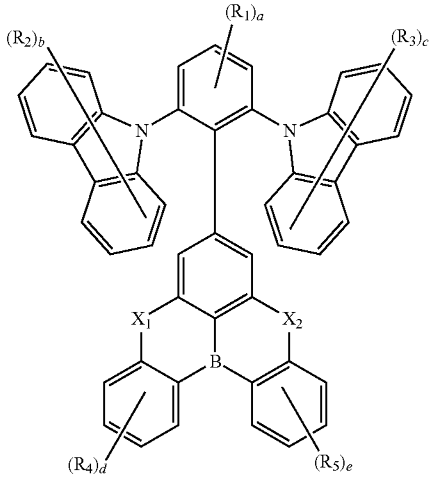

In Formula 1, $X_1$ and $X_2$ may each independently be O, S, Se, or N(Ra). $X_1$ and $X_2$ may be the same as or different from each other. For example, in an embodiment, $X_1$ and $X_2$ may each be N(Ra), or one of $X_1$ and $X_2$ may be N(Ra), and the other of $X_1$ and $X_2$ may be O, S, or Se. However, embodiments are not limited thereto.

In an embodiment, at least one of $X_1$ and $X_2$ may be N(Ra), and Ra may be a group represented by any one of Formulas $A_1$ to $A_6$.

$A_1$

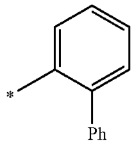

$A_2$

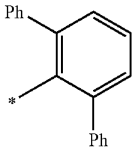

$A_3$

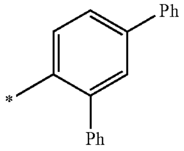

$A_4$

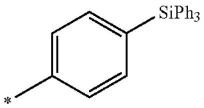

$A_5$

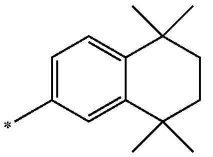

$A_6$

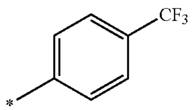

In Formulas $A_1$ to $A_6$, Ph is an unsubstituted phenyl group. In Formulas $A_1$ to $A_6$, may indicate, when at least one of $X_1$ and $X_2$ is N(Ra), a portion where Ra as represented by any one of Formulas $A_1$ to $A_6$ is bonded to a nitrogen atom of N(Ra).

In Formula 1, $R_1$ to $R_5$, and Ra may each independently be a hydrogen atom, a deuterium atom, a halogen atom, a cyano group, a substituted or unsubstituted amine group, a substituted or unsubstituted silyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. For example, $R_1$ to $R_5$, and Ra may be bonded to an adjacent group to form a hydrocarbon ring.

In an embodiment, $R_1$ may be a hydrogen atom, a substituted or unsubstituted carbazole group, or a substituted or unsubstituted t-butyl group. However, embodiments are not limited thereto.

In an embodiment, $R_2$ and $R_3$ may each independently be a hydrogen atom, a deuterium atom, a fluorine atom, a cyano group, a substituted or unsubstituted triphenylsilyl group, a substituted or unsubstituted phenyl group, a substituted or unsubstituted t-butyl group, or a substituted or unsubstituted methyl group. However, embodiments are not limited thereto.

In an embodiment, $R_4$ and $R_5$ may each independently be a substituted or unsubstituted carbazole group, or a substituted or unsubstituted diphenyl amine group. However, embodiments are not limited thereto.

In Formula 1, a may be an integer from 0 to 3. When a is 0, $R_1$ may be unsubstituted, and when a is 1, one $R_1$ group may be substituted. When a is 2 or greater, multiple $R_1$ groups may be substituted. When a is 1, $R_1$ may be substituted at a phenyl group at an ortho position with respect to a carbazole group. When a is 2 or greater, multiple $R_1$ groups may all be the same, or at least one $R_1$ group may be different from the other $R_1$ groups.

In an embodiment, the polycyclic compound represented by Formula 1 may be represented by Formula 2. Formula 2 represents a case in which a is 1 and $R_1$ is substituted at a phenyl group at a meta position with respect to a carbazole group.

[Formula 2]

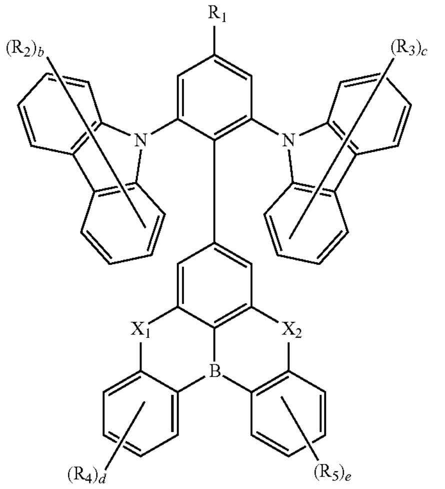

In Formula 2, $X_1$, $X_2$, b to e, and $R_1$ to $R_5$ may be the same as defined in Formula 1.

In Formula 1, b and c may each independently be an integer from 0 to 8. When b is 0, a carbazole group is unsubstituted, and when b is 1, one $R_2$ group is substituted at a carbazole group. When b is 2 or greater, multiple $R_2$ groups are substituted at the carbazole group. When b is 1, $R_2$ may be substituted at a carbazole group at a para position with respect to a nitrogen atom in the carbazole group, and when b is 2, two $R_2$ groups may be substituted at a carbazole group and may each be at a para position with respect to a nitrogen atom in the carbazole group. When b is 2 or greater, multiple $R_2$ groups may all be the same, or at least one $R_2$ group may be different from the other $R_2$ groups. When c is 1, $R_3$ may be substituted at a carbazole group at a para position with respect to a nitrogen atom in the carbazole group, and when c is 2, two $R_3$ groups may be substituted at a carbazole group and may each be at a para position with respect to a nitrogen atom in the carbazole group. When c is 2 or greater, multiple $R_3$ groups may all be the same, or at least one $R_3$ group may be different from the other $R_3$ groups.

In an embodiment, the polycyclic compound represented by Formula 1 may be represented by Formula 3-1 or Formula 3-2. Formula 3-1 is a case in which b and c are each 1 in Formula 3, and each of $R_2$ and $R_3$ is substituted at a carbazole group at a para position with respect to a nitrogen atom in the carbazole group. Formula 3-2 is a case in which b and c are each 2 in Formula 3, and each of $R_2$ and $R_3$ is substituted at a carbazole group and are each at a para position with respect to a nitrogen atom in the carbazole group.

[Formula 3-1]

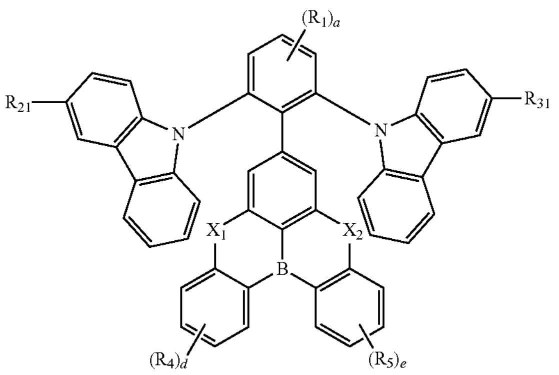

[Formula 3-2]

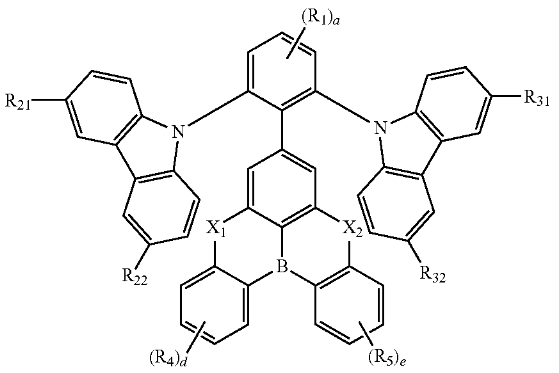

In Formula 3-1 and Formula 3-2, $R_{21}$, $R_{22}$, $R_{31}$, and $R_{32}$ may each independently be a hydrogen atom, a fluorine atom, a cyano group, a substituted or unsubstituted phenyl group, a substituted or unsubstituted t-butyl group, a substituted or unsubstituted triphenylsilyl group, or a substituted or unsubstituted methyl group. In Formula 3-1 and Formula 3-2, $X_1$, $X_2$, a, d, e, $R_1$, $R_4$, and $R_5$ may be the same as defined in Formula 1.

In Formula 1, d and e may each independently be an integer from 0 to 4. When d is 1, $R_4$ may be substituted at a core moiety at a para position with respect to a boron atom. When d is 2 or greater, multiple $R_4$ groups may all be the same, or at least one $R_4$ group may be different from the other $R_4$ groups. When e is 1, $R_5$ may be substituted at a core moiety at the para position with respect to a boron atom. When e is 2 or greater, multiple $R_5$ groups may all be the same, or at least one $R_5$ group may be different from the other $R_5$ groups.

In an embodiment, the polycyclic compound represented by Formula 1 may be represented by Formula 4. Formula 4 is a case in which d and e are each 1, and each of $R_4$ and $R_5$ is substituted at a core moiety at the para position with respect to a boron atom.

[Formula 4]

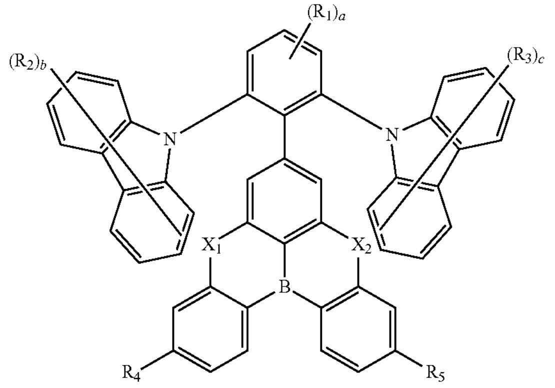

In Formula 4, $X_1$, $X_2$, a to c, and $R_1$ to $R_5$ may be the same as defined in Formula 1.

In an embodiment, the polycyclic compound represented by Formula 1 may be any one selected from Compound Group 1, as explained above.

The polycyclic compound represented by Formula 1 or including the phenyl group PN substituted with the first to third substituents SUB1 to SUB3 may be used as a thermally activated delayed fluorescence (TADF) material. For example, the polycyclic compound of an embodiment may be used as a TADF dopant material which emits blue light. The polycyclic compound of an embodiment may be a light emitting material having a light emission center wavelength ($\lambda_{max}$) in a wavelength region equal to or less than about 490 mm. For example, the polycyclic compound of an embodiment may be a light emitting material having a light emission center wavelength in a range of about 450 nm to about 470 nm. The polycyclic compound of an embodiment may be a blue thermally activated delayed fluorescence dopant. However, embodiments are not limited thereto.

The polycyclic compound represented by Formula 1 according to the above-described embodiments, or including the phenyl group PN substituted with the first to third substituents SUB1 to SUB3 has a twisted molecular structure in which the phenyl group PN and the first substituent SUB1 are twisted due to the steric hindrance effect of the bulky second and third substituents SUB2 and SUB3. Due to the twisted molecular structure in which the phenyl group PN and the first substituent SUB1 are twisted, the first substituent SUB1 may be positioned on the first plane PA1, and the phenyl group PN may be positioned on the second plane PA2. The polycyclic compound may have the first substituent SUB1 positioned between the bulky second substituent SUB2 and third substituent SUB3. For example, between the bulky second substituent SUB2 and third substituent SUB3, the boron atom of the first substituent SUB1 may be positioned. Due to the steric hindrance effect of the bulky second substituent SUB2 and third substituent SUB3, a vacant p-orbital of the boron atom of the first substituent SUB1 may be shielded from a nucleophile. Due to the steric hinderance effect of the bulky second substituent SUB2 and third substituent SUB3, the intermolecular distance between the polycyclic compound and other molecules becomes large, so that there may be less intermolecular interaction. As a result, the structural stability of the polycyclic compound according to embodiments may increase, and the efficiency of a light emitting device including the polycyclic compound according to the embodiments in a light emitting layer may be improved.

The light emitting device of an embodiment may have a maximum external quantum efficiency (EQE) equal to or greater than about 20%. The maximum external quantum efficiency may be calculated by the following equation:

[internal quantum efficiency×charge balance×out coupling efficiency]

The internal quantum efficiency is a ratio at which generated excitons are converted into the form of light. The charge balance means the balance between a hole and an electron which form an exciton, and generally has a value of 1 assuming that a hole and an electron are in a 1:1 ratio. The out coupling efficiency is the ratio of light emitted to the outside to light emitted from a light emitting layer. In the polycyclic compound having a twisted molecular structure, resonance between the first substituent SUB1, which is a core moiety, and the phenyl group PN does not occur, so that the delocalization of electrons from the first substituent SUB1 of the polycyclic compound to the phenyl group PN does not occur. Therefore, the electron density in the core moiety of the polycyclic compound may increase, and in the core moiety of the polycyclic compound, multi resonance may be promoted. As a result, electrical properties of the polycyclic compound according to embodiments may increase, and the efficiency of a light emitting device including the polycyclic compound according to the embodiments in a light emitting layer may be improved. For example, the maximum external quantum efficiency (EQE) of the light emitting device may be equal to or greater than about 20%.

The light emitting device ED of an embodiment may further include the following light emitting layer material in addition to the polycyclic compound of an embodiment described above. In the light emitting device ED of an embodiment, the light emitting layer EML may include an anthracene derivative, a pyrene derivative, a fluoranthene derivative, a chrysene derivative, a dihydrobenzanthracene derivative, or a triphenylene derivative. For example, the light emitting layer EML may include an anthracene derivative or a pyrene derivative.

In the light emitting device ED of an embodiment illustrated in FIG. 3 to FIG. 6, the light emitting layer EML may include a host and a dopant, and the light emitting layer EML may include a compound represented by Formula E-1. The compound represented by Formula E-1 may be used as a fluorescent host material.

[Formula E-1]

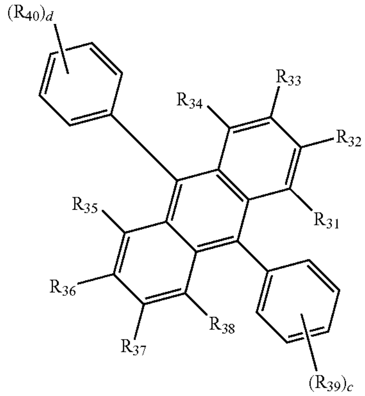

In Formula E-1, $R_{31}$ to $R_{40}$ may each independently be a hydrogen atom, a deuterium atom, a halogen atom, a substituted or unsubstituted silyl group, a substituted or unsubstituted thio group, a substituted or unsubstituted oxy group, a substituted or unsubstituted alkyl group having 1 to 10 carbon atoms, a substituted or unsubstituted an alkenyl group having 1 to 10 carbon atoms, a substituted or unsubstituted aryl group having 6 to 30 ring carbon atoms, or a substituted or unsubstituted heteroaryl group having 2 to 30 ring carbon atoms, or may be bonded to an adjacent group to form a ring. In Formula E-1, $R_{31}$ to $R_{40}$ may be bonded to an adjacent group to form a saturated hydrocarbon ring, an unsaturated hydrocarbon ring, a saturated heterocycle, or an unsaturated heterocycle.

In Formula E-1, c and d may each independently be an integer from 0 to 5.

The compound represented by Formula E-1 may be any one selected from Compound E1 to Compound E19.

E1

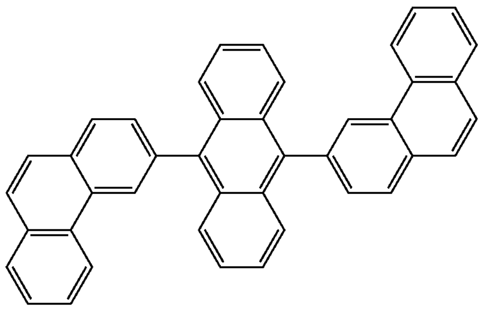

E2

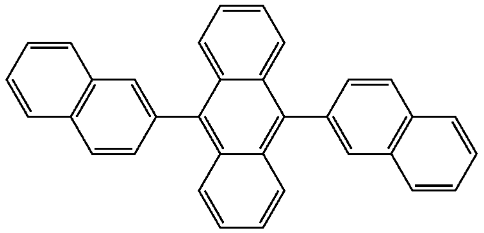

E3

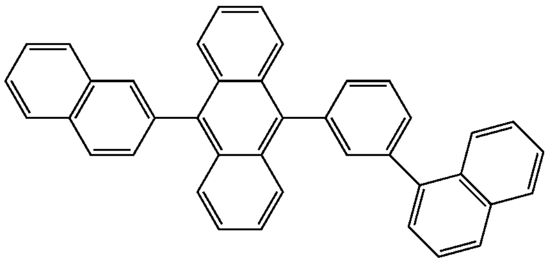

E4

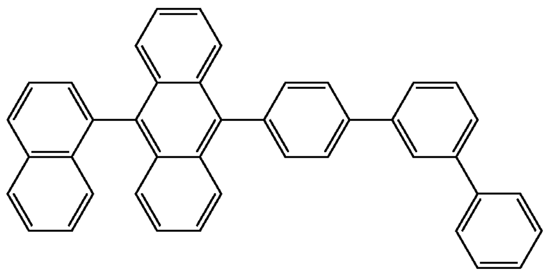

-continued
E5
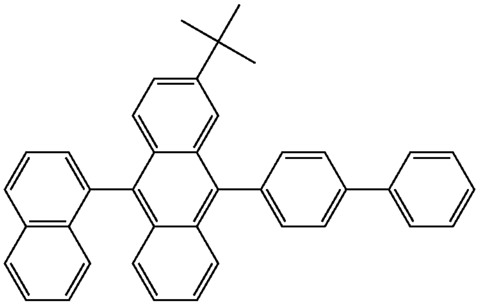
E6
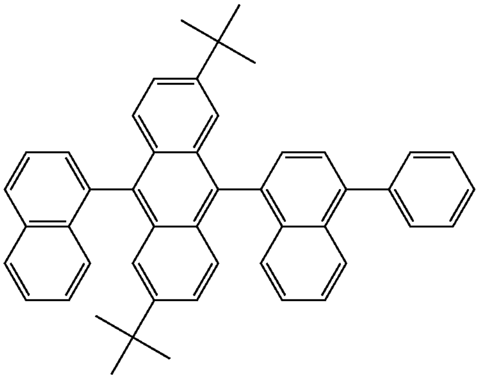
E7
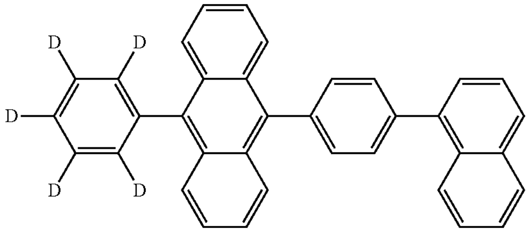
E8
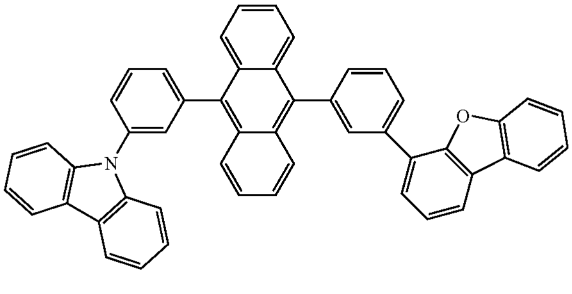
E9
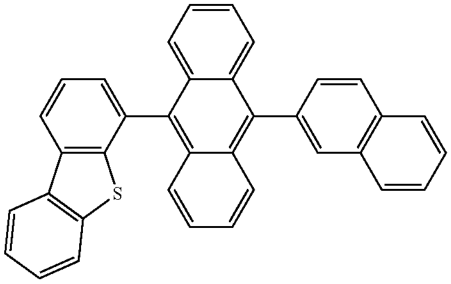
-continued
E10
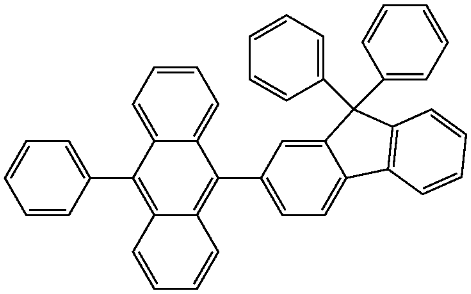
E11
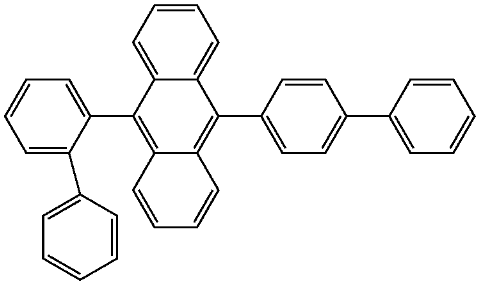
E12
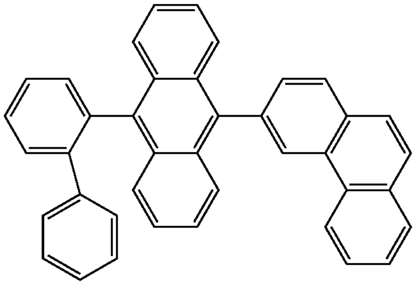
E13
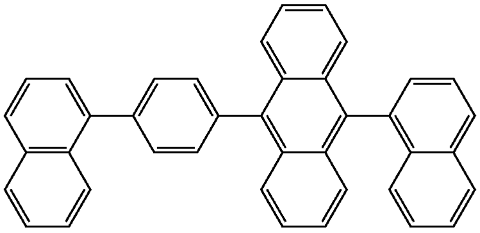
E14
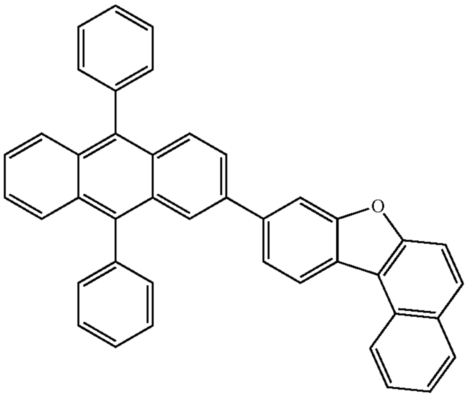

-continued

E15

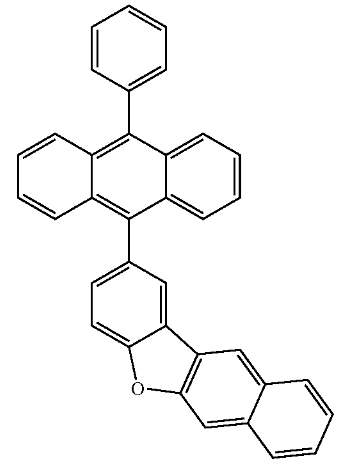

E16

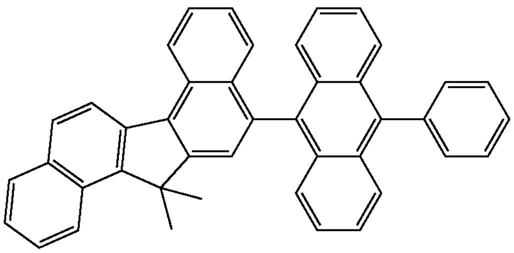

E17

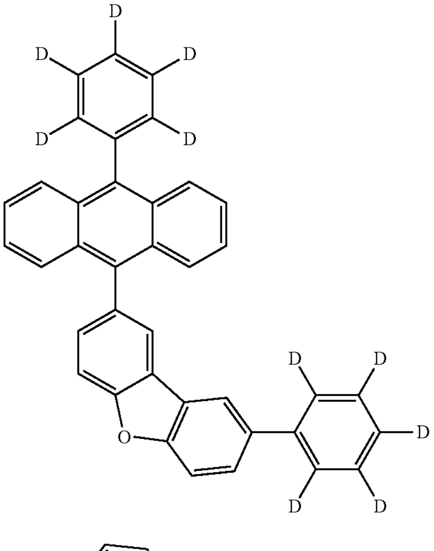

E18

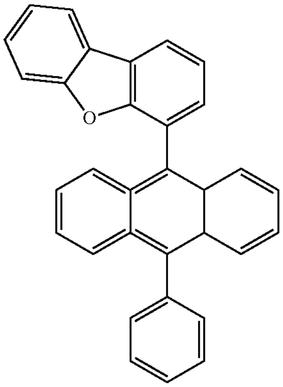

-continued

E19

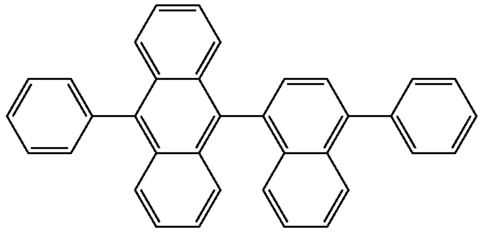

In an embodiment, the light emitting layer EML may include a compound represented by Formula E-2a or Formula E-2b. The compound represented by Formula E-2a or Formula E-2b may be used as a phosphorescent host material.

[Formula E-2a]

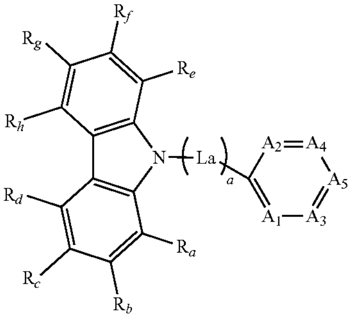

In Formula E-2a, a may be an integer from 0 to 10, and $L_a$ may be a direct linkage, a substituted or unsubstituted arylene group having 6 to 30 ring-forming carbon atoms, or a substituted or unsubstituted heteroarylene group having 2 to 30 ring-forming carbon atoms. When a is 2 or greater, multiple $L_a$ groups may each independently be a substituted or unsubstituted arylene group having 6 to 30 ring-forming carbon atoms, or a substituted or unsubstituted heteroarylene group having 2 to 30 ring-forming carbon atoms.

In Formula E-2a, $A_1$ to $A_5$ may each independently be N or $C(R_i)$. $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 10 carbons, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. $R_a$ to $R_i$ may be bonded to an adjacent group to form a hydrocarbon ring or a heterocycle containing N, O, S, and the like as a ring-forming atom.

In Formula E-2a, two or three of $A_1$ to $A_5$ may be N, and the remainder of $A_1$ to $A_5$ may be $C(R_i)$.

[Formula E-2b]

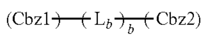

In Formula E-2b, Cbz1 and Cbz2 may each independently be an unsubstituted carbazole group, or a carbazole group substituted with an aryl group having 6 to 30 ring-forming carbon atoms. $L_b$ may be a direct linkage, a substituted or unsubstituted arylene group having 6 to 30 ring-forming carbon atoms, or a substituted or unsubstituted heteroarylene group having 2 to 30 ring-forming carbon atoms. In Formula E-2b, b may be an integer from 0 to 10, and when b is 2 or greater, multiple $L_b$ groups may each independently be a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be any one selected from Compound Group E-2. However, the compounds listed in Compound Group E-2 are only examples. The compound represented by Formula E-2a or Formula E-2b is not limited to what is listed in Compound Group E-2.

[Compound Group E-2]

E-2-1

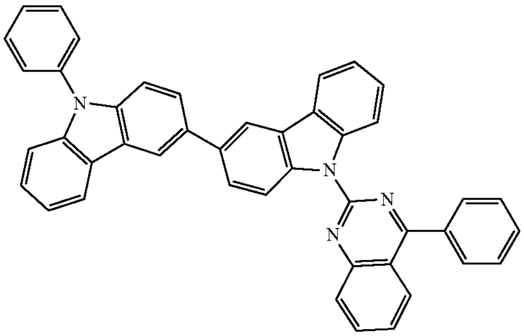

E-2-2

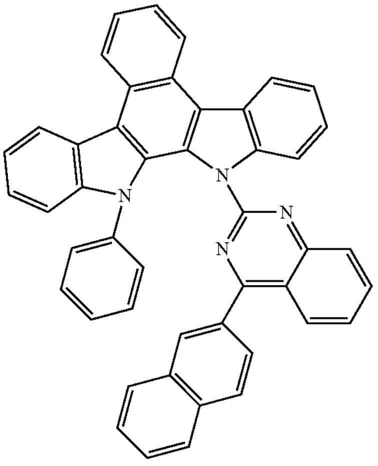

-continued

E-2-3

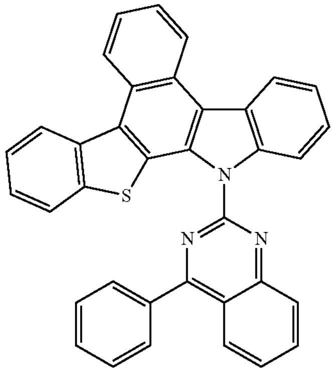

E-2-4

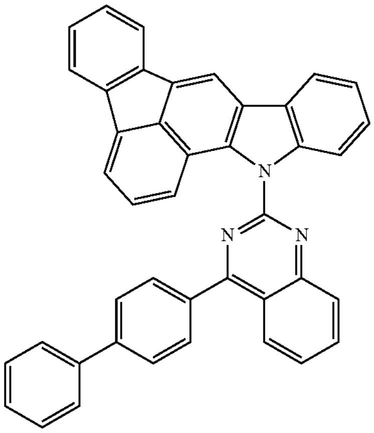

E-2-5

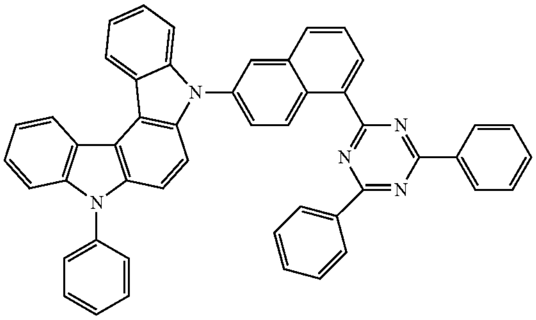

E-2-6

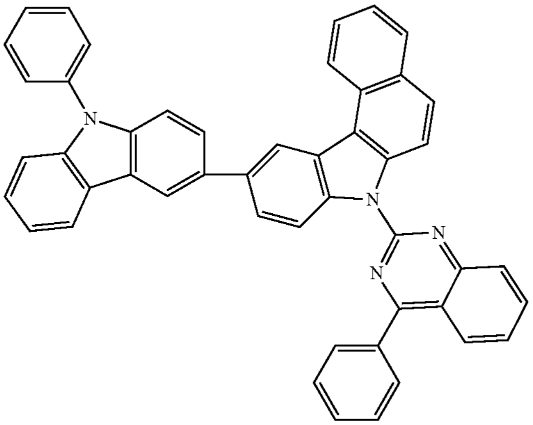

E-2-7
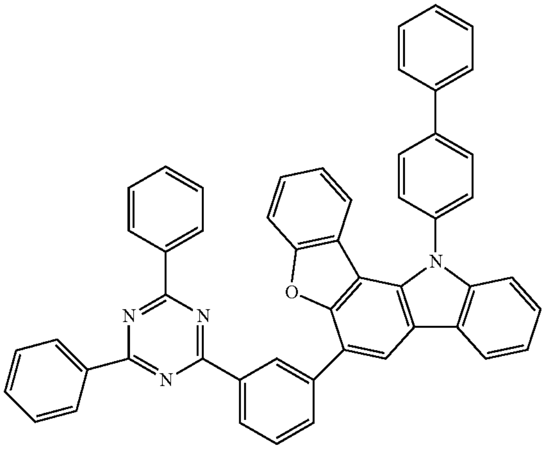
E-2-8
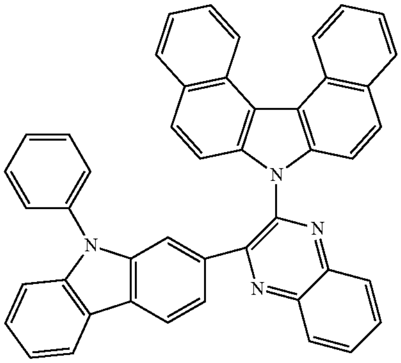
E-2-9
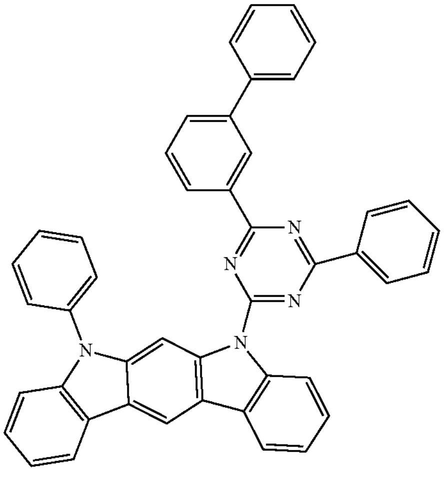
E-2-10
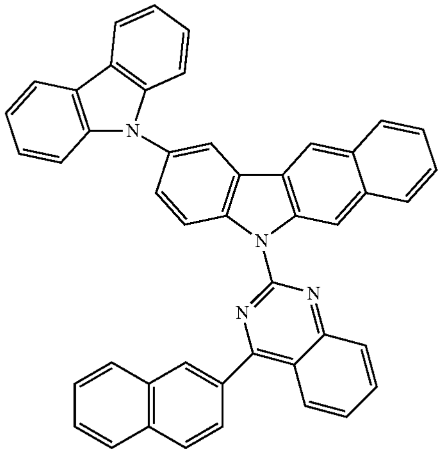
E-2-11
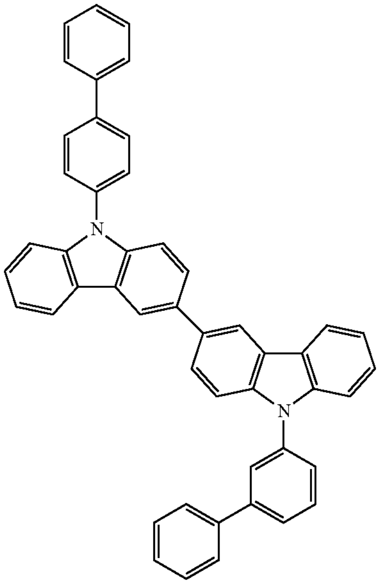
E-2-12
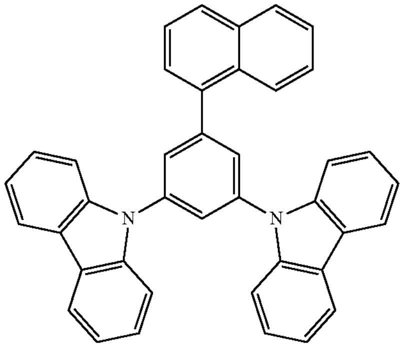

-continued
E-2-13
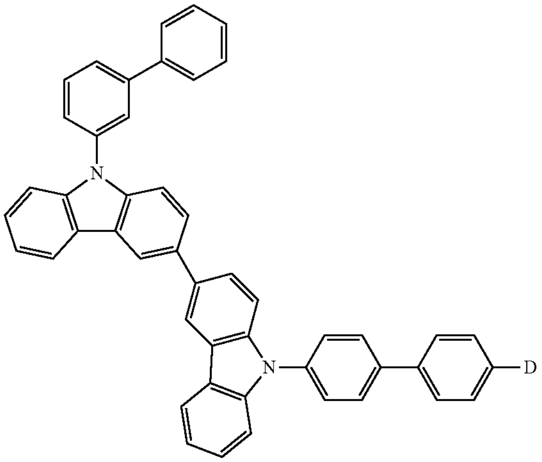
E-2-14
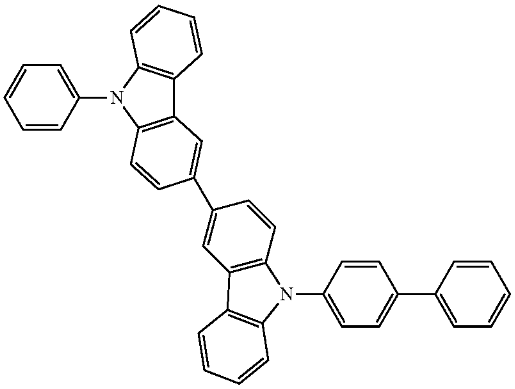
E-2-15
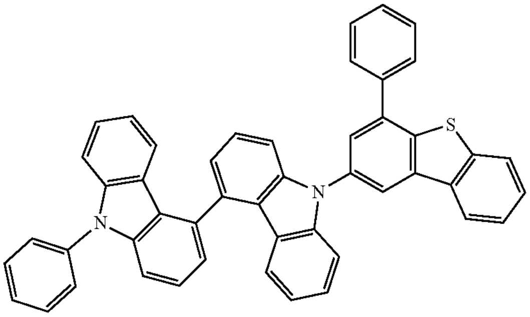
E-2-16
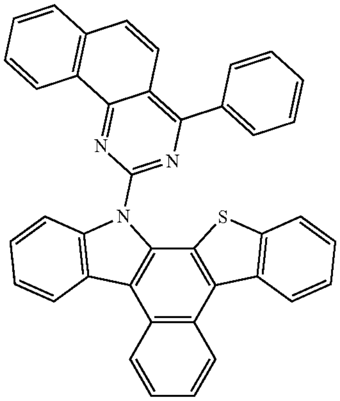
-continued
E-2-17
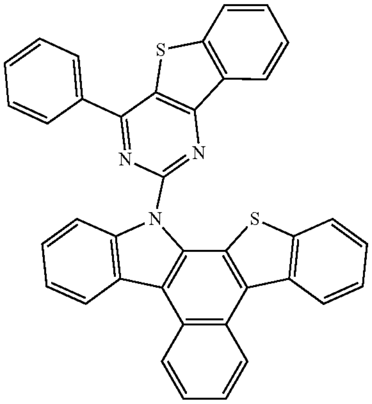
E-2-18
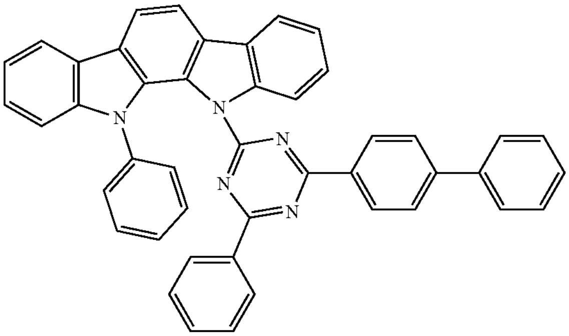
E-2-19
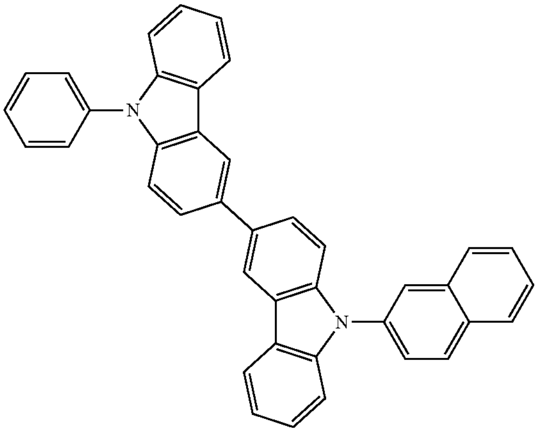
E-2-20
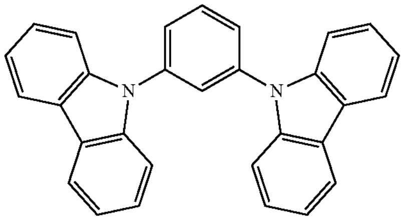

-continued

E-2-21

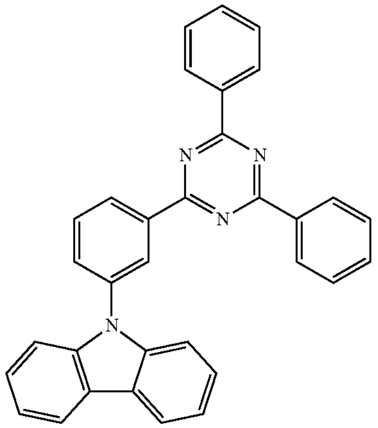

E-2-22

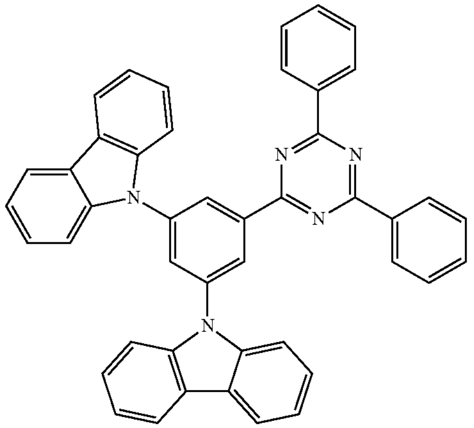

E-2-23

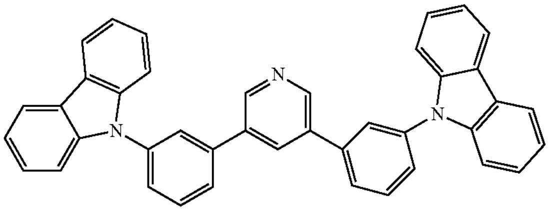

-continued

E-2-24

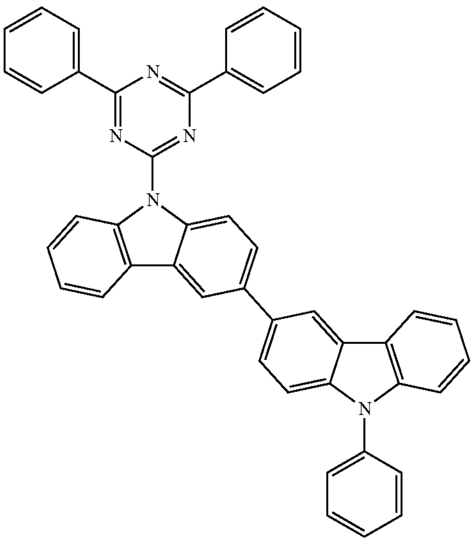

The light emitting layer EML may further include a common material in the art as a host material. For example, the light emitting layer EML may include, as a host material, at least one of bis(4-(9H-carbazol-9-yl) phenyl) diphenylsilane (BCPDS), (4-(1-(4-(diphenylamino) phenyl) cyclohexyl) phenyl) diphenyl-phosphine oxide (POPCPA), bis[2-(diphenylphosphino)phenyl] ether oxide (DPEPO), 4,4'-bis (N-carbazolyl)-1,1'-biphenyl), mCP(1,3-Bis(carbazol-9-yl) benzene (CBP), 2,8-bis(diphenylphosphoryl)dibenzo[b,d] furan (PPF), 4,4',4"-tris(carbazol-9-yl)-triphenylamine (TCTA), or 1,3,5-tris(1-phenyl-1H-benzo[d]imidazole-2-yl) benzene (TPBi). However, embodiments are not limited thereto. For example, tris(8-hydroxyquinolino)aluminum ($Alq_3$), 9,10-di(naphthalene-2-yl)anthracene (ADN), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis (triphenylsilyl)benzene (UGH2), hexaphenylcyclotrisiloxane ($DPSiO_3$), octaphenylcyclotetra siloxane ($DPSiO_4$), and the like may be used as a host material.

The light emitting layer EML may include a compound represented by Formula M-a or Formula M-b. The compound represented by Formula M-a or Formula M-b may be used as a phosphorescent dopant material.

[Formula M-a]

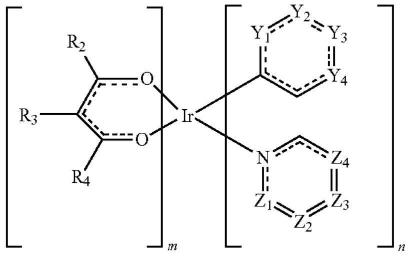

In Formula M-a, $Y_1$ to $Y_4$ and $Z_1$ to $Z_4$ may each independently be $C(R_1)$ or N, and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbons, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In Formula M-a, m may be 0 or 1, and n may be 2 or 3. In Formula M-a, when m is 0, n may be 3, and when m is 1, n may be 2.

The compound represented by Formula M-a may be used as a phosphorescent dopant.

The compound represented by Formula M-a may be any one selected from Compounds M-a1 to M-a25. However, Compounds M-a1 to M-a25 are only examples. The compound represented by Formula M-a is not limited to Compounds M-a1 to M-a25.

M-a1

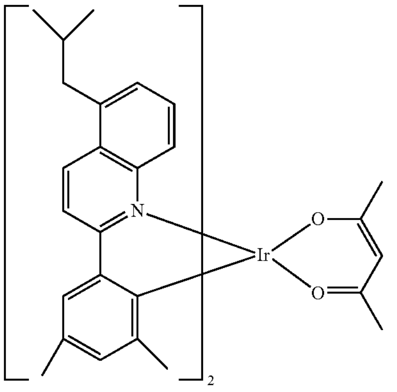

M-a2

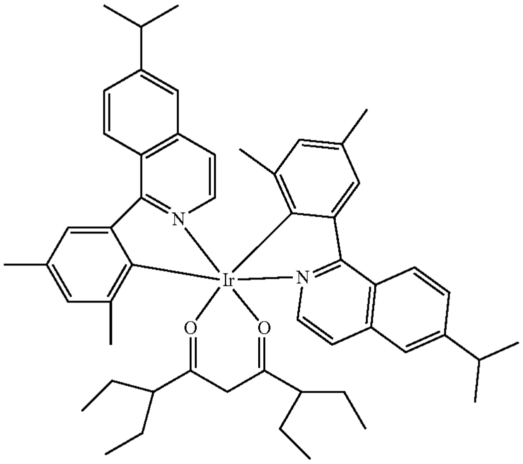

-continued

M-a3

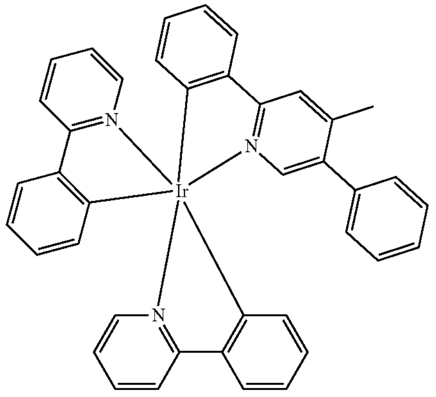

M-a4

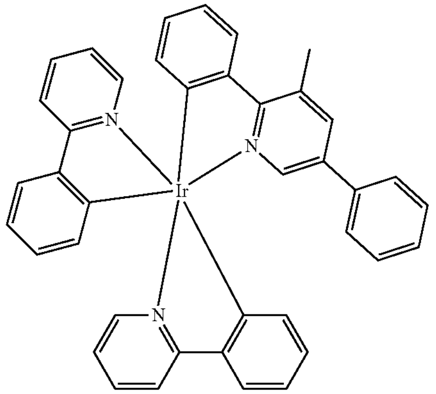

M-a5

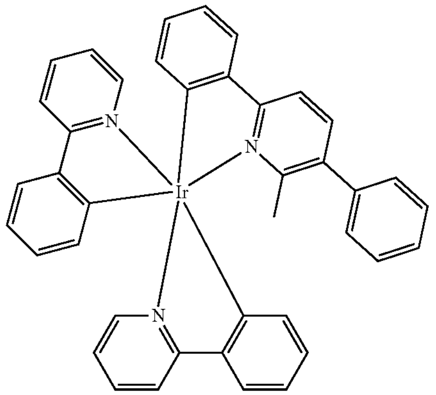

M-a6

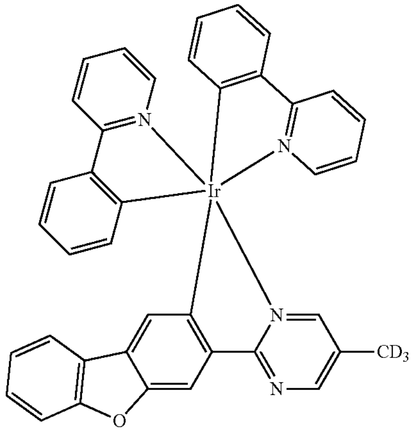

-continued
M-a7
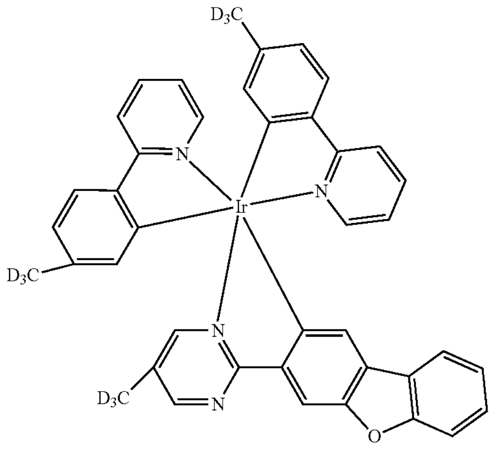
M-a8
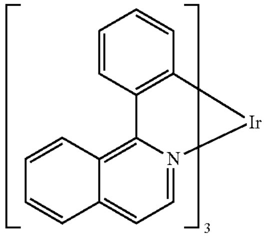
M-a9
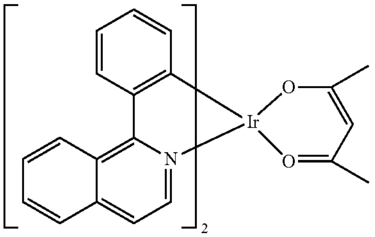
M-a10
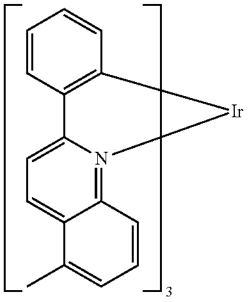
M-a11
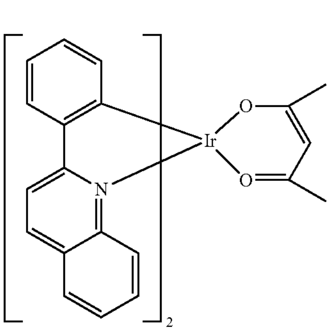
-continued
M-a12
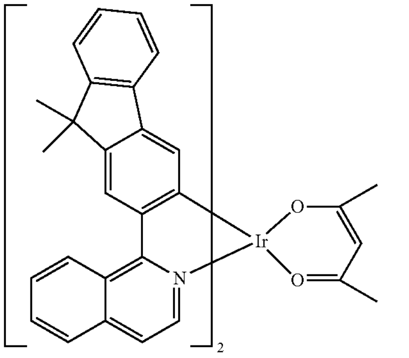
M-a13
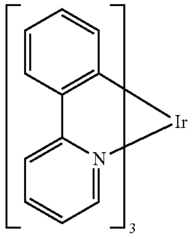
M-a14
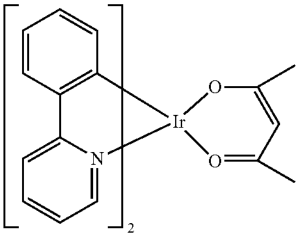
M-a15
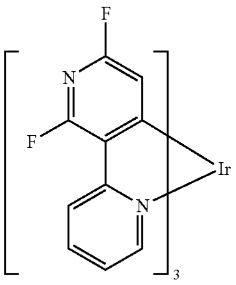
M-a16
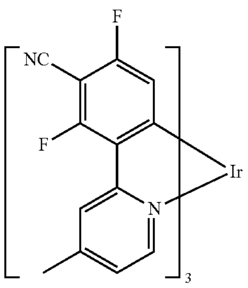

-continued
M-a17
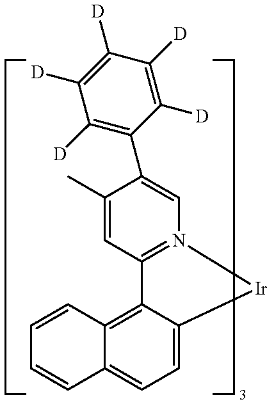
M-a18
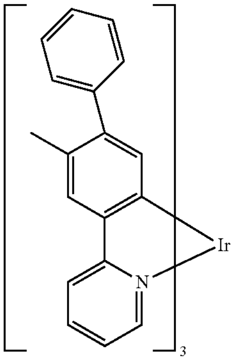
M-a19
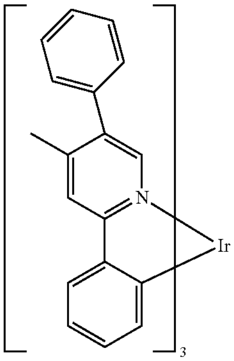
M-a20
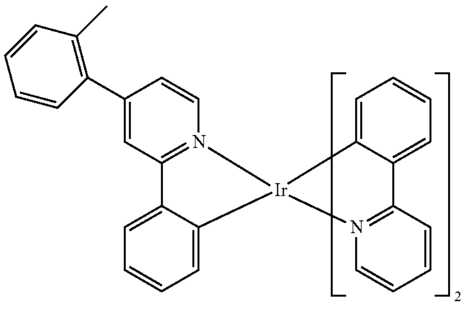
-continued
M-a21
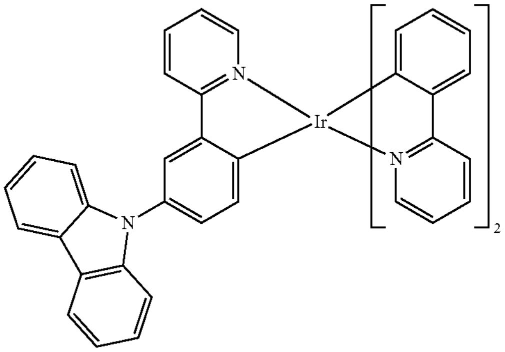
M-a22
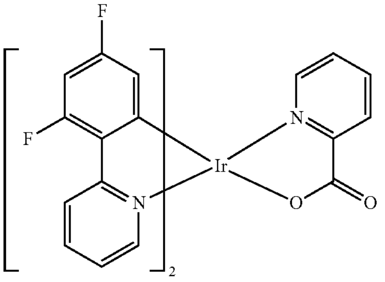
M-a23
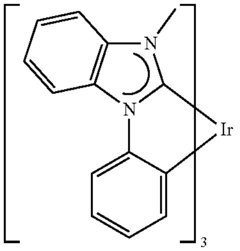
M-a24
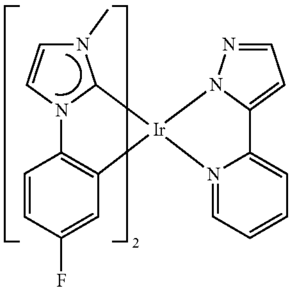
M-a25
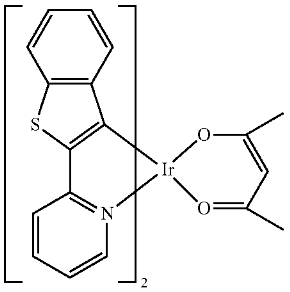
Compound M-a1 and Compound M-a2 may be used as a red dopant material, and Compound M-a3 to Compound M-a7 may be used as a green dopant material.

[Formula M-b]

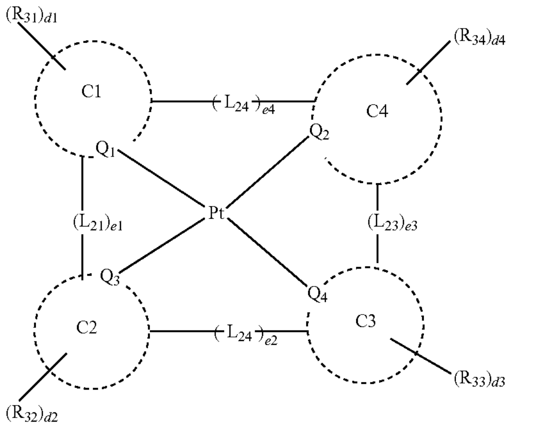

In Formula M-b, $Q_1$ to $Q_4$ may each independently be C or N, and C1 to C4 may each independently be a substituted or unsubstituted hydrocarbon ring having 5 to 30 ring-forming carbon atoms, or a substituted or unsubstituted heterocycle having 2 to 30 ring-forming carbon atoms. In Formula M-b, $L_{21}$ to $L_{24}$ may each independently be a direct linkage,

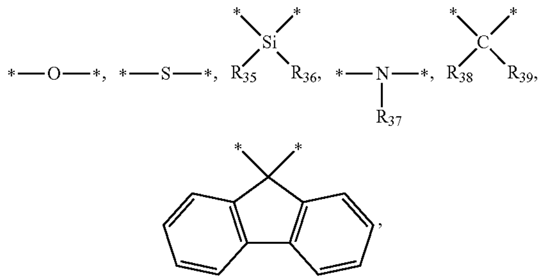

a substituted or unsubstituted alkyl group having 1 to 20 carbons, a substituted or unsubstituted arylene group having 6 to 30 ring-forming carbon atoms, or a substituted or unsubstituted heteroarylene group having 2 to 30 ring-forming carbon atoms, and e1 to e4 may each independently be 0 or 1. In Formula M-b, $R_{31}$ to $R_{39}$ may each independently be a hydrogen atom, a deuterium atom, a halogen atom, a cyano group, a substituted or unsubstituted amine group, a substituted or unsubstituted alkyl group having 1 to 20 carbons, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring, and d1 to d4 may each independently be an integer from 0 to 4.

The compound represented by Formula M-b may be used as a blue phosphorescent dopant or as a green phosphorescent dopant.

The compound represented by Formula M-b may be any one selected from Compound M-b-1 to Compound M-b-12. However, Compounds M-b-1 to M-b-12 are only examples. The compound represented by Formula M-b is not limited to Compounds M-b-1 to M-b-12.

M-b-1

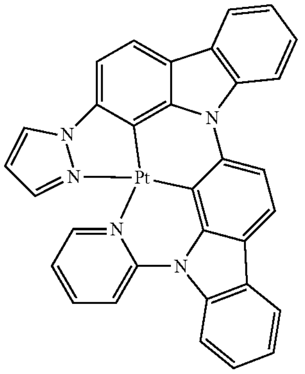

M-b-2

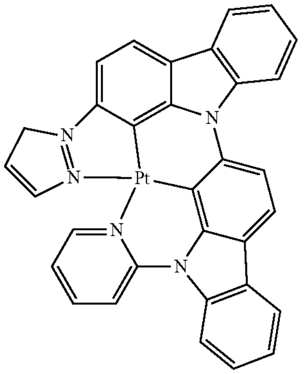

M-b-3

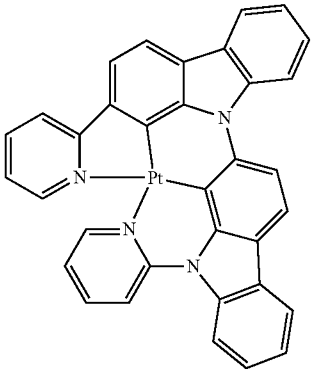

M-b-4

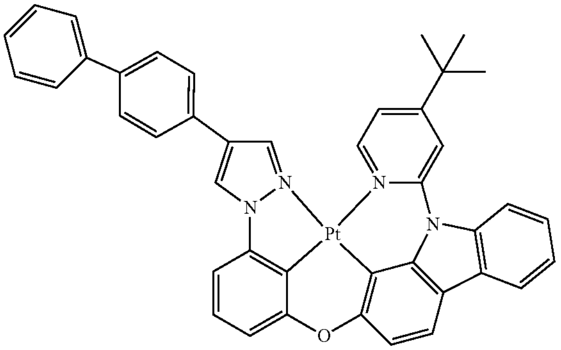

-continued

M-b-5

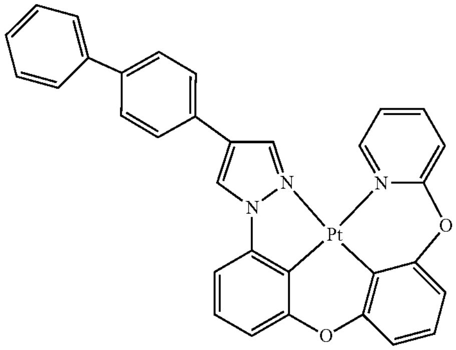

M-b-6

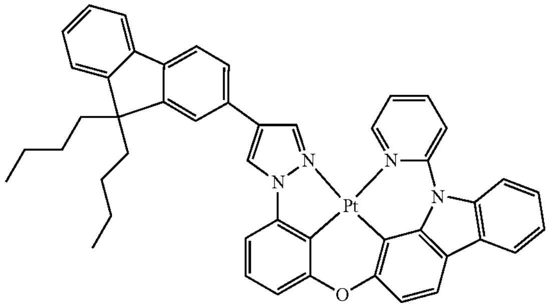

M-b-7

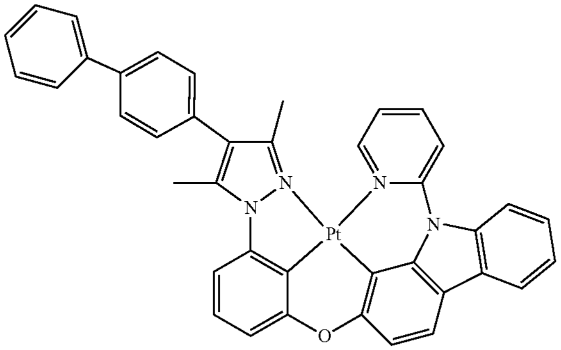

M-b-8

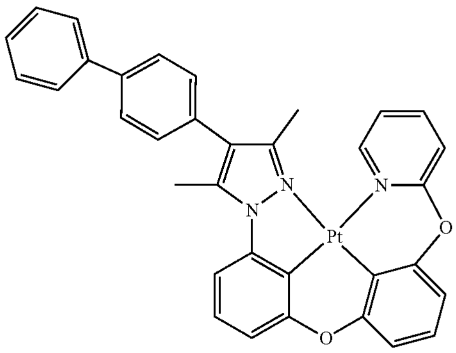

-continued

M-b-9

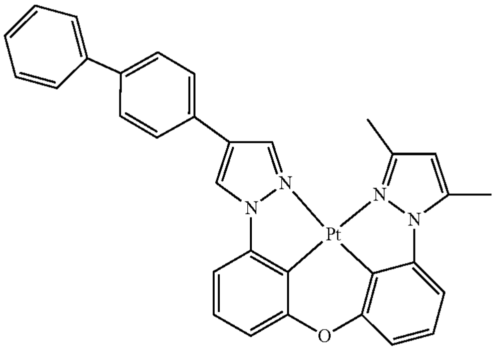

M-b-10

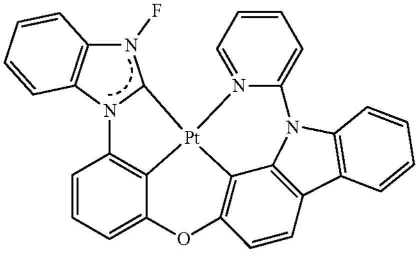

M-b-11

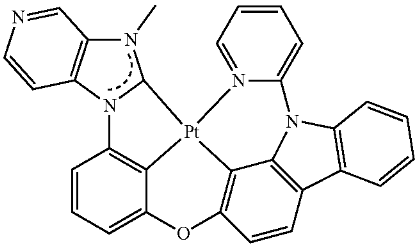

M-b-12

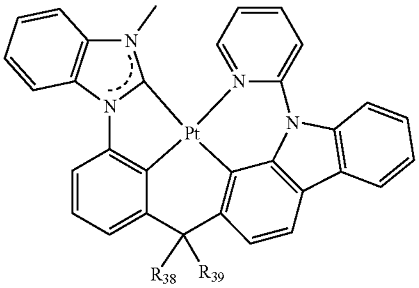

In Compounds M-b-1 to M-b-12, R, $R_{38}$, and $R_{39}$ may each independently be a hydrogen atom, a deuterium atom, a halogen atom, a cyano group, a substituted or unsubstituted amine group, a substituted or unsubstituted alkyl group having 1 to 20 carbons, a substituted or unsubstituted aryl group having 6 to 30 ring-forming carbon atoms, or a substituted or unsubstituted heteroaryl group having 2 to 30 ring-forming carbon atoms.

The light emitting layer EML may include a compound represented by any one of Formula F-a to Formula F-c. The compound represented by Formula F-a to Formula F-c may be used as a fluorescent dopant material.

[Formula F-a]

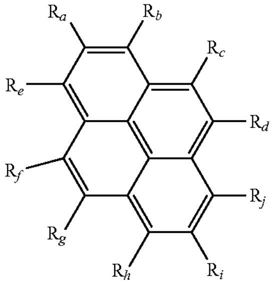

In Formula F-a, two selected from $R_a$ to $R_j$ may each independently be substituted with a group represented by $$*\text{—}NAr_1Ar_2.$$

The remainder of $R_a$ to $R_j$ which are not substituted with the group represented by $$*\text{—}NAr_1Ar_2$$

may each independently be a hydrogen atom, a deuterium atom, a halogen atom, a cyano group, a substituted or unsubstituted amine group, a substituted or unsubstituted alkyl group having 1 to 20 carbons, a substituted or unsubstituted aryl group having 6 to 30 ring-forming carbon atoms, or a substituted or unsubstituted heteroaryl group having 2 to 30 ring-forming carbon atoms.

In the group represented by $$*\text{—}NAr_1Ar_2,$$

$Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. For example, at least one of $Ar_1$ and $Ar_2$ may be a heteroaryl group containing O or S as a ring-forming atom.

[Formula F-b]

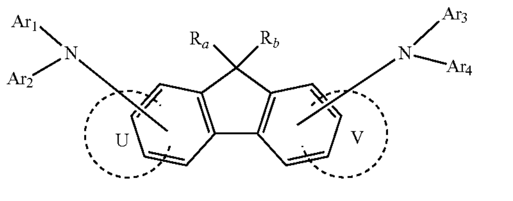

In Formula F-b, $R_a$ and $R_b$ may each independently be a hydrogen atom, a deuterium atom, a substituted or unsubstituted alkyl group having 1 to 20 carbons, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In Formula F-b, U and V may each independently be a substituted or unsubstituted hydrocarbon ring having 5 to 30 ring-forming carbon atoms, or a substituted or unsubstituted heterocycle having 2 to 30 ring-forming carbon atoms.

In Formula F-b, the number of rings represented by U and V may each independently be 0 or 1. For example, in Formula F-b, when the number of U or V is 1, a condensed ring may be present at a portion designated by U or V, and when the number of U or V is 0, a condensed ring may not be present at a portion designated by U or V. When the number of U is 0 and the number of V is 1, or the number of U is 1 and the number of V is 0, a condensed ring having a fluorene core of Formula F-b may be a tetracyclic compound. When the number of U and the number of V are both 0, a condensed ring of Formula F-b may be a tricyclic compound. When the number of U and the number of V are each 1, a condensed ring having a fluorene core of Formula F-b may be a pentacyclic compound.

[Formula F-c]

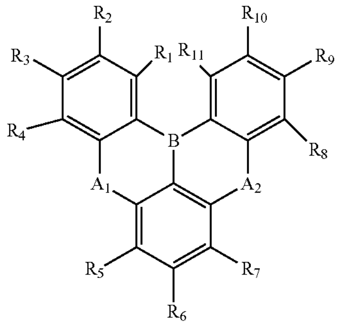

In Formula F-c, $A_1$ and $A_2$ may each independently be O, S, Se, or $N(R_m)$, and $R_m$ may be a hydrogen atom, a deuterium atom, a substituted or unsubstituted alkyl group having 1 to 20 carbons, a substituted or unsubstituted aryl group having 6 to 30 ring-forming carbon atoms, or a substituted or unsubstituted heteroaryl group having 2 to 30 ring-forming carbon atoms. In Formula F-c, $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbons, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In Formula F-c, $A_1$ and $A_2$ may each independently be bonded to substituents of adjacent rings to form a condensed ring. For example, when $A_1$ and $A_2$ are each independently $N(R_m)$, $A_1$ may be bonded to $R_4$ or $R_5$ to form a ring. For example, $A_2$ may be bonded to $R_7$ or $R_8$ to form a ring.

In an embodiment, the light emitting layer EML may include, as a dopant material, a styryl derivative (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalen-2-yl)vinyl)phenyl)-N-phenylbenzenamine (N-BDAVBi), 4,4'-bis[2-(4-(N,N-diphenylamino)phenyl)vinyl]biphenyl (DPAVBi), perylene and a derivative thereof (for example, 2,5,8,11-tetra-t-butylperylene (TBP)), pyrene and a derivative thereof (for example, 1,1-dipyrene, 1,4-dipyrenylbenzene, and 1,4-bis(N, N-diphenylamino) pyrene), and the like.

The light emitting layer EML may include a phosphorescent dopant material. For example, as a phosphorescent dopant, a metal complex including iridium (Ir), platinum (Pt), osmium (Os), gold (Au), titanium (Ti), zirconium (Zr), hafnium (Hf), europium (Eu), terbium (Tb), or thulium (Tm) may be used. For example, iridium(III) bis(4,6-difluorophenylpyridinato-N,C2')picolinate (FIrpic), Bis(2,4-difluorophenylpyridinato)-tetrakis(1-pyrazolyl)borate iridium(III) (Fir6), or platinum octaethyl porphyrin (PtOEP) may be used as the phosphorescent dopant. However, embodiments are not limited thereto.

The light emitting layer EML may include a quantum dot material. The quantum dot may be a Group II-VI compound, a Group III-VI compound, a Group I-III-VI compound, a Group III-V compound, a Group III-II-V compound, a Group I-IV-VI compound, a Group IV element, a Group IV compound, or a combination thereof.

The Group II-VI compound may be a binary compound selected from the group consisting of CdSe, CdTe, CdS, ZnS, ZnSe, ZnTe, ZnO, HgS, HgSe, HgTe, MgSe, MgS, and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof; or any combination thereof.

The Group III-VI compound may be a binary compound such as $In_2S_3$, $In_2Se_3$, and the like; a ternary compound such as $InGaS_3$, $InGaSe_3$, and the like; or any combination thereof.

The Group I-III-VI compound may be a ternary compound selected from the group consisting of AgInS, $AgInS_2$, CuInS, $CuInS_2$, $AgGaS_2$, $CuGaS_2$ $CuGaO_2$, $AgGaO_2$, $AgAlO_2$, and a mixture thereof; a quaternary compound such as $AgInGaS_2$, $CuInGaS_2$, and the like; or any combination thereof.

The Group III-V compound may be a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof; a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof; or any combination thereof. The Group III-V compound may further include a Group II metal. For example, InZnP or the like may be selected as the Group III-II-V compound.

The Group IV-VI compound may be a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixture thereof; a quaternary compound selected from the group consisting of SnPbSSe, SnPbSeTe, SnPbSTe, and a mixture thereof; or any combination thereof. The Group IV element may be selected from the group consisting of Si, Ge, and a mixture thereof. The Group IV compound may be a binary compound selected from the group consisting of SiC, SiGe, and a mixture thereof.

A binary compound, a ternary compound, or a quaternary compound may be present in a particle at a uniform concentration distribution, or may be present in a particle at a partially different concentration. In an embodiment, the quantum dot material may have a core/shell structure in which one quantum dot surrounds another quantum dot. In the core/shell structure, a quantum dot material may have a concentration gradient in which the concentration of an element that is present in the shell decreases toward the center.

In embodiments, a quantum dot may have a core-shell structure including a core including nanocrystals and a shell surrounding the core, as described above. The shell of the quantum dot may be a protection layer that prevents chemical deformation of the core so as to maintain semiconductor properties, and/or may be a charging layer that imparts electrophoretic properties to the quantum dot. The shell may be a single layer or multiple layers. An example of the shell of the quantum dot may include a metal oxide, a non-metal oxide, a semiconductor compound, or a combination thereof.

For example, the metal oxide or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO; or a ternary compound such as $MgAl_2O_4$, $CoFe_2O_4$, $NiFe_2O_4$, and $CoMn_2O_4$. However, embodiments are not limited thereto.

The semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like. However, embodiments are not limited thereto.

The quantum dot may have a full width of half maximum (FWHM) of alight emission wavelength spectrum equal to or less than about 45 nm. For example, the quantum dot may have a FWHM of a light emission wavelength spectrum equal to or less than about 40 nm. For example, the quantum dot may have a FWHM of a light emission wavelength spectrum equal to or less than about 30 nm. Color purity or color reproducibility may be improved in the above ranges. Light emitted through the quantum dot may be emitted in all directions so that a wide viewing angle may be improved.

The form of the quantum dot is not particularly limited as long as it is a form used in the art. For example, a quantum dot may have a spherical shape, a pyramidal shape, a multi-arm shape, or a cubic shape, or the quantum dot may be in the form of nanoparticles, nanotubes, nanowires, nanofibers, nanoparticles, and the like.

The quantum dot may control the color of emitted light according to a particle size thereof. Accordingly, the quantum dot may have various light emitting colors such as blue, red, green, and the like.

In the light emitting device ED of an embodiment illustrated in FIG. 3 to FIG. 6, the electron transport region ETR is provided on the light emitting layer EML. The electron transport region ETR may include at least one of a hole blocking layer HBL, an electron transport layer ETL, or an electron injection layer EIL, but embodiments are not limited thereto.

The electron transport region ETR may be a layer formed of a single material, a layer formed of different materials, or a multi-layered structure having layers formed of different materials.

For example, the electron transport region ETR may have a single-layered structure of an electron injection layer EIL or an electron transport layer ETL, or a single-layered structure formed of an electron injection material and an electron transport material. The electron transport region ETR may be a single layer formed of different materials, or may have a structure in which an electron transport layer ETL/electron injection layer EIL, or a hole blocking layer HBL/electron transport layer ETL/electron injection layer EIL are stacked in its respective stated order from the light emitting layer EML, but embodiments are not limited thereto. A thickness of the electron transport region ETR may be, for example, in a range of about 1,000 Å to about 1,500 Å.

The electron transport region ETR may be formed using various methods such as vacuum deposition, spin coating, casting, Langmuir-Blodgett (LB), inkjet printing, laser printing, and laser induced thermal imaging (LITI).

The electron transport region ETR may include a compound represented by Formula ET-1.

[Formula ET-1]

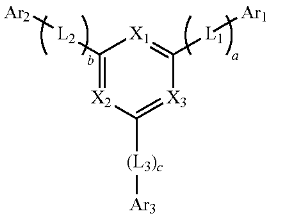

In Formula ET-1, at least one of $X_1$ to $X_3$ may be N, and the remainder of $X_1$ to $X_3$ may be $C(R_a)$. $R_a$ may be a hydrogen atom, a deuterium atom, a substituted or unsubstituted alkyl group having 1 to 20 carbons, a substituted or unsubstituted aryl group having 6 to 30 ring-forming carbon atoms, or a substituted or unsubstituted heteroaryl group having 2 to 30 ring-forming carbon atoms. In Formula ET-1, $Ar_1$ to $Ar_3$ may each independently be a hydrogen atom, a deuterium atom, a substituted or unsubstituted alkyl group having 1 to 20 carbons, a substituted or unsubstituted aryl group having 6 to 30 ring-forming carbon atoms, or a substituted or unsubstituted heteroaryl group having 2 to 30 ring-forming carbon atoms.

In Formula ET-1, a to c may each independently be an integer from 0 to 10. In Formula ET-1, $L_1$ to $L_3$ may each independently be a direct linkage, a substituted or unsubstituted arylene group having 6 to 30 ring-forming carbon atoms, or a substituted or unsubstituted heteroarylene group having 2 to 30 ring-forming carbon atoms. When a to c are each 2 or greater, $L_1$ to $L_3$ may each independently be a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound. However, embodiments are not limited thereto. The electron transport region ETR may include tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate) ($Bebg_2$), 9,10-di(naphthalene-2-yl)anthracene (ADN), 1,3-bis[3,5-di(pyridin-3-yl)phenyl]benzene (BmPyPhB), and a compound thereof.

The electron transport region ETR may include at least one of Compounds ET1 to ET36.

ET1

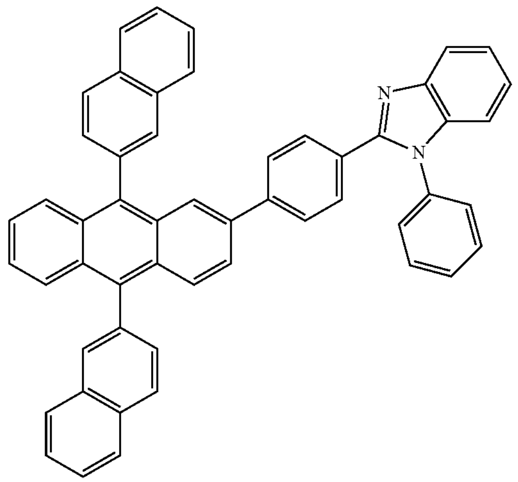

ET2

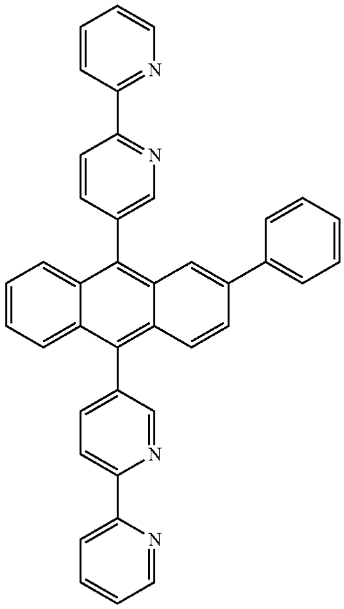

-continued
ET3
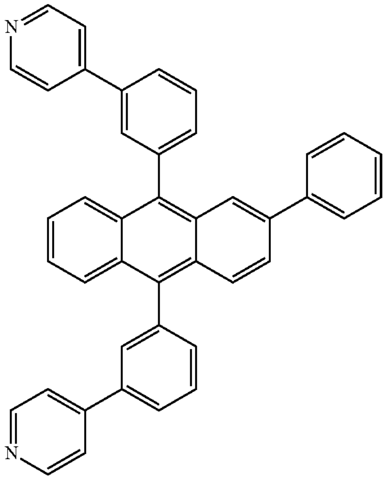
ET4
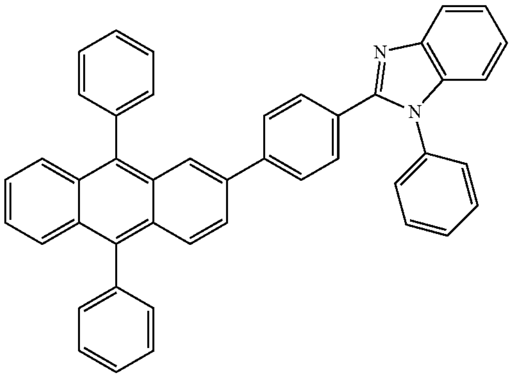
ET5
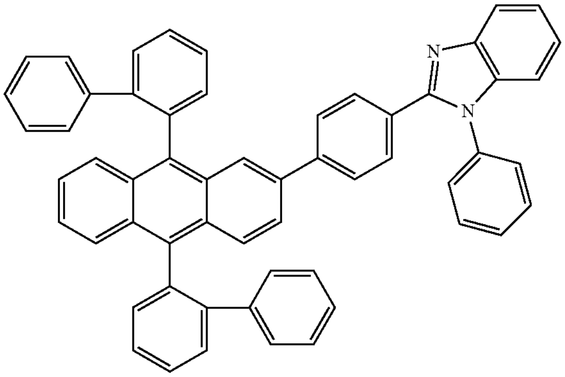
-continued
ET6
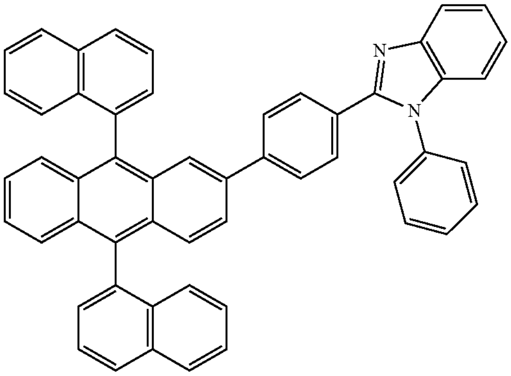
ET7
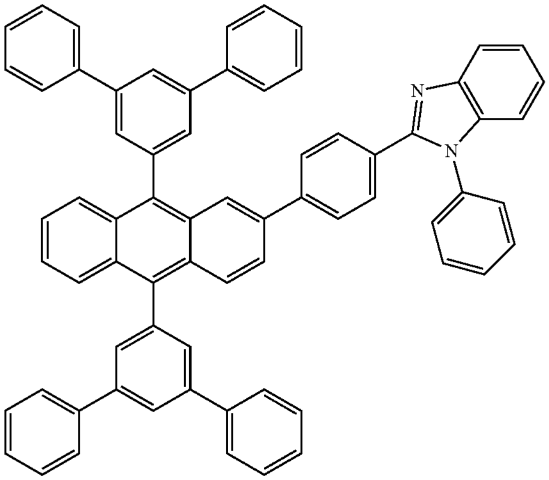
ET8
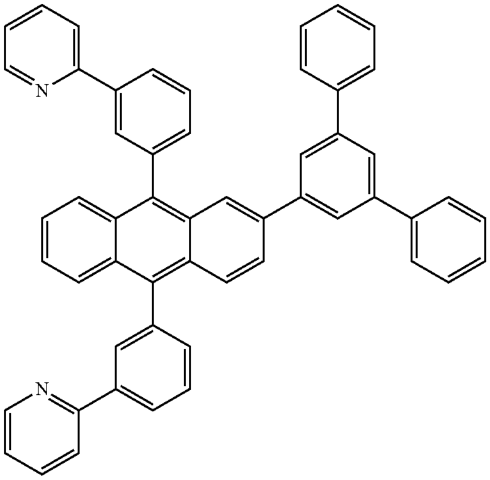

-continued
ET9
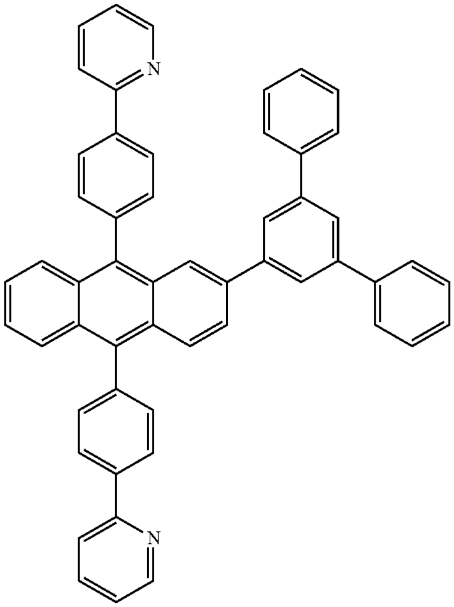
ET10
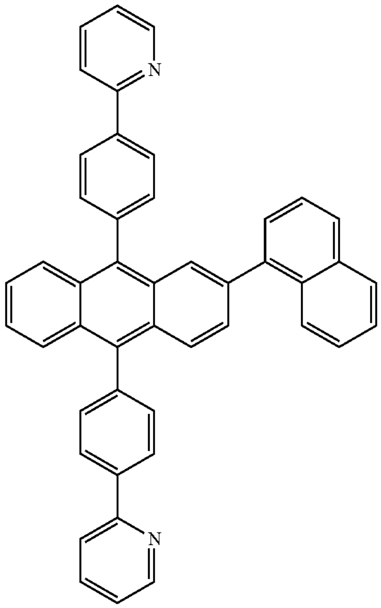
-continued
ET11
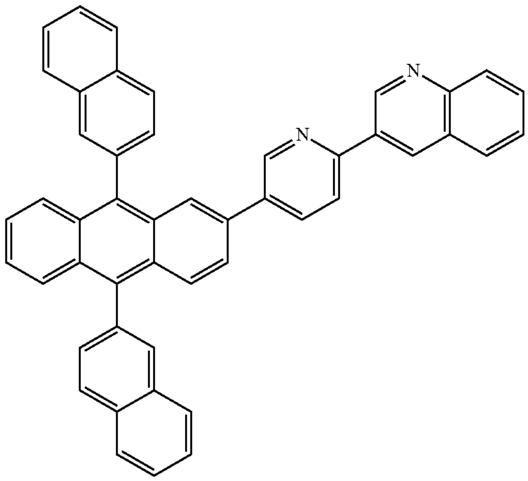
ET12
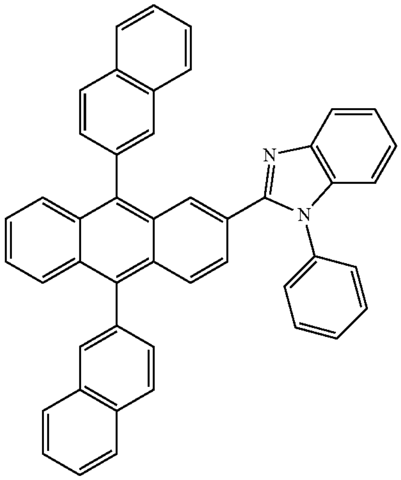
ET13
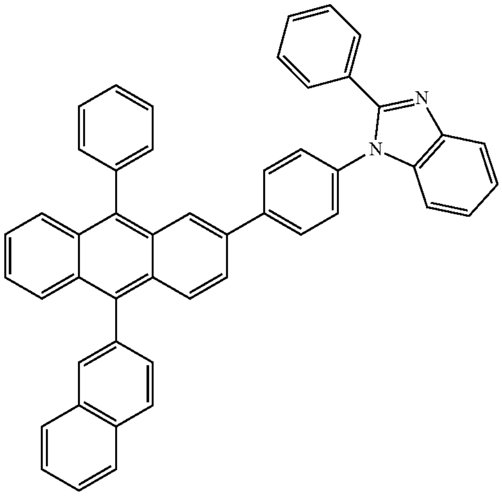

-continued
ET14
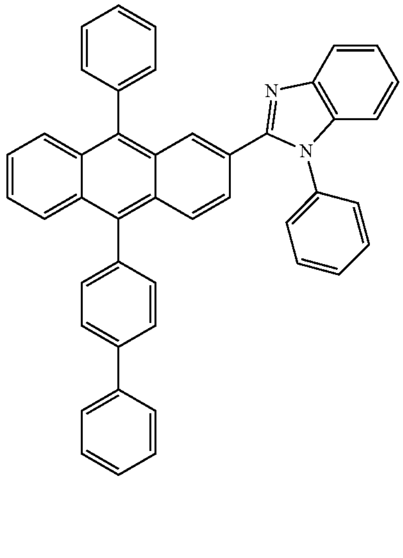
ET15
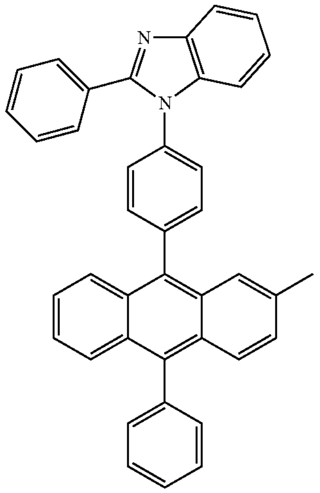
ET16
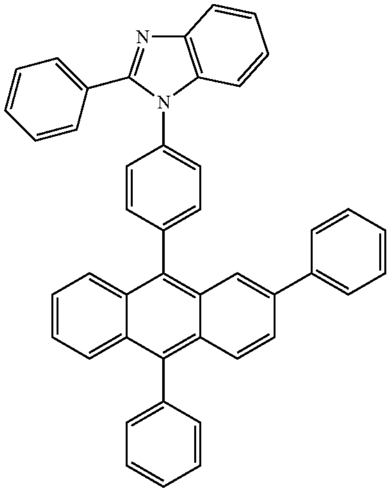
-continued
ET17
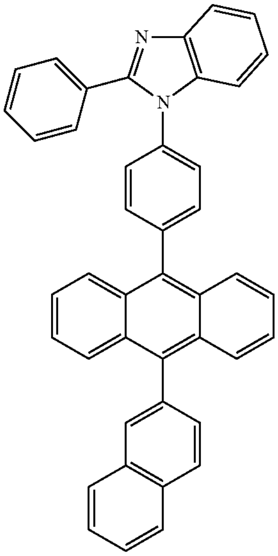
ET18
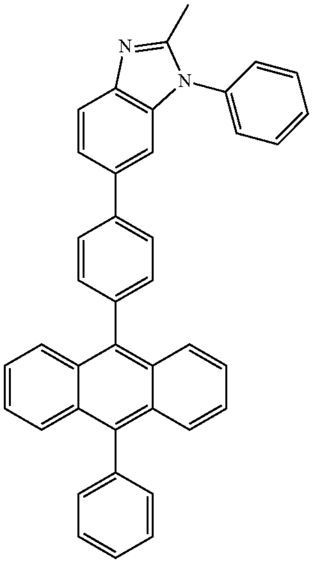
ET19
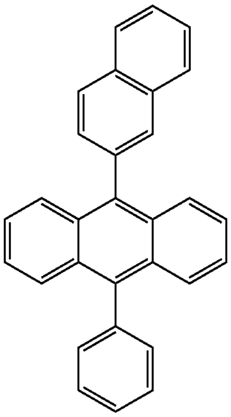

-continued
ET20
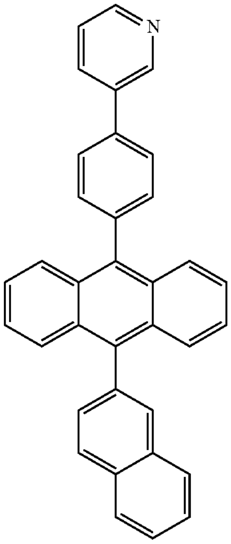
ET21
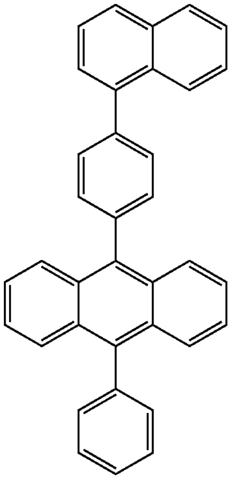
ET22
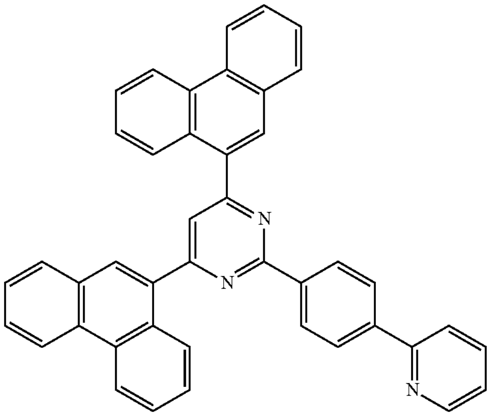
-continued
ET23
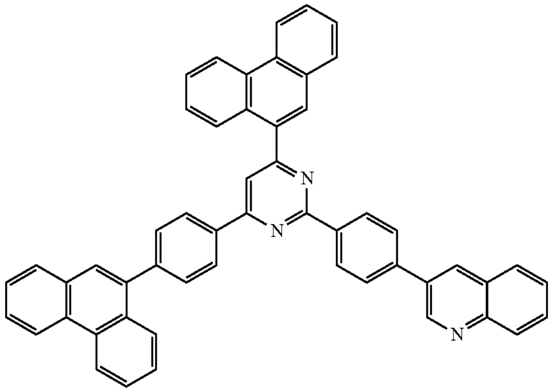
ET24
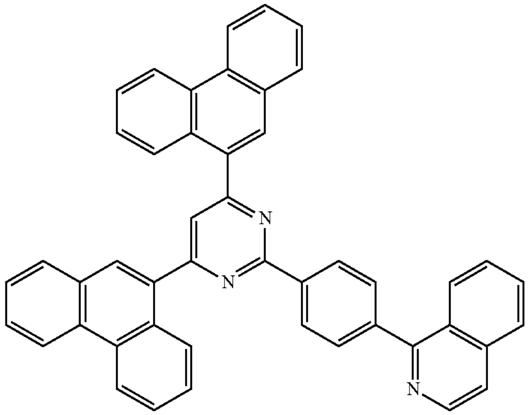
ET25
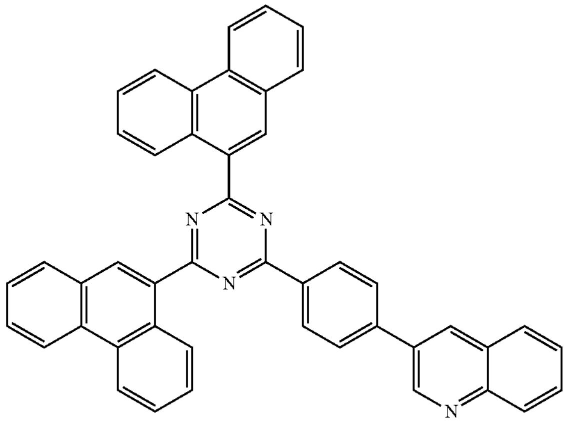

-continued
ET26
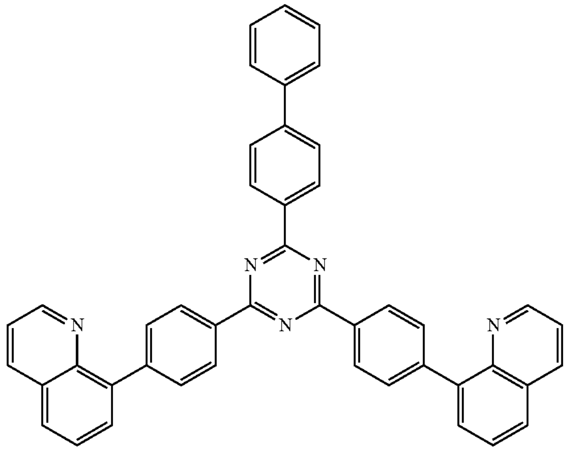
ET27
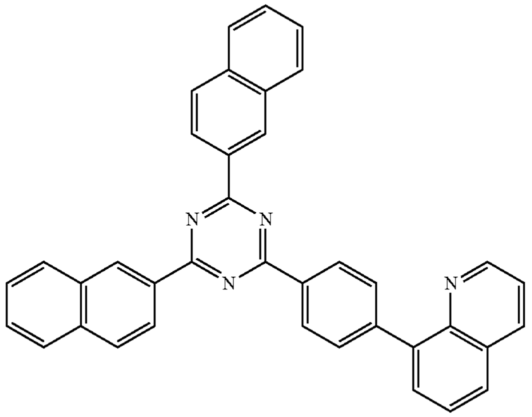
ET28
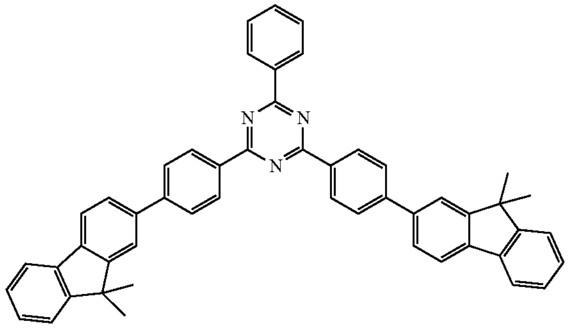
-continued
ET29
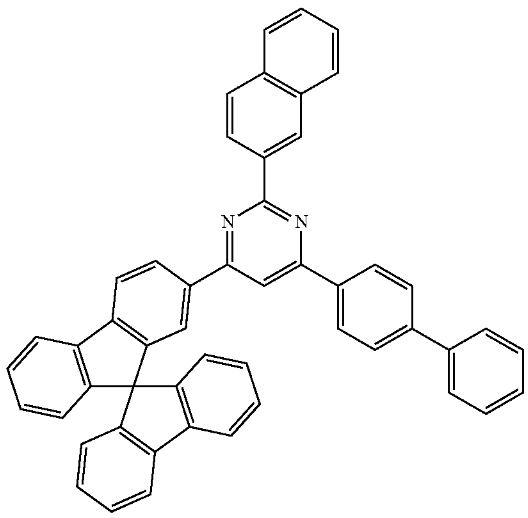
ET30
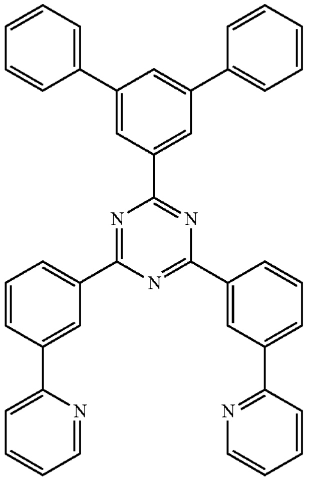
ET31
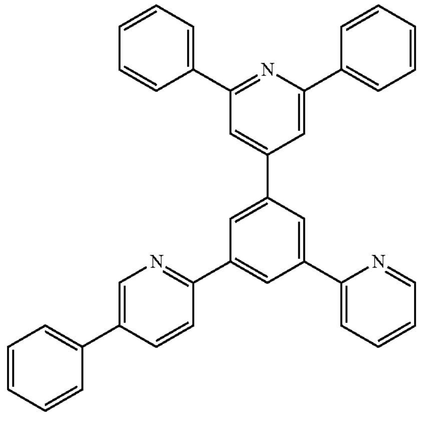

-continued

ET32

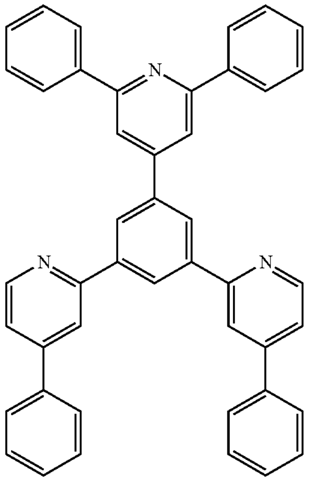

ET33

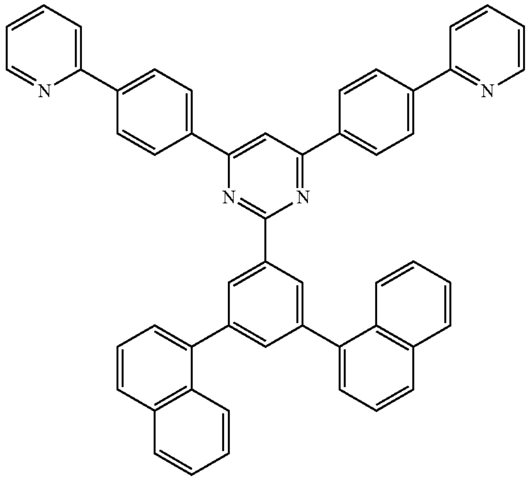

ET34

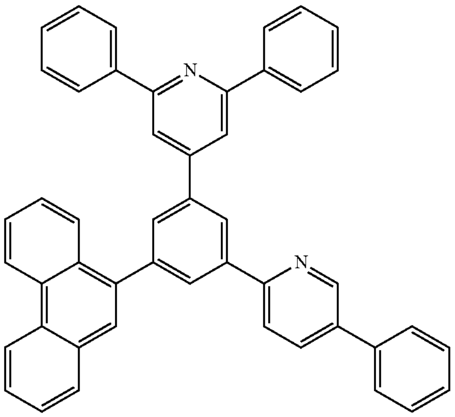

-continued

ET35

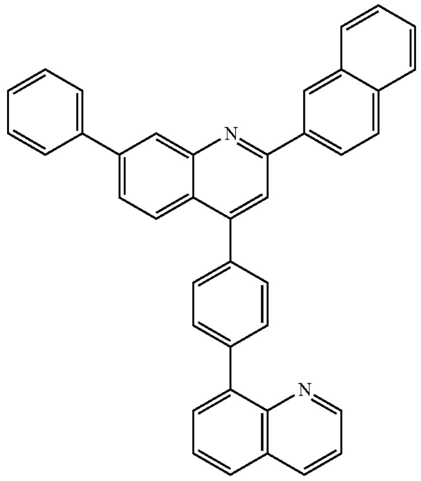

ET36

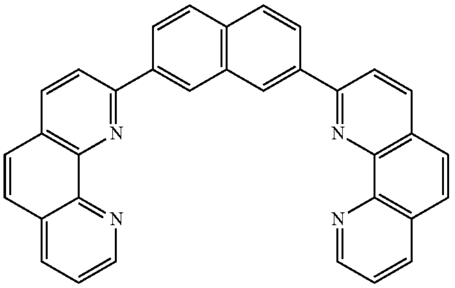

The electron transport region ETR may include a halogenated metal such as LiF, NaCl, CsF, RbCl, RbI, CuI, and KI, a lanthanide such as Yb, or a co-deposition material of the above halogenated metal and the lanthanide. For example, the electron transport region ETR may include KI:Yb, RbI:Yb, and the like as the co-deposition material. The electron transport region ETR may include a metal oxide such as $Li_2O$ and BaO, or 8-hydroxyl-Lithium quinolate (Liq) and the like, but embodiments are not limited thereto. The electron transport region ETR may also be composed of a mixture of an electron transport material and an insulating organo metal salt. The organo metal salt may be a material having an energy band gap equal to or greater than about 4 eV. For example, the organo metal salt may include a metal acetate, a metal benzoate, a metal acetoacetate, a metal acetylacetonate, or a metal stearate.

The electron transport region ETR may further include at least one of 2,9-dimethyl-4,7-diphenyl-1,10-phenanthroline (BCP), diphenyl(4-(triphenylsilyl)phenyl)phosphine oxide (TSPO1), or 4,7-diphenyl-1,10-phenanthroline (Bphen), but embodiments are not limited thereto.

The electron transport region ETR may include the above-described compounds of the electron transport region in at least one of the electron injection layer EIL, the electron transport layer ETL, or the hole blocking layer HBL.

When the electron transport region ETR includes an electron transport layer ETL, a thickness of the electron transport layer ETL may be in a range of about 100 Å to about 1,000 Å. For example, the thickness of the electron transport layer ETL may be in a range of about 150 Å to about 500 Å. When the thickness of the electron transport layer ETL satisfies the above-described range, satisfactory electron transport properties may be obtained without a substantial increase in driving voltage. When the electron transport region ETR includes an electron injection layer EIL, a thickness of the electron injection layer EIL may be in a range of about 1 Å to about 100 Å. For example, the thickness of the electron injection layer EIL may be in a range of about 3 Å to about 90 Å. When the thickness of the electron injection layer EIL satisfies the above-described range, satisfactory electron injection properties may be obtained without a substantial increase in driving voltage.

The second electrode EL2 is provided on the electron transport region ETR. The second electrode EL2 may be a common electrode. The second electrode EL2 may be a cathode or an anode, but embodiments are not limited thereto. For example, when the first electrode EL1 is an anode, the second electrode EL2 may be a cathode, and when the first electrode EL1 is a cathode, the second electrode EL2 may be an anode.

The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), or the like.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, a compound thereof, or a mixture thereof (for example, AgMg, AgYb, or MgAg). In another embodiment, the second electrode EL2 may have a multi-layered structure including a reflective film or a transflective film, each formed of the materials described above, and a transparent conductive film formed of indium tin oxide (ITO), indium zinc oxide (IZO), zinc oxide (ZnO), indium tin zinc oxide (ITZO), or the like. For example, the second electrode EL2 may include any one of the above-described metal materials, a combination of two or more selected from the above-described metal materials, an oxide of any one of the above-described metal materials, or the like.

Although not shown in the drawings, the second electrode EL2 may be electrically connected to an auxiliary electrode. When the second electrode EL2 is electrically connected to the auxiliary electrode, the resistance of the second electrode EL2 may decrease.

In an embodiment, the light emitting device ED may further include a capping layer CPL disposed on the second electrode EL2. The capping layer CPL may be a multilayer or a single layer.

In an embodiment, the capping layer CPL may include an organic layer or an inorganic layer. For example, when the capping layer CPL includes an inorganic substance, the inorganic substance may include an alkaline metal compound such as LiF, an alkaline earth metal compound such as $MgF_2$, SiON, $SiN_X$, SiOy, or the like.

For example, when the capping layer CPL includes an organic substance, the organic substance may include α-NPD, NPB, TPD, m-MTDATA, $Alq_3$, CuPc, N4,N4,N4',N4'-tetra (biphenyl-4-yl)biphenyl-4,4'-diamine (TPD15), 4,4',4"-Tris(carbazol sol-9-yl)triphenylamine (TCTA), and the like, or may include an epoxy resin, or an acrylate such as a methacrylate. However, embodiments are not limited thereto. The capping layer CPL may include at least one of Compounds P1 to P5, but embodiments are not limited thereto.

P1

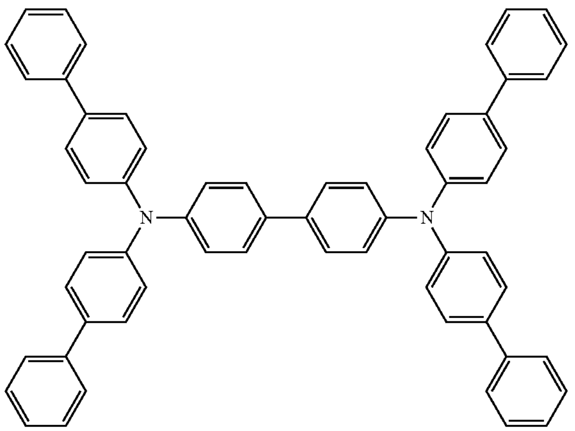

P2

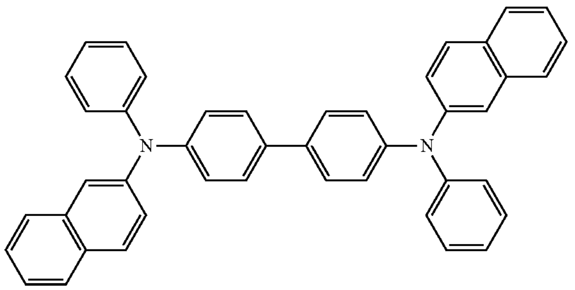

P3

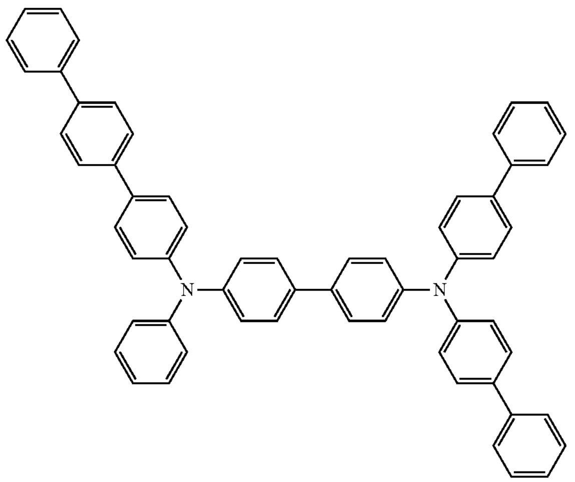

P4

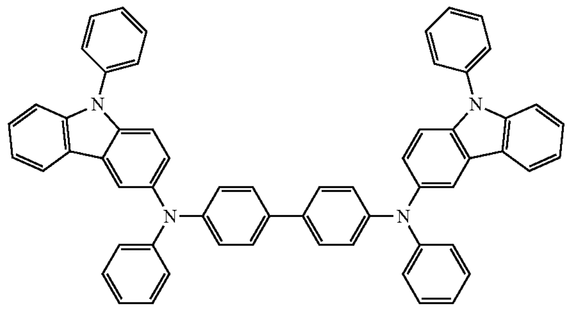

-continued

P5

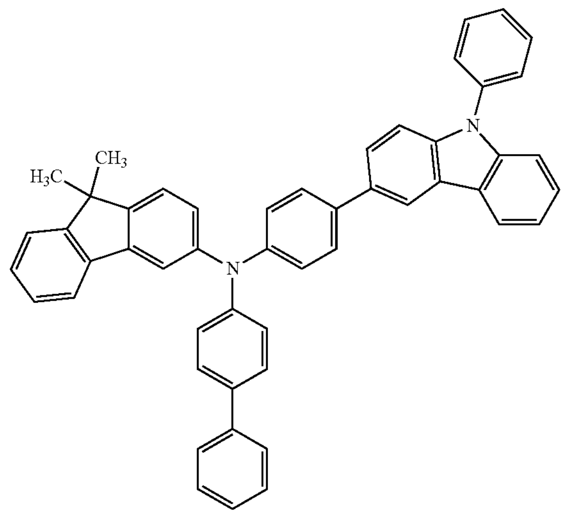

A refractive index of the capping layer CPL may be equal to or greater than about 1.6. For example, the refractive index of the capping layer CPL may be equal to or greater than about 1.6 with respect to light in a wavelength range of about 550 nm to about 660 nm.

Figure 8:
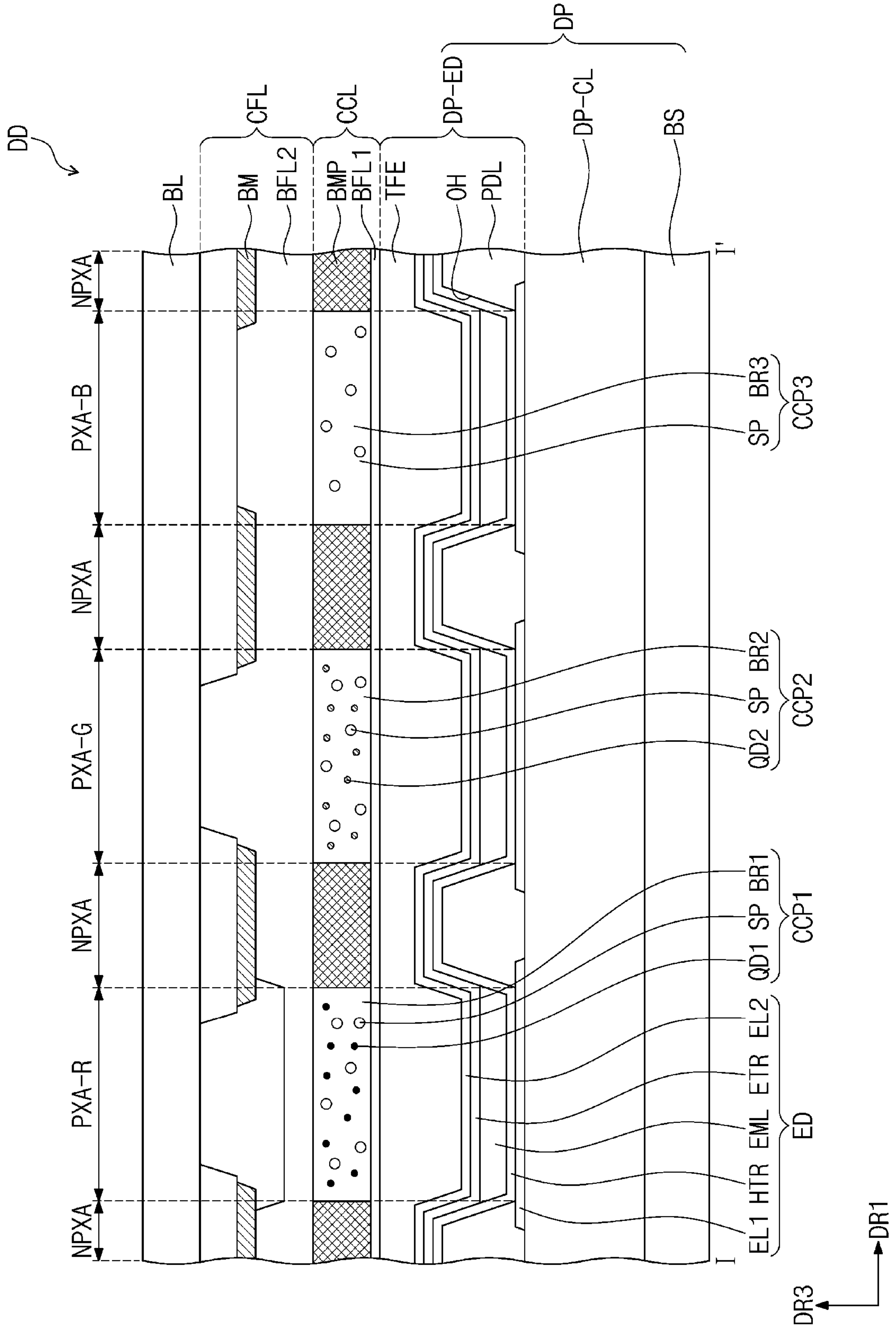
FIG. 8 is a schematic cross-sectional view of a display device according to an embodiment.
Figure 9:
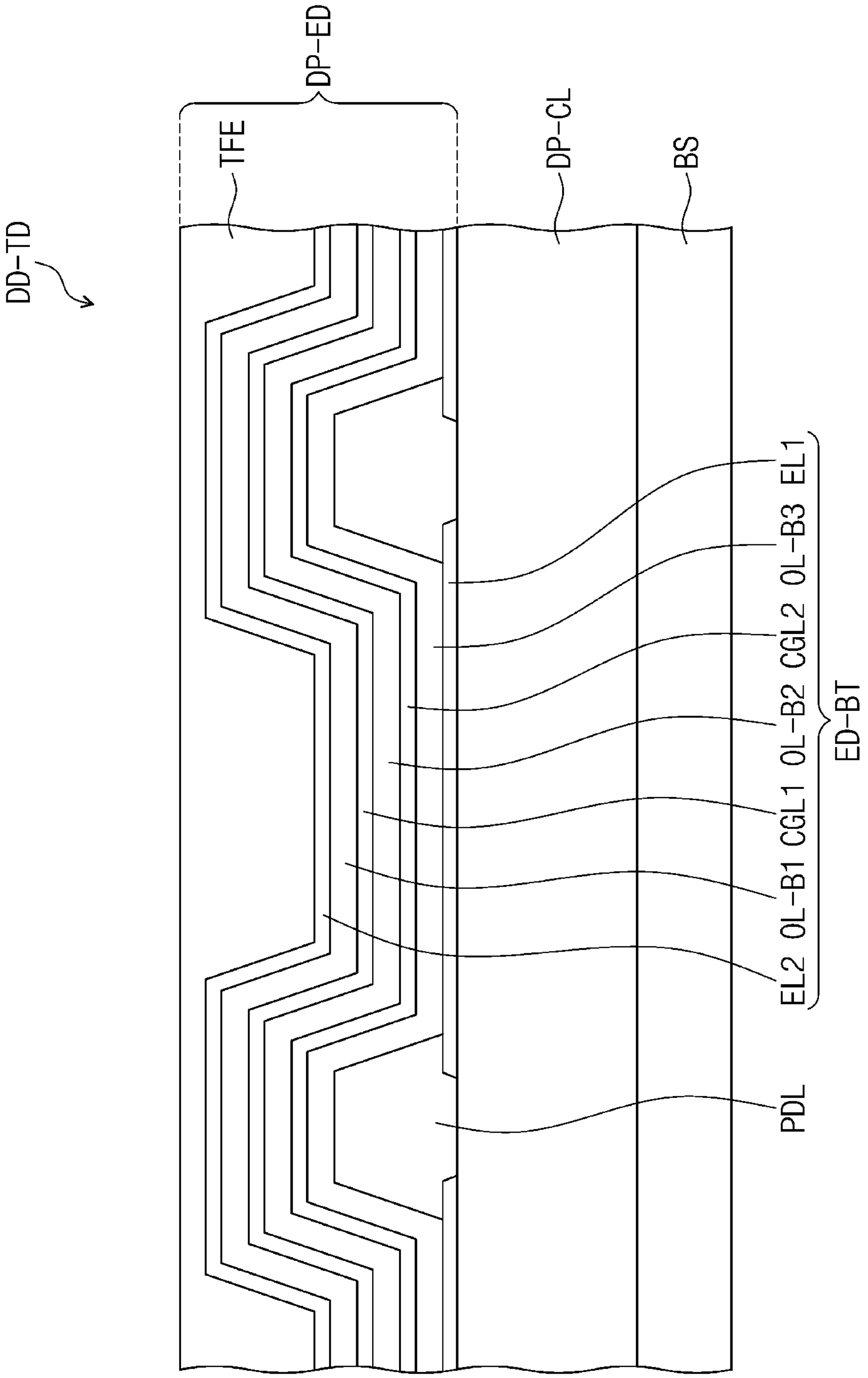
FIG. 9 is a schematic cross-sectional view of a display device according to an embodiment.

FIG. 8 and FIG. 9 are each a schematic cross-sectional view of a display device according to an embodiment. Hereinafter, in a description of a display device of an embodiment to be provided with reference to FIG. 8 and FIG. 9, the same contents as those described above with reference to FIG. 1 to FIG. 7 will not be repeated. Instead, the description will focus on the differing features.

Referring to FIG. 8, a display device DD according to an embodiment may include a display panel DP having a display element layer DP-ED, a light control layer CCL disposed on the display panel DP, and a color filter layer CFL.

Referring to FIG. 8, the display panel DP may include a base layer BS, a circuit layer DP-CL provided on the base layer BS, and a display element layer DP-ED, and the display element layer DP-ED may include a light emitting device ED.

The light emitting element ED may include a first electrode EL1, a hole transport region HTR disposed on the first electrode EL1, a light emitting layer EML disposed on the hole transport region HTR, an electron transport region ETR disposed on the light emitting layer EML, and a second electrode EL2 disposed on the electron transport region ETR. A structure of a light emitting device according to FIG. 3 to FIG. 6 as described above may be applied to the structure of the light emitting device ED illustrated in FIG. 8.

Referring to FIG. 8, the light emitting layer EML may be disposed in openings OH defined in a pixel definition layer PDL. For example, the light emitting layer EML which is divided by the pixel definition layer PDL and correspondingly provided to each of the light emitting regions PXA-R, PXA-G, and PXA-B may emit light in a same wavelength region. In the display device DD of an embodiment, the light emitting layer EML may emit blue light. Although not shown in the drawings, in an embodiment, the light emitting layer EML may be provided as a common layer to all of the light emitting regions PXA-R, PXA-G, and PXA-B.

The light control layer CCL may be disposed on the display panel DP. The light control layer CCL may include a light converting body. The light converting body may include a quantum dot, a fluorescent body, or the like. The light converting body may convert the wavelength of a provided light and may emit the converted light. For example, the light control layer CCL may be a layer including a quantum dot, or a layer including a fluorescent body.

The light control layer CCL may include light control units CCP1, CCP2, and CCP3. The light control units CCP1, CCP2, and CCP3 may be spaced apart from each other.

Referring to FIG. 8, a dividing pattern BMP may be disposed between the light control units CCP1, CCP2, and CCP3, which are spaced apart from each other, but embodiments are not limited thereto. In FIG. 8, the dividing pattern BMP is illustrated as not overlapping the light control units CCP1, CCP2, and CCP3, but edges of the light control units CCP1, CCP2, and CCP3 may overlap at least a portion of the dividing pattern BMP.

The light control layer CCL may include a first light control unit CCP1 including a first quantum dot QD1 that converts a first color light provided from the light emitting device ED to a second color light, a second light control unit CCP2 including a second quantum dot QD2 that converts the first color light to a third color light, and a third light control unit CCP3 that transmits the first color light.

In an embodiment, the first light control unit CCP1 may provide red light, which is the second color light, and the second light control unit CCP2 may provide green light, which is the third color light. The third light control unit CCP3 may transmit and provide blue light, which is the first color light provided from the light emitting device ED. For example, the first quantum dot QD1 may be a red quantum dot, and the second quantum dot QD2 may be a green quantum dot. The same descriptions as provided above with respect to quantum dots may be applied to the quantum dots QD1 and QD2.

The light control layer CCL may further include a scattering body SP. The first light control unit CCP1 may include the first quantum dot QD1 and the scattering body SP, the second light control unit CCP2 may include the second quantum dot QD2 and the scattering body SP, and the third light control unit CCP3 may not include a quantum dot but may include the scattering body SP.

The scattering body SP may be an inorganic particle. For example, the scattering body SP may include at least one of $TiO_2$, ZnO, $Al_2O_3$, $SiO_2$, or hollow silica. The scattering body SP may include any one of $TiO_2$, ZnO, $Al_2O_3$, $SiO_2$, and hollow silica, or may be a mixture of two or more materials selected from $TiO_2$, ZnO, $Al_2O_3$, $SiO_2$, and hollow silica.

The first light control unit CCP1, the second light control unit CCP2, and the third light control unit CCP3 may each include base resins BR1, BR2, and BR3, which disperse the quantum dots QD1 and QD2 and the scattering body SP. In an embodiment, the first light control unit CCP1 may include the first quantum dot QD1 and the scattering body SP dispersed in a first base resin BR1, the second light control unit CCP2 may include the second quantum dot QD2 and the scattering body SP dispersed in a second base resin BR2, and the third light control unit CCP3 may include the scattering body SP dispersed in a third base resin BR3. The base resins BR1, BR2, and BR3 may each be a medium in which the quantum dots QD1 and QD2 and the scattering body SP are dispersed, and may be formed of various resin compositions which may be generally referred to as a binder. For example, the base resins BR1, BR2, and BR3 may each independently be an acrylic resin, a urethane-based resin, a silicone-based resin, an epoxy resin, or the like. The base resins BR1, BR2, and BR3 may each be a transparent resin. In an embodiment, the first base resin BR1, the second base resin BR2, and the third base resin BR3 may be the same as or different from each other.

The light control layer CCL may include a barrier layer BFL1. The barrier layer BFL1 may prevent penetration of moisture and/or oxygen (hereinafter, referred to as 'moisture/oxygen'). The barrier layer BFL1 may be disposed on the light control units CCP1, CCP2, and CCP3 and may block the light control units CCP1, CCP2, CCP3 from being exposed to moisture/oxygen. The barrier layer BFL1 may cover the light control units CCP1, CCP2, and CCP3. A barrier layer BFL2 may be provided between the light control units CCP1, CCP2, CCP3 and the color filter layer CFL.

The barrier layers BFL1 and BFL2 may each include at least one inorganic layer. For example, the barrier layers BFL1 and BFL2 may each be formed by including an inorganic material. For example, the barrier layers BFL1 and BFL2 may be formed by including silicon nitride, aluminum nitride, zirconium nitride, titanium nitride, hafnium nitride, tantalum nitride, silicon oxide, aluminum oxide, titanium oxide, tin oxide, cerium oxide and silicon oxynitride, or a thin metal film having light transmittance, and the like. The barrier layers BFL1 and BFL2 may further include an organic film. The barrier layers BFL1 and BFL2 may be formed of a single layer or of multiple layers.

In the display device DD of an embodiment, the color filter layer CFL may be disposed on the light control layer CCL. In an embodiment, the color filter layer CFL may be directly disposed on the light control layer CCL. For example, the barrier layer BFL2 may be omitted.

The color filter layer CFL may include alight blocking part BM and filters CF1, CF2, and CF3. The color filter layer CFL may include a first filter CF1 that transmits the second color light, a second filter CF2 that transmits the third color light, and a third filter CF3 that transmits the first color light. For example, the first filter CF may be a red filter, the second filter CF2 may be a green filter, and the third filter CF3 may be a blue filter. Each of the filters CF1, CF2, and CF3 may include a polymer photosensitive resin and a pigment or a dye. The first filter CF1 may include a red pigment or a red dye, the second filter CF2 may include a green pigment or a green dye, and the third filter CF3 may include a blue pigment or a blue dye. However, embodiments are not limited thereto. The third filter CF3 may not include a pigment or a dye. The third filter CF3 may include a polymer photosensitive resin but may not include a pigment or a dye. The third filter CF3 may be transparent. The third filter CF3 may be formed of a transparent photosensitive resin.

In an embodiment, the first filter CF1 and the second filter CF2 may each be a yellow filter. The first filter CF1 and the second filter CF2 may be provided as one body without being distinguished from each other.

The light blocking part BM may be a black matrix. The light blocking part BM may include an organic light blocking material or an inorganic light blocking material, each including a black pigment or a black dye. The light blocking part BM may prevent light leakage and may distinguish boundaries between adjacent filters CF1, CF2, and CF3. In an embodiment, the light blocking part BM may be formed of a blue filter.

The first to third filters CF1, CF2, and CF3 may be disposed corresponding to a red light emitting region PXA-R, a green light emitting region PXA-G, and a blue light emitting region PXA-B, respectively.

A base substrate BL may be disposed on the color filter layer CFL. The base substrate BL may provide a base surface on which the color filter layer CFL, the light control layer CCL, and the like are disposed. The base substrate BL may be a glass substrate, a metal substrate, a plastic substrate, and the like. However, embodiments are not limited thereto, and the base substrate BL may include an inorganic layer, an organic layer, or a composite material layer. Although not shown in the drawings, in an embodiment, the base substrate BL may be omitted.

FIG. 9 is a schematic cross-sectional view showing a portion of a display device according to an embodiment. FIG. 9 illustrates a schematic cross-sectional view of a portion corresponding to the display panel DP of FIG. 8. In a display device DD-TD of an embodiment, a light emitting device ED-BT may include light emitting structures OL-B1, OL-B2, and OL-B3. The light emitting device ED-BT may include a first electrode EL1 and a second electrode EL2 facing each other, and the light emitting structures OL-B1, OL-B2, and OL-B3 stacked in a thickness direction and provided between the first electrode EL1 and the second electrode EL2. Each of the light emitting structures OL-B1, OL-B2, and OL-B3 may include a hole transport region HTR and an electron transport region ETR disposed with the light emitting layer EML (see FIG. 8) interposed therebetween.

For example, the light emitting device ED-BT included in the display device DD-TD of an embodiment may be a light emitting device having a tandem structure and including multiple light emitting layers.

In an embodiment illustrated in FIG. 9, light emitted from each of the light emitting structures OL-B1, OL-B2, and OL-B3 may all be blue light. However, embodiments are not limited thereto. The wavelength region of light emitted from each of the light emitting structures OL-B1, OL-B2, and OL-B3 may be different from each other. For example, the light emitting device ED-BT including light emitting structures OL-B1, OL-B2, and OL-B3 emitting light of different wavelength regions may emit white light.

Charge generating layers CGL1 and CGL2 may be disposed between adjacent light emitting structures OL-B1, OL-B2, and OL-B3. The charge generating layers CGL1 and CGL2 may each independently include a p-type charge generating layer and/or an n-type charge generating layer.

Hereinafter, referring to the Examples and the Comparative Examples, a polycyclic compound according to an embodiment and a light emitting device of an embodiment will be described in detail. The Examples are for illustrative purposes only to facilitate the understanding of disclosure, and thus, the scope of the disclosure is not limited thereto.

Examples

1. Synthesis of Polycyclic Compound

A method for synthesizing a polycyclic compound according to an embodiment will be described in detail with reference to a method for synthesizing Compound 2, Compound 18, Compound 26, Compound 45, Compound 56, and Compound 72 of Compound Group 1. The method for synthesizing a polycyclic compound described below is only an example, and the method for synthesizing a polycyclic compound according to an embodiment is not limited to the following example.

<Synthesis of Compound 2>

Compound 2 according to an embodiment may be synthesized, for example, by the steps of Reaction Formula 1.

[Reaction Formula 1]

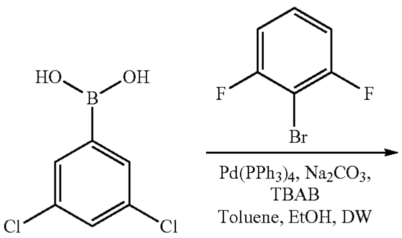

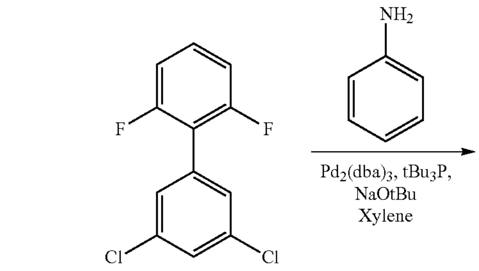

2-1

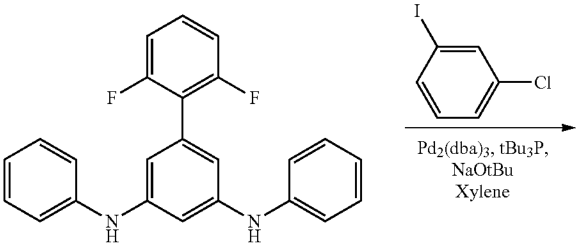

2-2

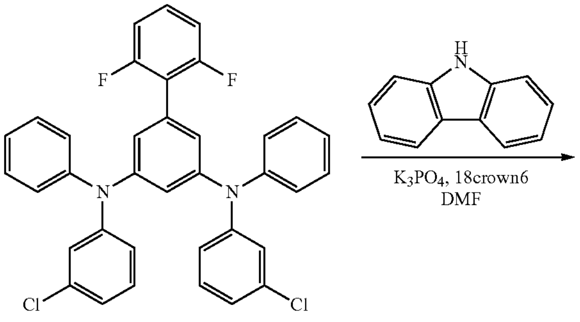

2-3

-continued

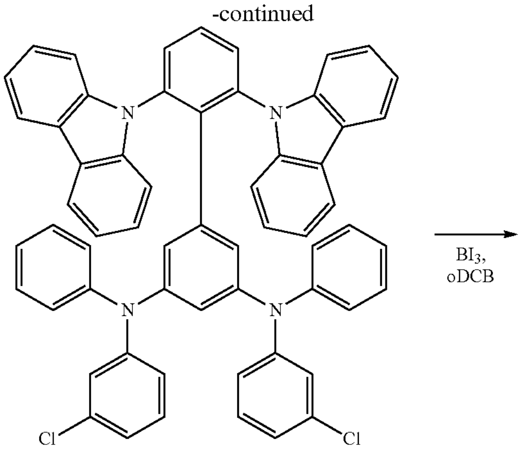

2-4

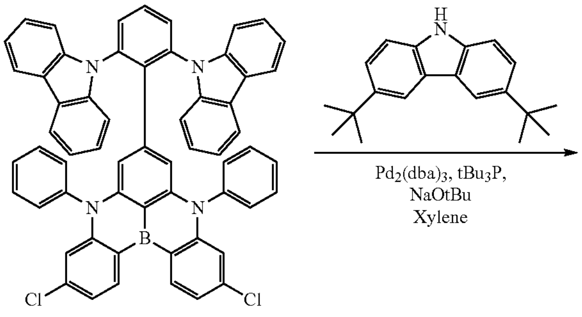

2-5

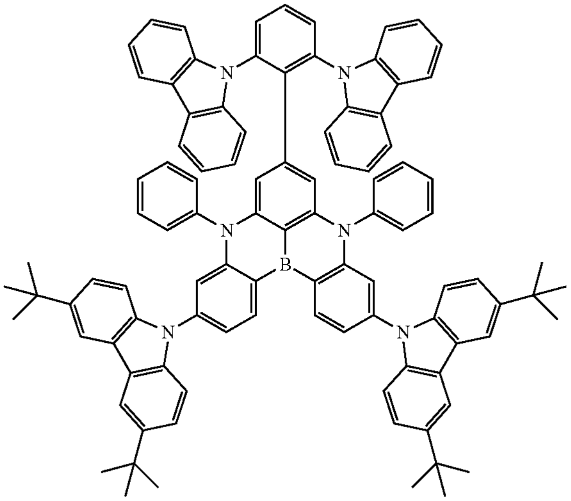

2

(Synthesis of Intermediate 2-1)

(3,5-dichlorophenyl)boronic acid (1 equivalent), 2-bromo-1,3-difluorobenzene (1.1 equivalents), tetrakis(triphenylphosphine)-palladium(0) (0.05 equivalents), tetra-n-butylammonium bromide (0.05 equivalents), and sodium carbonate (3 equivalents) were dissolved in toluene:ethanol: DW (5:1:2), and stirred for 13 hours at 110° C. The mixture was cooled, and dried under reduced pressure to remove ethanol. Cleaning was performed with ethyl acetate and water three times to obtain an organic layer, and the organic layer was dried with $MgSO_4$ and dried under reduced pressure. Purification and recrystallization (dichloromethane:n-Hexane) were performed by column chromatography to obtain Intermediate 2-1. (Yield: 67%)

(Synthesis of Intermediate 2-2)

Intermediate 2-1 (1 equivalent), aniline (2 equivalents), tris(dibenzylideneacetone)dipalladium(0) (0.1 equivalents), tri-tert-butylphosphine (0.2 equivalents), sodium tert-butoxide (3 equivalents) were dissolved in toluene, and stirred for 4 hours at 110° C. in a nitrogen atmosphere. The mixture was cooled, and dried under reduced pressure to remove toluene. The mixture from which ethanol was removed was cleaned with ethyl acetate and water three times to obtain an organic layer, and the organic layer was dried with $MgSO_4$ and dried under reduced pressure. Purification and recrystallization (dichloromethane:n-Hexane) were performed by column chromatography to obtain Intermediate 2-2. (Yield: 71%)

(Synthesis of Intermediate 2-3)

Intermediate 2-2 (1 equivalent), 1-chloro-3-iodobenzene (2 equivalents), tris(dibenzylideneacetone)dipalladium(0) (0.1 equivalents), tri-tert-butylphosphine (0.2 equivalents), sodium tert-butoxide (3 equivalents) were dissolved in toluene, and stirred for 8 hours at 110° C. in a nitrogen atmosphere. The mixture was cooled, and dried under reduced pressure to remove toluene. The mixture from which ethanol was removed was cleaned with ethyl acetate and water three times to obtain an organic layer, and the organic layer was dried with $MgSO_4$ and dried under reduced pressure. Purification and recrystallization (dichloromethane:n-Hexane) were performed by column chromatography to obtain Intermediate 2-3. (Yield: 75%)

(Synthesis of Intermediate 2-4)

Intermediate 2-3 (1 equivalent), 9H-carbazole (2 equivalents), $K_3PO_4$ (5 equivalents), 18 crown 6 (3 equivalents) were dissolved in DMF, and stirred for 40 hours at 180° C. The mixture was cooled, and dried under reduced pressure to remove DMF. Cleaning was performed with ethyl acetate and water to obtain an organic layer, and the organic layer was dried with $MgSO_4$ and dried under reduced pressure. Purification and recrystallization (dichloromethane:n-Hexane) were performed by column chromatography to obtain Intermediate 2-4. (Yield: 62%)

(Synthesis of Intermediate 2-5)

After Intermediate 2-4 (1 equivalent) was dissolved in ortho dichlorobenzene, the flask was cooled to 0° C. in a nitrogen atmosphere, and $BI_3$ (2.5 equivalents) dissolved in ortho dichlorobenzene was slowly injected thereto. After the completion of the dropping, the temperature was raised to 140° C. and stirring was performed for 4 hours. Cooling was performed to 0° C., and the reaction was terminated by slowly dropping triethylamine into the flask until the heating stopped. Hexane was added to allow precipitation to occur, and filtration was performed to obtain solids. The obtained solids were purified by silica filtration, and purified again by MC/Hex recrystallization to obtain Intermediate 2-5. Final purification was performed with a column (dichloromethane:n-Hexane). Isomers other than Intermediate 2-5 were purified in the following reaction. (Yield: 34%)

(Synthesis of Compound 2)

Intermediate 2-5 (1 equivalent), 3,6-di-tert-butyl-9H-carbazole (2 equivalents), tris(dibenzylideneacetone)dipalladium(0) (0.1 equivalents), tri-tert-butylphosphine (0.2 equivalents), sodium tert-butoxide (3 equivalents) were dissolved in o-xylene, and stirred for 20 hours at 150° C. in a nitrogen atmosphere. The mixture was cooled, and dried under reduced pressure to remove o-xylene. Cleaning was performed with ethyl acetate and water three times to obtain an organic layer, and the organic layer was dried with $MgSO_4$ and dried under reduced pressure. Purification and recrystallization (dichloromethane:n-Hexane) were performed by column chromatography to obtain Compound 2. Final purification was performed by sublimation purification. (Yield after sublimation: 4.5%)

<Synthesis of Compound 18>

Compound 18 according to an embodiment may be synthesized, for example, by the steps of Reaction Formula 2.

[Reaction Formula 2]

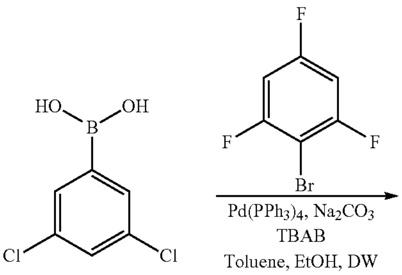

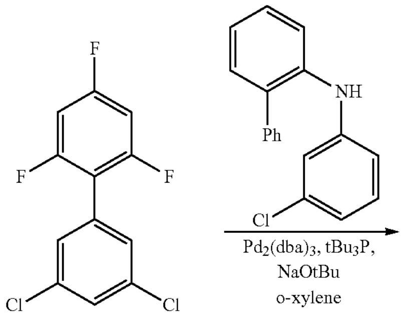

18-1

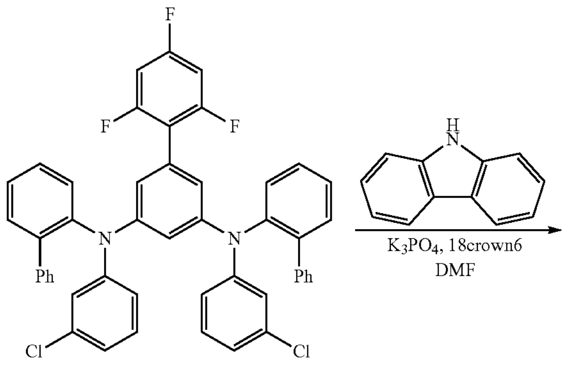

18-2

-continued

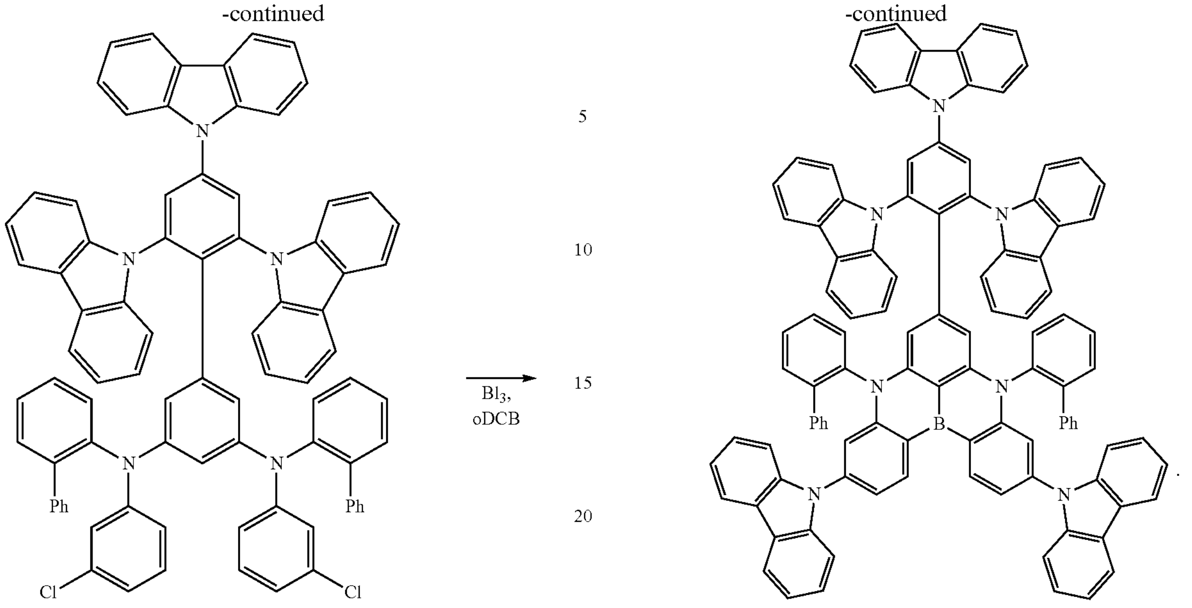

18-3

18

(Synthesis of Intermediate 18-1)

(3,5-dichlorophenyl)boronic acid (1 equivalent), 2-bromo-1,3,5-trifluorobenzene (1.1 equivalents), tetrakis (triphenylphosphine)-palladium(0) (0.05 equivalents), tetra-n-butylammonium bromide (0.05 equivalents), sodium carbonate (3 equivalents) were dissolved in toluene:ethanol: DW (5:1:2), and stirred for 13 hours at 110° C. The mixture was cooled, and dried under reduced pressure to remove ethanol. Cleaning was performed with ethyl acetate and water three times to obtain an organic layer, and the organic layer was dried with $MgSO_4$ and dried under reduced pressure. Purification and recrystallization (dichloromethane:n-Hexane) were performed by column chromatography to obtain Intermediate 18-1. (Yield: 56%)

(Synthesis of Intermediate 18-2)

Intermediate 18-1 (1 equivalent), N-(3-chlorophenyl)-[1, 1'-biphenyl]-2-amine (2 equivalents), tris(dibenzylideneacetone)dipalladium(0) (0.1 equivalents), tri-tert-butylphosphine (0.2 equivalents), sodium tert-butoxide (3 equivalents) were dissolved in o-xylene, and stirred for 20 hours at 150° C. in a nitrogen atmosphere. The mixture was cooled, and dried under reduced pressure to remove o-xylene. Cleaning was performed with ethyl acetate and water three times to obtain an organic layer, and the organic layer was dried with $MgSO_4$ and dried under reduced pressure. Purification and recrystallization (dichloromethane:n-Hexane) were performed by column chromatography to obtain Intermediate 18-2. (Yield: 68%)

(Synthesis of Intermediate 18-3)

Intermediate 18-2 (1 equivalent), 9H-carbazole (3 equivalents), $K_3PO_4$ (5 equivalents), 18 crown 6 (3 equivalents) were dissolved in DMF, and stirred for 40 hours at 180° C. The mixture was cooled, and dried under reduced pressure to remove DMF. Cleaning was performed with ethyl acetate and water to obtain an organic layer, and the organic layer was dried with $MgSO_4$ and dried under reduced pressure. Purification and recrystallization (dichloromethane:n-Hexane) were performed by column chromatography to obtain Intermediate 18-3. (Yield: 72%)

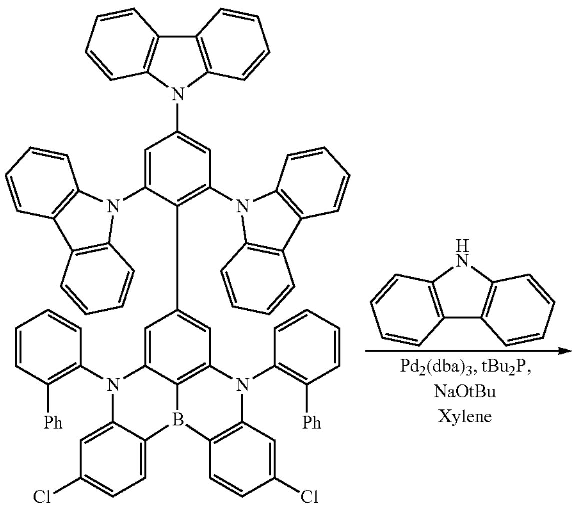

18-4

(Synthesis of Intermediate 18-4)

After Intermediate 18-3 (1 equivalent) was dissolved in ortho dichlorobenzene, the flask was cooled are 0° C. in a nitrogen atmosphere, and $BI_3$ (2.5 equivalents) dissolved in ortho dichlorobenzene was slowly injected thereto. After the completion of the dropping, the temperature was raised to 140° C. and stirring was performed for 10 hours. Cooling was performed to 0° C., and the reaction was terminated by slowly dropping triethylamine into the flask until the heating stopped. Hexane was added to allow precipitation to occur, and filtration was performed to obtain solids. The obtained solids were purified by silica filtration, and purified again by MC/Hex recrystallization to obtain Intermediate 18-4. Final purification was performed with a column (dichloromethane:n-Hexane). Isomers other than Intermediate 18-4 were purified in the following reaction. (Yield: 44%)

(Synthesis of Compound 18)

Intermediate 18-4 (1 equivalent), 9H-carbazole (2.1 equivalents), tris(dibenzylideneacetone)dipalladium(0) (0.1 equivalents), tri-tert-butylphosphine (0.2 equivalents), sodium tert-butoxide (3 equivalents) were dissolved in o-xylene, and stirred for 20 hours at 150° C. in a nitrogen atmosphere. The mixture was cooled, and dried under reduced pressure to remove o-xylene. Cleaning was performed with ethyl acetate and water three times to obtain an organic layer, and the organic layer was dried with $MgSO_4$ and dried under reduced pressure. Purification and recrystallization (dichloromethane:n-Hexane) were performed by column chromatography to obtain Compound 18. Final purification was performed by sublimation purification. (Yield after sublimation: 3.7%)

<Synthesis of Compound 26>

Compound 26 according to an embodiment may be synthesized, for example, by the steps of Reaction Formula 3.

[Reaction Formula 3]

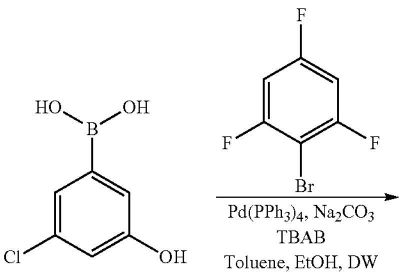

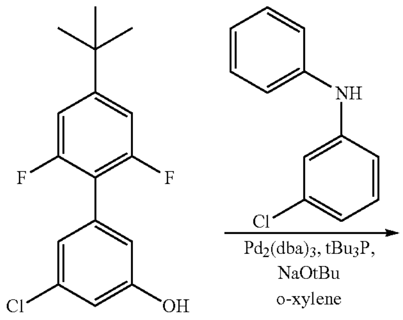

26-1

-continued

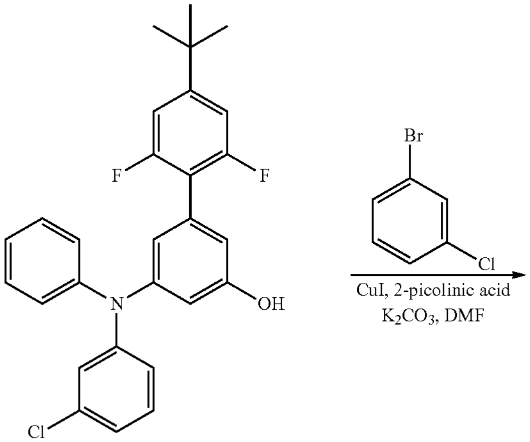

26-2

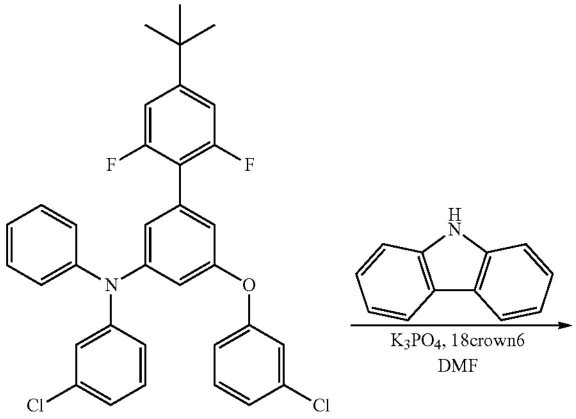

26-3

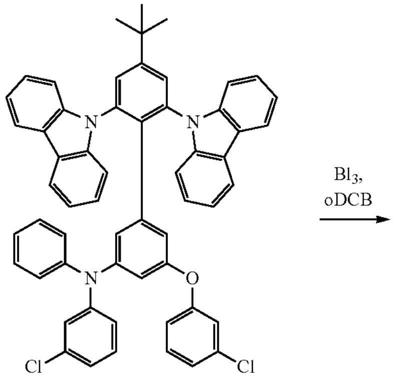

26-4

-continued

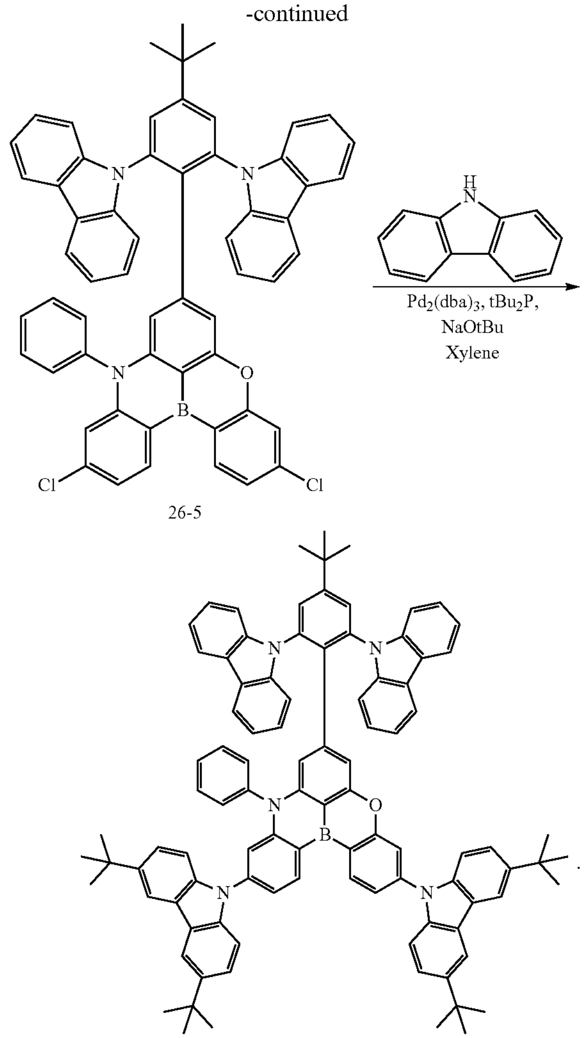

26-5

26

(Synthesis of Intermediate 26-1)

(3-chloro-5-hydroxyphenyl) boronic acid (1 equivalent), 2-bromo-5-(tert-butyl)-1,3-difluorobenzene (1.1 equivalents), tetrakis(triphenylphosphine)-palladium(0) (0.05 equivalents), tetra-n-butylammonium bromide (0.05 equivalents), sodium carbonate (3 equivalents) were dissolved in toluene:ethanol:DW (5:1:2), and stirred for 15 hours at 110° C. The mixture was cooled, and dried under reduced pressure to remove ethanol. Cleaning was performed with ethyl acetate and water three times to obtain an organic layer, and the organic layer was dried with $MgSO_4$ and dried under reduced pressure. Purification and recrystallization (dichloromethane:n-Hexane) were performed by column chromatography to obtain Intermediate 26-1. (Yield: 69%)

(Synthesis of Intermediate 26-2)

Intermediate 26-1 (1 equivalent), 3-chloro-N-phenylaniline (1.1 equivalents), tris(dibenzylideneacetone)dipalladium(0) (0.05 equivalents), tri-tert-butylphosphine (0.10 equivalents), sodium tert-butoxide (2 equivalents) were dissolved in o-xylene, and stirred for 20 hours at 140° C. in a nitrogen atmosphere. The mixture was cooled, and dried under reduced pressure to remove o-xylene. Cleaning was performed with ethyl acetate and water three times to obtain an organic layer, and the organic layer was dried with $MgSO_4$ and dried under reduced pressure. Purification and recrystallization (dichloromethane:n-Hexane) were performed by column chromatography to obtain Intermediate 26-2. (Yield: 54%)

(Synthesis of Intermediate 26-3)

Intermediate 26-2 (1 equivalent), 1-bromo-3-chlorobenzene (1.1 equivalents), CuI (1 equivalent), 2-picolinic acid (0.05 equivalents), potassium carbonate (3 equivalents) were dissolved in DMF, and stirred for 20 hours at 150° C. The mixture was cooled, and dried under reduced pressure to remove DMF. Cleaning was performed with ethyl acetate and water three times to obtain an organic layer, and the organic layer was dried with $MgSO_4$ and dried under reduced pressure. Purification and recrystallization (dichloromethane:n-Hexane) were performed by column chromatography to obtain Intermediate 26-3. (Yield: 54%)

(Synthesis of Intermediate 26-4)

Intermediate 26-3 (1 equivalent), 9H-carbazole (2.5 equivalents), $K_3PO_4$ (4 equivalents), 18 crown 6 (3 equivalents) were dissolved in DMF, and stirred for 40 hours at 180° C. The mixture was cooled, and dried under reduced pressure to remove DMF. Cleaning was performed with ethyl acetate and water to obtain an organic layer, and the organic layer was dried with $MgSO_4$ and dried under reduced pressure. Purification and recrystallization (dichloromethane:n-Hexane) were performed by column chromatography to obtain Intermediate 26-4. (Yield: 46%)

(Synthesis of Intermediate 26-5)

After Intermediate 26-4 (1 equivalent) was dissolved in ortho dichlorobenzene, the flask was cooled to 0° C. in a nitrogen atmosphere, and $BI_3$ (1.5 equivalents) dissolved in ortho dichlorobenzene was slowly injected thereto. After the completion of the dropping, the temperature was raised to 140° C. and stirring was performed for 10 hours. Cooling was performed to 0° C., and the reaction was terminated by slowly dropping triethylamine into the flask until the heating stopped. Hexane was added to allow precipitation to occur, and filtration was performed to obtain solids. The obtained solids were purified by silica filtration, and purified again by MC/Hex recrystallization to obtain Intermediate 26-5. Final purification was performed with a column (dichloromethane:n-Hexane). Isomers other than Intermediate 26-5 were purified in the following reaction. (Yield: 31%)

(Synthesis of Compound 26)

Intermediate 26-5 (1 equivalent), 9H-carbazole (2.2 equivalents), tris(dibenzylideneacetone)dipalladium(0) (0.1 equivalents), tri-tert-butylphosphine (0.2 equivalents), sodium tert-butoxide (3 equivalents) were dissolved in o-xylene, and stirred for 20 hours at 150° C. in a nitrogen atmosphere. The mixture was cooled, and dried under reduced pressure to remove o-xylene. Cleaning was performed with ethyl acetate and water three times to obtain an organic layer, and the organic layer was dried with $MgSO_4$ and dried under reduced pressure. Purification and recrystallization (dichloromethane:n-Hexane) were performed by column chromatography to obtain Compound 26. Final purification was performed by sublimation purification. (Yield after sublimation: 8.7%)

<Synthesis of Compound 45>

Compound 45 according to an embodiment may be synthesized, for example, by the steps of Reaction Formula 4.

[Reaction Formula 4]
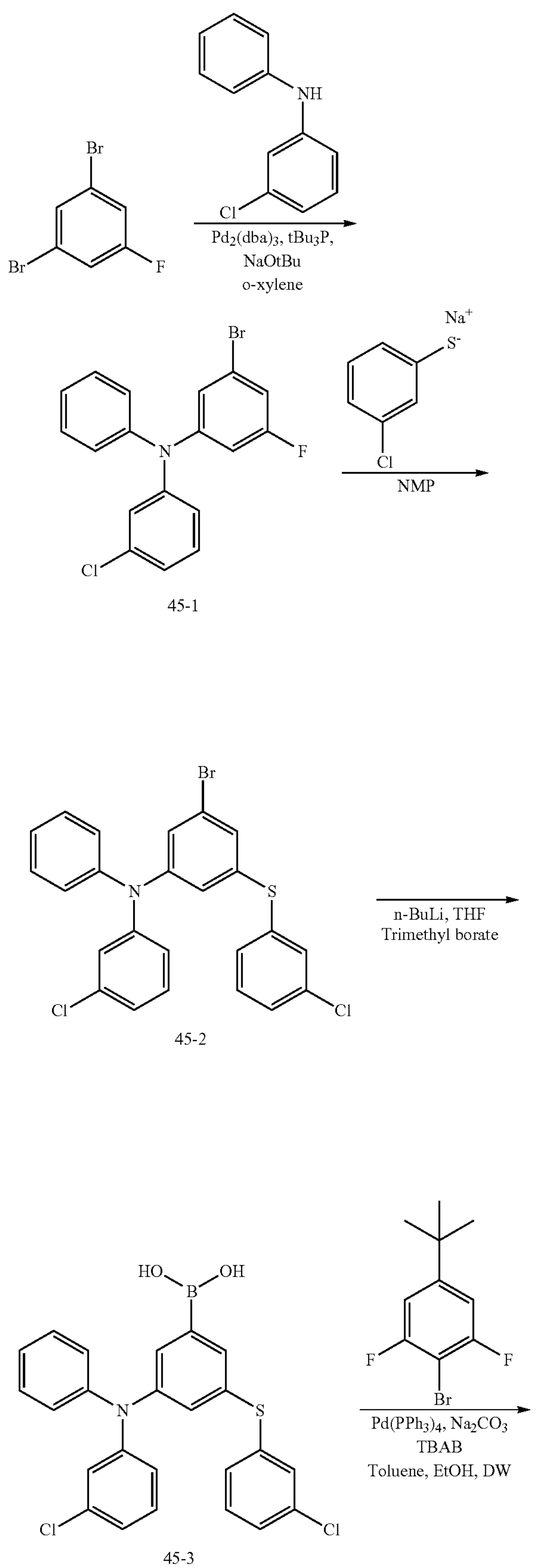
45-1
45-2
45-3
-continued
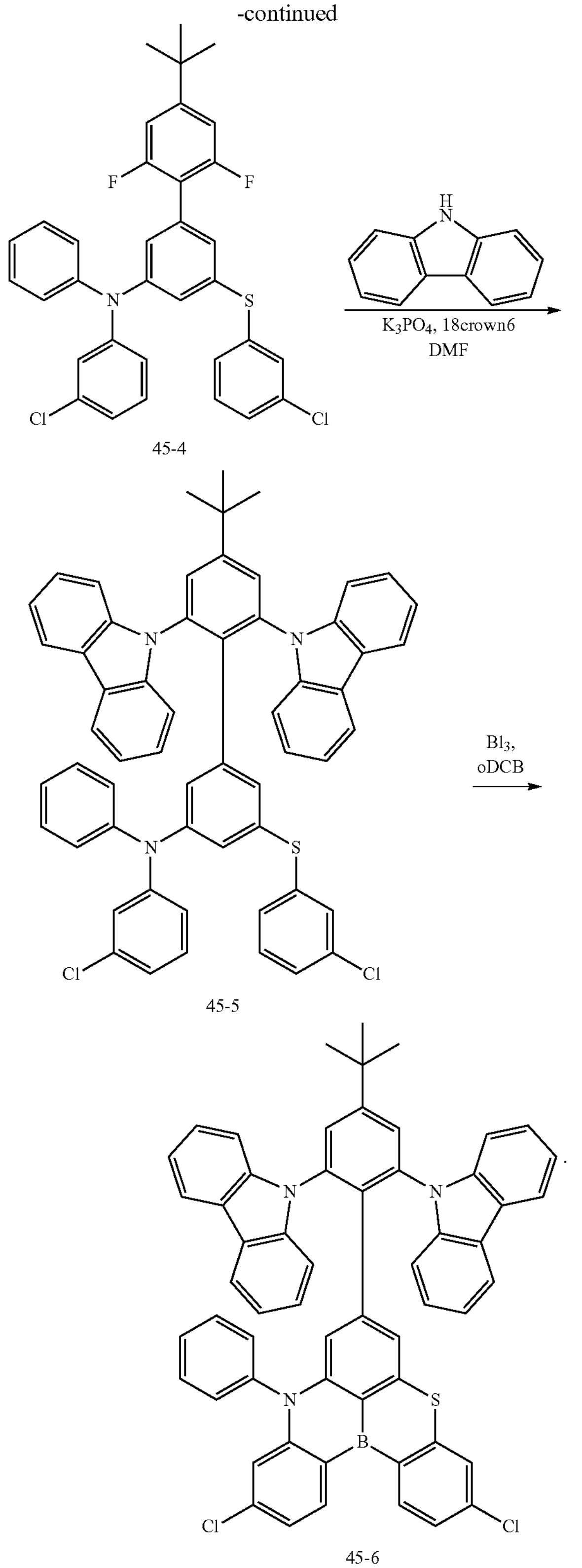
45-4
45-5
45-6
(Synthesis of Intermediate 45-1)
1,3-dibromo-5-fluorobenzene (1 equivalent), 3-chloro-N-phenylaniline (1 equivalent), tris(dibenzylideneacetone)dipalladium(0) (0.05 equivalents), tri-tert-butylphosphine (0.1 equivalents), sodium tert-butoxide (1.2 equivalents) were dissolved in o-xylene, and stirred for 20 hours at 150° C. in a nitrogen atmosphere. The mixture was cooled, and dried under reduced pressure to remove o-xylene. Cleaning was performed with ethyl acetate and water three times to obtain an organic layer, and the organic layer was dried with $MgSO_4$ and dried under reduced pressure. Purification (dichloromethane:n-Hexane) was performed by column chromatography to obtain Intermediate 45-1. (Yield: 67%)

(Synthesis of Intermediate 45-2)

Intermediate 45-1 (1 equivalent) and sodium 3-chlorobenzenethiolate (3 equivalents) were dissolved in NMP, and the temperature was raised to 170° C. and stirring was performed for 10 hours. Toluene was diluted at room temperature, and dropped to distilled water. After extraction, an organic layer was dried using $Na_2SO_4$. The obtained organic substances were purified by silica filtration, and purified again by MC/Hex recrystallization to obtain Intermediate 45-2. Final purification was performed with a column (dichloromethane:n-Hexane). (Yield: 41%)

(Synthesis of Intermediate 45-3)

After Intermediate 45-2 (1 equivalent) was dissolved in anhydrous THF, the temperature was lowered to −78° C. and stirring was performed for 1 hour, and n-BuLi (1 equivalent) was slowly dropped thereto. After stirring was performed for 2 hours, trimethyl borate (3 equivalents) was dropped, and the temperature was raised to room temperature and stirring was performed for 6 hours. Organic substances obtained after performing extraction with EA and distilled water were purified by silica filtration to obtain Intermediate 45-3. (Yield: 70%)

(Synthesis of Intermediate 45-4)

Intermediate 45-3 (1 equivalent), 2-bromo-5-(tert-butyl)-1,3-difluorobenzene (1.1 equivalents), tetrakis(triphenylphosphine)-palladium(0) (0.05 equivalents), tetra-n-butylammonium bromide (0.05 equivalents), sodium carbonate (3 equivalents) were dissolved in toluene:ethanol:DW (5:1:2), and stirred for 15 hours at 110° C. The mixture was cooled, and dried under reduced pressure to remove ethanol. Cleaning was performed with ethyl acetate and water three times to obtain an organic layer, and the organic layer was dried with $MgSO_4$ and dried under reduced pressure. Purification (dichloromethane:n-Hexane) was performed by column chromatography to obtain Intermediate 45-4. (Yield: 62%)

(Synthesis of Intermediate 45-5)

Intermediate 45-4 (1 equivalent), 9H-carbazole (3 equivalents), $K_3PO_4$ (5 equivalents), 18 crown 6 (3 equivalents) were dissolved in DMF, and stirred for 40 hours at 180° C. The mixture was cooled, and dried under reduced pressure to remove DMF. Cleaning was performed with ethyl acetate and water to obtain an organic layer, and the organic layer was dried with $MgSO_4$ and dried under reduced pressure. Purification and recrystallization (dichloromethane:n-Hexane) were performed by column chromatography to obtain Intermediate 45-5. (Yield: 48%)

(Synthesis of Intermediate 45-6)

After Intermediate 45-5 (1 equivalent) was dissolved in ortho dichlorobenzene, the flask was cooled to 0° C. in a nitrogen atmosphere, and $BI_3$ (1.5 equivalents) dissolved in ortho dichlorobenzene was slowly injected thereto. After the completion of the dropping, the temperature was raised to 140° C. and stirring was performed for 10 hours. Cooling was performed to 0° C., and the reaction was terminated by slowly dropping triethylamine into the flask until the heating stopped. Hexane was added to allow precipitation to occur, and filtration was performed to obtain solids. The obtained solids were purified by silica filtration, and purified again by MC/Hex recrystallization to obtain Intermediate 45-6. Final purification was performed with a column (dichloromethane:n-Hexane). Isomers other than Intermediate 45-6 were purified in the following reaction. (Yield: 31%)

(Synthesis of Compound 45)

Intermediate 45-6 (1 equivalent), 9H-carbazole-3-carbonitrile (2.2 equivalents), tris(dibenzylideneacetone)dipalladium(0) (0.1 equivalents), tri-tert-butylphosphine (0.2 equivalents), sodium tert-butoxide (3 equivalents) were dissolved in o-xylene, and stirred for 20 hours at 150° C. in a nitrogen atmosphere. The mixture was cooled, and dried under reduced pressure to remove o-xylene. Cleaning was performed with ethyl acetate and water three times to obtain an organic layer, and the organic layer was dried with $MgSO_4$ and dried under reduced pressure. Purification and recrystallization (dichloromethane:n-Hexane) were performed by column chromatography to obtain Compound 45. Final purification was performed by sublimation purification. (Yield after sublimation: 6.7%)

<Synthesis of Compound 56>

Compound 56 according to an embodiment may be synthesized, for example, by the steps of Reaction Formula 5.

[Reaction Formula 5]

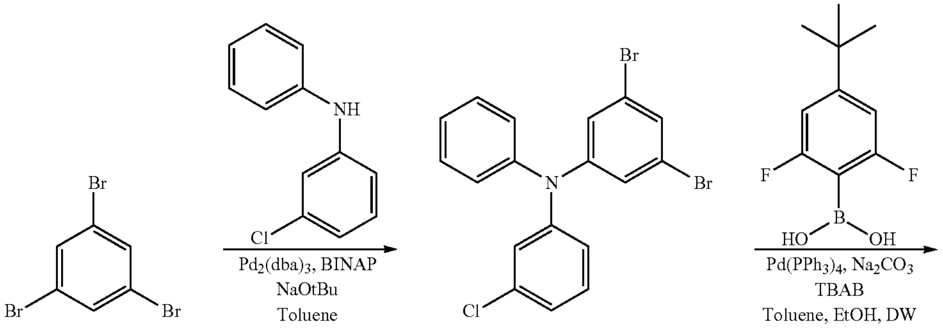

56-1

-continued

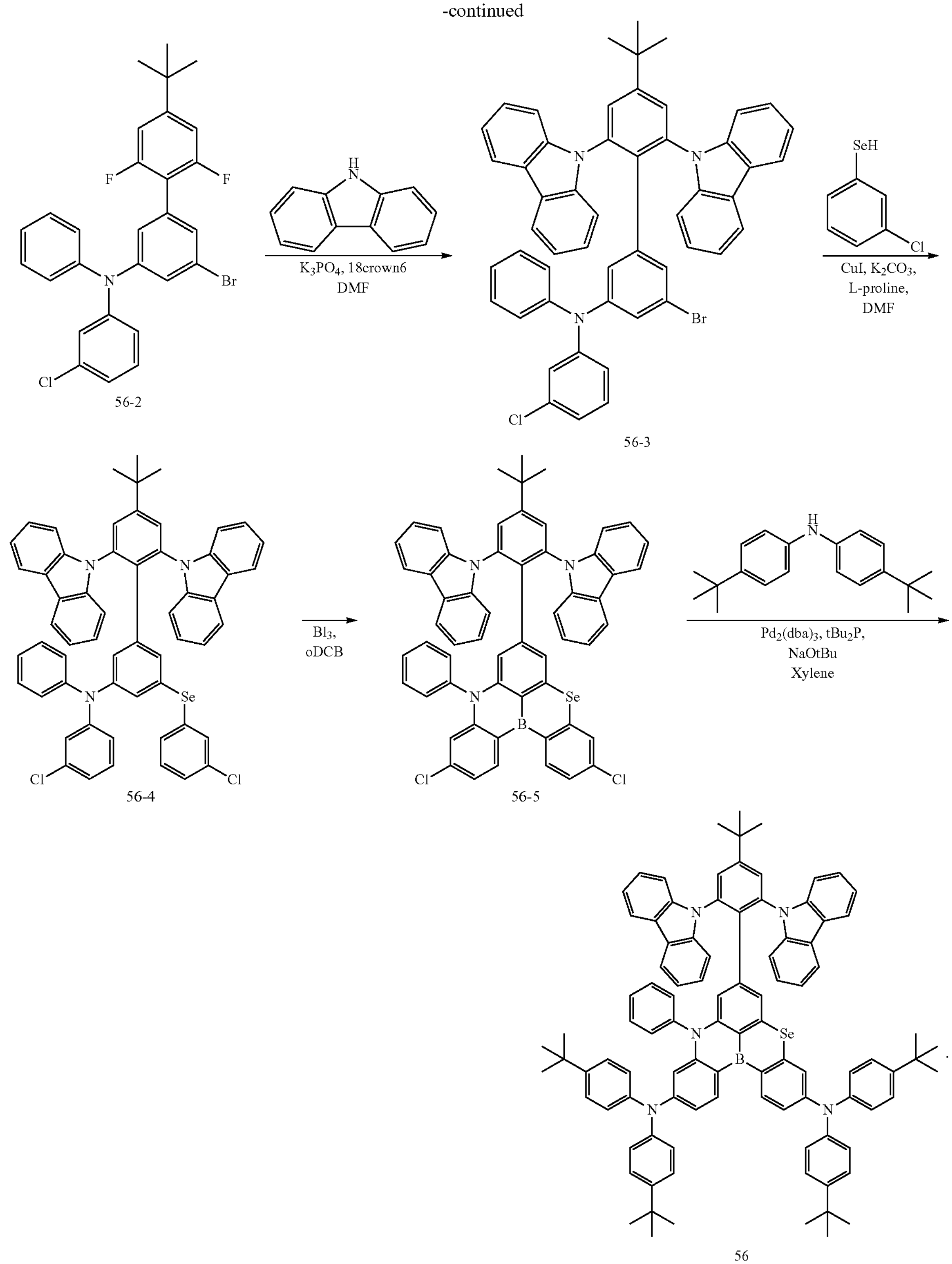

56-2 56-3 56-4 56-5 56

(Synthesis of Intermediate 56-1)

1,3,5-tribromobenzene (1 equivalent), 3-chloro-N-phenylaniline (1 equivalent), tris(dibenzylideneacetone)dipalladium(0) (0.05 equivalents), BINAP (0.1 equivalents), sodium tert-butoxide (1 equivalent) were dissolved in toluene, and stirred for 8 hours at 100° C. in a nitrogen atmosphere. The mixture was cooled, and dried under reduced pressure to remove toluene. Cleaning was performed with ethyl acetate and water three times to obtain an organic layer, and the organic layer was dried with $MgSO_4$ and dried under reduced pressure. Purification (dichloromethane:n-Hexane) was performed by column chromatography to obtain Intermediate 56-1. (Yield: 38%)

(Synthesis of Intermediate 56-2)

Intermediate 56-1 (1 equivalent), (4-(tert-butyl)-2,6-difluorophenyl)boronic acid (1 equivalent), tetrakis(triphenylphosphine)-palladium(0) (0.05 equivalents), tetra-n-butylammonium bromide (0.05 equivalents), sodium carbonate (1.3 equivalents) were dissolved in toluene:ethanol:DW (5:1:2), and stirred for 15 hours at 110° C. The mixture was cooled, and dried under reduced pressure to remove ethanol. Cleaning was performed with ethyl acetate and water three times to obtain an organic layer, and the organic layer was dried with $MgSO_4$ and dried under reduced pressure. Purification (dichloromethane:n-Hexane) was performed by column chromatography to obtain Intermediate 56-2. (Yield: 56%)

(Synthesis of Compound 56-3)

Intermediate 56-2 (1 equivalent), 9H-carbazole (3 equivalents), $K_3PO_4$ (5 equivalents), 18 crown 6 (3 equivalents) were dissolved in DMF, and stirred for 40 hours at 180° C. The mixture was cooled, and dried under reduced pressure to remove DMF. Cleaning was performed with ethyl acetate and water to obtain an organic layer, and the organic layer was dried with $MgSO_4$ and dried under reduced pressure. Purification and recrystallization (dichloromethane:n-Hexane) were performed by column chromatography to obtain Intermediate 56-3. (Yield: 56%)

(Synthesis of Compound 56-4)

Intermediate 56-3 (1 equivalent), 9H-carbazole (3 equivalents), $K_3PO_4$ (5 equivalents), 18 crown 6 (3 equivalents) were dissolved in DMF, and stirred for 40 hours at 180° C. The mixture was cooled, and dried under reduced pressure to remove DMF. Cleaning was performed with ethyl acetate and water to obtain an organic layer, and the organic layer was dried with $MgSO_4$ and dried under reduced pressure. Purification and recrystallization (dichloromethane:n-Hexane) were performed by column chromatography to obtain Intermediate 56-3. (Yield: 56%)

(Synthesis of Intermediate 56-5)

After Intermediate 56-4 (1 equivalent) was dissolved in ortho dichlorobenzene, the flask was cooled to 0° C. in a nitrogen atmosphere, and $BI_3$ (1.5 equivalents) dissolved in ortho dichlorobenzene was slowly injected thereto. After the completion of the dropping, the temperature was raised to 140° C. and stirring was performed for 10 hours. Cooling was performed to 0° C., and the reaction was terminated by slowly dropping triethylamine into the flask until the heating stopped. Hexane was added to allow precipitation to occur, and filtration was performed to obtain solids. The obtained solids were purified by silica filtration, and purified again by MC/Hex recrystallization to obtain Intermediate 56-4. Final purification was performed with a column (dichloromethane:n-Hexane). Isomers other than Intermediate 56-5 were purified in the following reaction. (Yield: 33%)

(Synthesis of Compound 56)

Intermediate 56-5 (1 equivalent), bis(4-(tert-butyl)phenyl)amine (2.2 equivalents), tris(dibenzylideneacetone)dipalladium(0) (0.1 equivalents), tri-tert-butylphosphine (0.2 equivalents), sodium tert-butoxide (3 equivalents) were dissolved in o-xylene, and stirred for 20 hours at 150° C. in a nitrogen atmosphere. The mixture was cooled, and dried under reduced pressure to remove o-xylene. Cleaning was performed with ethyl acetate and water three times to obtain an organic layer, and the organic layer was dried with $MgSO_4$ and dried under reduced pressure. Purification and recrystallization (dichloromethane:n-Hexane) were performed by column chromatography to obtain Compound 56. Final purification was performed by sublimation purification. (Yield after sublimation: 10.9%)

<Synthesis of Compound 72>

Compound 72 according to an embodiment may be synthesized, for example, by the steps of Reaction Formula 6.

[Reaction Formula 6]

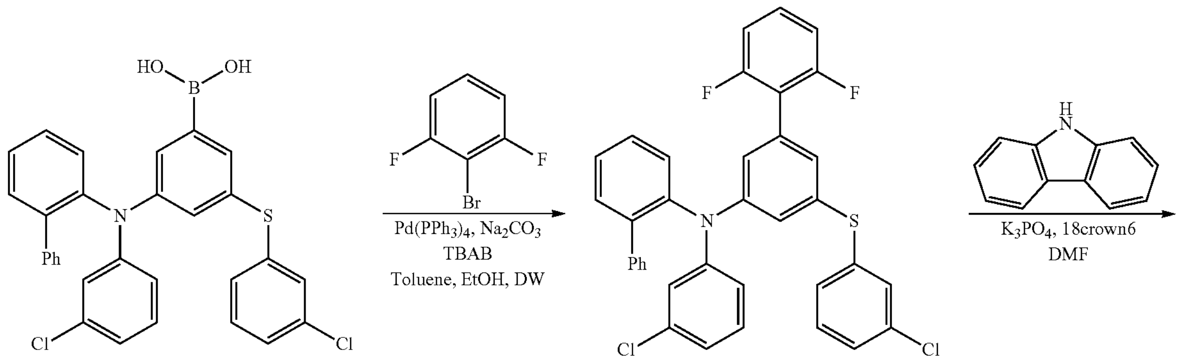

72-1

-continued

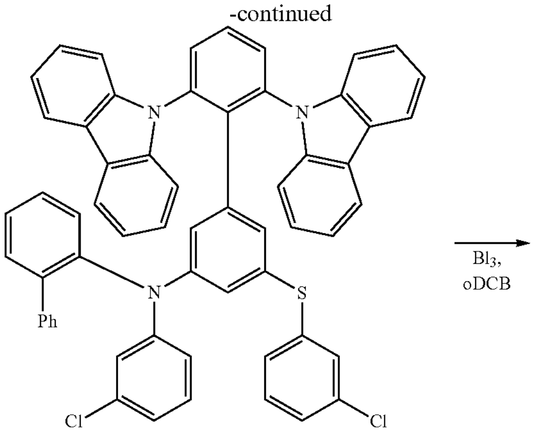

72-2

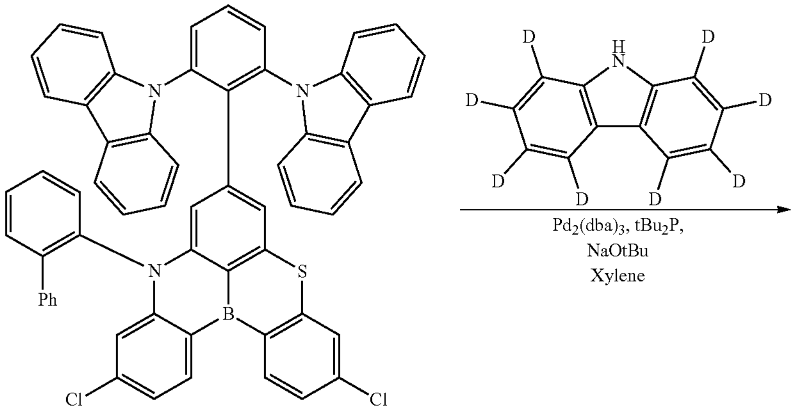

72-3

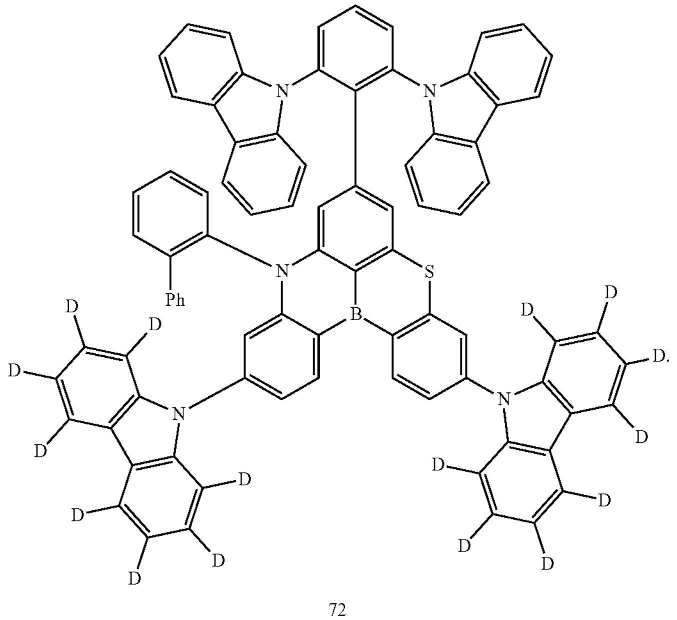

72

(Synthesis of Intermediate 72-1)

(3-([1,1'-biphenyl]-2-yl(3-chlorophenyl)amino)-5-((3-chlorophenyl)thio)phenyl)boronic acid (1 equivalent), 2-bromo-1,3-difluorobenzene (1.1 equivalents), tetrakis(triphenylphosphine)-palladium(0) (0.05 equivalents), tetra-n-butylammonium bromide (0.05 equivalents), sodium carbonate (2 equivalents) were dissolved in toluene:ethanol:DW (5:1:2), and stirred for 15 hours at 110° C. The mixture was cooled, and dried under reduced pressure to remove ethanol. Cleaning was performed with ethyl acetate and water three times to obtain an organic layer, and the organic layer was dried with $MgSO_4$ and dried under reduced pressure. Purification and recrystallization (dichloromethane:n-Hexane) were performed by column chromatography to obtain Intermediate 72-1. (Yield: 71%)

(Synthesis of Intermediate 72-2)

Intermediate 72-1 (1 equivalent), 9H-carbazole (3 equivalents), $K_3PO_4$ (5 equivalents), 18 crown 6 (3 equivalents) were dissolved in DMF, and stirred for 40 hours at 180° C. The mixture was cooled, and dried under reduced pressure to remove DMF. Cleaning was performed with ethyl acetate and water to obtain an organic layer, and the organic layer was dried with $MgSO_4$ and dried under reduced pressure. Purification and recrystallization (dichloromethane:n-Hexane) were performed by column chromatography to obtain Intermediate 72-2. (Yield: 62%)

(Synthesis of Intermediate 72-3)

After Intermediate 72-2 (1 equivalent) was dissolved in ortho dichlorobenzene, the flask was cooled to 0° C. in a nitrogen atmosphere, and $BI_3$ (1.5 equivalents) dissolved in ortho dichlorobenzene was slowly injected thereto. After the completion of the dropping, the temperature was raised to 140° C. and stirring was performed for 10 hours. Cooling was performed to 0° C., and the reaction was terminated by slowly dropping triethylamine into the flask until the heating stopped. Hexane was added to allow precipitation to occur, and filtration was performed to obtain solids. The obtained solids were purified by silica filtration, and purified again by MC/Hex recrystallization to obtain Intermediate 72-3. Final purification was performed with a column (dichloromethane:n-Hexane). Isomers other than Intermediate 72-3 were purified in the following reaction. (Yield: 26%)

(Synthesis of Compound 72)

Intermediate 72-3 (1 equivalent), 9H-carbazole-3-carbonitrile (2.2 equivalents), tris(dibenzylideneacetone)dipalladium(0) (0.1 equivalents), tri-tert-butylphosphine (0.2 equivalents), sodium tert-butoxide (3 equivalents) were dissolved in o-xylene, and stirred for 20 hours at 150° C. in a nitrogen atmosphere. The mixture was cooled, and dried under reduced pressure to remove o-xylene. Cleaning was performed with ethyl acetate and water three times to obtain an organic layer, and the organic layer was dried with $MgSO_4$ and dried under reduced pressure. Purification and recrystallization (dichloromethane:n-Hexane) were performed by column chromatography to obtain Compound 72. Final purification was performed by sublimation purification. (Yield after sublimation: 7.9%)

(Molecular Weights and NMR Analysis Results of Synthesized Compounds)

TABLE 1

| Compound | H NMR(δ) | Mass Calculation value | Mass Measurement value |
|---|---|---|---|
| 2 | 9.20 (2H, d), 7.90 (2H, d), 7.85 (2H, d), 7.77 (2H, s), 7.58-7.41 (11H, m), 7.30-7.02 (15H, m), 6.91-6.75 (13H, m), 6.46, (2H, d), 1.37 (18H, s), 1.35 (18H, s) | 1380.69 | 1381.71 |
| 18 | 9.12 (2H, d), 7.92 (2H, d), 7.88 (2H, d), 7.80 (2H, d), 7.75 (2H, d), 7.62-7.45 (19H, m), 7.36-7.12 (20H, m), 6.98-6.77 (17H, m), 6.63 (1H, s), 6.57, (1H, s) | 1473.56 | 1474.64 |
| 26 | 9.22 (2H, d), 8.18 (2H, d), 8.10 (2H, d), 7.95 (2H, s), 7.90 (2H, s), 7.67-7.45 (10H, m), 7.32-7.15 (12H, m), 7.05-6.82 (9H, m), 6.52 (2H, d), 1.40 (9H, s), 1.38 (18H, s), 1.33 (18H, s) | 1361.71 | 1362.43 |
| 45 | 9.15 (2H, d), 8.20 (2H, s), 8.05 (2H, d), 7.85 (2H, d), 7.78 (2H, d), 7.68-7.45 (11H, m), 7.31-7.11 (13H, m), 7.03-6.72 (9H, m), 6.64 (1H, s), 6.55 (1H, s), 1.35 (9H, s) | 1203.43 | 1204.53 |
| 56 | 9.25 (2H, d), 7.80 (2H, d), 7.75 (2H, d), 7.55-7.31 (14H, m), 7.25-7.06 (13H, m), 6.93-6.68 (12H, m), 6.57 (1H, s), 6.43 (1H, s), 1.40 (18H, s), 1.38 (18H, s), 1.33 (9H, s) | 1429.55 | 1430.78 |
| 72 | 9.10 (2H, d), 7.83 (2H, d), 7.71 (2H, d), 7.65-7.44 (11H, m), 7.35-7.16 (9H, m), 6.98-6.73 (8H, m), 6.51 (1H, s), 6.42 (1H, s) | 1189.50 | 1190.46 |

2. Manufacturing and Evaluation of Light Emitting Device (Manufacturing of Light Emitting Device)

A light emitting device of an embodiment including the polycyclic compound of an embodiment in a light emitting layer was manufactured in the following manner. Light emitting devices of Examples 1 to 6 were respectively manufactured using the polycyclic compounds of Compound 2, Compound 18, Compound 26, Compound 45, Compound 56, and Compound 72 as a dopant in a light emitting layer.

In Comparative Example 1 to Comparative Example 4, a light emitting device was respectively manufactured using Comparative Example Compound X-1 to Comparative Example Compound X-4.

Compounds of Examples and compounds of Comparative Examples used in the manufacturing of a device are shown.

Example Compounds

2

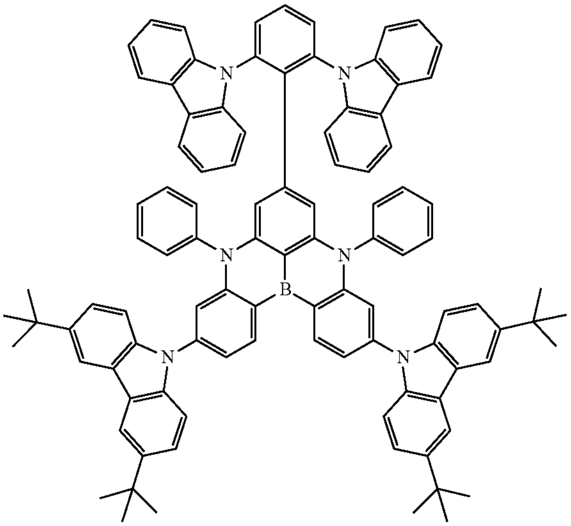

-continued

18

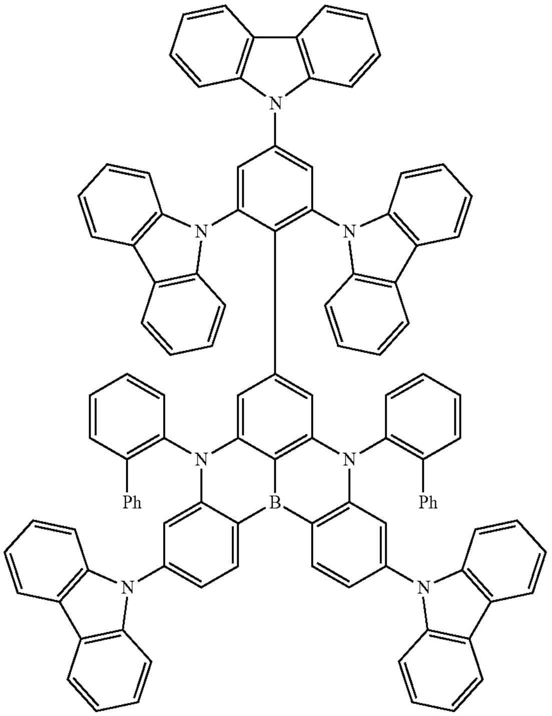

26

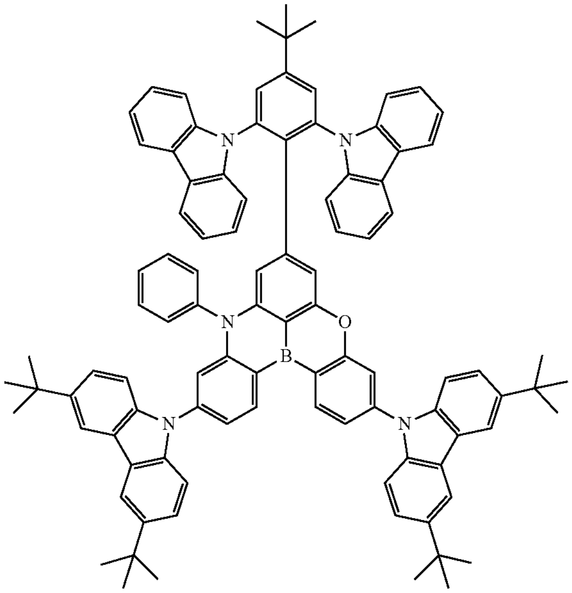

-continued
45
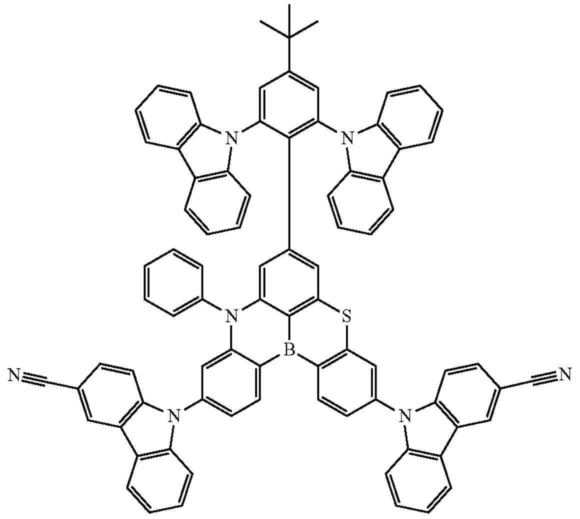
56
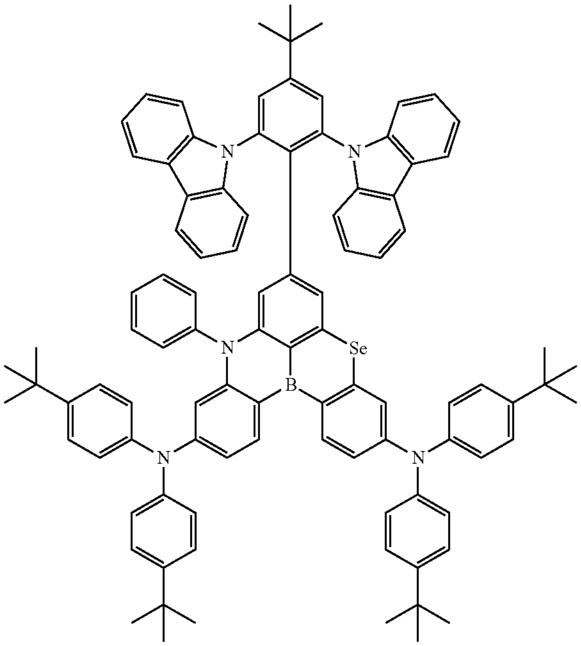
-continued
72
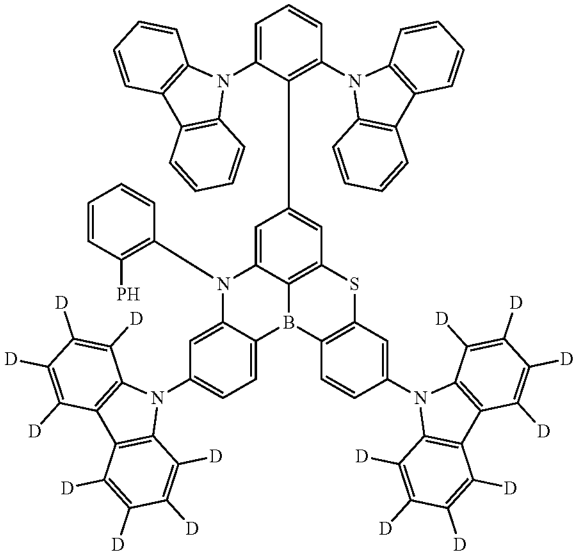
Comparative Example Compounds
X-1
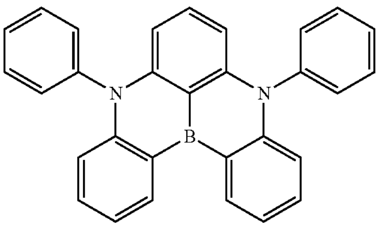
X-2
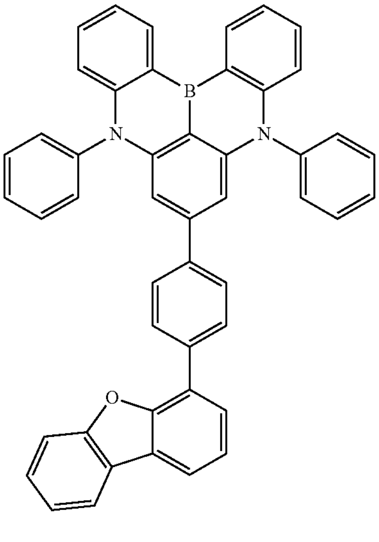

-continued
X-3
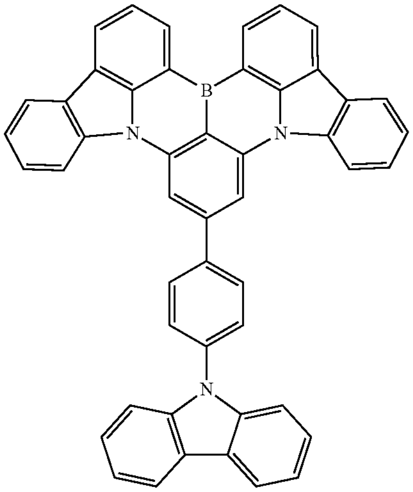
X-4
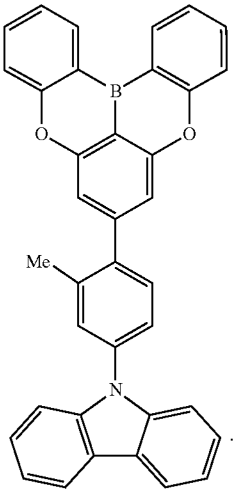
(Other Compounds Used in the Manufacture of Devices)
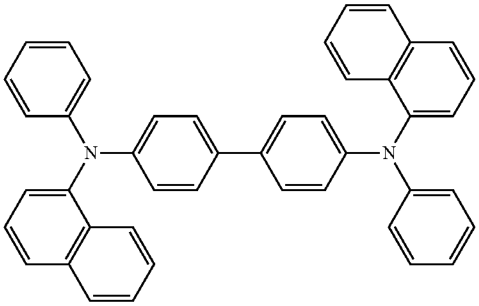
NPD
-continued
H-1-19
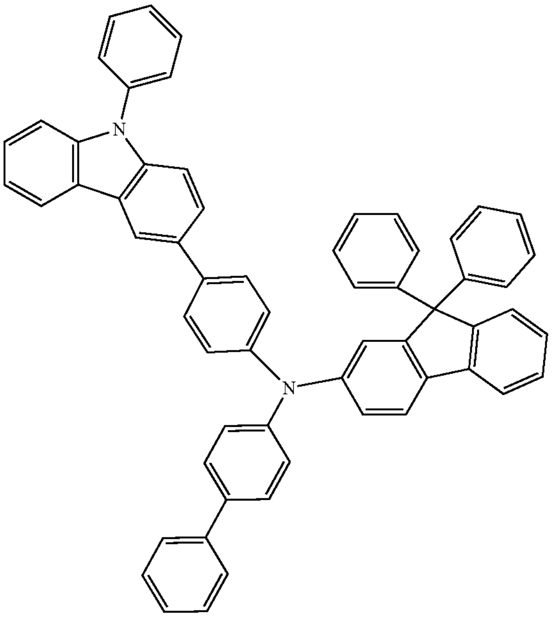
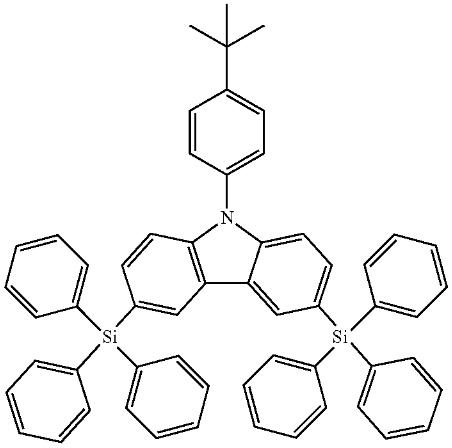
CzSi
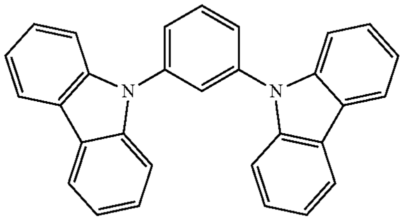
mCP
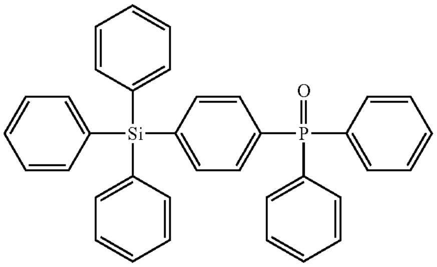
TSPO1

-continued

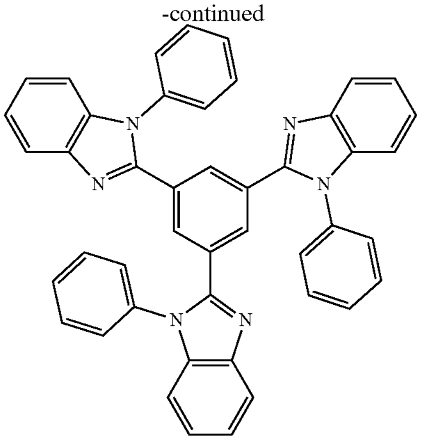

TPBI

An ITO glass substrate having a resistance value of 15 $\Omega/cm^2$ and a thickness of 1200 Å was cut to a size of 50 mm×50 mm×0.7 mm, and ultrasonically cleaned for 5 minutes each using isopropyl alcohol and pure water, and irradiated with ultraviolet rays for 30 minutes and exposed to ozone to be cleaned. N,N'-di(1-naphthyl)-N,N'-diphenylbenzidine (NPD) was vacuum deposited on an upper portion of ITO formed on the glass substrate to form a hole injection layer with a thickness of 300 Å. A compound H-1-19 was vacuum deposited on an upper portion of the hole injection layer to form a hole transport layer with a thickness of 200 Å. A hole-transporting compound CzSi was vacuum deposited on an upper portion of the hole transport layer to form a light emitting auxiliary layer with a thickness of 100 Å.

On an upper portion of the light emitting auxiliary layer, mCP and an Example compound or mCP and a Comparative Example compound were simultaneously deposited at a weight ratio of 99:1 to form a light emitting layer with a thickness of 200 Å.

On an upper portion of the light emitting layer, TSPO1 was deposited to form an electron transport layer with a thickness of 200 Å. A buffer electron-transporting compound TPBi was deposited on an upper portion of the electron transport layer to form a buffer layer with a thickness of 300 Å, and LiF was deposited thereon to form an electron injection layer with a thickness of 10 Å.

Aluminum (Al) was vacuum deposited to form a second electrode with a thickness of 3000 Å, thereby manufacturing a light emitting device.

(Properties Evaluation of Light Emitting Device)

Table 2 shows evaluation results of the light emitting device of each of Examples 1 to 6 and Comparative Examples 1 and 4. In Table 2, the driving voltage (V), light emission efficiency (Cd/A), maximum external quantum efficiency (%), and light emitting color of each of the manufactured light emitting device were compared and shown. The manufactured devices were all confirmed to exhibit a blue light emitting color.

TABLE 2

| Device manufacturing example | Dopant compound | Driving Voltage (V) | Efficiency (cd/A) | Maximum external quantum efficiency (%) |
|---|---|---|---|---|
| Example 1 | Compound 2 | 4.3 | 26.1 | 24.8 |
| Example 2 | Compound 18 | 4.4 | 25.7 | 23.6 |
| Example 3 | Compound 26 | 4.3 | 24.8 | 22.9 |
| Example 4 | Compound 45 | 4.5 | 23.2 | 21.7 |
| Example 5 | Compound 56 | 4.3 | 24.9 | 23.0 |
| Example 6 | Compound 72 | 4.4 | 23.9 | 21.9 |
| Comparative Example 1 | X-1 | 5.4 | 15.7 | 14.3 |
| Comparative Example 2 | X-2 | 5.2 | 17.2 | 16.1 |
| Comparative Example 3 | X-3 | 5.1 | 17.8 | 16.5 |
| Comparative Example 4 | X-4 | 5.3 | 14.9 | 13.4 |

Referring to the results of Table 2, it can be seen that the light emitting devices of Examples in which the polycyclic compound of an embodiment was used as a dopant material in a light emitting layer exhibited low driving voltage, excellent device efficiency, and excellent maximum external quantum efficiency properties.

It can be seen that the device of each of Examples 1 to 6 had a driving voltage of 4.5 V or lower, whereas the device of each of Comparative Example 1 to Comparative Example 4 had a driving voltage of 5.1 V or higher. It can be seen that the device of each of Examples 1 to 6 had a device efficiency of 23.2 cd/A or higher, whereas the device of each of Comparative Example 1 to Comparative Example 4 had a device efficiency of 17.8 cd/A or lower. It can be seen that the device of each of Examples 1 to 6 had a maximum external quantum efficiency of 20% or higher, whereas the device of each of Comparative Example 1 to Comparative Example 4 had a maximum external quantum efficiency of less than 20%. Referring to Table 2, it can be seen that when compared to the device of each of Comparative Example 1 to Comparative Example 4, the device of each of Examples 1 to 6 exhibit low voltage, high device efficiency, and excellent maximum external quantum efficiency.

Compared to Comparative Example Compound X-1 to Comparative Example Compound X-4, it can be seen that compounds of Examples include a substituent having a bulky structure at each of a core and an ortho position in a phenyl group substituted in a core structure to shield a boron atom from being exposed to an electrical charge, thereby increasing the stability of a polycyclic compound, and as a result, exhibit a low driving voltage and high light emission efficiency.

As described above, Examples 1 to 6 exhibit the results of improved light emission efficiency compared to Comparative Example 1 to Comparative Example 4. By using polycyclic compounds of an embodiment including a phenyl group, a boron-based polycyclic ring containing one boron atom substituted with the phenyl group, and two bulky substituents in the boron-based polycyclic ring and at an ortho position in the phenyl group, it is possible to improve the light emission efficiency of a light emitting device of an embodiment.

A polycyclic compound of an embodiment includes a phenyl group, a boron-based polycyclic ring substituted with the phenyl group, and two bulky substituents substituted with the boron-based polycyclic ring and at each of two ortho positions in the phenyl group, and thus, have high structural stability to contribute to high efficiency properties of a light emitting device. A light emitting device according to an embodiment includes the polycyclic compound of an embodiment, and thus, may exhibit high-efficiency properties.

A light emitting device of an embodiment includes a polycyclic compound, and thus, may exhibit high-efficiency properties.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A light emitting device comprising:

a first electrode;

a second electrode disposed on the first electrode; and a light emitting layer disposed between the first electrode and the second electrode, and including a polycyclic compound, wherein the first electrode and the second electrode each independently include at least one selected from Ag, Mg, Cu, Al, Pt, Pd, Au, Ni, Nd, Ir, Cr, Li, Ca, LiF, Mo, Ti, W, In, Sn, Zn, an oxide thereof, a compound thereof, and a mixture thereof, and the polycyclic compound includes:

a phenyl group;

a first substituent substituted at the phenyl group, and represented by Formula A-1;

a second substituent substituted at the phenyl group at an ortho position with respect to the first substituent; and a third substituent substituted at the phenyl group at an ortho position with respect to the first substituent and at a meta position with respect to the second substituent, wherein the second substituent and the third substituent are each independently a group represented by Formula A-2:

[Formula A-1]

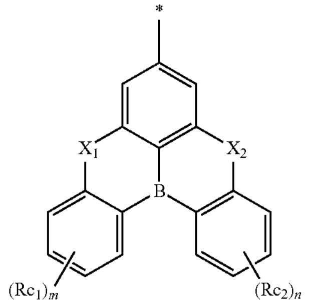

-continued

[Formula A-2]

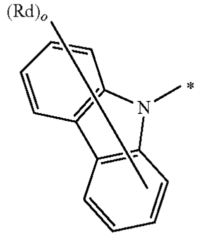

Rd is a hydrogen atom, a deuterium atom, a halogen atom, a cyano group, a substituted or unsubstituted amine group, a substituted or unsubstituted silyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or is bonded to an adjacent group to form a ring, and wherein in Formulas A-1 and A-2, represents a binding site to the phenyl group.

2. The light emitting device of claim 1, wherein the phenyl group and the first substituent have a twisted molecular structure.

3. The light emitting device of claim 2, wherein the first substituent is positioned on a first plane, and the phenyl group is positioned on a second plane which is not parallel to the first plane.

4. The light emitting device of claim 1, wherein in Formula A-1, at least one of $X_1$ and $X_2$ is N(Ra), and Ra is a group represented by one of Formulas $A_1$ to $A_6$:

$A_1$

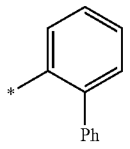

$A_2$

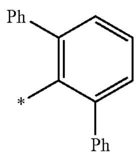

$A_3$

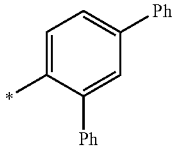

$A_4$

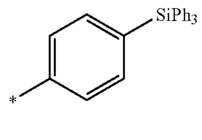

-continued

A5

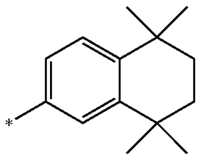

A6

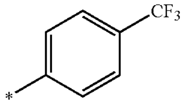

wherein in Formulas $A_1$ to $A_6$,

Ph is an unsubstituted phenyl group, and represents a binding site to a nitrogen atom in N(Ra).

5. The light emitting device of claim 1, wherein in Formula A-1, $Rc_1$ and $Rc_2$ are each independently a substituted or unsubstituted carbazole group, or a substituted or unsubstituted diphenyl amine group.

6. The light emitting device of claim 1, wherein in Formula A-1, m and n are each 1, and $Rc_1$ and $Rc_2$ are each at a para position with respect to the boron atom.

7. The light emitting device of claim 1, wherein in Formula A-2,

Rd is a hydrogen atom, a deuterium atom, a fluorine atom, a cyano group, a substituted or unsubstituted phenyl group, a substituted or unsubstituted t-butyl group, a substituted or unsubstituted triphenylsilyl group, or a substituted or unsubstituted methyl group.

8. The light emitting device of claim 1, wherein the polycyclic compound further comprises a fourth substituent substituted at the phenyl group at a para position with respect to the first substituent, and the fourth substituent is a hydrogen atom, a substituted or unsubstituted carbazole group, or a substituted or unsubstituted t-butyl group.

9. The light emitting device of claim 1, wherein the polycyclic compound is one selected from Compound Group 1:

[Compound Group 1]

1

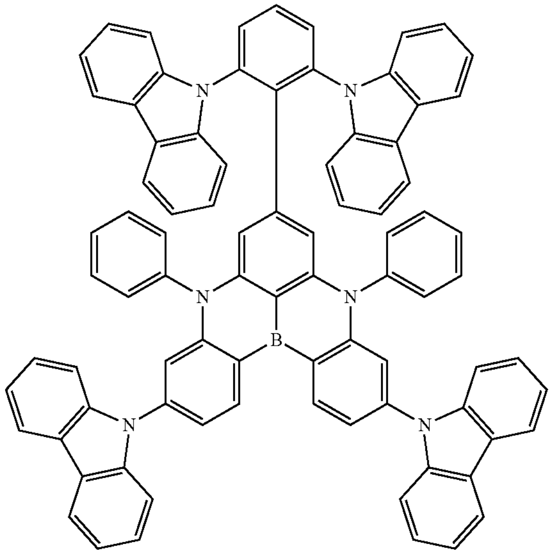

2

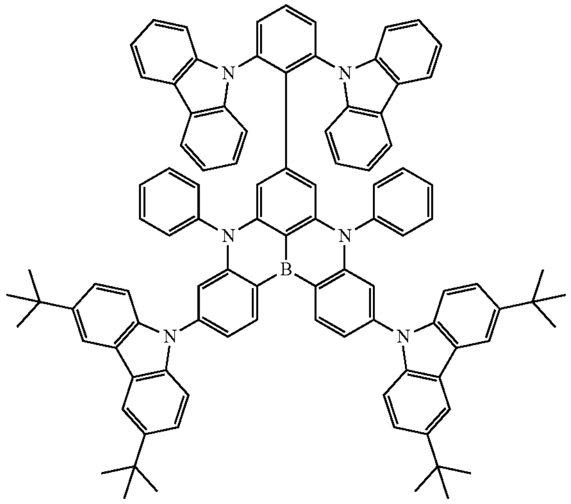

3

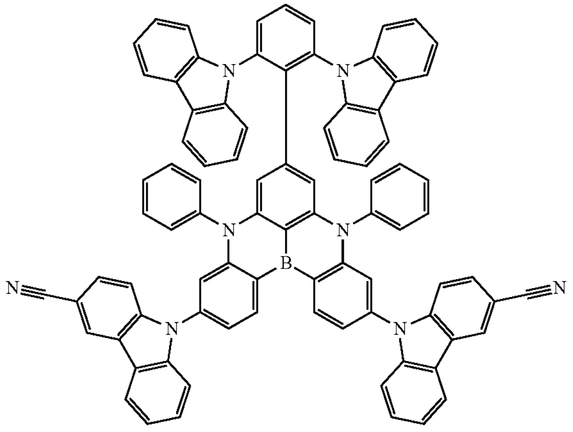

-continued
4
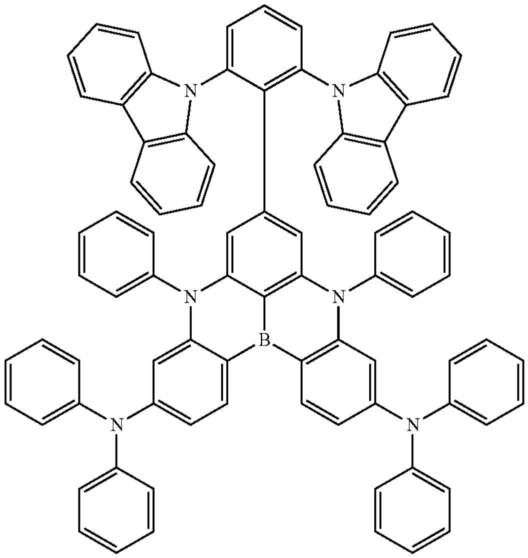
5
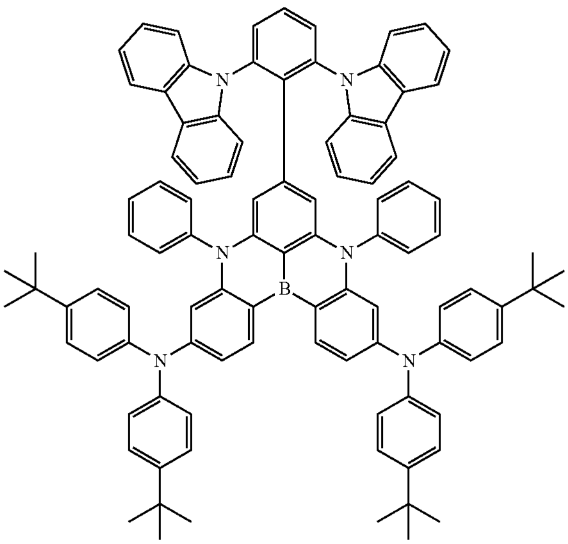
-continued
6
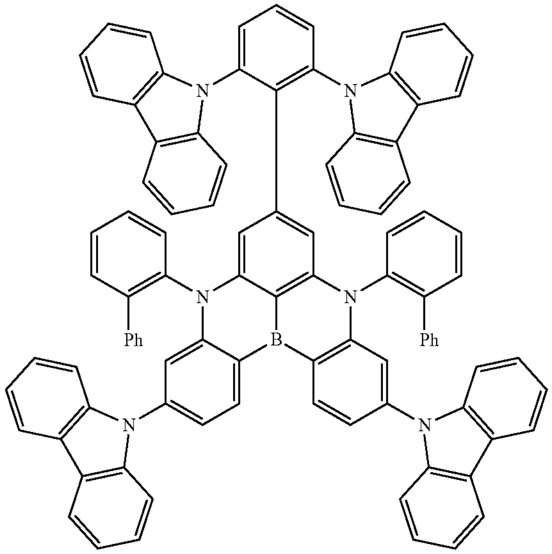
7
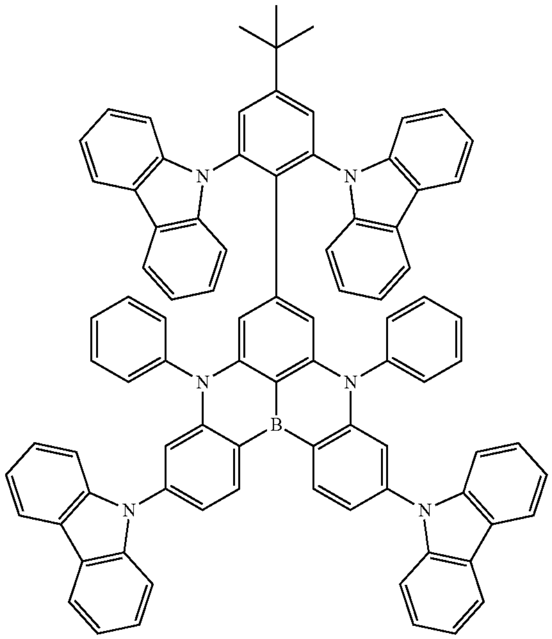

-continued
8
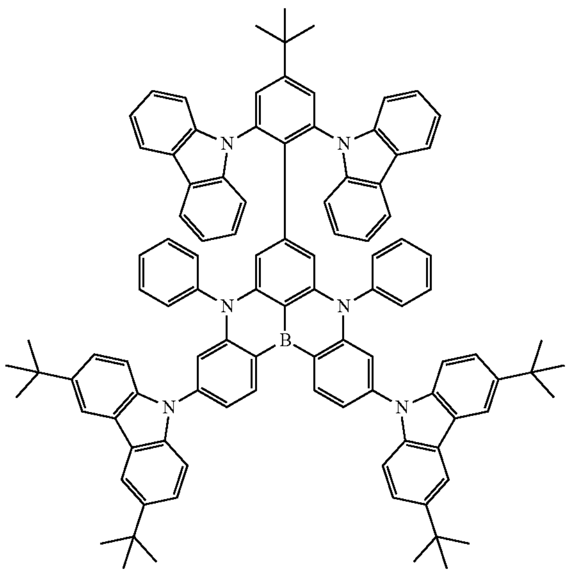
9
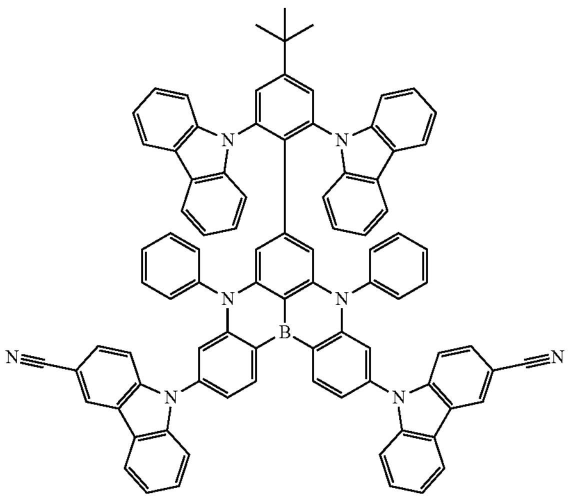
-continued
10
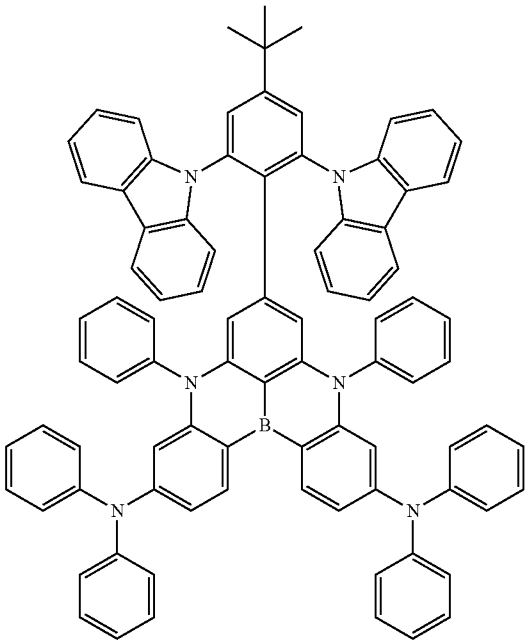
11
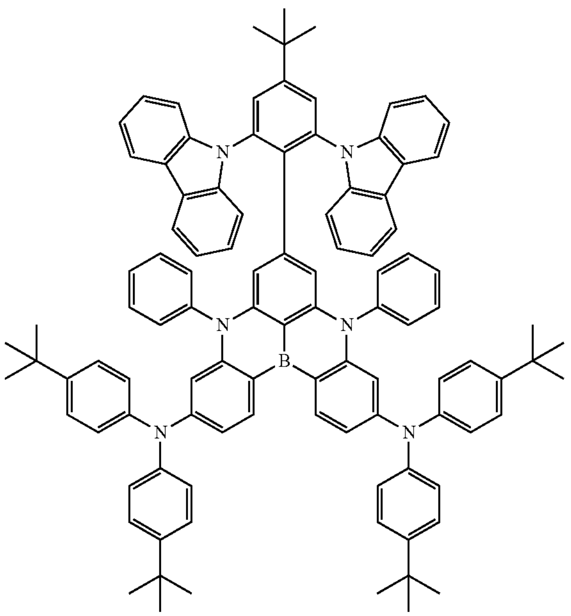

-continued
12
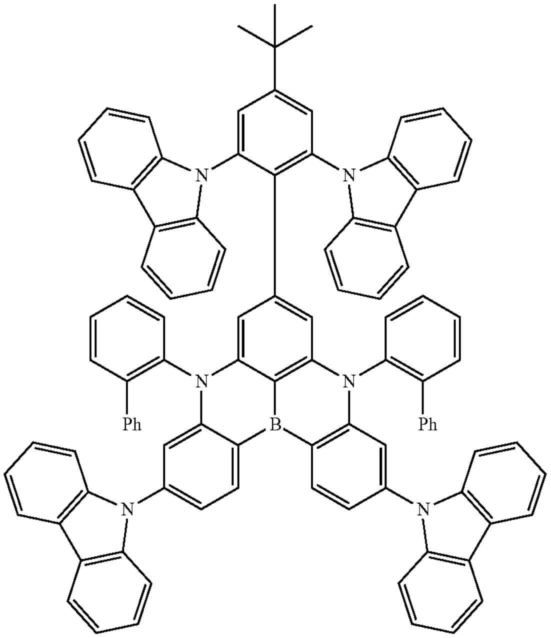
13
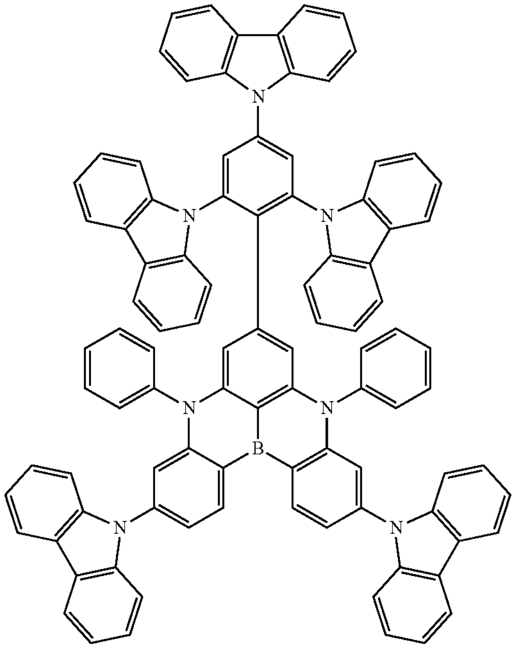
-continued
14
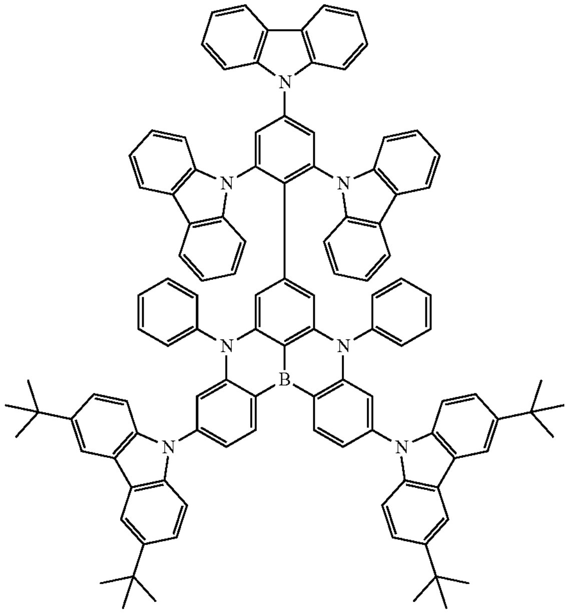
15
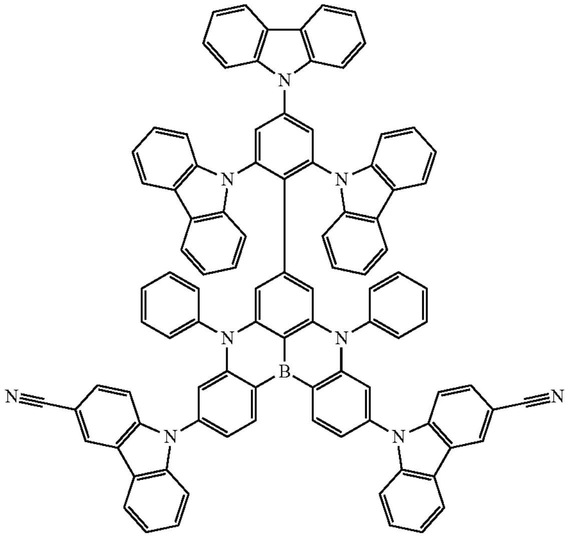

-continued
16
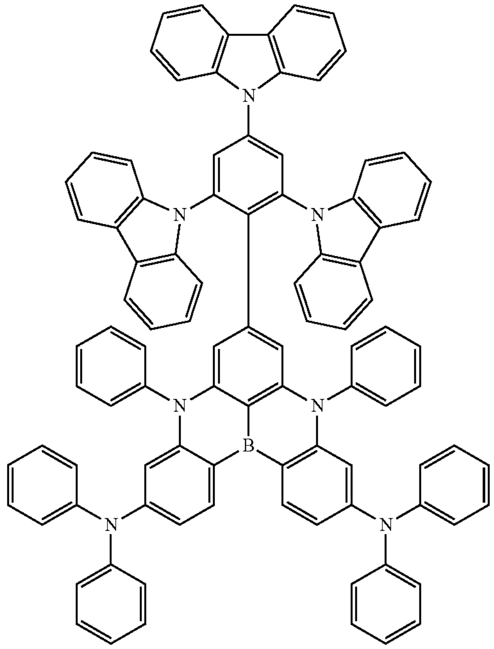
17
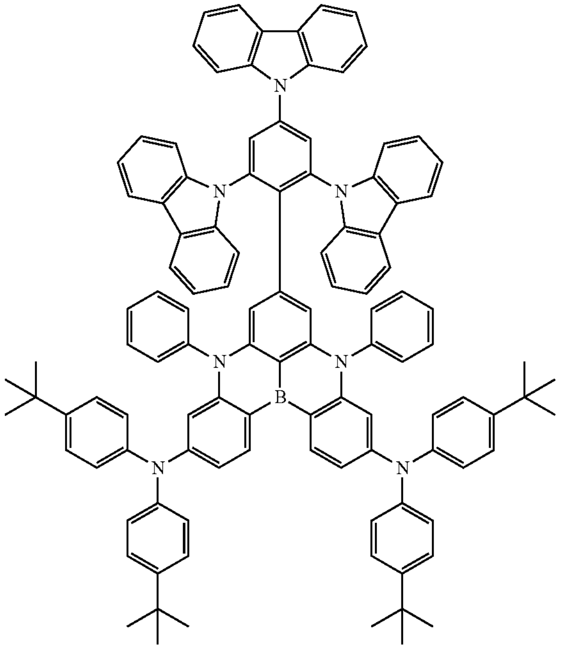
-continued
18
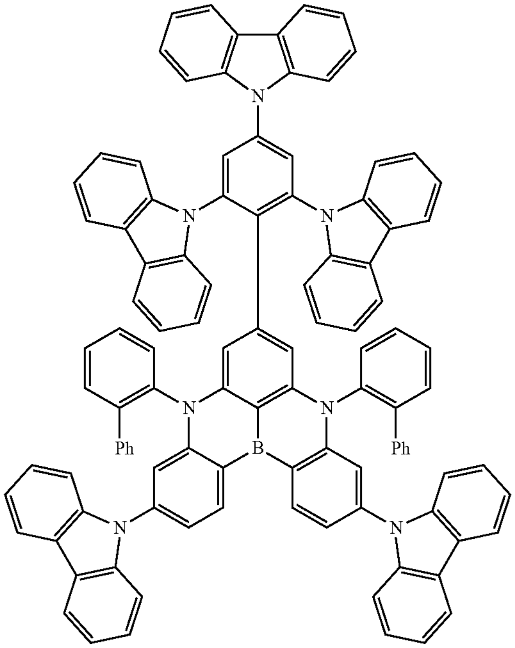
19
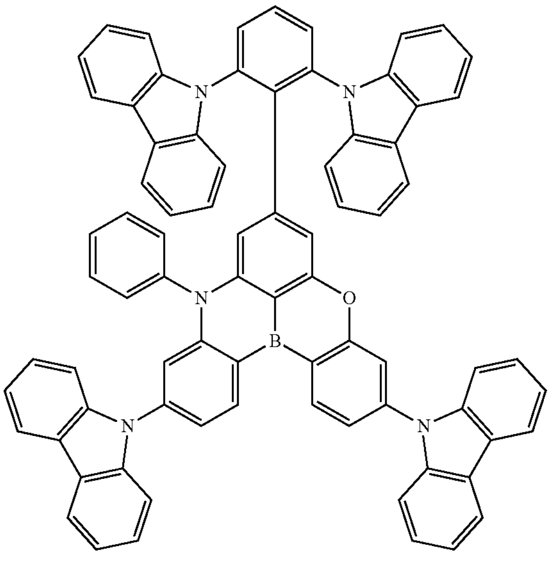

-continued
20
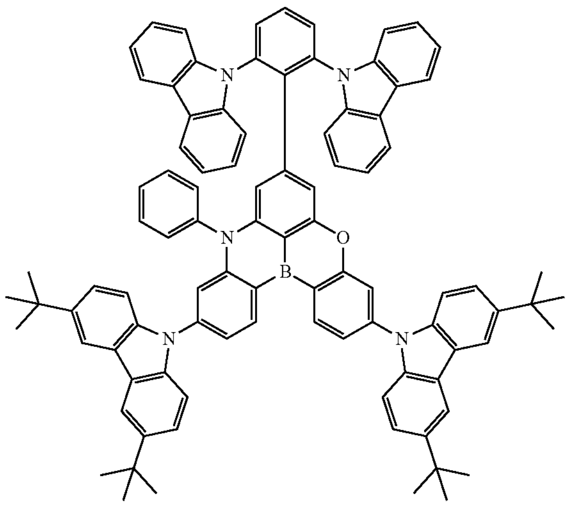
21
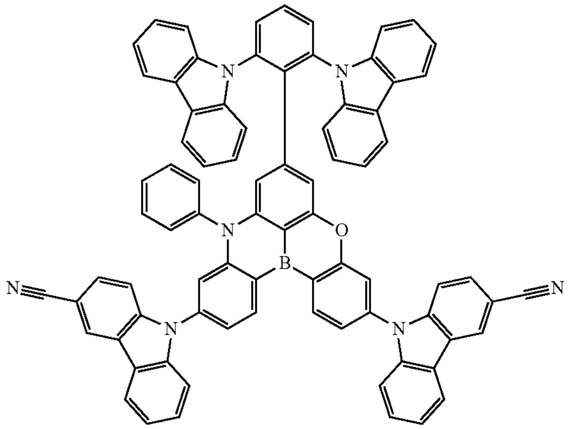
22
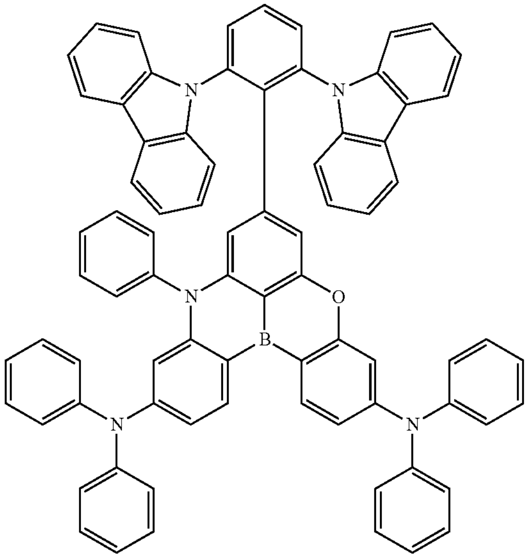
-continued
23
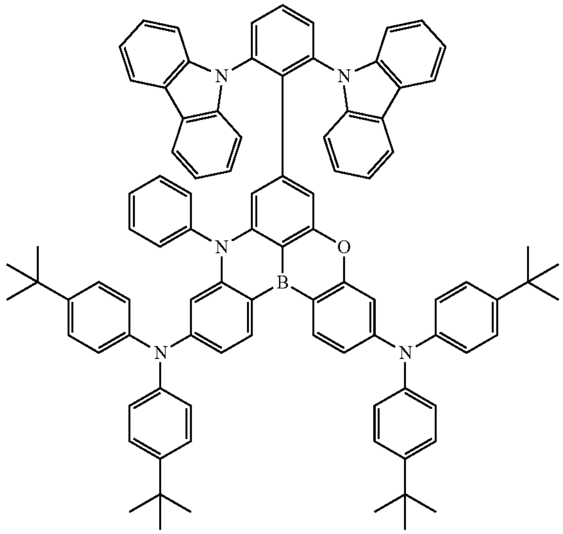
24
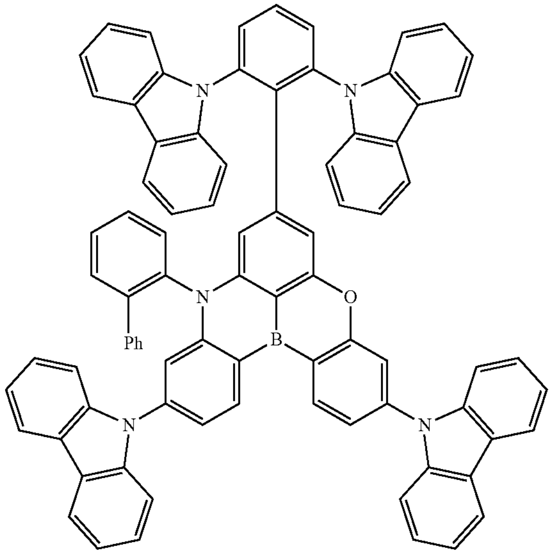

-continued
25
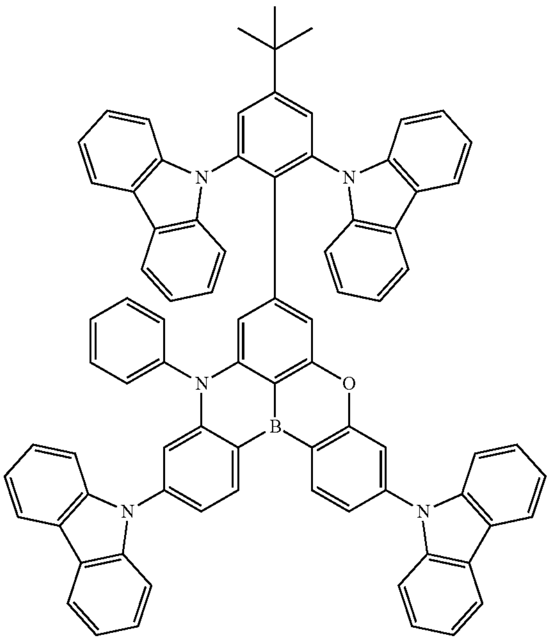
26
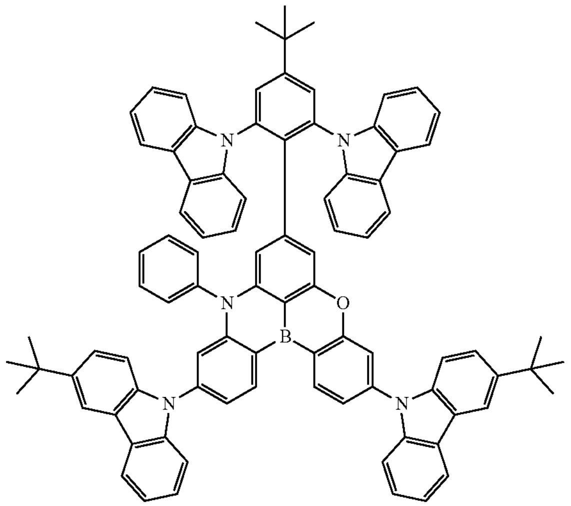
-continued
27
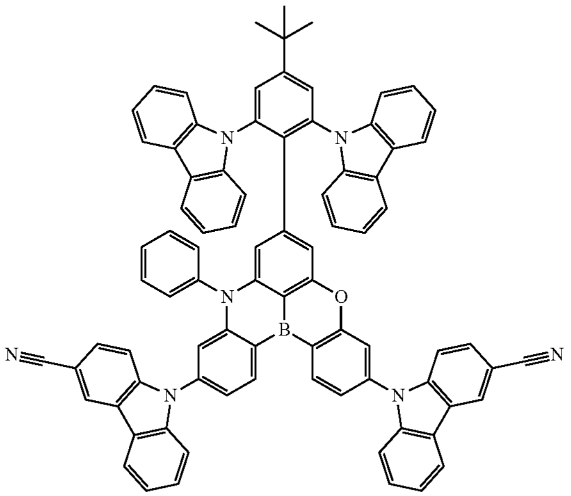
28
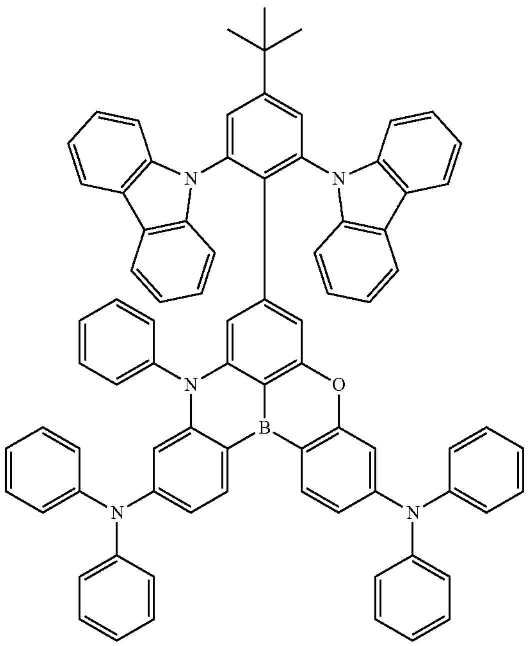

-continued
29
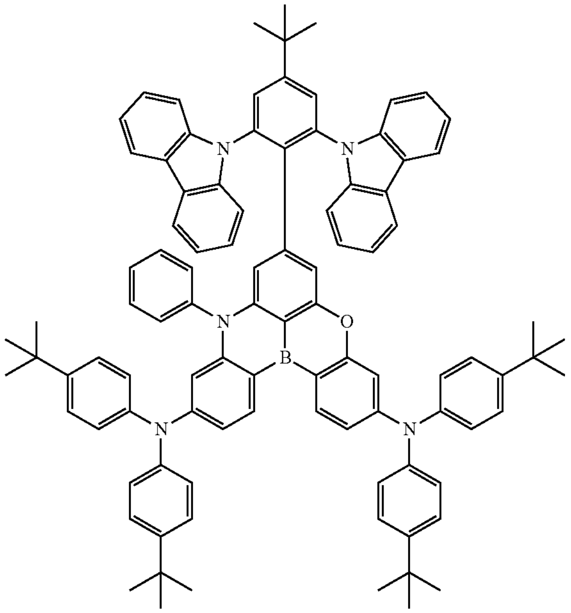
30
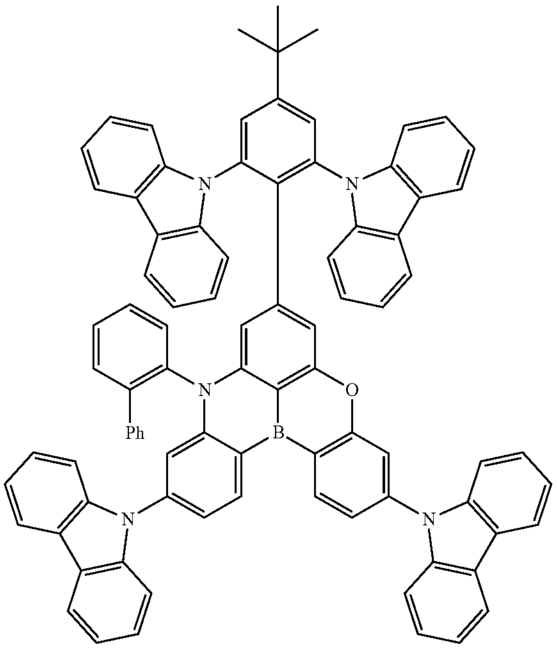
-continued
31
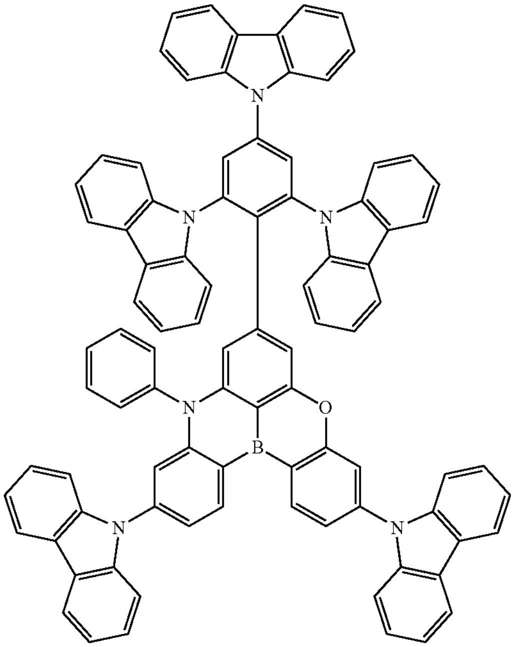
32
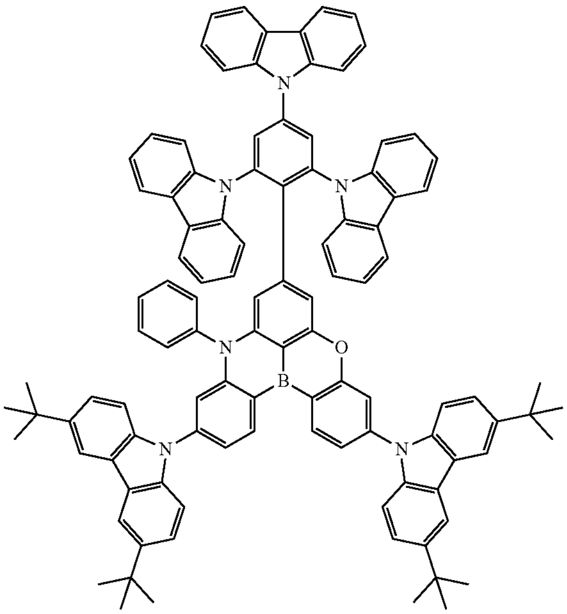

-continued
33
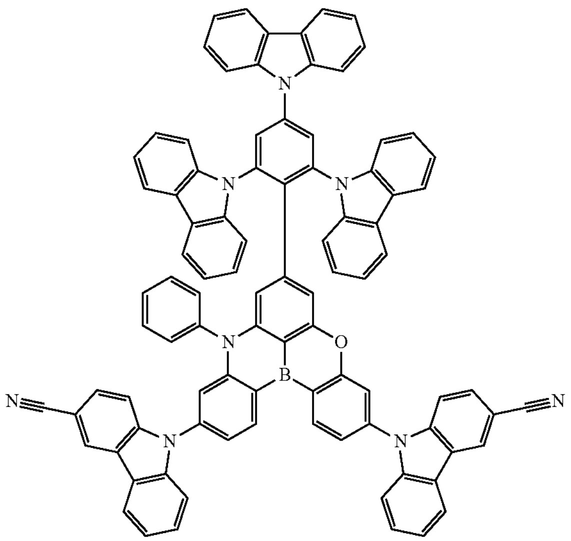
34
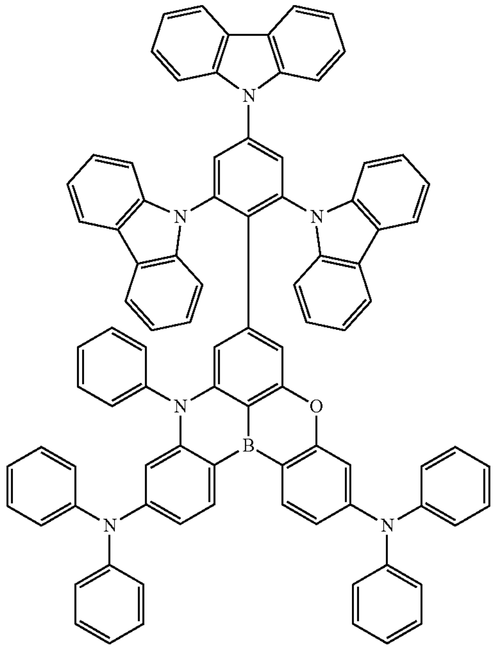
-continued
35
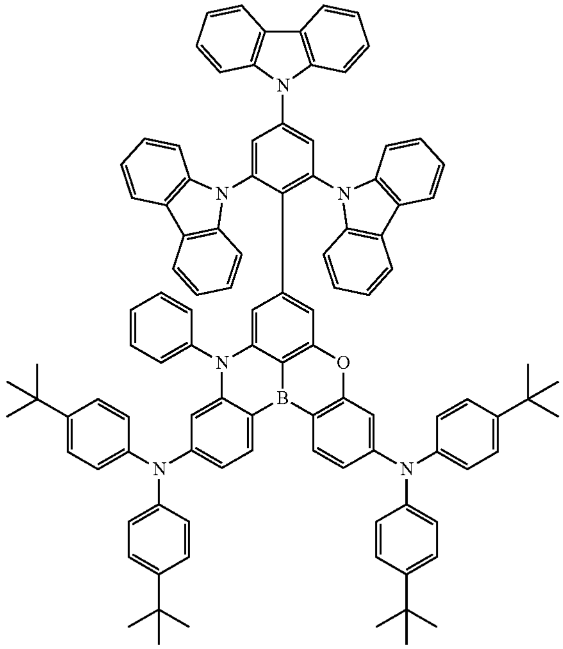
36
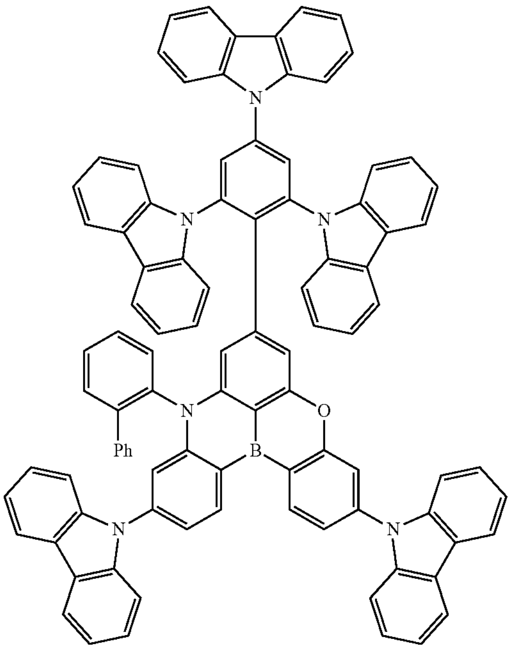

-continued
37
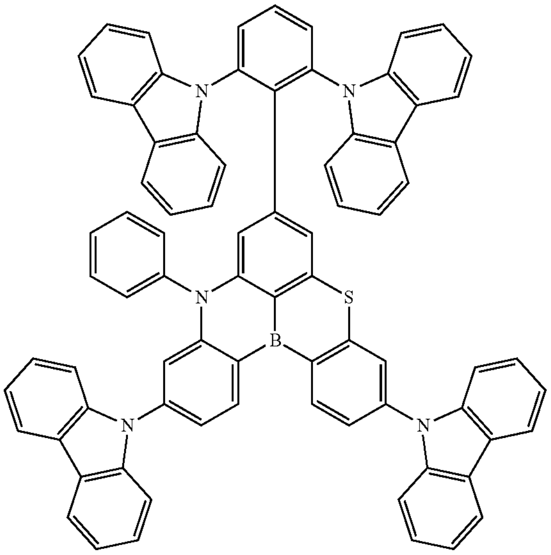
38
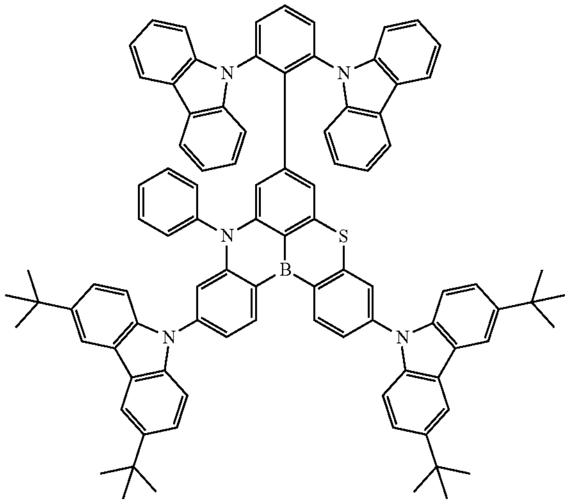
39
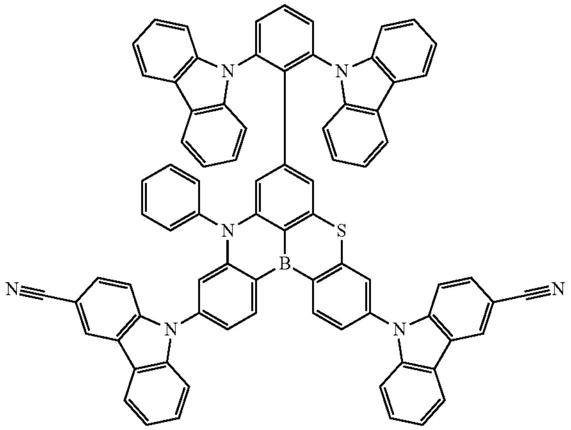
-continued
40
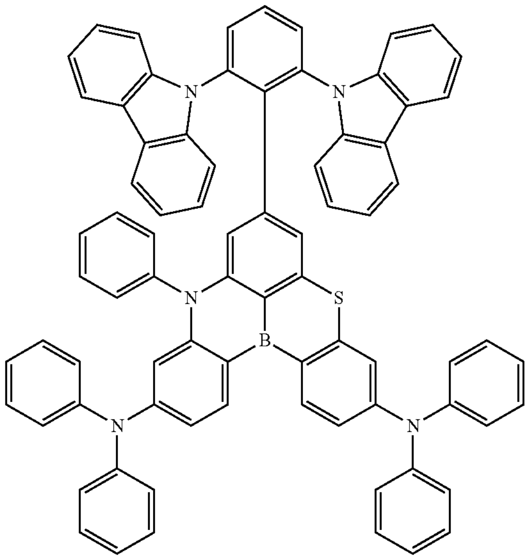
41
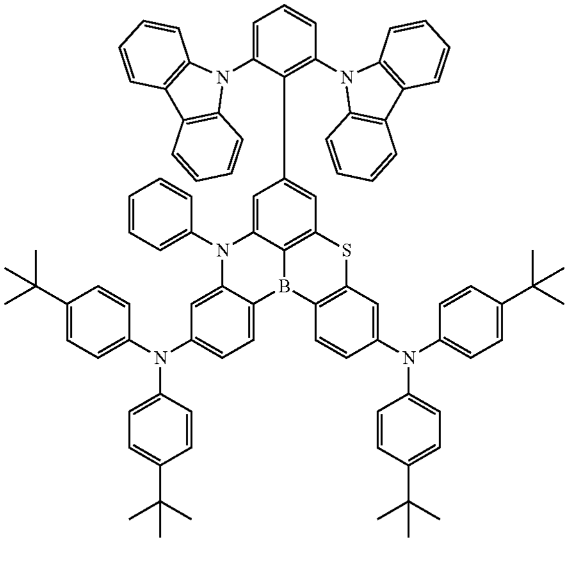

42
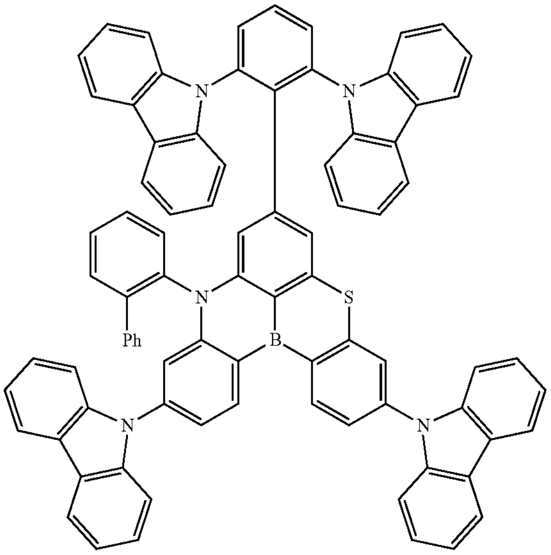
43
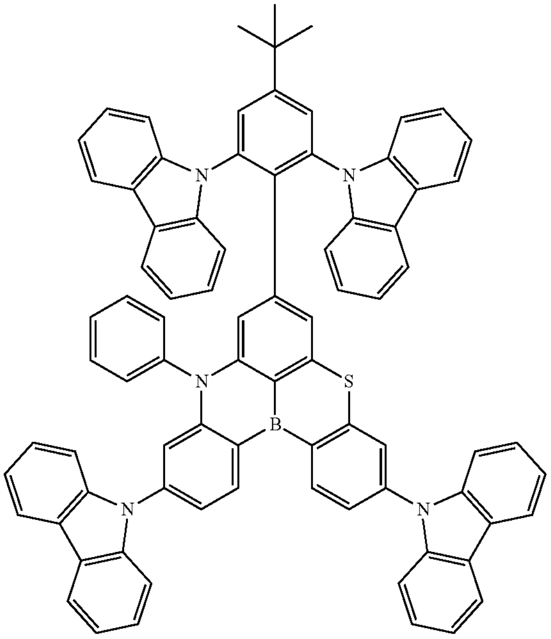
44
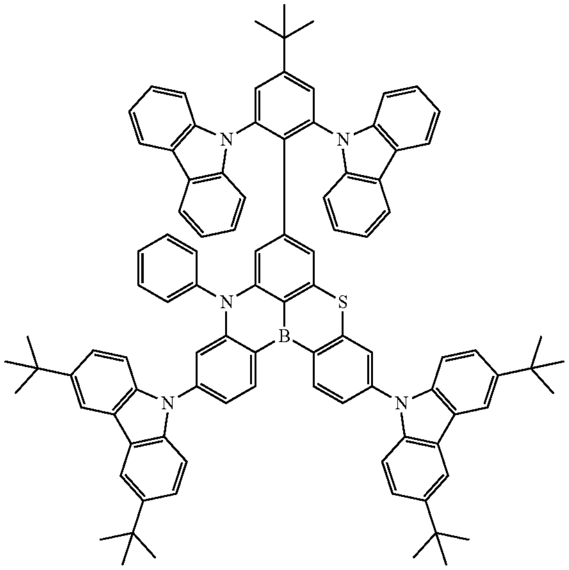
45
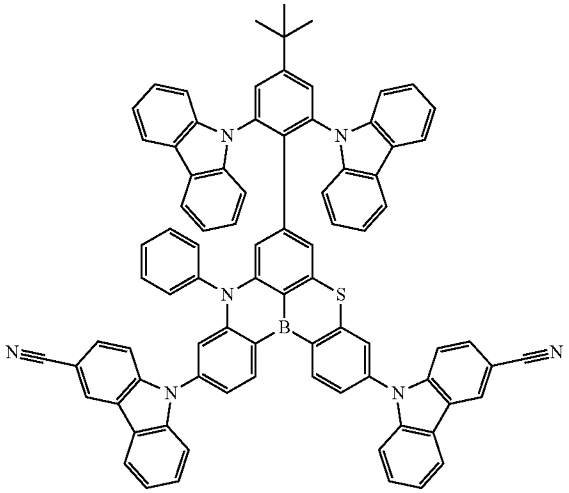

-continued
46
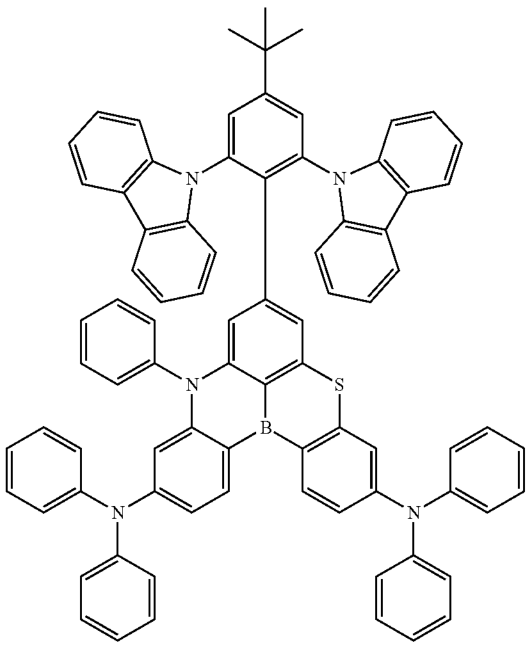
47
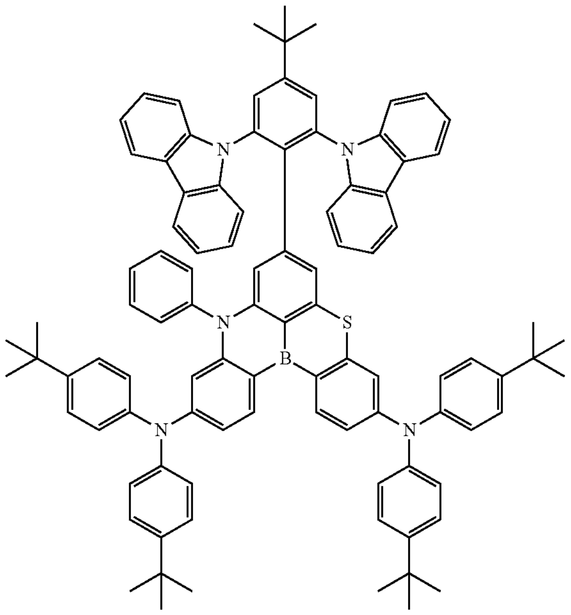

-continued
48
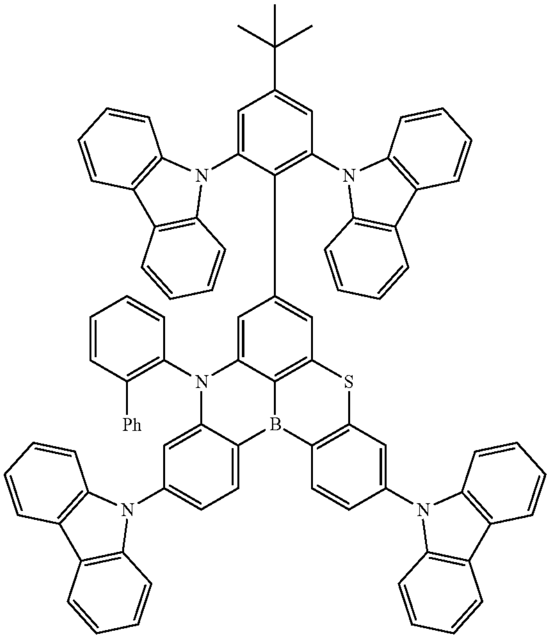
49
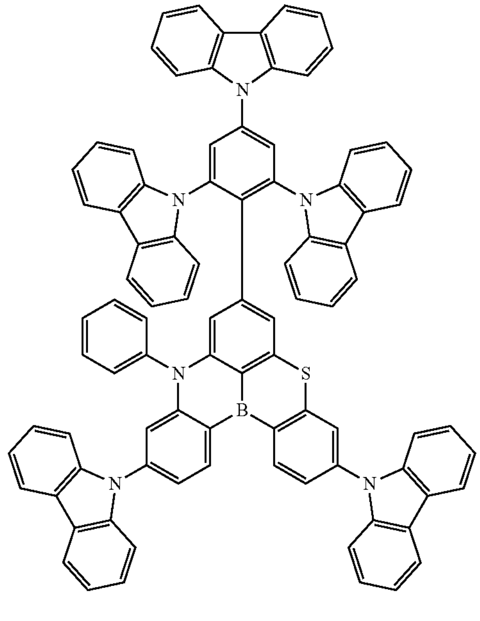
50
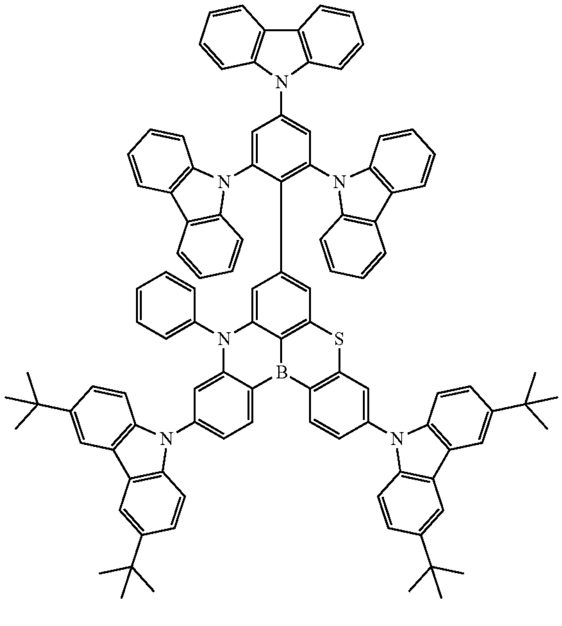

-continued
51
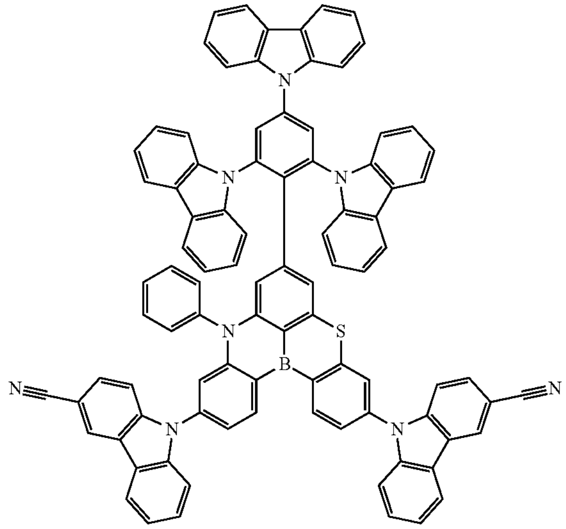
52
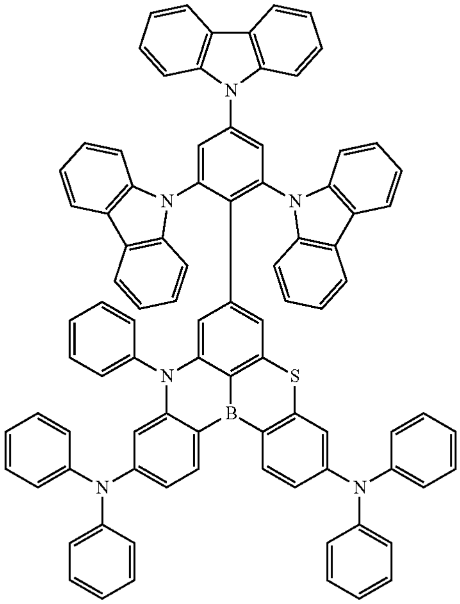
53
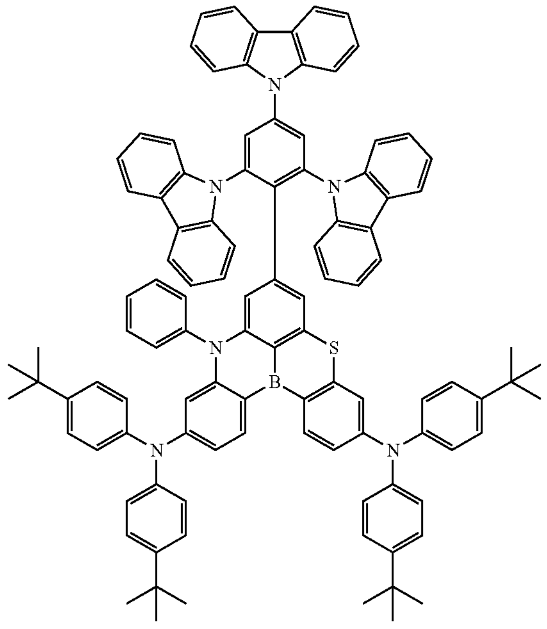
54
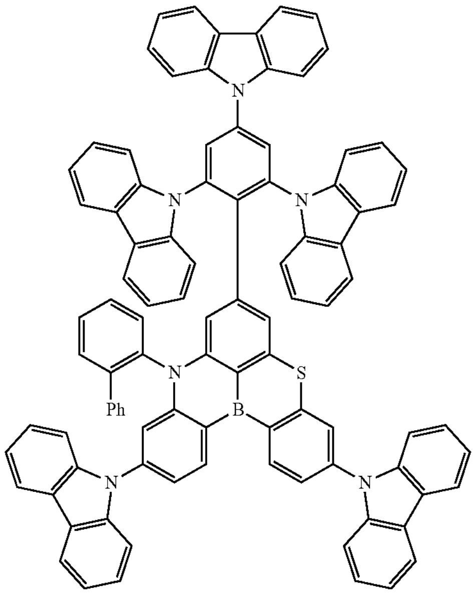

-continued
55
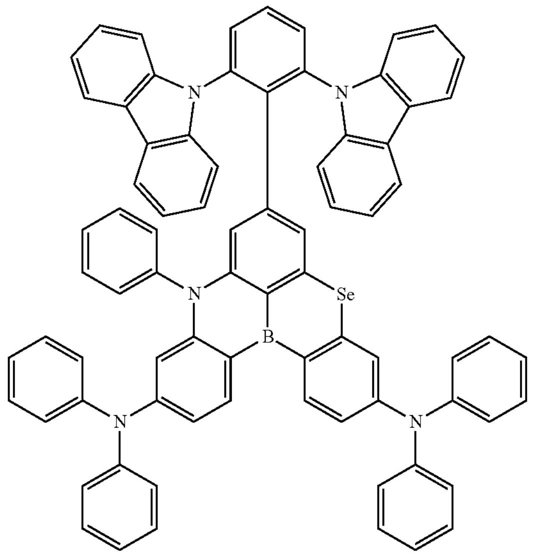
56
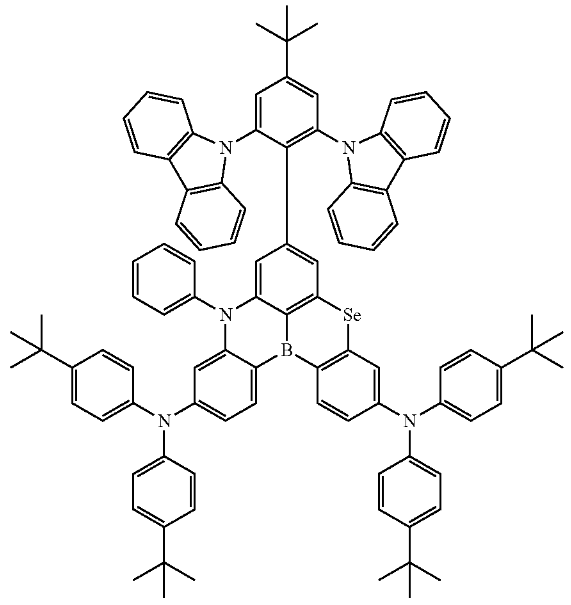
57
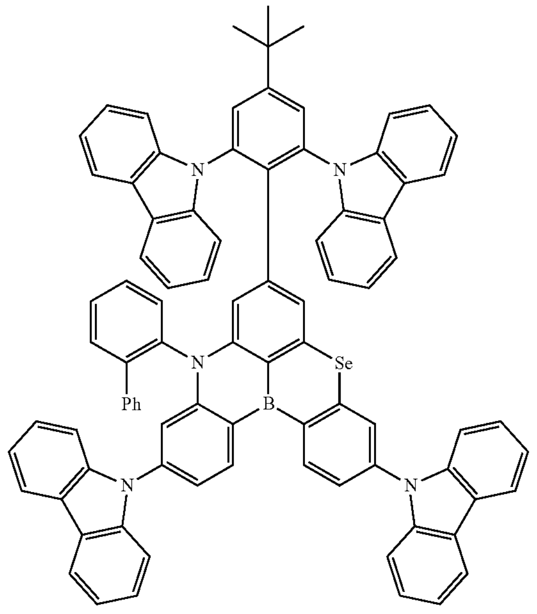
58
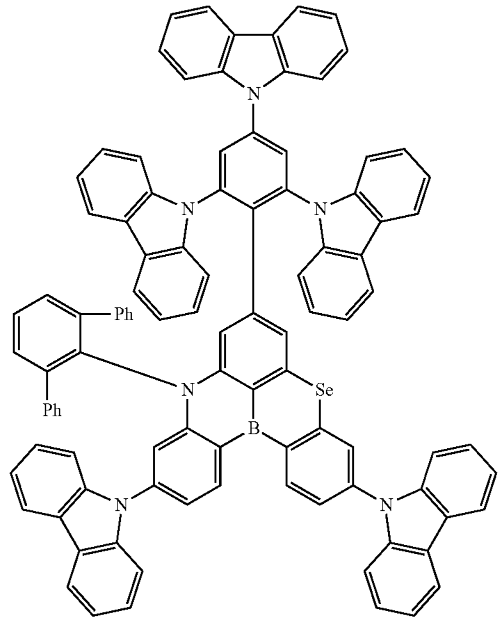

-continued
59
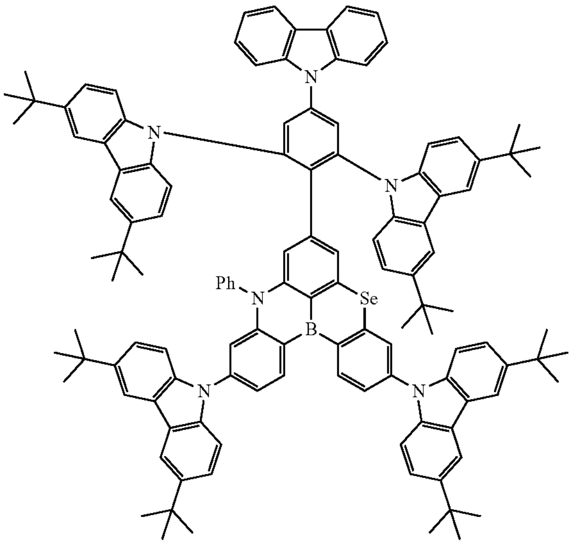
60
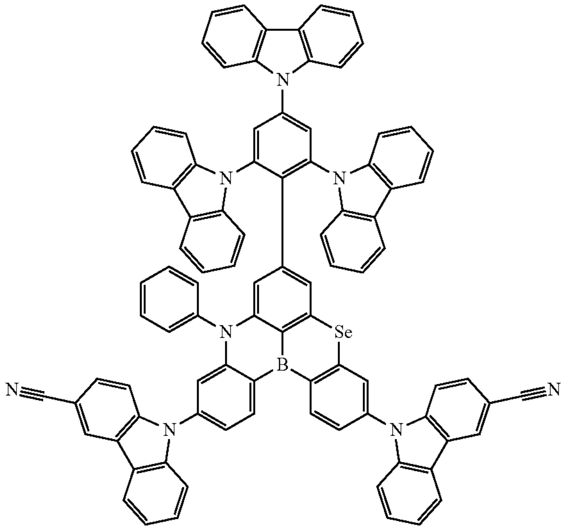
61
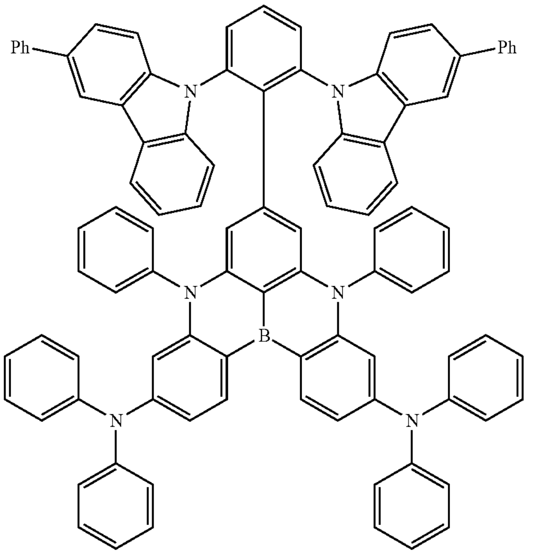
62
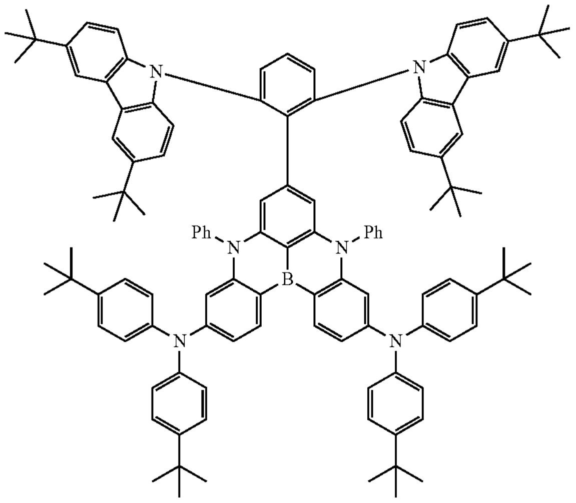

-continued
63
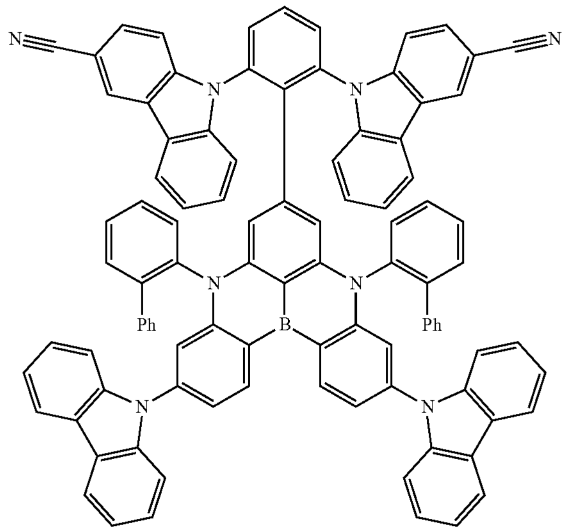
64
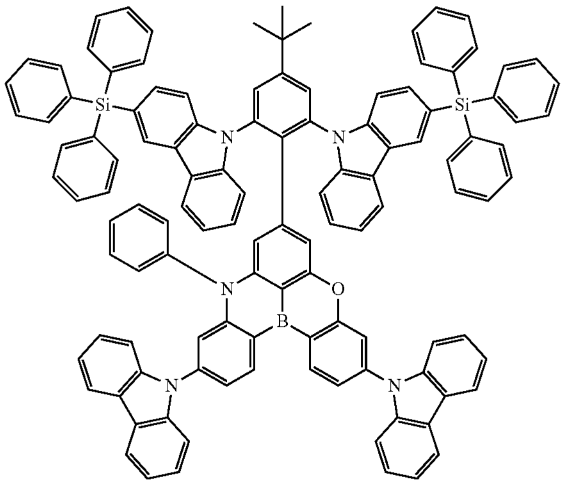
65
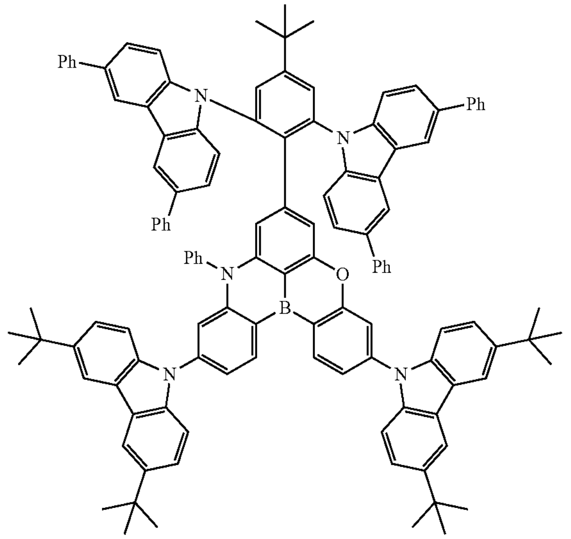
66
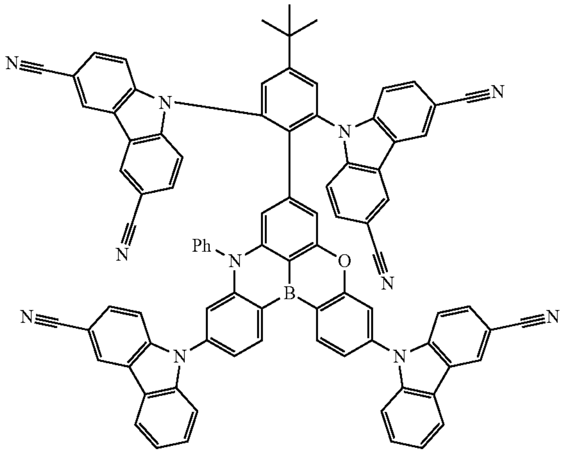

-continued
67
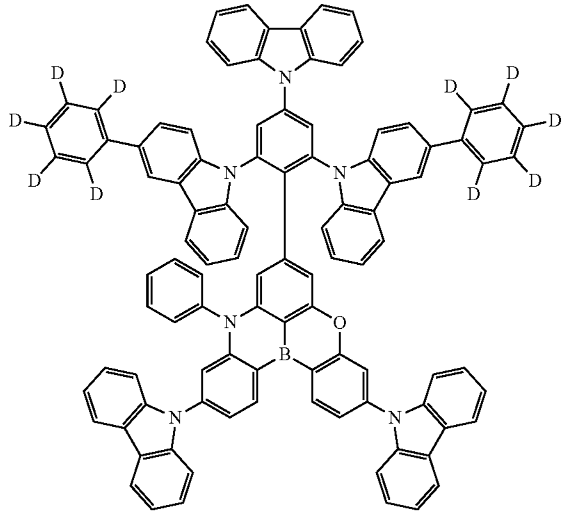
68
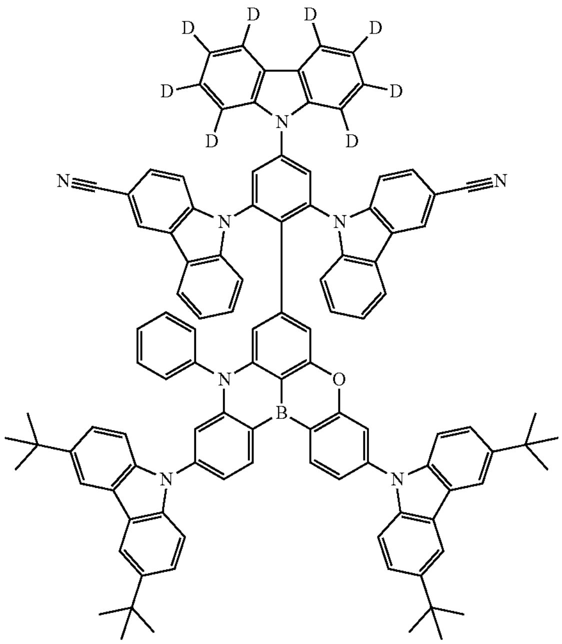
69
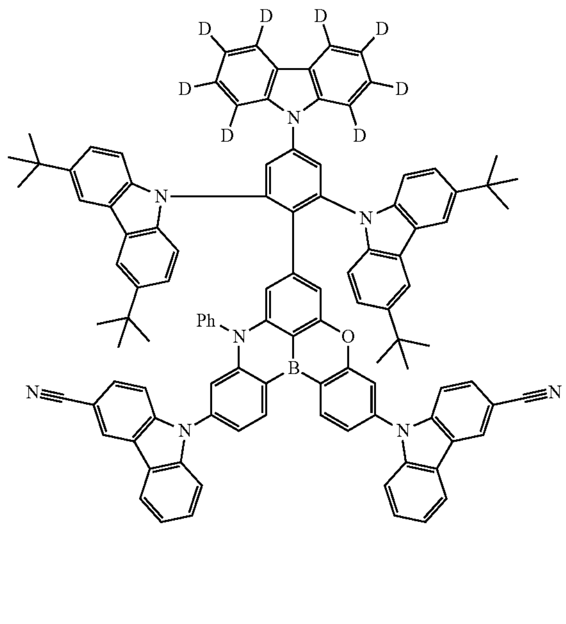
70
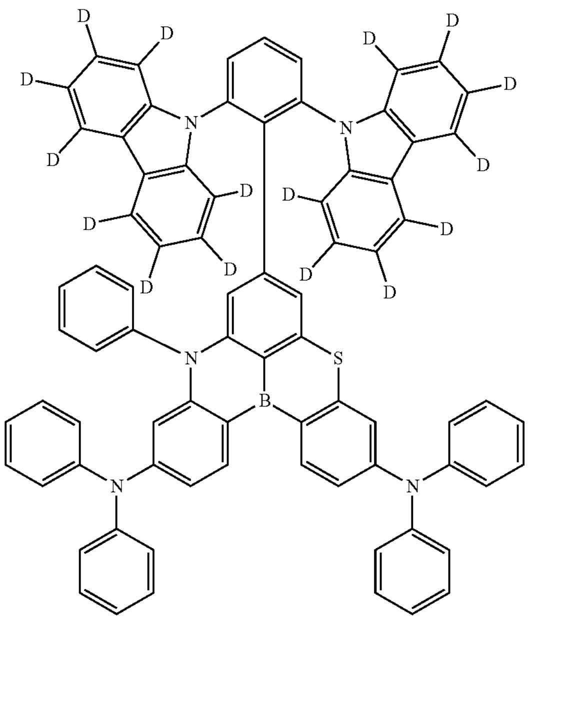

-continued
71
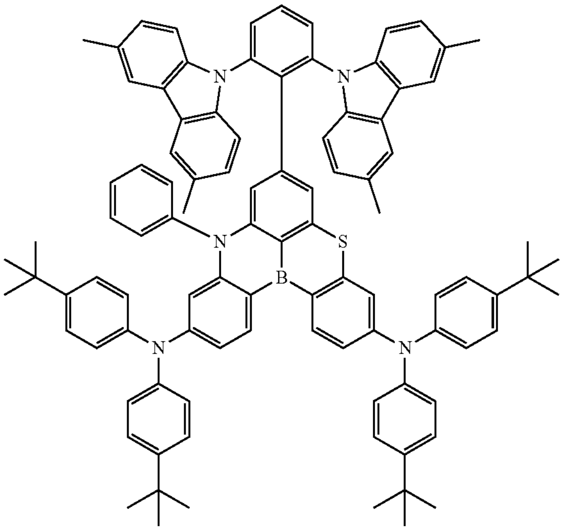
72
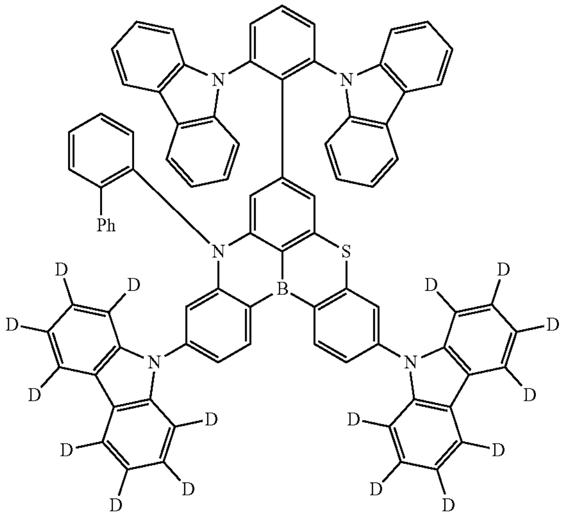
73
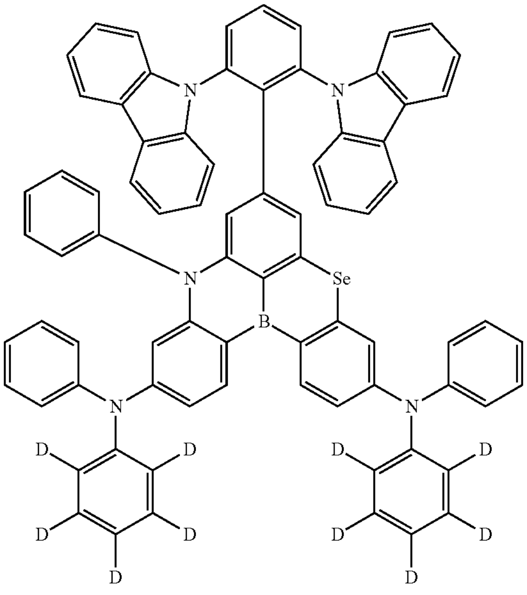
74
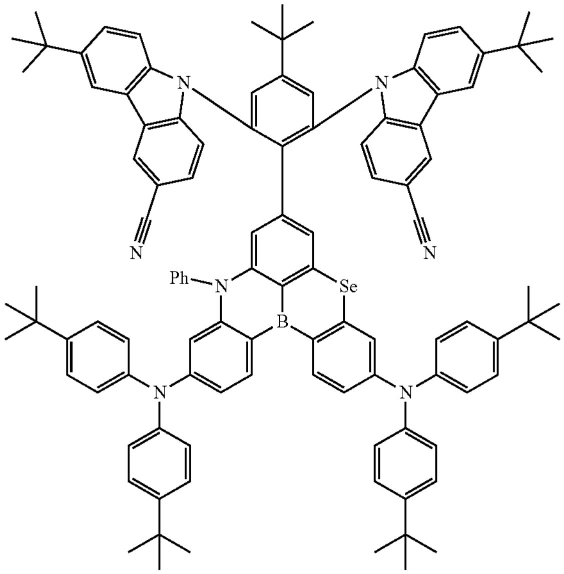

-continued
75
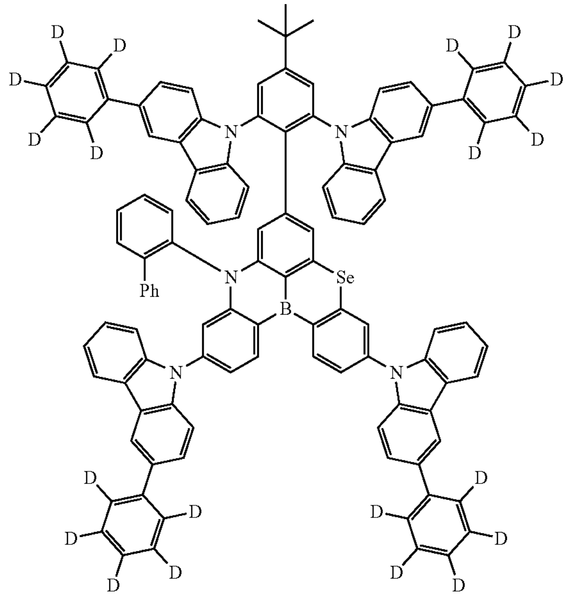
76
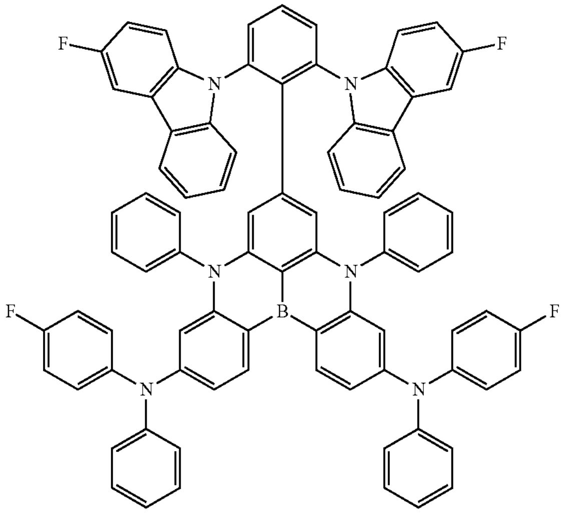
77
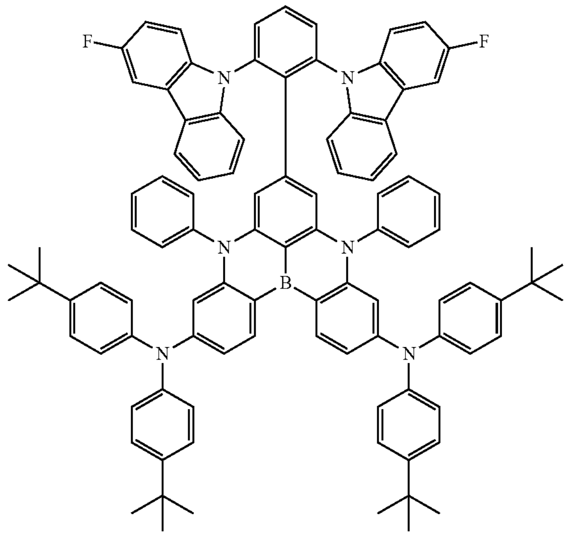
78
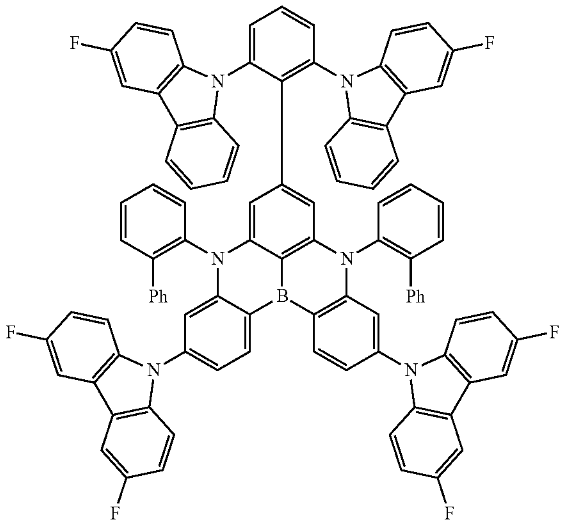

-continued
79
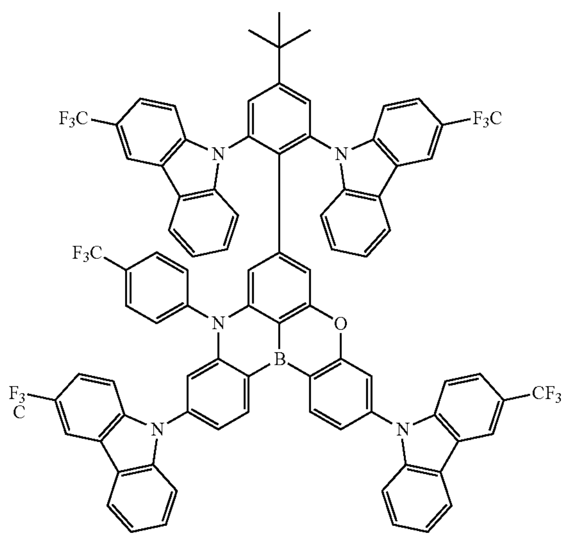
80
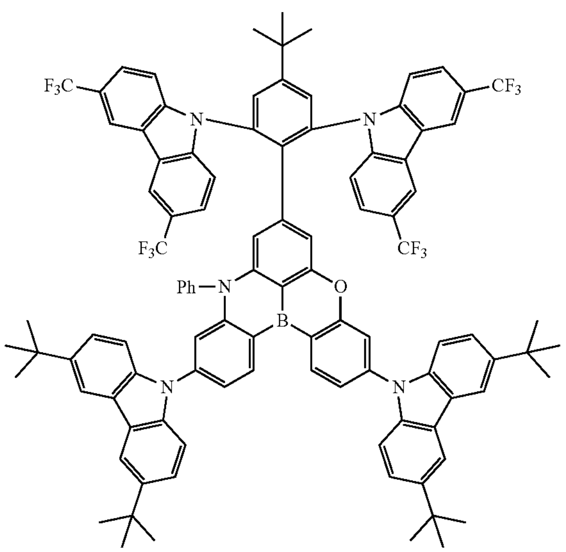
81
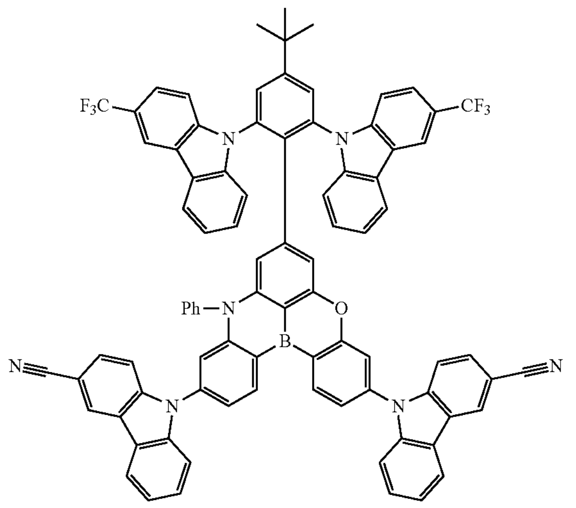
82
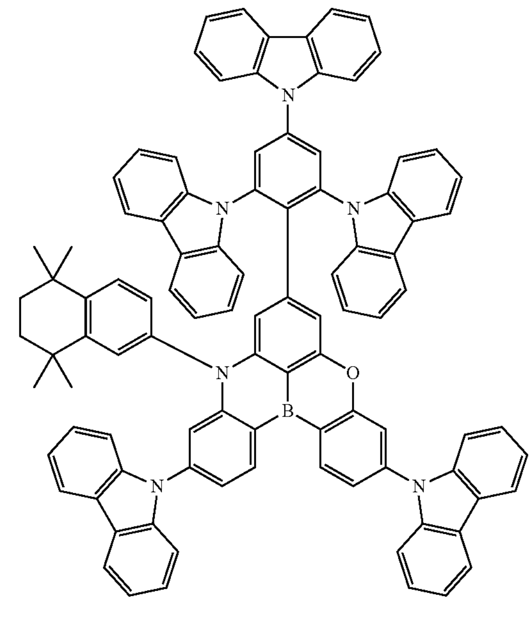

-continued
83
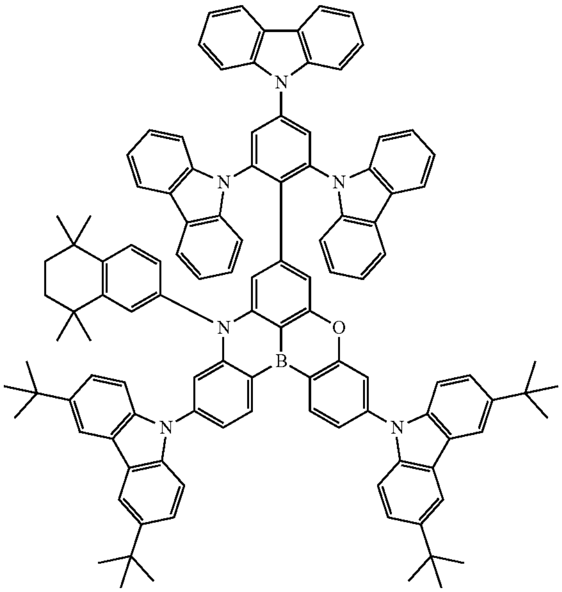
84
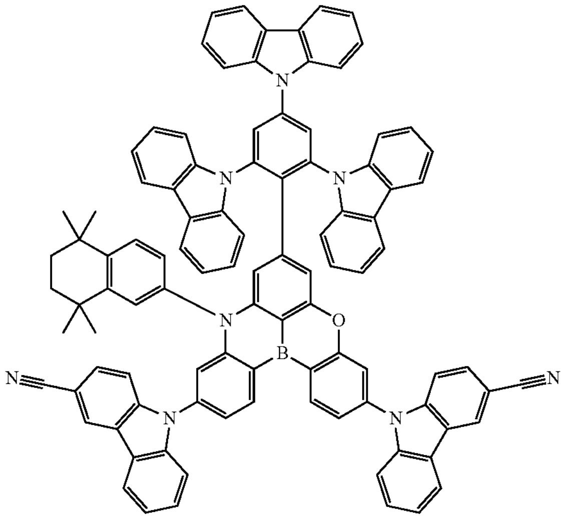
85
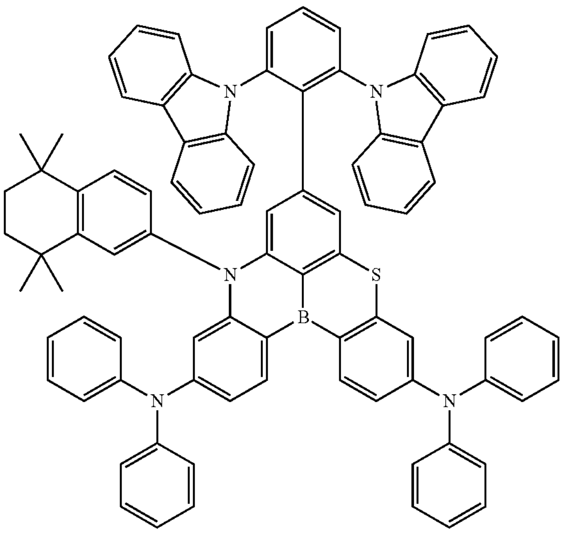
86
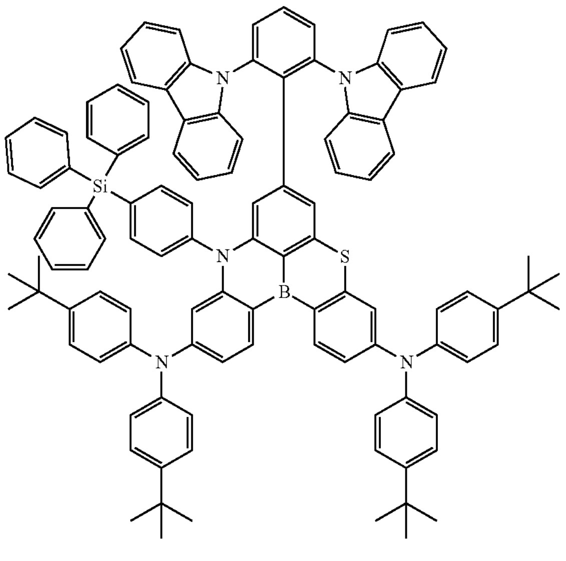

-continued
87
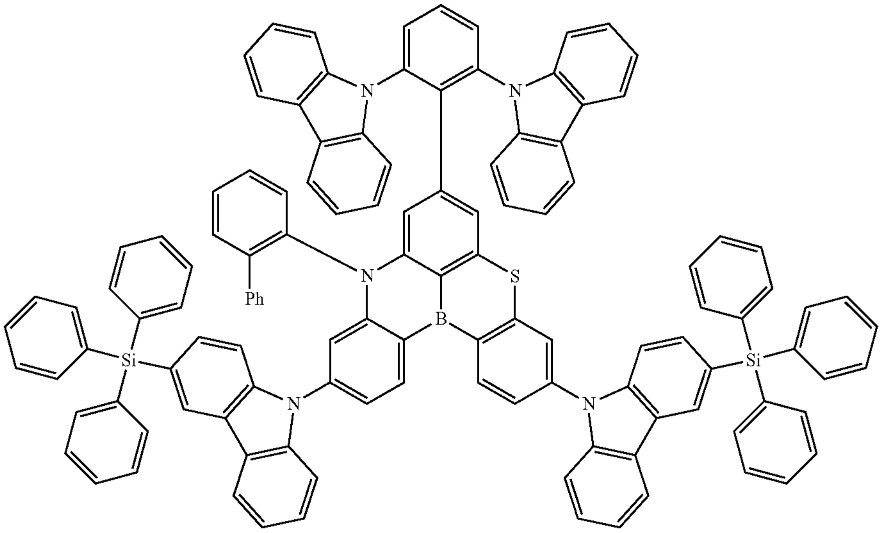
88
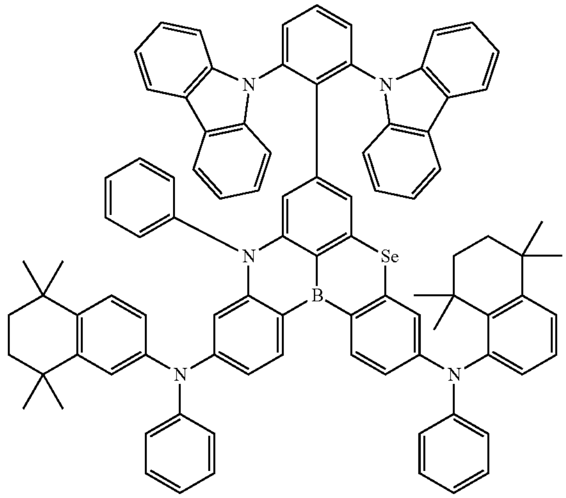
89
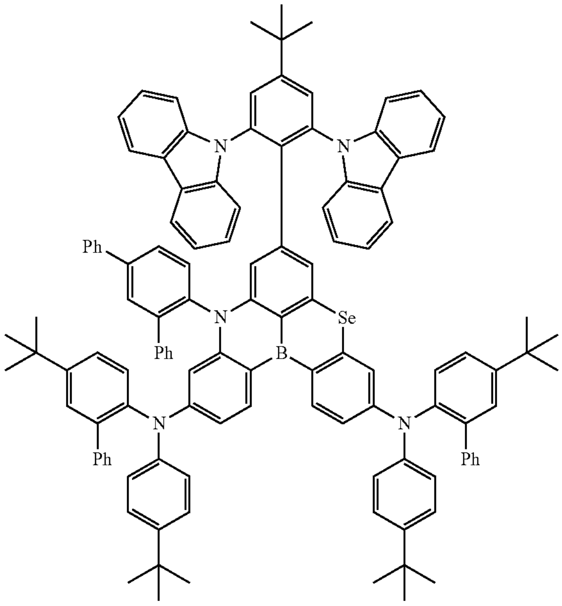

-continued

90

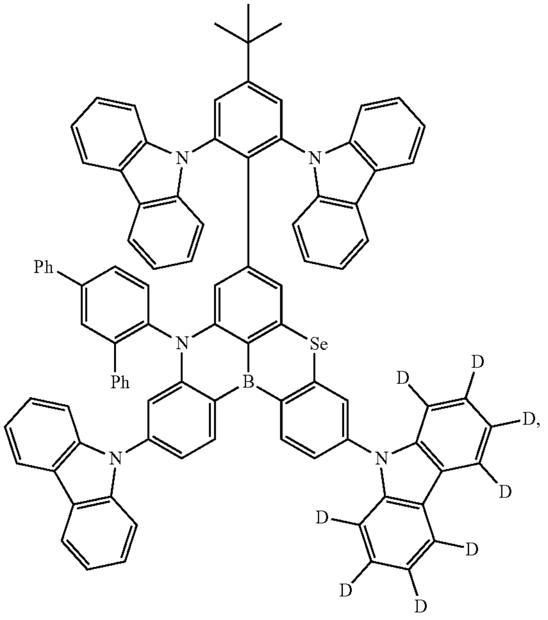

wherein in Compound Group 1,

Ph is an unsubstituted phenyl group.

10. A light emitting device comprising:

a first electrode;

a second electrode disposed on the first electrode; and a light emitting layer disposed between the first electrode and the second electrode, wherein the light emitting layer includes a polycyclic compound represented by Formula 1, and the maximum external quantum efficiency of the light emitting device is equal to or greater than about 20%:

[Formula 1]

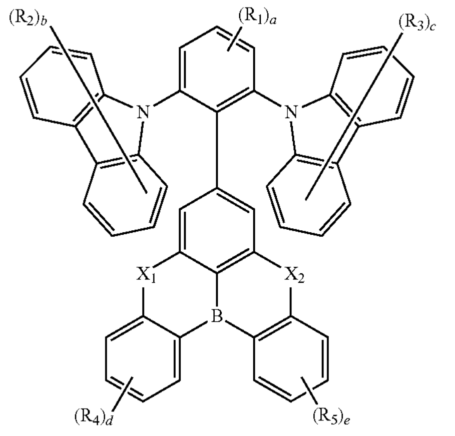

wherein in Formula 1, $X_1$ and $X_2$ are each independently O, S, Se, or N(Ra), a is an integer from 0 to 3, b and c are each independently an integer from 0 to 8, d and e are each independently an integer from 0 to 4, and $R_1$ to $R_5$, and Ra are each independently a hydrogen atom, a deuterium atom, a halogen atom, a cyano group, a substituted or unsubstituted amine group, a substituted or unsubstituted silyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring.

11. The light emitting device of claim 10, wherein the polycyclic compound represented by Formula 1 is represented by Formula 2:

[Formula 2]

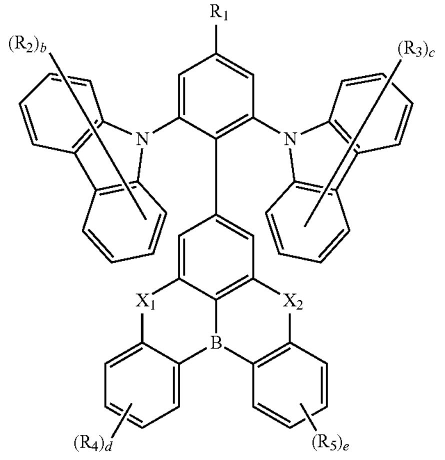

wherein in Formula 2, $X_1$, $X_2$, b to e, and $R_1$ to $R_5$ are the same as defined in Formula 1.

12. The light emitting device of claim 11, wherein in Formula 2, $R_1$ is a hydrogen atom, a substituted or unsubstituted carbazole group, or a substituted or unsubstituted t-butyl group.

13. The light emitting device of claim 10, wherein in Formula 1, $R_2$ and $R_3$ are each independently a hydrogen atom, a deuterium atom, a fluorine atom, a cyano group, a substituted or unsubstituted triphenylsilyl group, a substituted or unsubstituted phenyl group, a substituted or unsubstituted t-butyl group, or a substituted or unsubstituted methyl group.

14. The light emitting device of claim 13, wherein the polycyclic compound represented by Formula 1 is represented by Formula 3-1 or Formula 3-2:

[Formula 3-1]

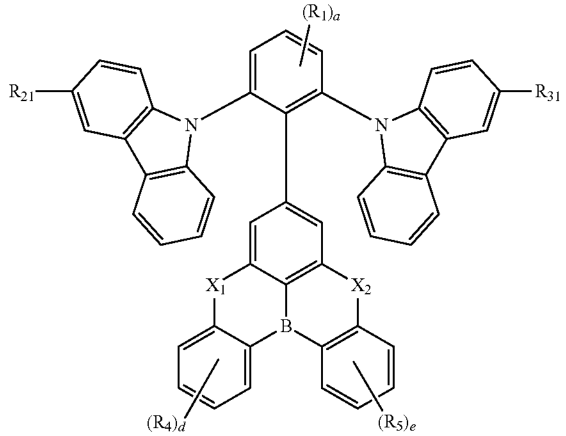

[Formula 3-2]

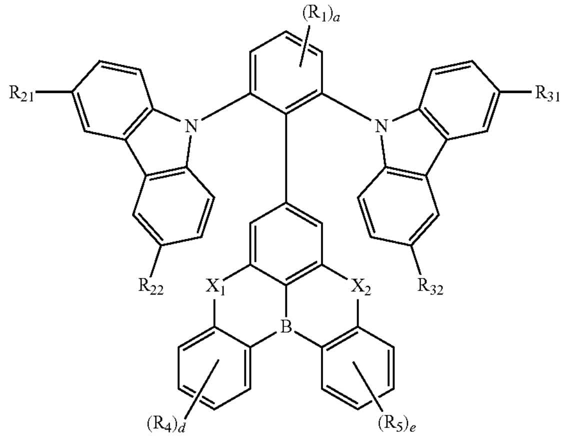

wherein in Formula 3-1 and Formula 3-2, $R_{21}$, $R_{22}$, $R_{31}$, and $R_{32}$ are each independently a hydrogen atom, a fluorine atom, a cyano group, a substituted or unsubstituted phenyl group, a substituted or unsubstituted t-butyl group, a substituted or unsubstituted triphenylsilyl group, or a substituted or unsubstituted methyl group, and $X_1$, $X_2$, a, d, e, $R_1$, $R_4$, and $R_5$ are the same as defined in Formula 1.

15. The light emitting layer of claim 10, wherein the polycyclic compound represented by Formula 1 is represented by Formula 4:

[Formula 4]

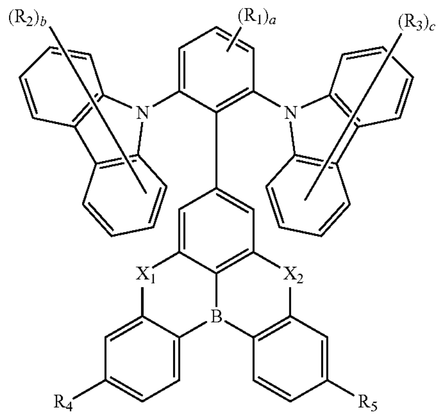

wherein in Formula 4, $X_1$, $X_2$, a to c, and $R_1$ to $R_5$ are the same as defined in Formula 1.

16. The light emitting device of claim 15, wherein in Formula 4, $R_4$ and $R_5$ are each independently a substituted or unsubstituted carbazole group, or a substituted or unsubstituted diphenyl amine group.

17. The light emitting device of claim 10, wherein at least one of $X_1$ and $X_2$ is N(Ra), and Ra is a group represented by one of Formulas $A_1$ to $A_6$:

$A_1$

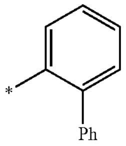

$A_2$

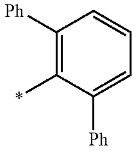

$A_3$

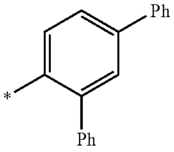

$A_4$

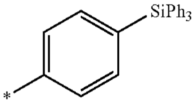

$A_5$

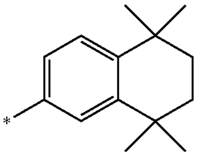

-continued

A6

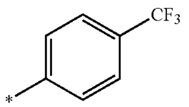

wherein in Formulas $A_1$ to $A_6$,

Ph is an unsubstituted phenyl group, and

—* represents a binding site to a nitrogen atom in N(Ra).

18. The light emitting device of claim 10, wherein the polycyclic compound comprises an enantiomer.

19. The light emitting device of claim 10, wherein the light emitting layer is a delayed fluorescent light emitting layer including a host and a dopant, and the dopant includes the polycyclic compound.

20. The light emitting device of claim 10, wherein the light emitting layer emits blue light having a center wavelength in a range of about 450 nm to about 470 nm.

21. The light emitting device of claim 10, wherein the polycyclic compound represented by Formula 1 is one selected from Compound Group 1:

[Compound Group 1]

1

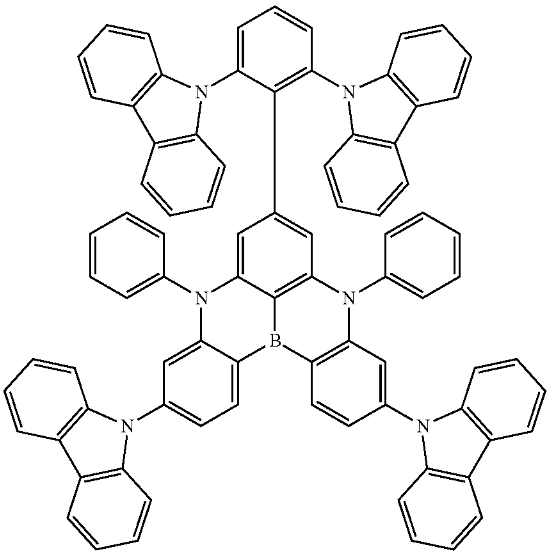

-continued

2

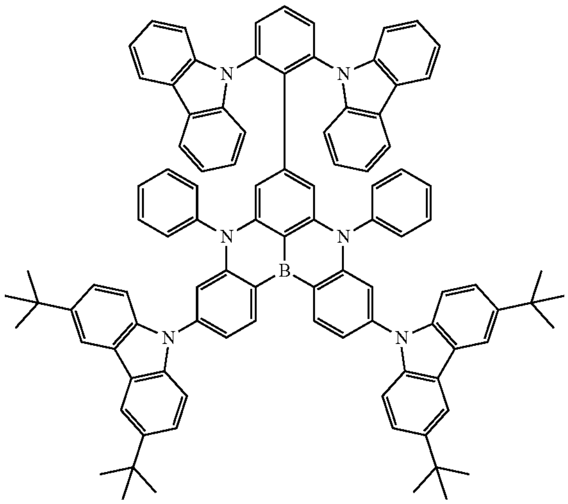

3

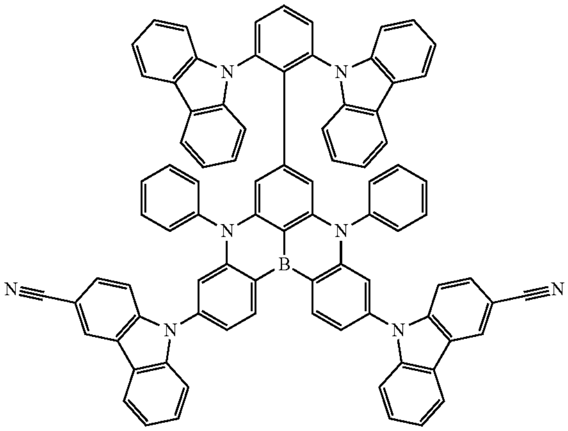

4

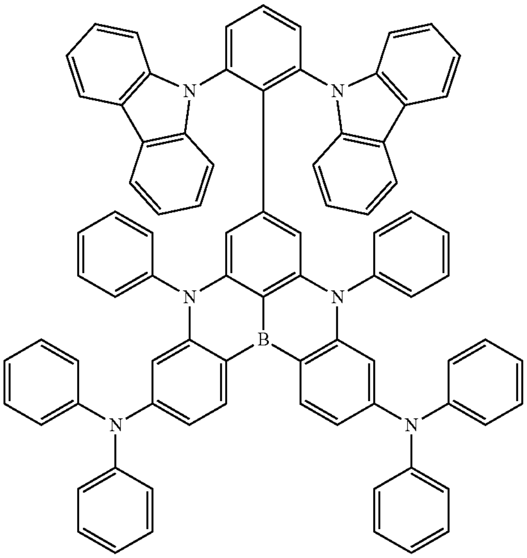

-continued
5
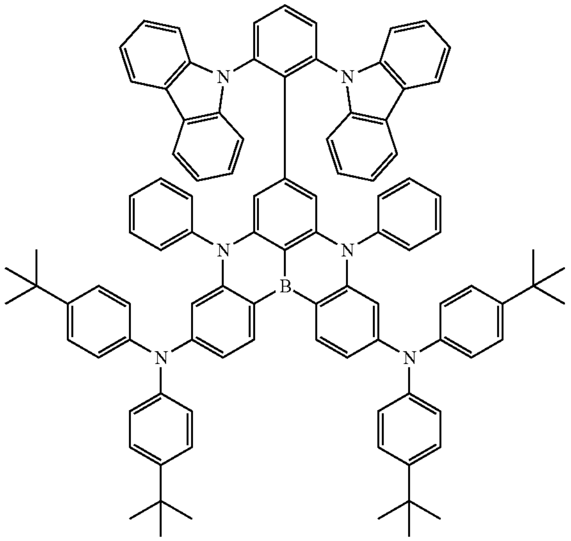
6
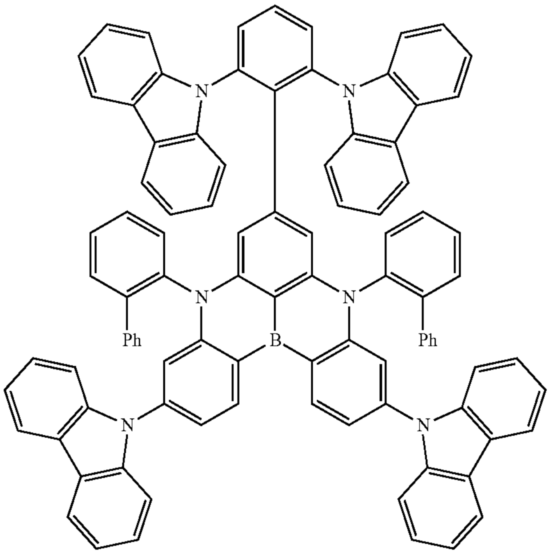
-continued
7
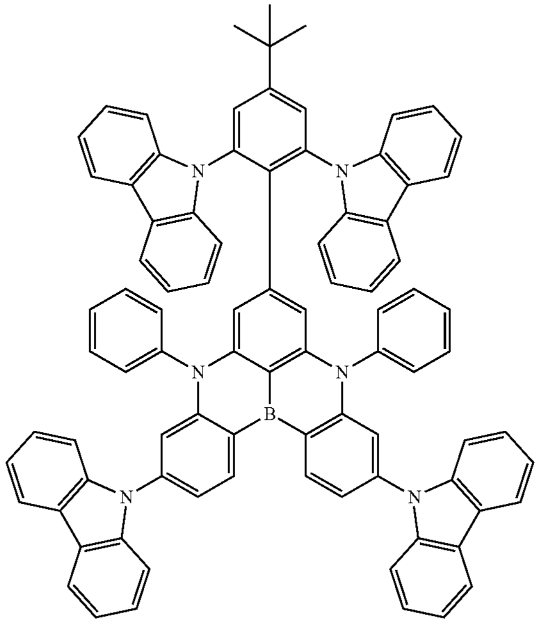
8
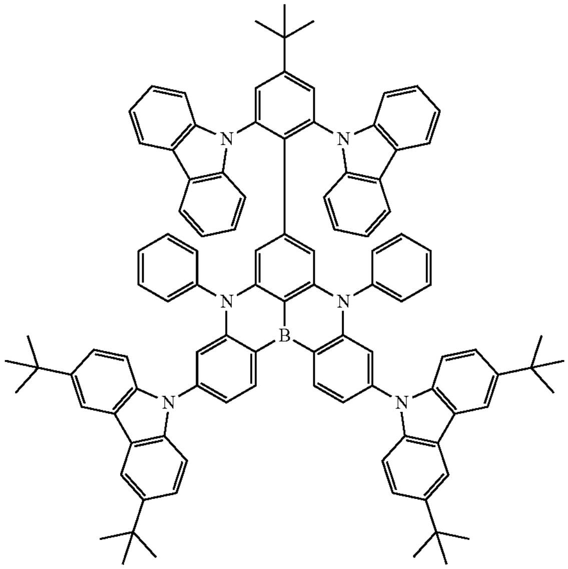

-continued
9
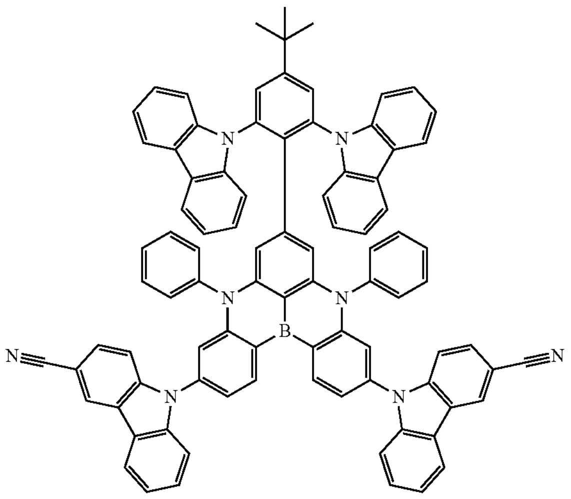
11
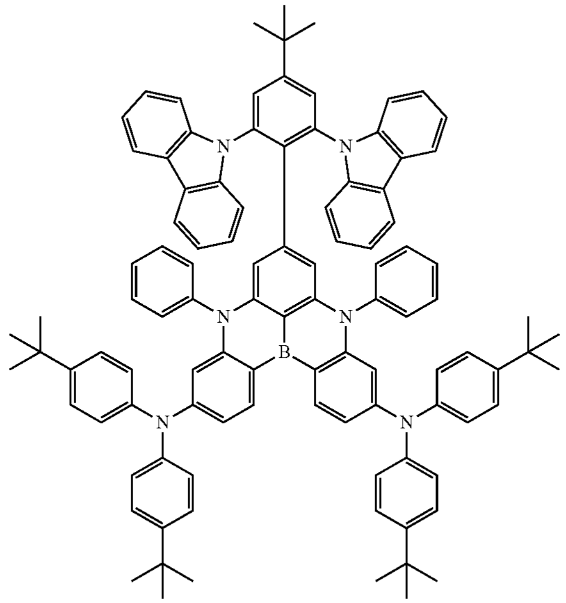
10
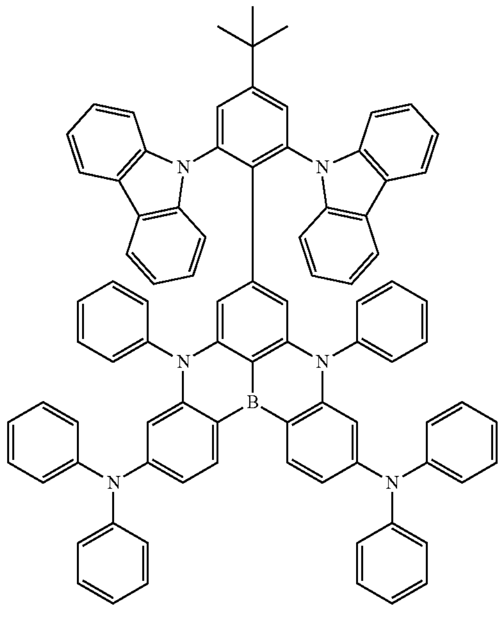
12
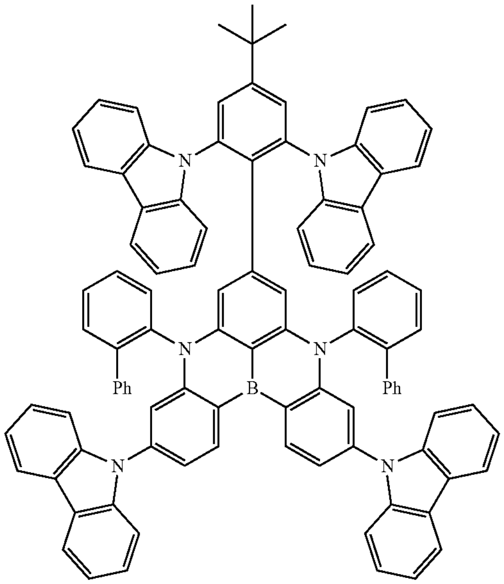

-continued
13
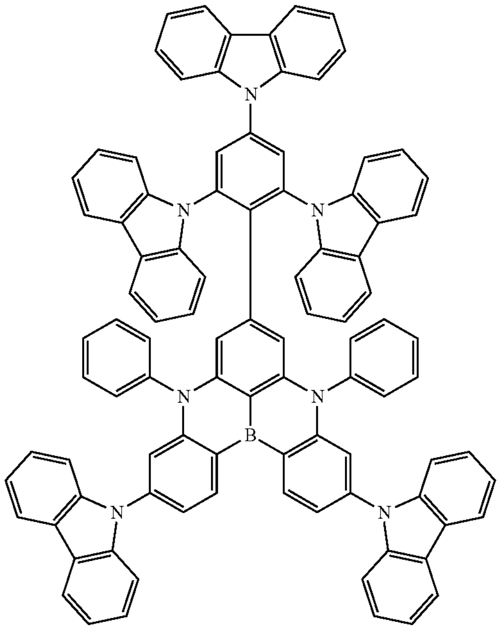
14
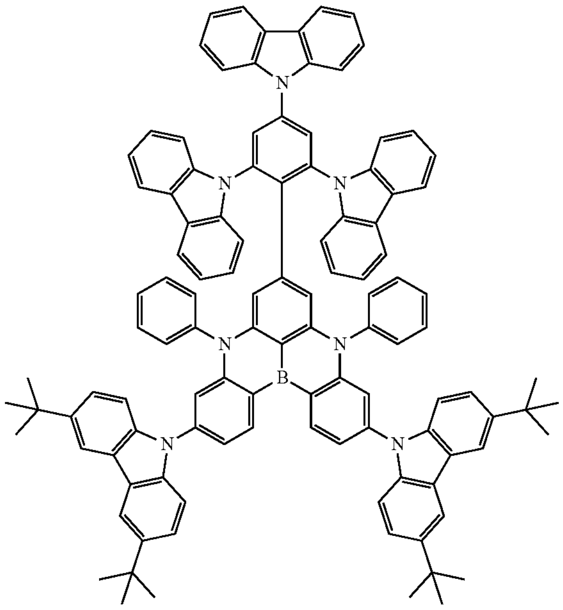
-continued
15
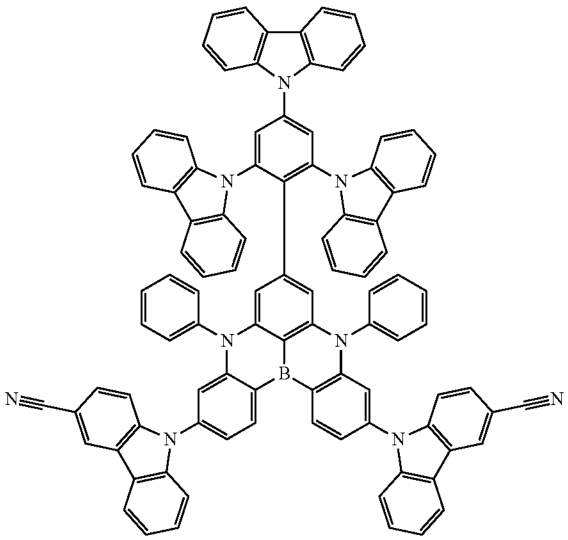
16
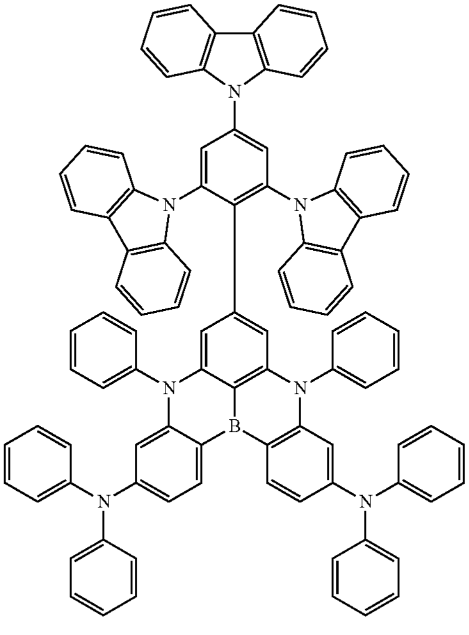

-continued
17
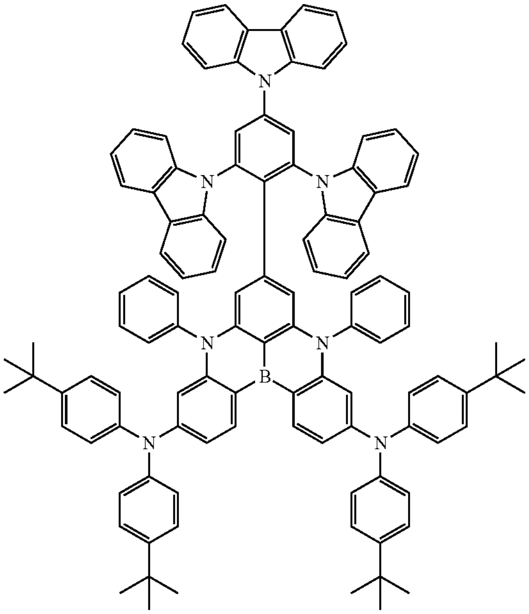
18
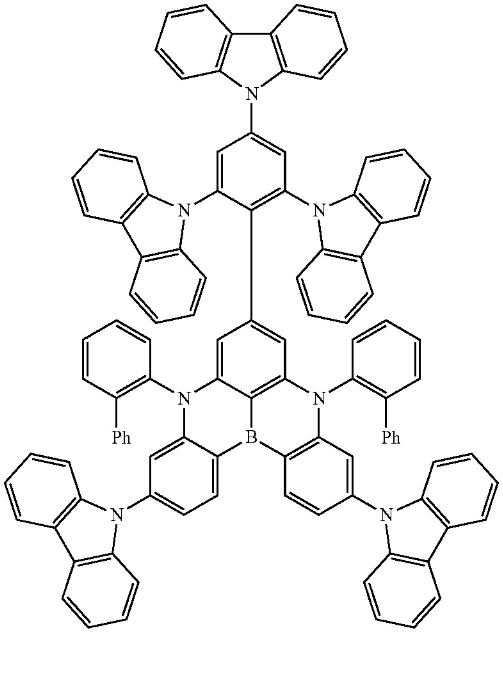
-continued
19
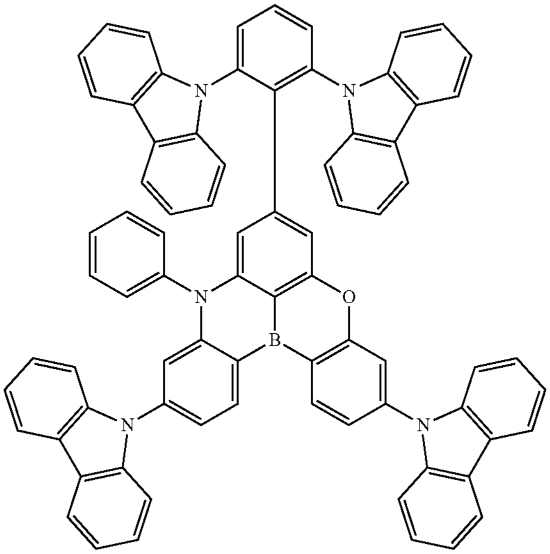
20
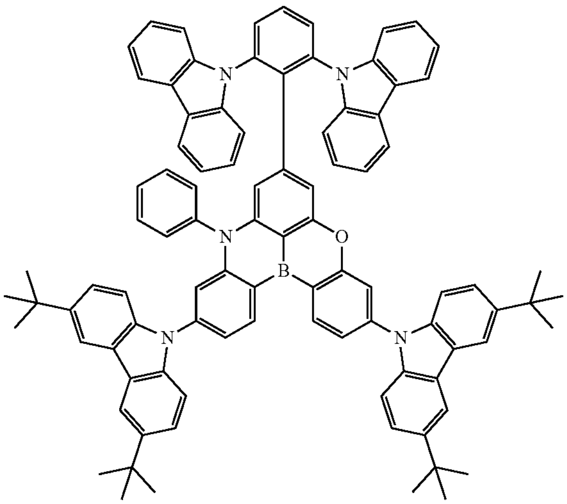
21
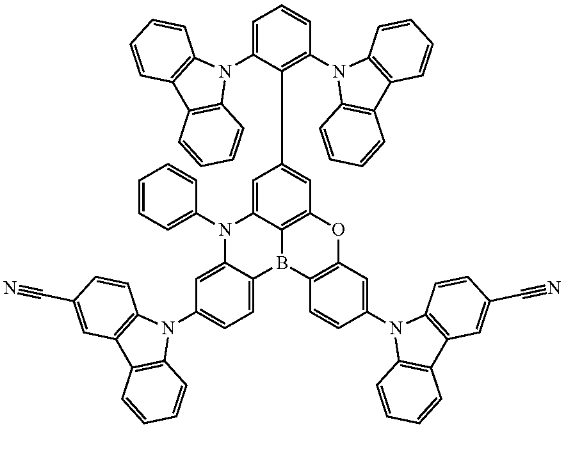

22
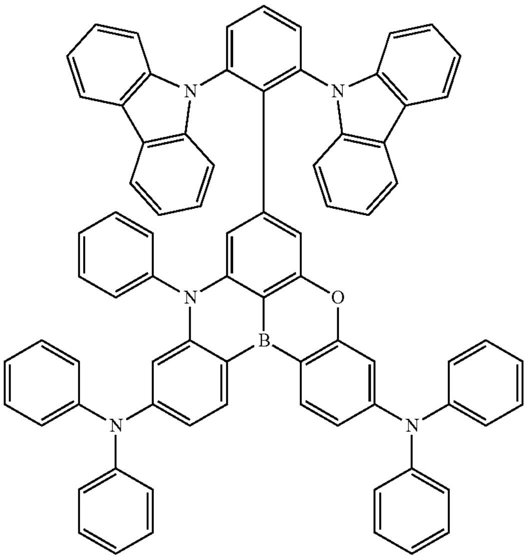
23
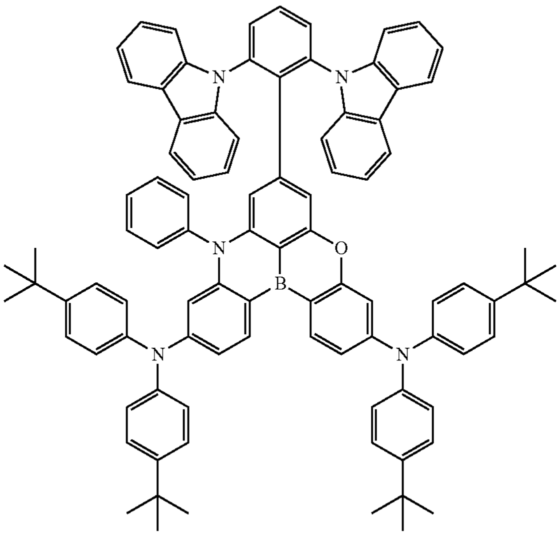
24
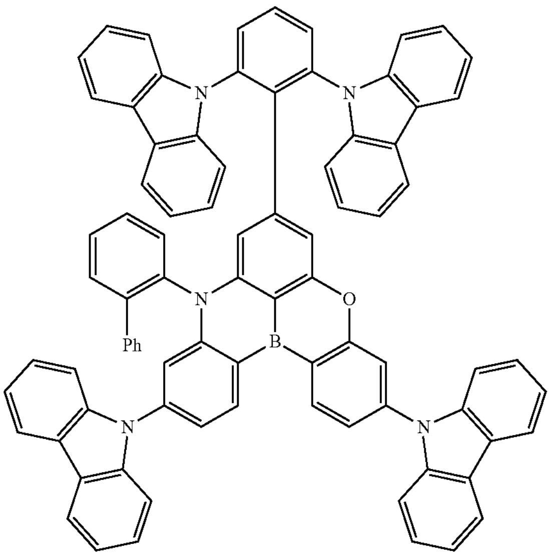
25
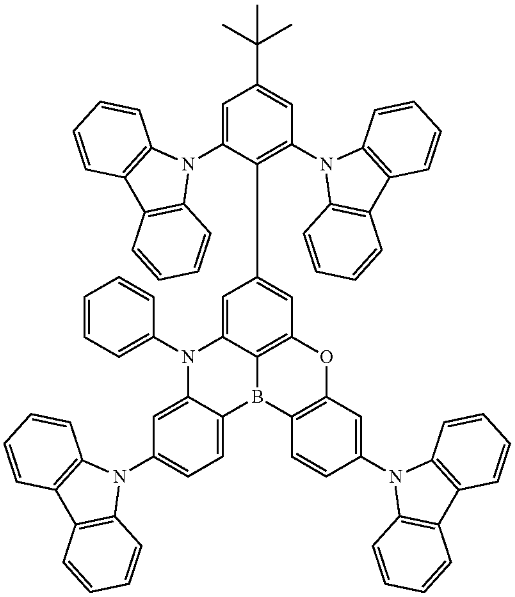

-continued
26
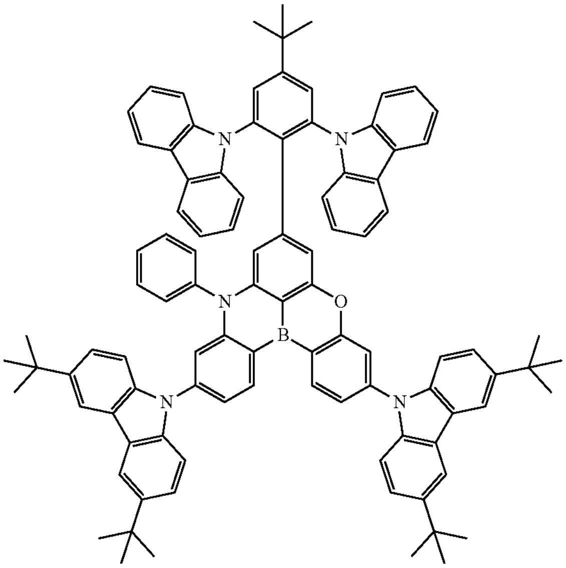
27
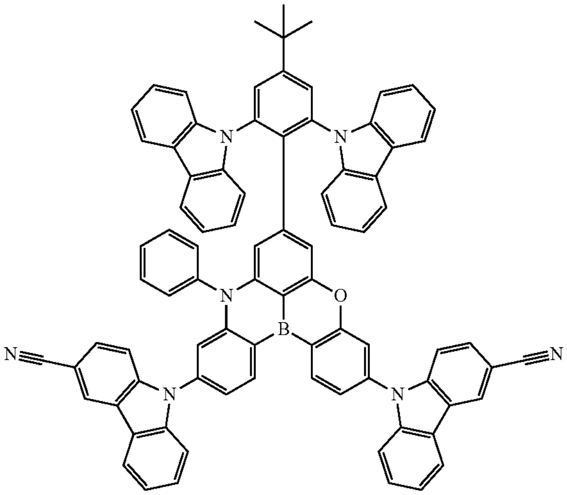
-continued
28
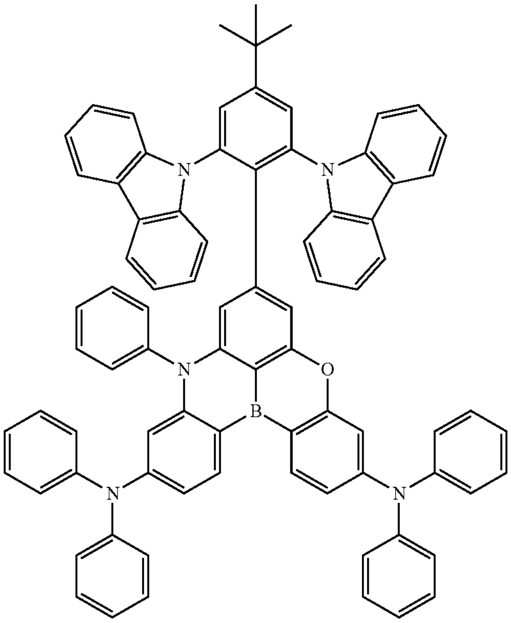
29
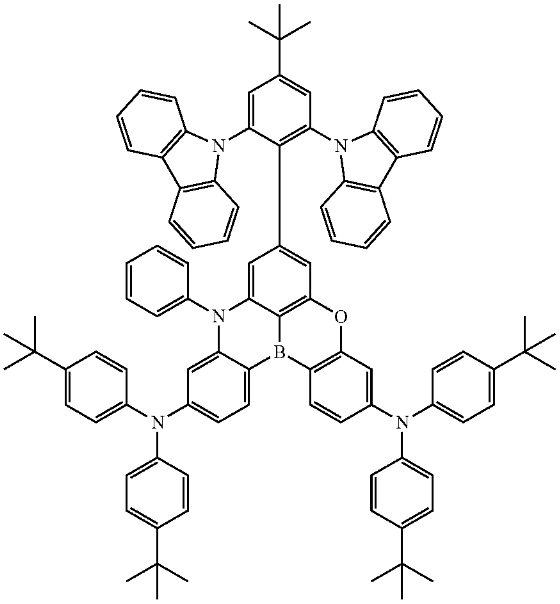

-continued
30
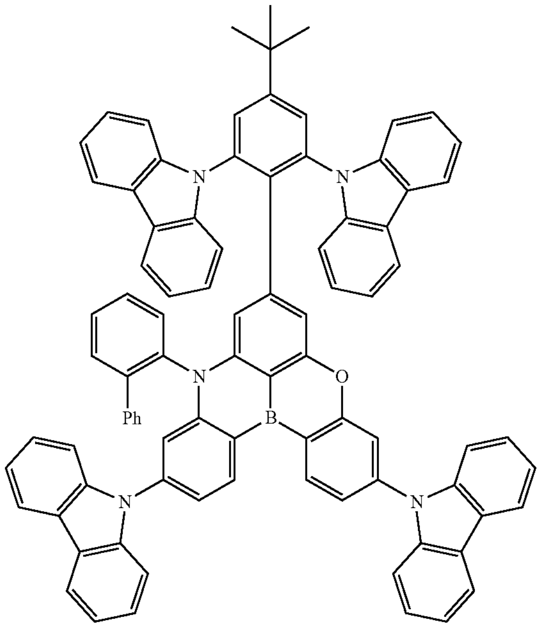
31
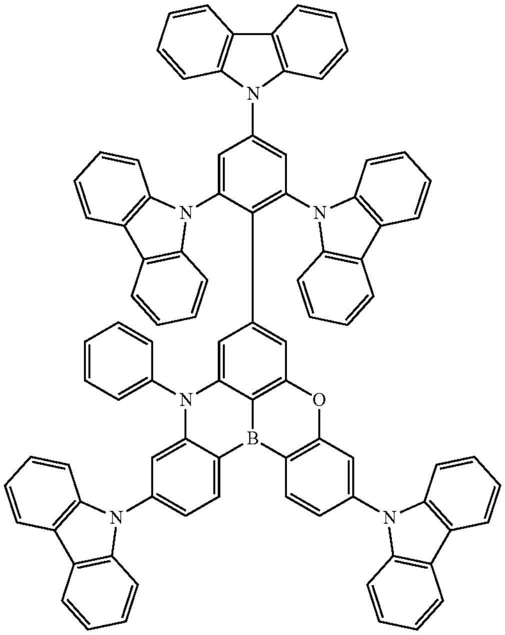
-continued
32
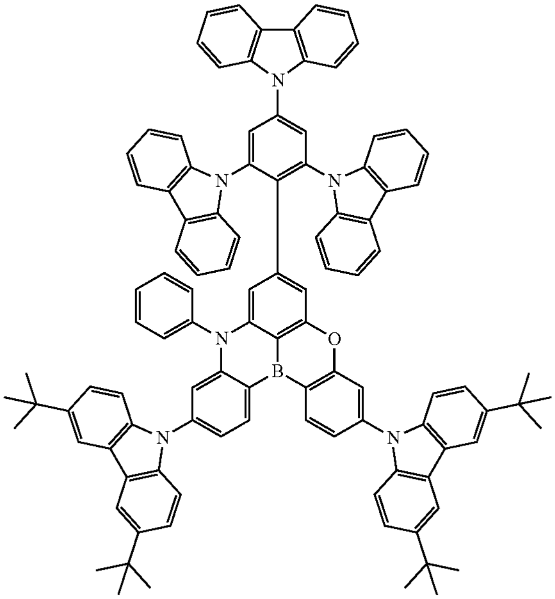
33
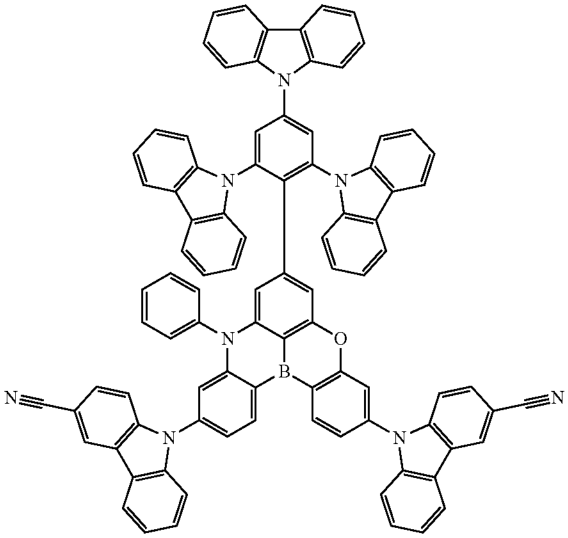

-continued
34
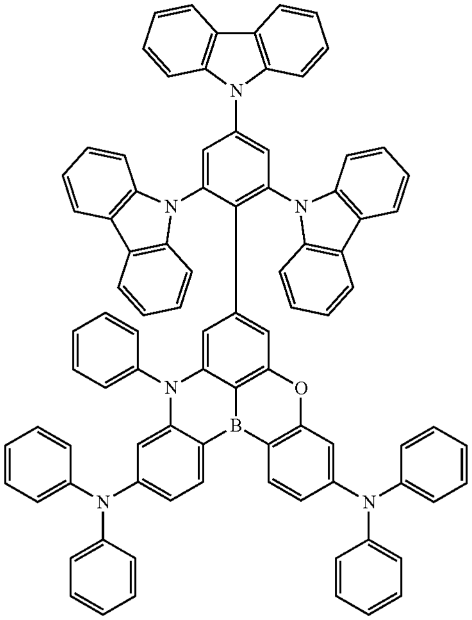
36
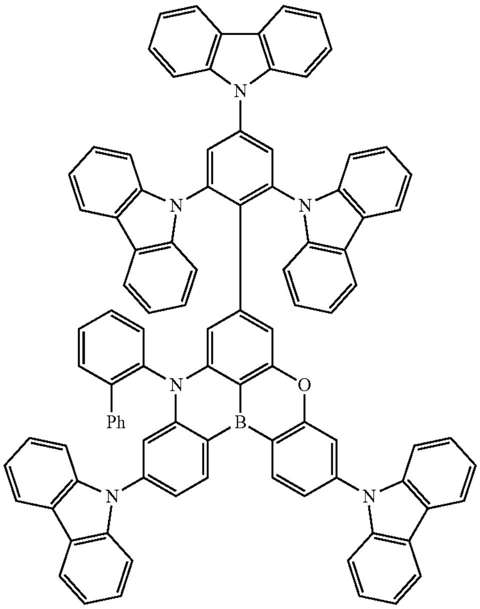
35
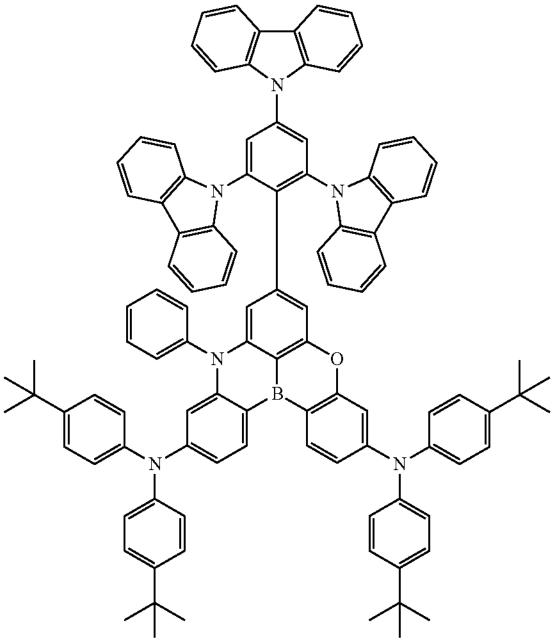
37
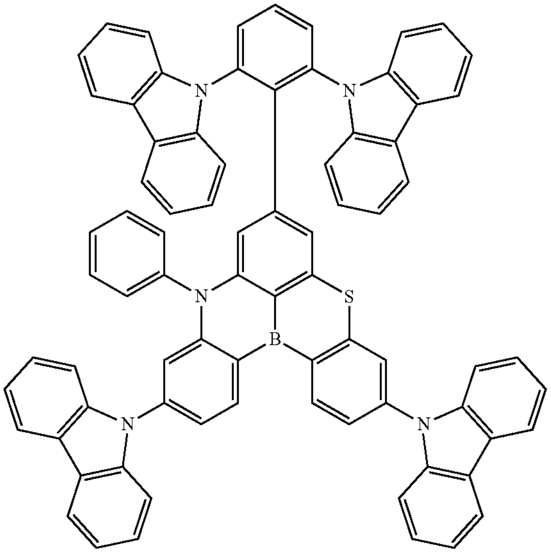

38
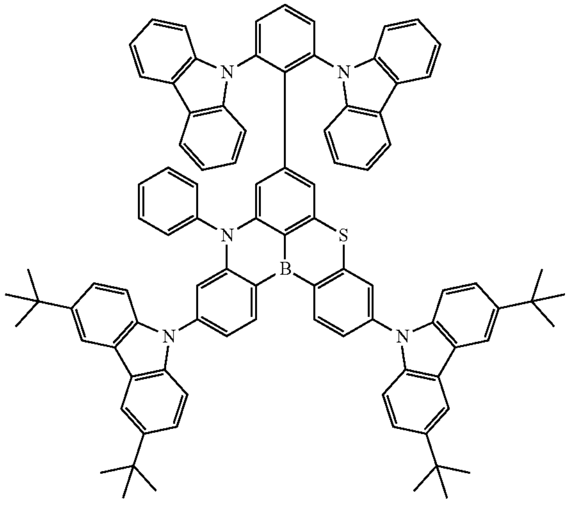
39
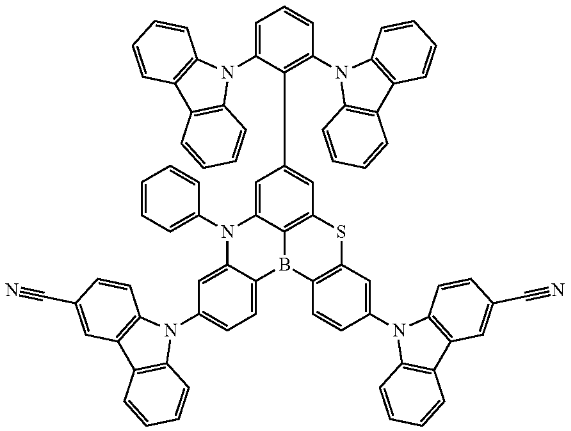
40
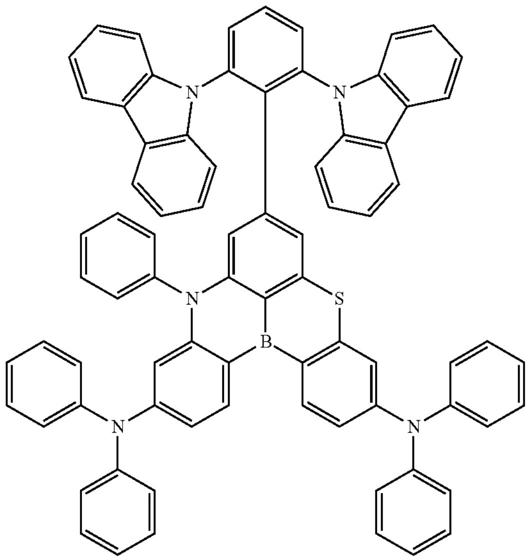
41
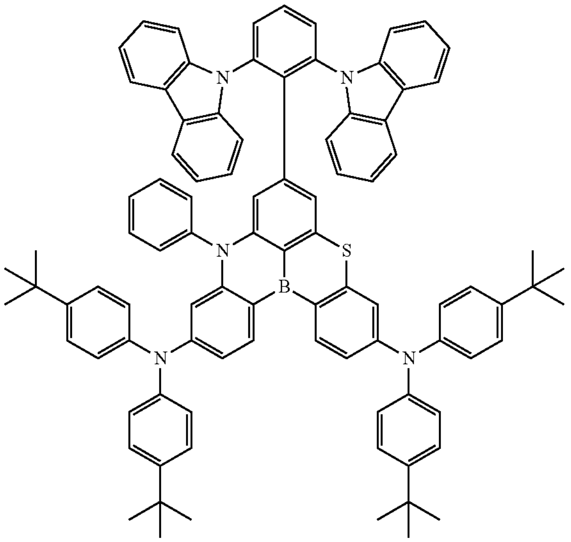
42
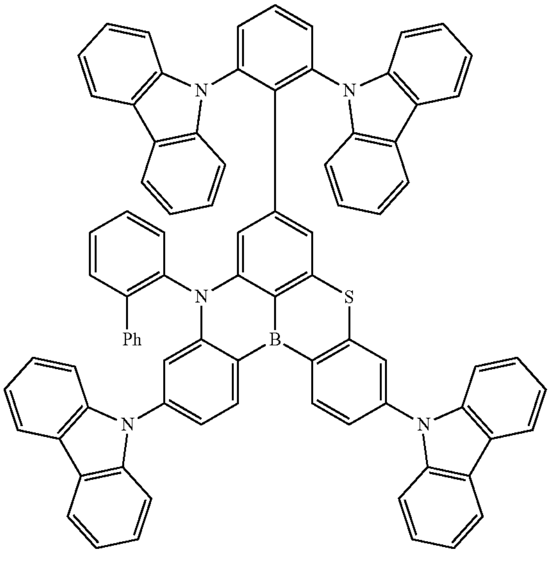

-continued
43
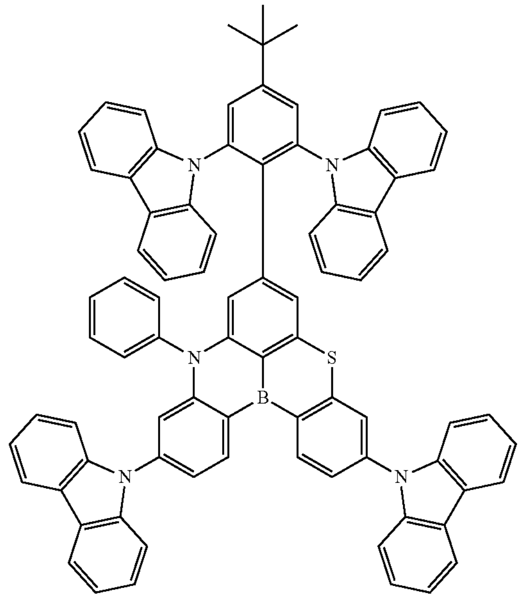
44
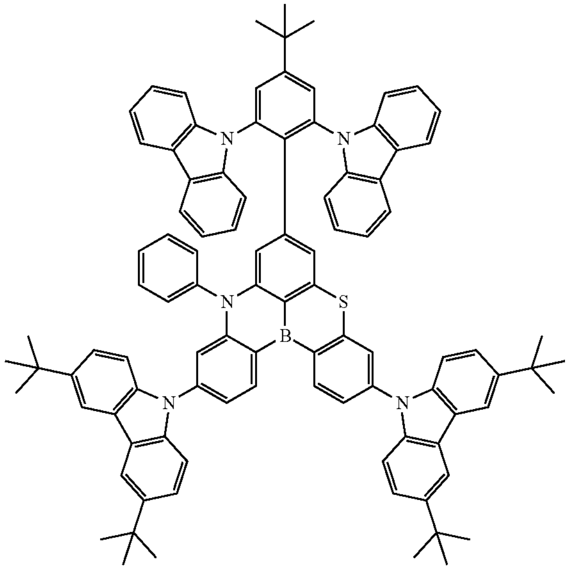
-continued
45
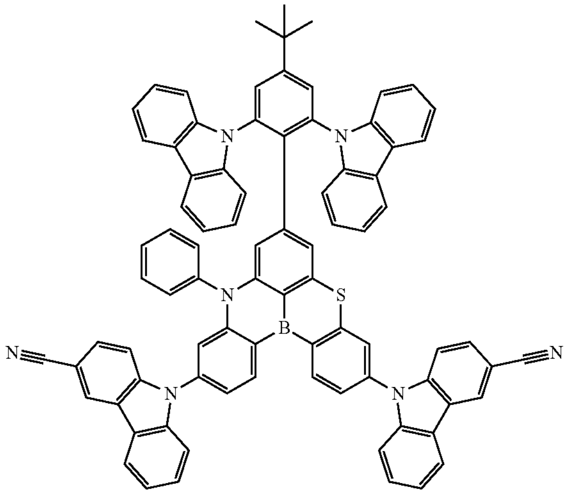
46
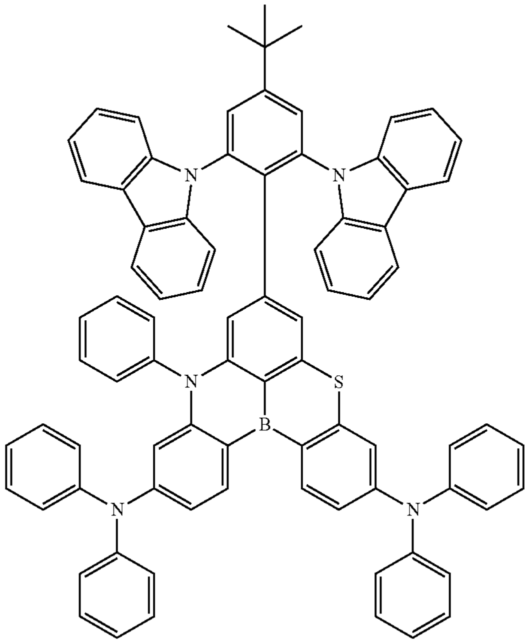

47
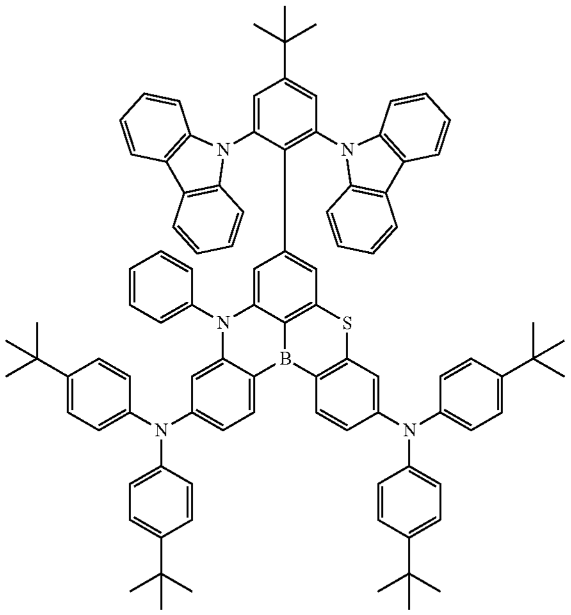
48
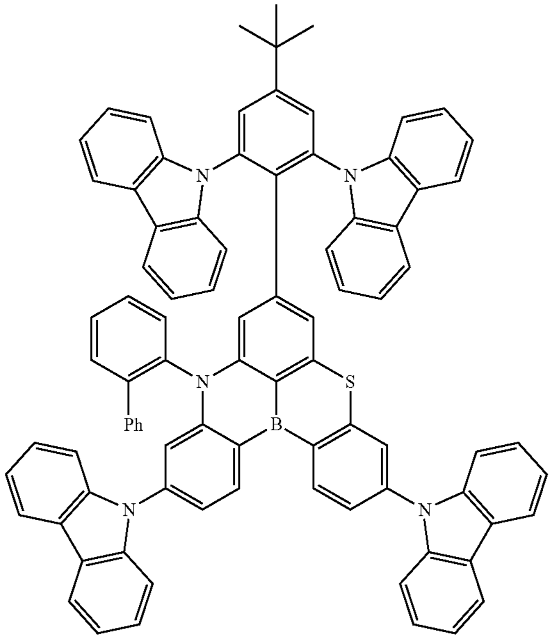
49
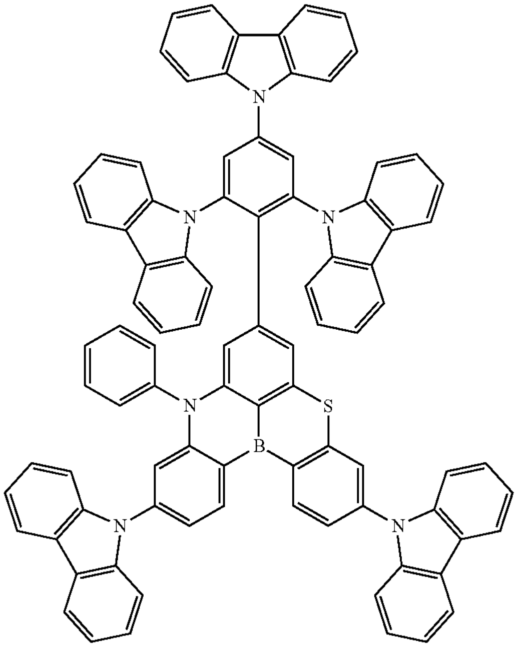
50
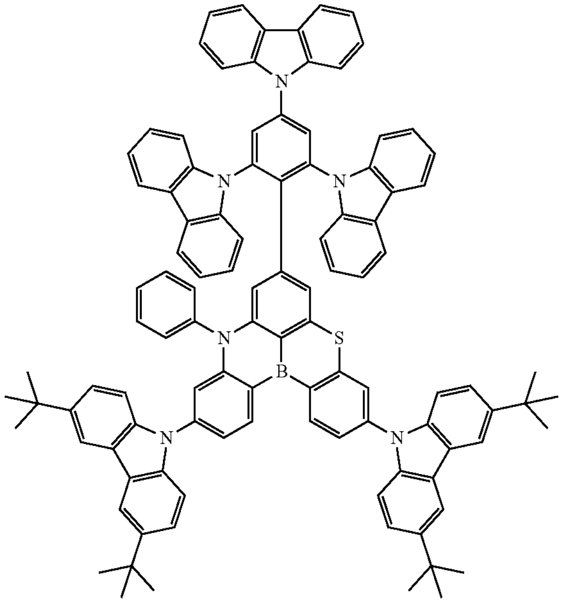

-continued
51
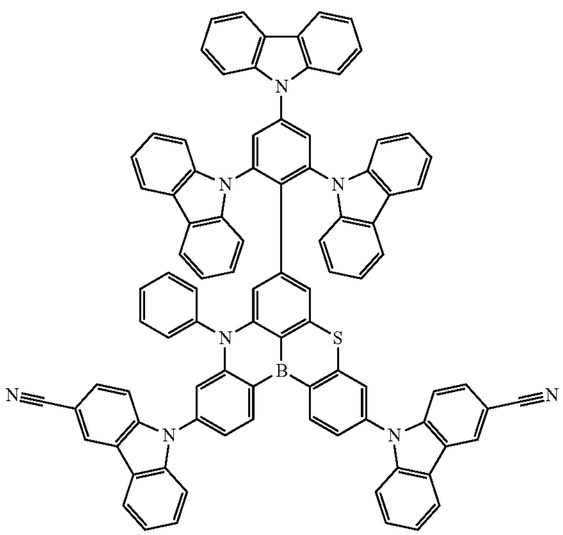
52
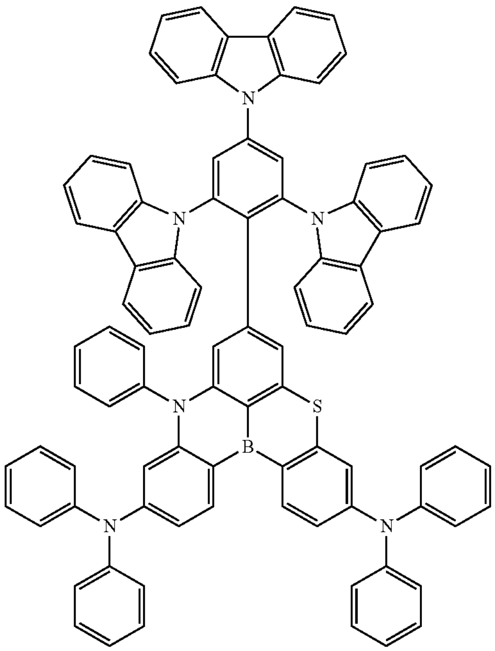
53
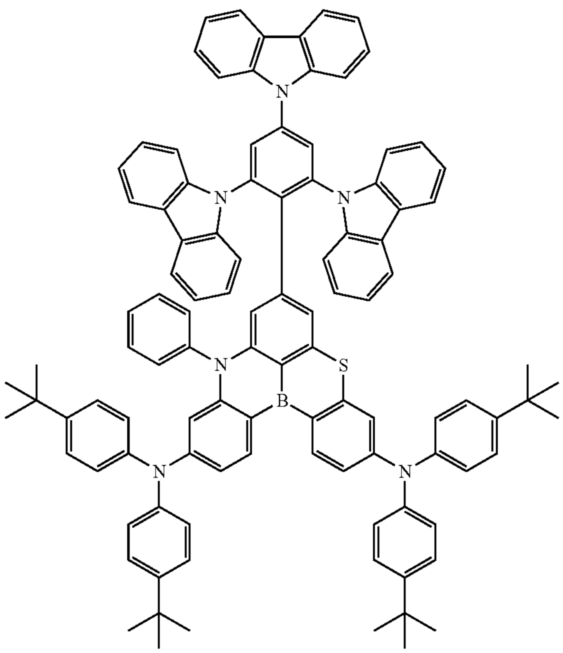
54
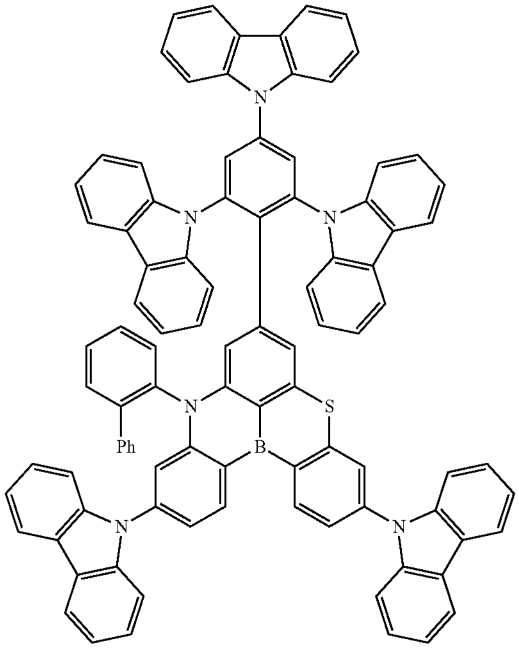

-continued
55
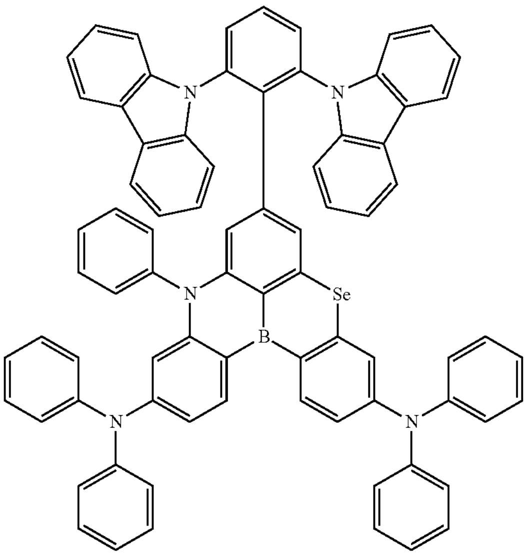
56
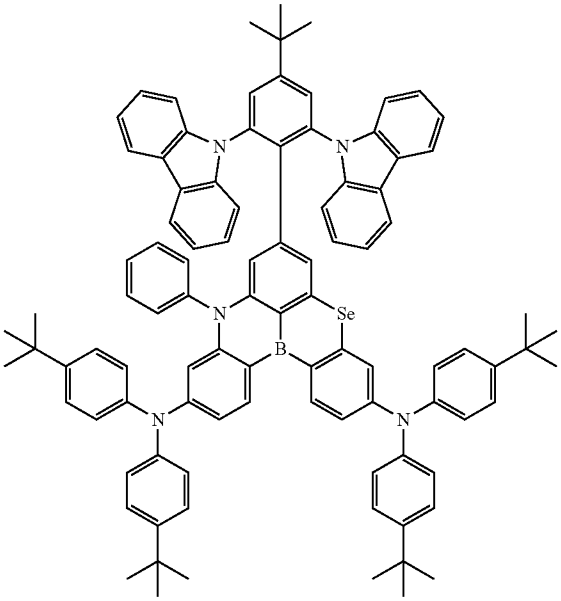
57
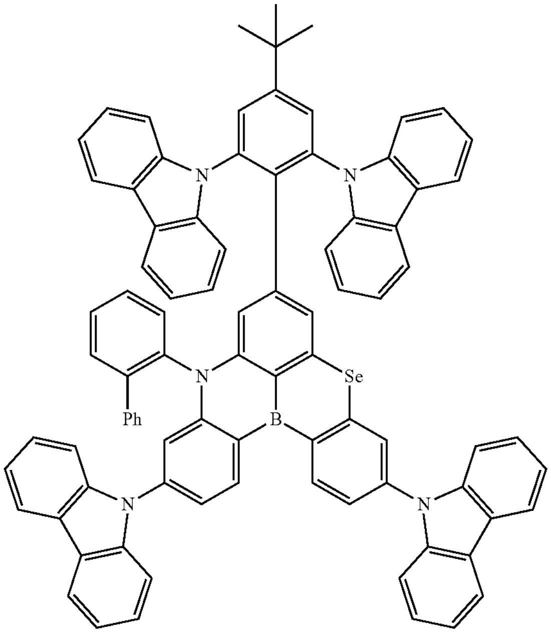
58
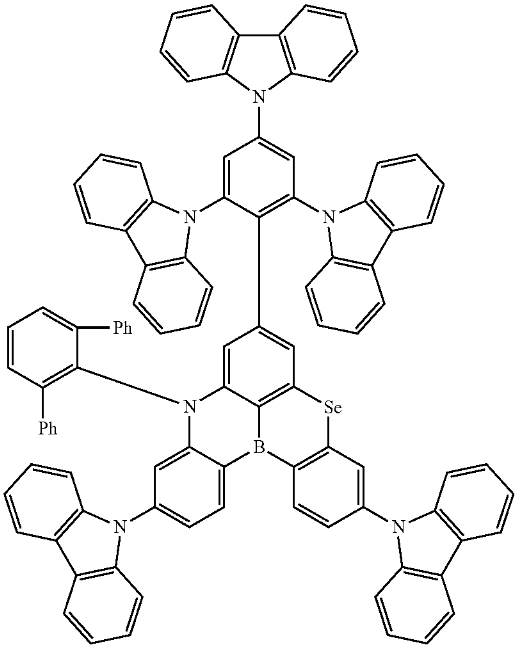

-continued
59
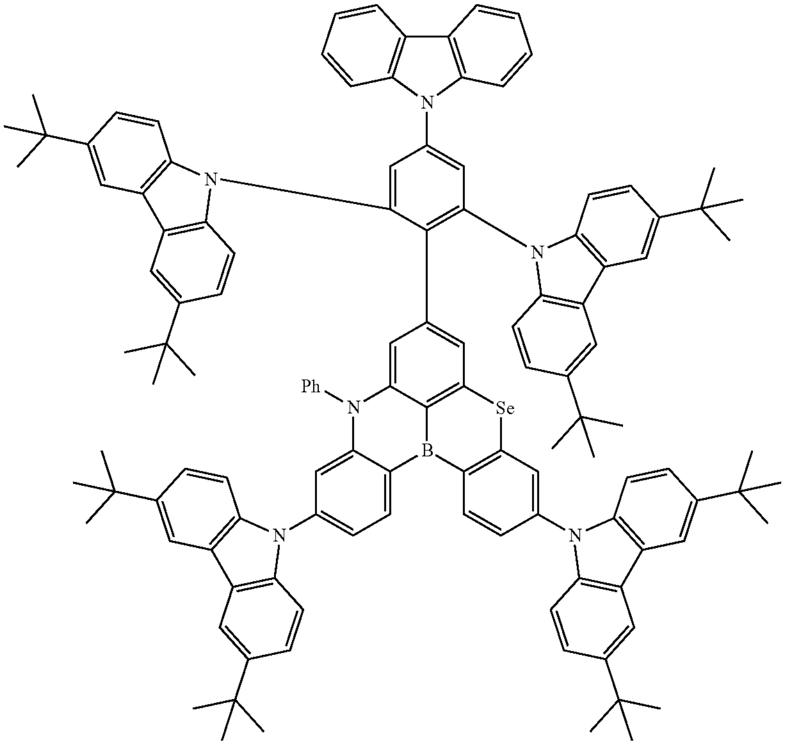
60
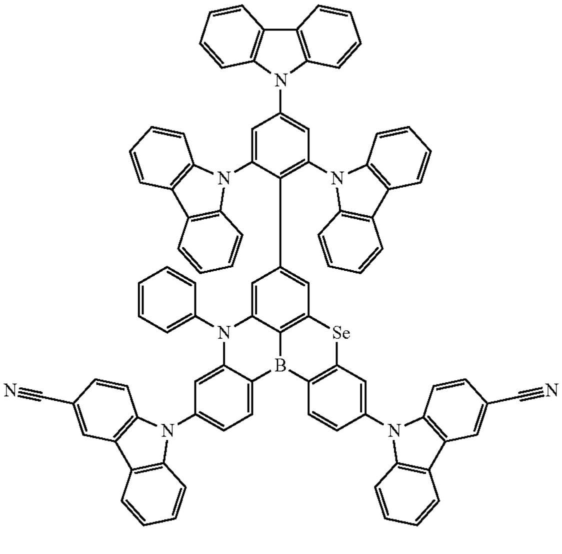
61
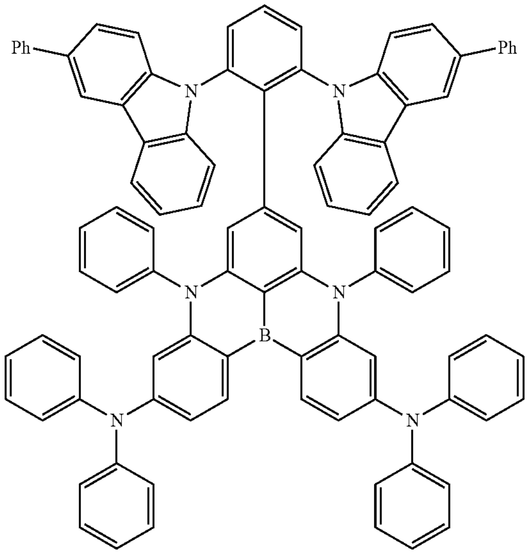

-continued
62
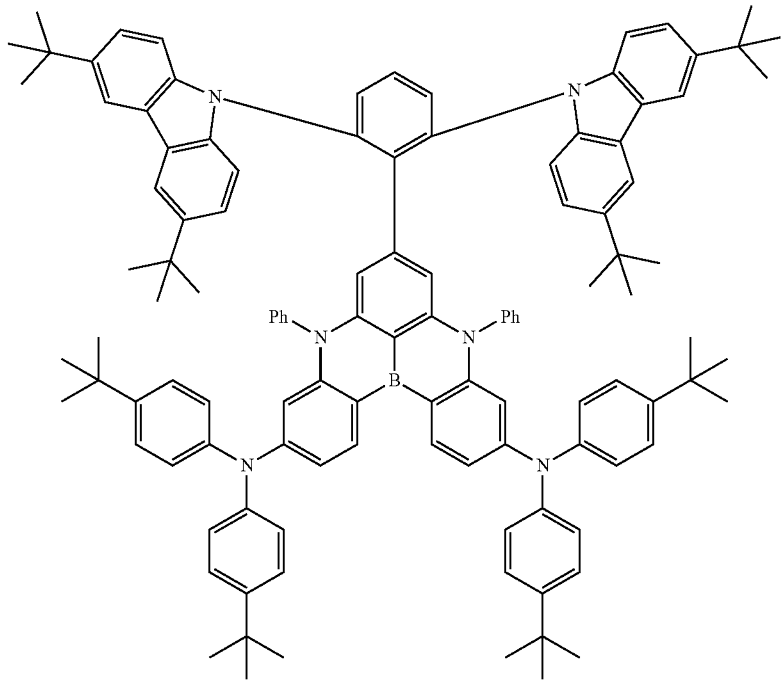
63
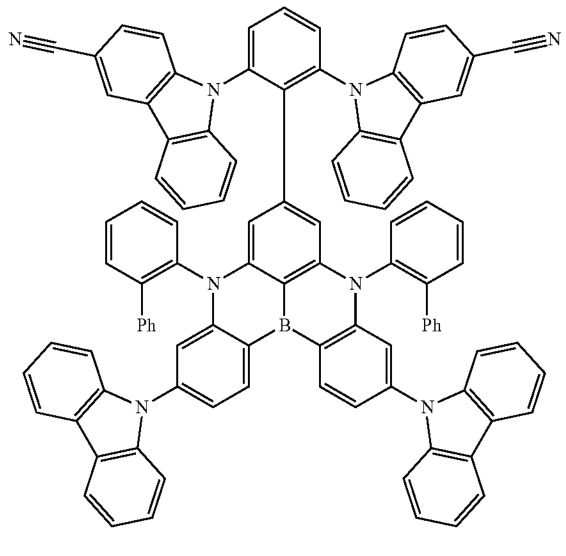
64
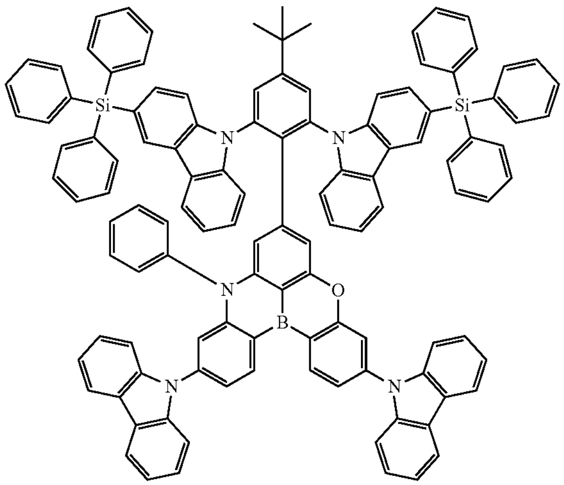

-continued
65
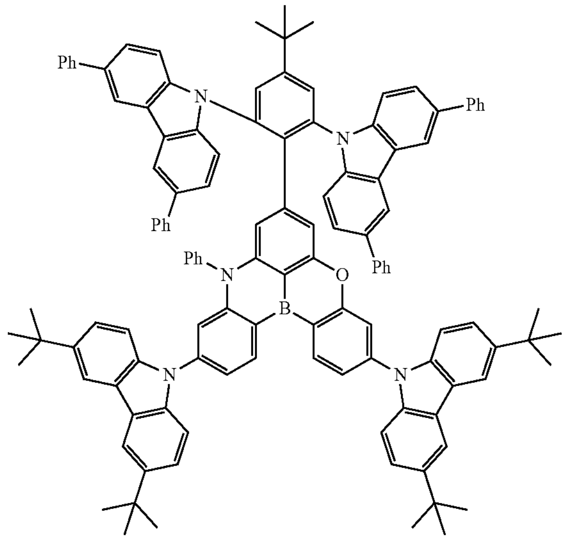
66
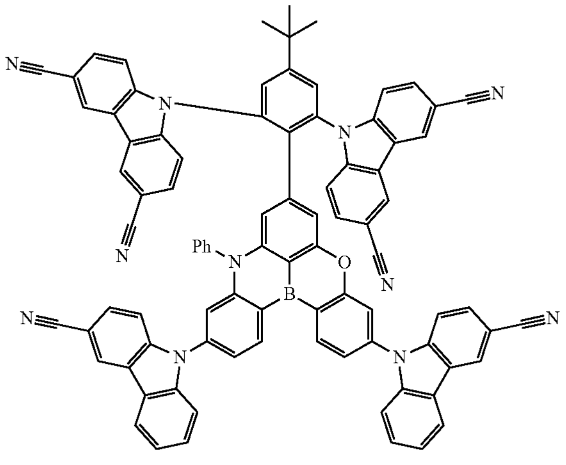
67
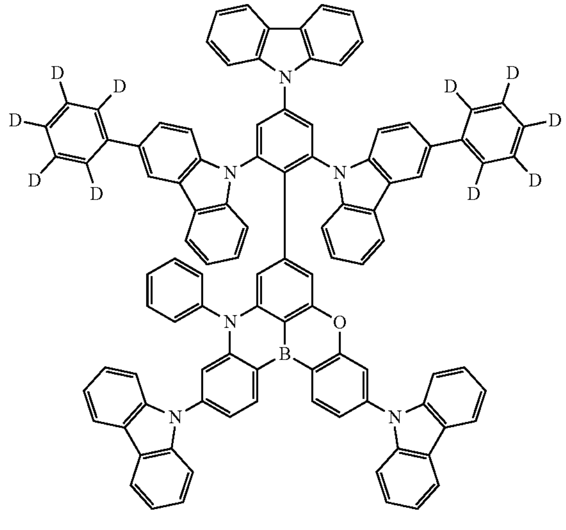
68
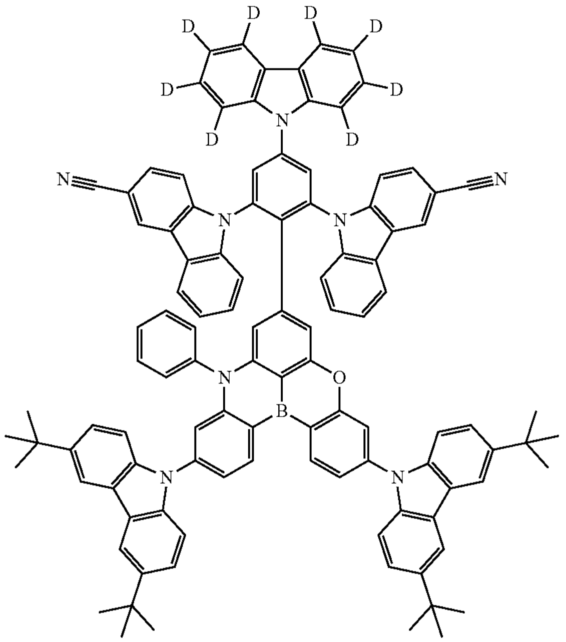

-continued
69
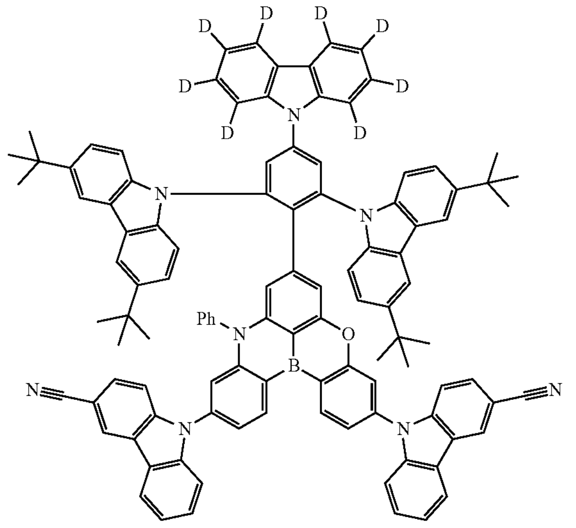
70
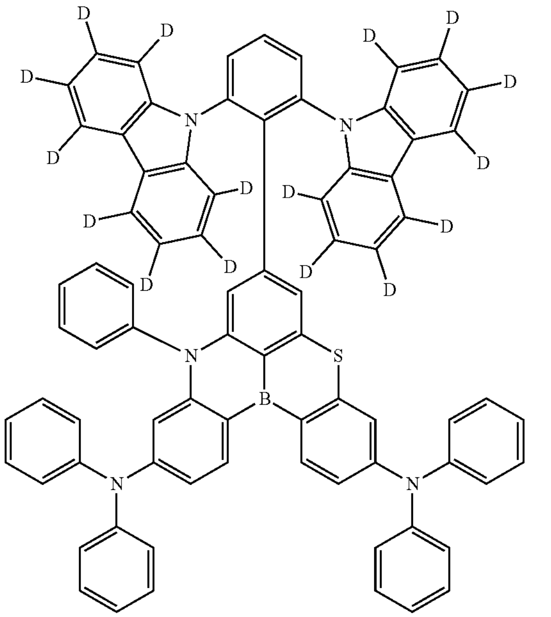
71
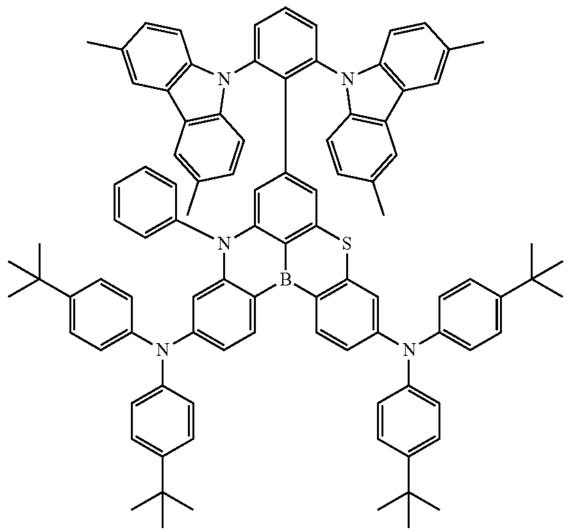
72
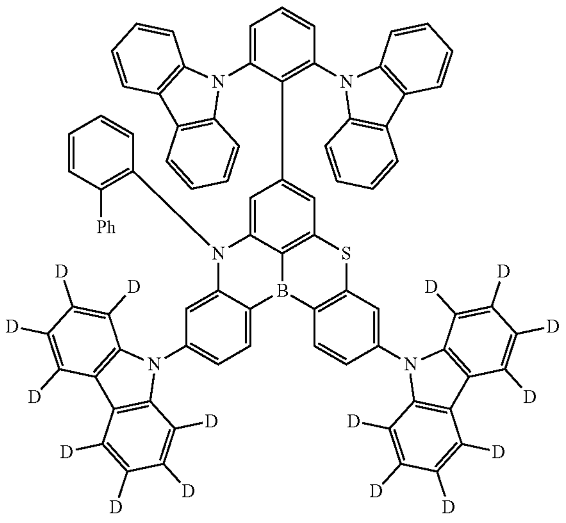

-continued
73
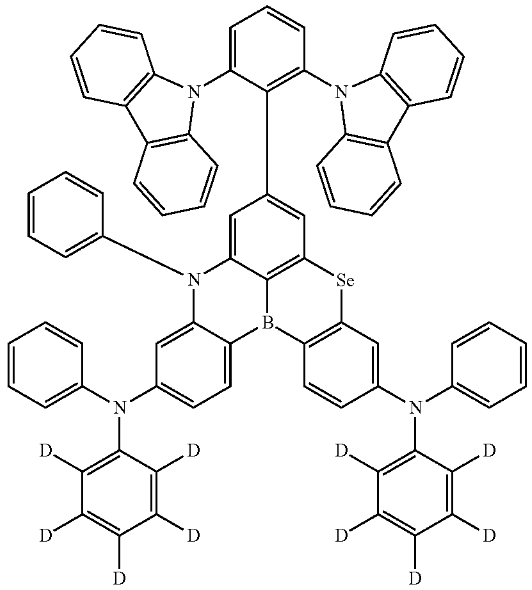
74
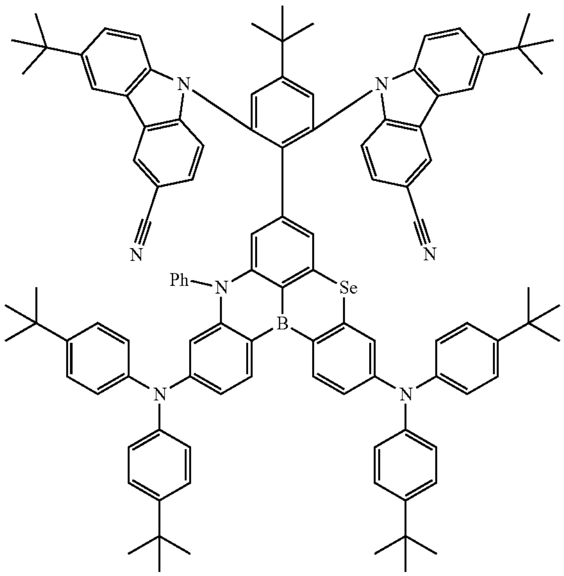
75
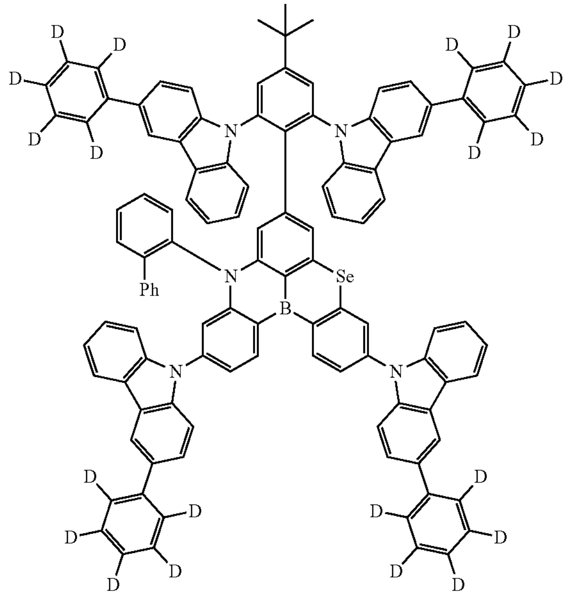
76
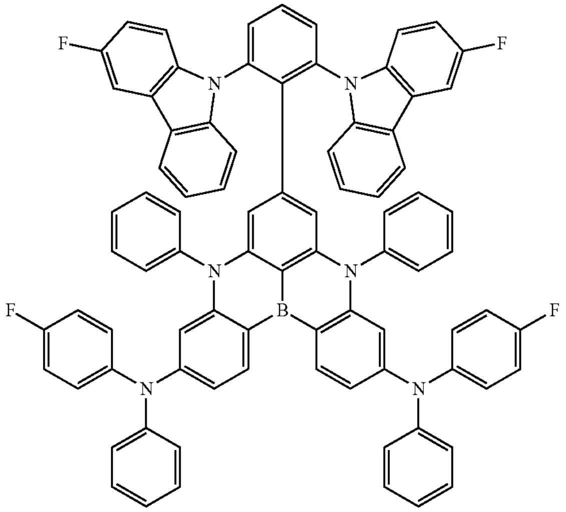

-continued
77
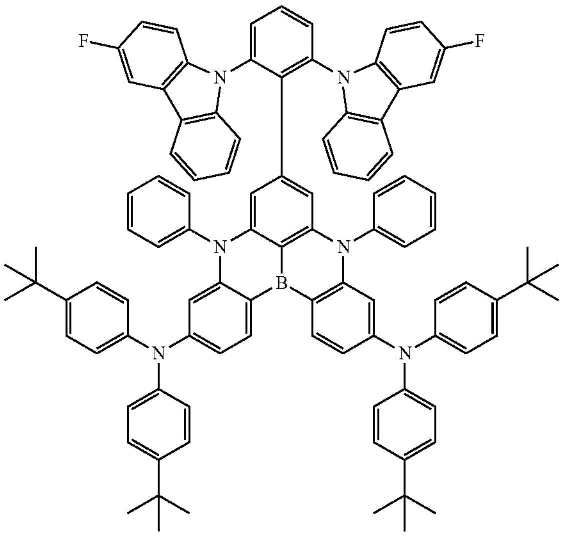
78
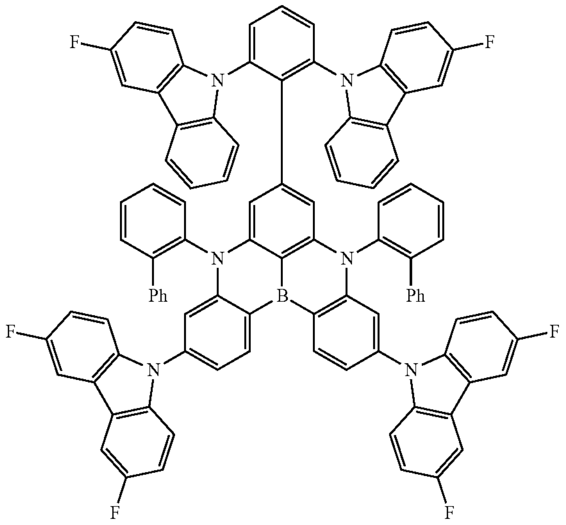
79
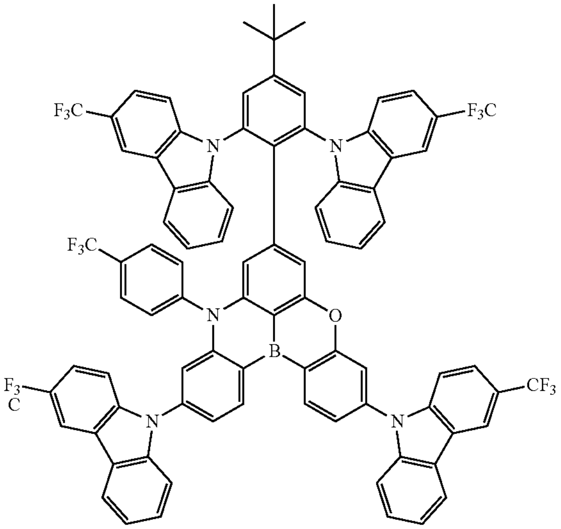
80
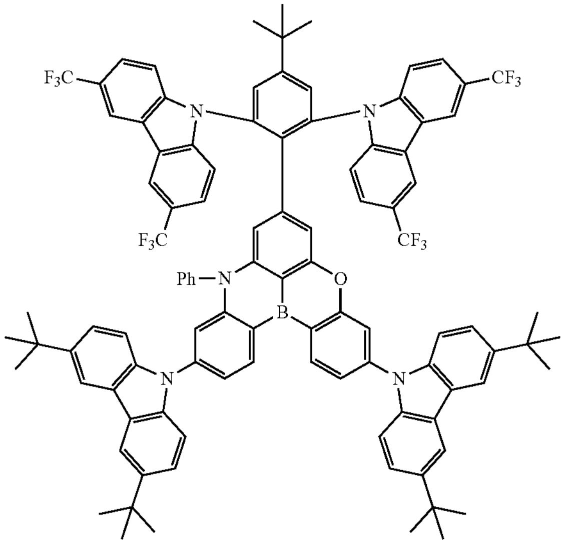

-continued
81
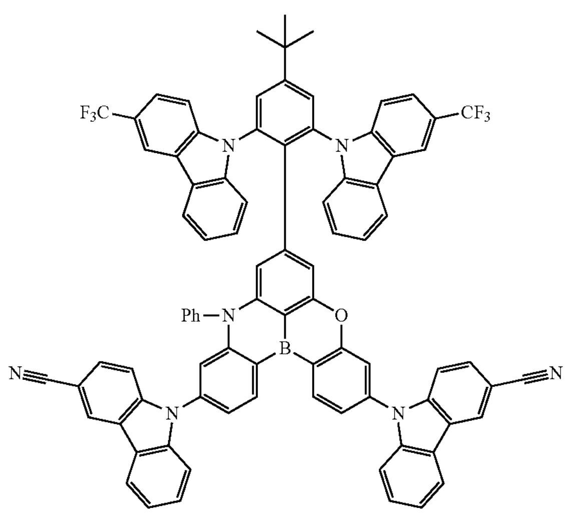
82
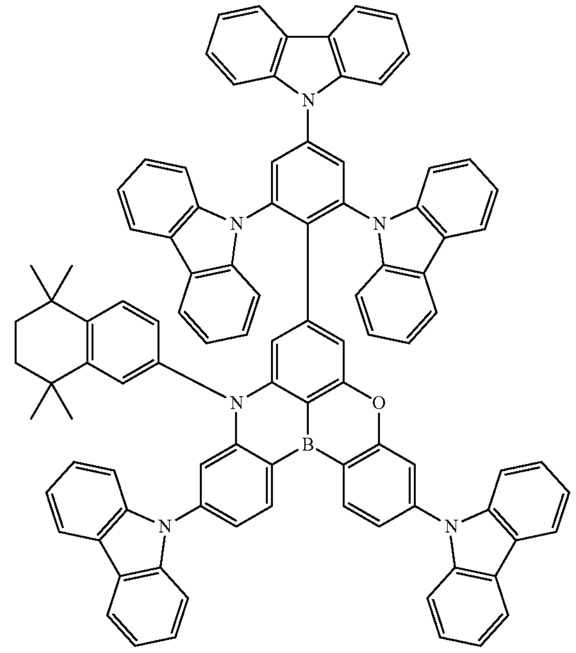
83
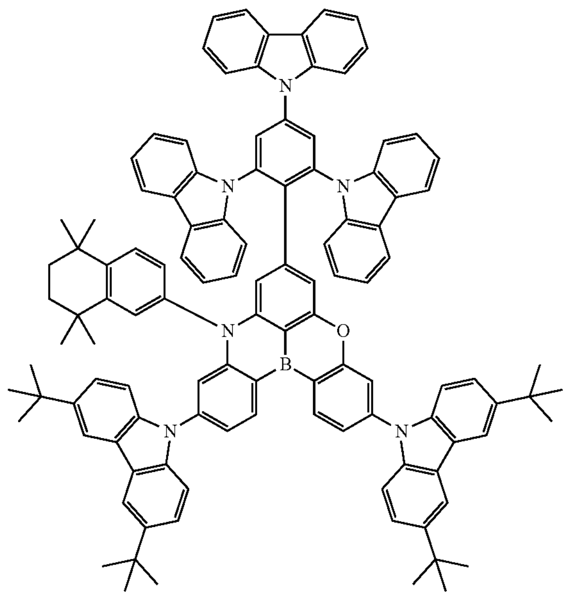
84
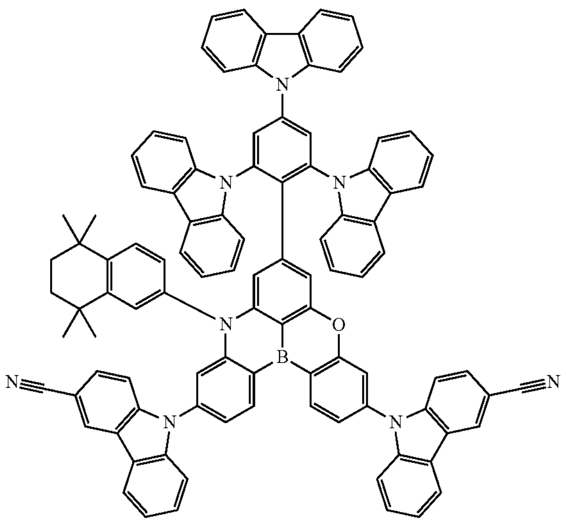

-continued
85
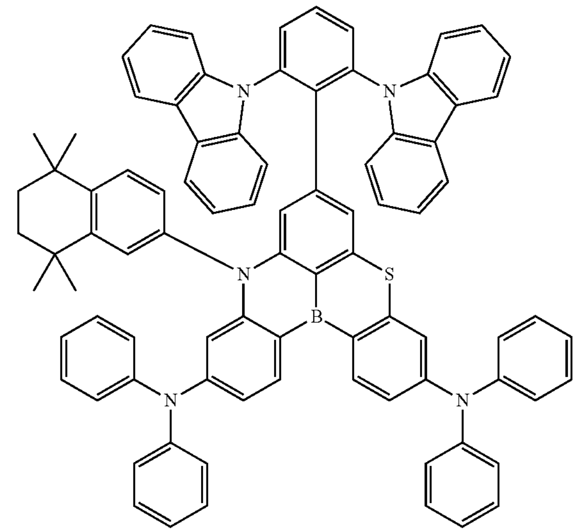
86
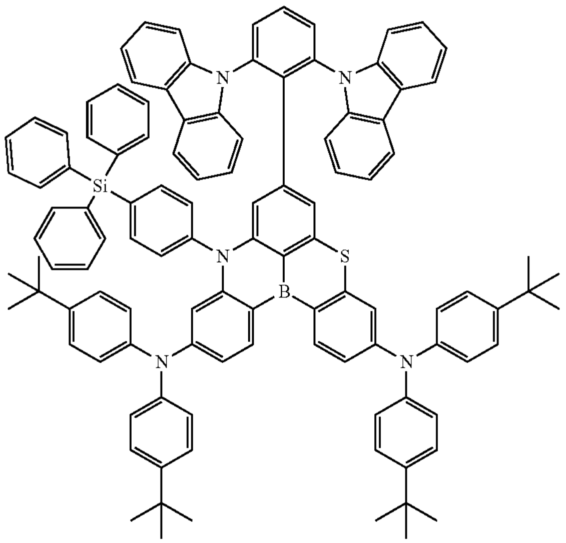
87
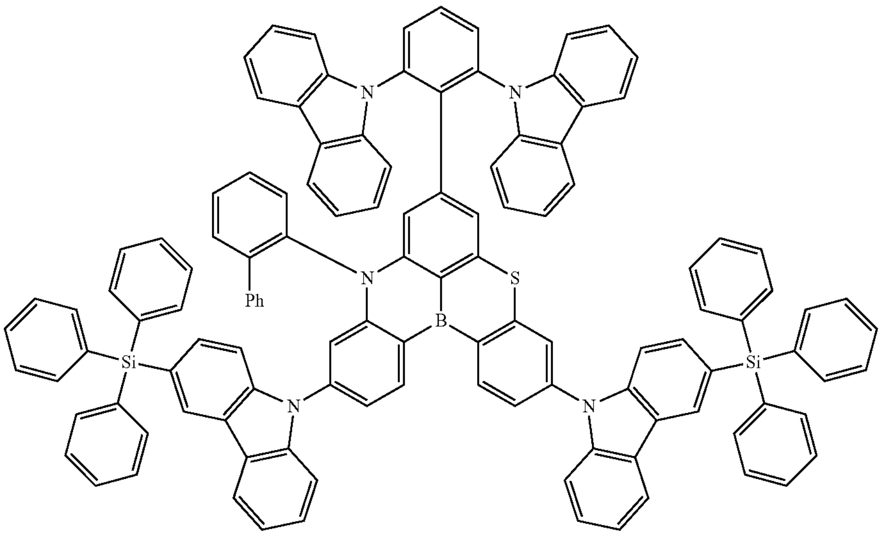

-continued

88

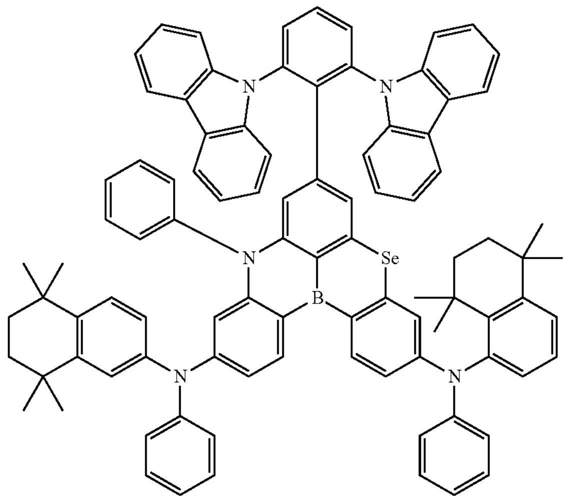

89

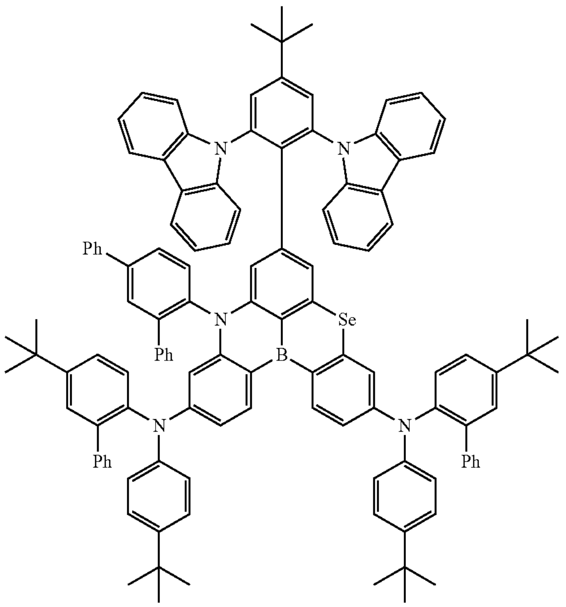

90

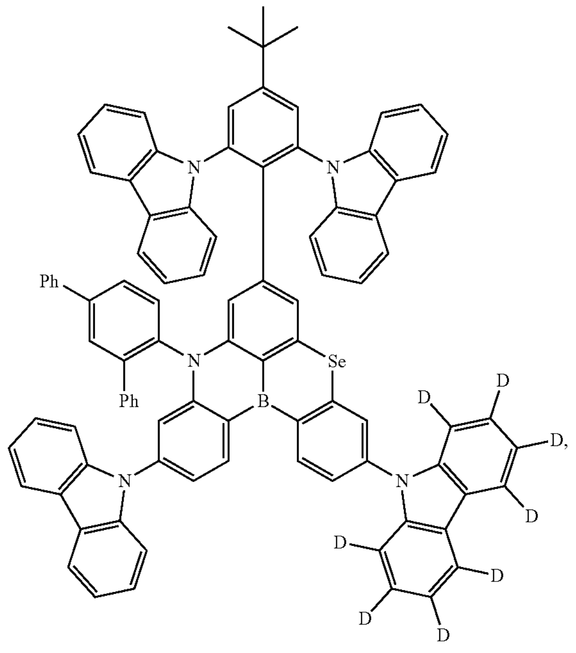

wherein in Compound Group 1,

Ph is an unsubstituted phenyl group.

22. A display device including a light emitting device, wherein the light emitting device comprises:

a first electrode;

a second electrode disposed on the first electrode; and a light emitting layer disposed between the first electrode and the second electrode, and including a polycyclic compound, the first electrode and the second electrode each independently include at least one selected from Ag, Mg, Cu, Al, Pt, Pd, Au, Ni, Nd, Ir, Cr, Li, Ca, LiF, Mo, Ti, W, In, Sn, Zn, an oxide thereof, a compound thereof, and a mixture thereof, the polycyclic compound includes:

a phenyl group, a first substituent substituted at the phenyl group, and represented by Formula A-1;

a second substituent substituted at the phenyl group at an ortho position with respect to the first substituent, and a third substituent substituted at the phenyl group at an ortho position with respect to the first substituent and at a meta position with respect to the second substituent, and the second substituent and the third substituent are each independently a group represented by Formula A-2:

[Formula A-1]

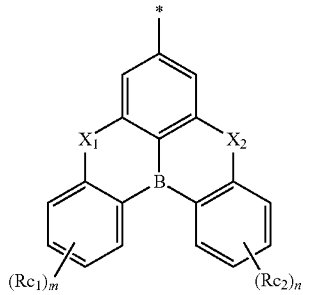

[Formula A-2]

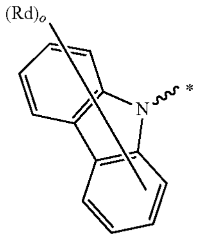

wherein in Formula A-1, $X_1$ and $X_2$ are each independently O, S, Se, or N(Ra), m and n are each independently an integer from 0 to 4, and Ra, $RC_1$, and $RC_2$ are each independently a hydrogen atom, a deuterium atom, a halogen atom, a cyano group, a substituted or unsubstituted amine group, a substituted or unsubstituted silyl group, a substituted or unsubstituted alkyl group having 1 to 20 carbon atoms, a substituted or unsubstituted alkenyl group haVing 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to forrn a ring, provided that:

m is not equal to zero, and at least one $RC_1$ is a substituted or unsubstituted carbazole group or a substituted or unsubstituted diphenyl amine group; or n is not equal to zero, and at least one $RC_2$ is a substituted or unsubstituted carbazole group or a substituted or unsubstituted diphenyl amine group, wherein in Formula A-Z, o is an integer from 0 to 8, and Rd is a hydrogen atom, a deuterium atom, a halogen atom, a cyano group, a substituted or unsubstituted amine group, a substituted or unsubstituted silyl group, a substituted or unsubstituted alkyl group having 1 to 20 carbon atoms, a substituted or unsubstituted alkenyl group haVing 2 to 20 carbon atoms, a substituted or unsubstituted aryl group haVing 6 to 30 ring-forming carbon atoms, or a substituted or unsubstituted heteroaryl group haVing 2 to 30 ring-forming carbon atoms, or is bonded to an adjacent group to forrn a ring, and wherein in Formulas A-1 and A-2, represents a binding site to the phenyl group.

* * * * *